United States Patent
Mueller et al.

(10) Patent No.: US 7,344,279 B2
(45) Date of Patent: Mar. 18, 2008

(54) THERMAL MANAGEMENT METHODS AND APPARATUS FOR LIGHTING DEVICES

(75) Inventors: George G. Mueller, Boston, MA (US); Frederick M. Morgan, Quincy, MA (US); Ihor A. Lys, Milton, MA (US); Kevin J. Dowling, Westford, MA (US); Edward Nortrup, Stoneham, MA (US)

(73) Assignee: Philips Solid-State Lighting Solutions, Inc., Burlington, MA (US)

( * ) Notice: Subject to any disclaimer, the term of this patent is extended or adjusted under 35 U.S.C. 154(b) by 18 days.

(21) Appl. No.: 11/010,840

(22) Filed: Dec. 13, 2004

(65) Prior Publication Data

US 2005/0276053 A1 Dec. 15, 2005

Related U.S. Application Data

(60) Provisional application No. 60/588,090, filed on Jul. 15, 2004, provisional application No. 60/558,400, filed on Mar. 31, 2004, provisional application No. 60/528,847, filed on Dec. 11, 2003.

(51) Int. Cl.
*F21V 29/00* (2006.01)

(52) U.S. Cl. ............... 362/294; 362/240; 362/249; 362/373; 362/800

(58) Field of Classification Search ............... 362/240, 362/249, 294, 373, 800
See application file for complete search history.

(56) References Cited

U.S. PATENT DOCUMENTS

| | | | |
|---|---|---|---|
| 4,290,096 A * | 9/1981 | Szpur | 362/223 |
| 4,507,719 A * | 3/1985 | Quiogue | 362/404 |
| 5,278,432 A | 1/1994 | Ignatius et al. | |
| 5,690,424 A | 11/1997 | Warshauer et al. | |
| 5,738,436 A | 4/1998 | Cummings et al. | |
| 5,785,418 A | 7/1998 | Hochstein | |
| 5,806,965 A | 9/1998 | Deese | |
| 5,842,775 A | 12/1998 | Roorda et al. | |
| 6,009,650 A | 1/2000 | Lamparter | |
| 6,016,038 A | 1/2000 | Mueller et al. | |
| 6,045,240 A | 4/2000 | Hochstein | |
| 6,059,421 A | 5/2000 | White et al. | |
| 6,078,257 A * | 6/2000 | Ferraro | 340/568.1 |
| 6,150,774 A | 11/2000 | Mueller et al. | |
| 6,166,496 A | 12/2000 | Lys et al. | |
| 6,211,626 B1 | 4/2001 | Lys et al. | |
| 6,220,722 B1 * | 4/2001 | Begemann | 362/231 |
| 6,292,901 B1 | 9/2001 | Lys et al. | |
| 6,335,548 B1 | 1/2002 | Roberts et al. | |
| 6,340,868 B1 | 1/2002 | Lys et al. | |
| 6,357,893 B1 | 3/2002 | Belliveau | |
| 6,441,943 B1 | 8/2002 | Roberts et al. | |

(Continued)

FOREIGN PATENT DOCUMENTS

JP 0512912 A * 1/1993

(Continued)

*Primary Examiner*—Sandra O'Shea
*Assistant Examiner*—Jason Moon Han
(74) *Attorney, Agent, or Firm*—Wolf, Greenfield & Sacks, P.C.

(57) ABSTRACT

Methods and systems are provided for providing active and passive thermal or cooling facilities for LED lighting systems, including radiating and convective thermal facilities, including fans, phase change materials, conductive polymers, potting compounds, vents, ducts, and other thermal facilities.

60 Claims, 113 Drawing Sheets

U.S. PATENT DOCUMENTS

| | | |
|---|---|---|
| 6,450,661 B1 * | 9/2002 | Okumura .................... 362/240 |
| 6,459,919 B1 | 10/2002 | Lys et al. |
| 6,481,874 B2 | 11/2002 | Petroski |
| 6,528,954 B1 | 3/2003 | Lys et al. |
| 6,548,967 B1 | 4/2003 | Dowling et al. |
| 6,561,689 B1 | 5/2003 | Kidd et al. |
| 6,577,080 B2 | 6/2003 | Lys et al. |
| 6,578,986 B2 | 6/2003 | Swaris et al. |
| 6,608,453 B2 | 8/2003 | Morgan et al. |
| 6,624,597 B2 | 9/2003 | Dowling et al. |
| 6,712,486 B1 | 3/2004 | Popovich et al. |
| 6,717,376 B2 | 4/2004 | Lys et al. |
| 6,720,745 B2 | 4/2004 | Lys et al. |
| 6,774,584 B2 | 8/2004 | Lys et al. |
| 6,777,891 B2 | 8/2004 | Lys et al. |
| 6,781,329 B2 | 8/2004 | Morgan et al. |
| 6,787,999 B2 | 9/2004 | Stimac et al. |
| 6,788,011 B2 | 9/2004 | Mueller et al. |
| 6,801,003 B2 | 10/2004 | Schanberger et al. |
| 6,806,659 B1 | 10/2004 | Mueller et al. |
| 6,815,724 B2 | 11/2004 | Dry |
| 6,851,831 B2 | 2/2005 | Karlicek, Jr. |
| 6,869,204 B2 | 3/2005 | Morgan et al. |
| 6,883,929 B2 | 4/2005 | Dowling |
| 6,888,322 B2 | 5/2005 | Dowling et al. |
| 6,897,624 B2 | 5/2005 | Ducharme et al. |
| 6,936,978 B2 | 8/2005 | Morgan et al. |
| 6,965,205 B2 | 11/2005 | Piepgras et al. |
| 6,967,448 B2 | 11/2005 | Morgan et al. |
| 6,969,954 B2 | 11/2005 | Lys |
| 6,974,233 B1 | 12/2005 | Aubrey |
| 6,974,234 B2 * | 12/2005 | Galli .................... 362/294 |
| 6,975,079 B2 | 12/2005 | Lys et al. |
| 7,031,920 B2 | 4/2006 | Dowling et al. |
| 7,038,398 B1 | 5/2006 | Lys et al. |
| 7,038,399 B2 | 5/2006 | Lys et al. |
| 7,042,172 B2 | 5/2006 | Dowling et al. |
| 2002/0038157 A1 | 3/2002 | Dowling et al. |
| 2002/0048169 A1 | 4/2002 | Dowling et al. |
| 2002/0070688 A1 | 6/2002 | Dowling et al. |
| 2002/0074559 A1 | 6/2002 | Dowling et al. |
| 2002/0078221 A1 | 6/2002 | Blackwell et al. |
| 2002/0130627 A1 | 9/2002 | Dowling et al. |
| 2002/0145394 A1 | 10/2002 | Morgan et al. |
| 2002/0145869 A1 | 10/2002 | Dowling |
| 2002/0152045 A1 | 10/2002 | Dowling et al. |
| 2002/0158583 A1 | 10/2002 | Lys et al. |
| 2002/0176259 A1 | 11/2002 | Ducharme |
| 2003/0011538 A1 | 1/2003 | Lys et al. |
| 2003/0028260 A1 | 2/2003 | Blackwell |
| 2003/0053310 A1 | 3/2003 | Sommers |
| 2003/0057884 A1 | 3/2003 | Dowling et al. |
| 2003/0057887 A1 | 3/2003 | Dowling et al. |
| 2003/0076281 A1 | 4/2003 | Morgan et al. |
| 2003/0100837 A1 | 5/2003 | Lys et al. |
| 2003/0133292 A1 | 7/2003 | Mueller et al. |
| 2003/0222587 A1 | 12/2003 | Dowling et al. |
| 2004/0036006 A1 | 2/2004 | Dowling |
| 2004/0052076 A1 | 3/2004 | Mueller et al. |
| 2004/0090191 A1 | 5/2004 | Mueller et al. |
| 2004/0090787 A1 | 5/2004 | Dowling et al. |
| 2004/0105261 A1 | 6/2004 | Ducharme et al. |
| 2004/0105264 A1 | 6/2004 | Spero |
| 2004/0116039 A1 | 6/2004 | Mueller et al. |
| 2004/0130909 A1 | 7/2004 | Mueller et al. |
| 2004/0178751 A1 | 9/2004 | Mueller et al. |
| 2004/0212320 A1 | 10/2004 | Dowling et al. |
| 2004/0212993 A1 | 10/2004 | Morgan et al. |
| 2004/0228124 A1 | 11/2004 | Reiff et al. |
| 2005/0099824 A1 | 5/2005 | Dowling et al. |
| 2005/0111231 A1 | 5/2005 | Crodian et al. |
| 2005/0116667 A1 | 6/2005 | Mueller et al. |
| 2005/0122065 A1 | 6/2005 | Young |
| 2005/0151489 A1 | 7/2005 | Lys et al. |
| 2005/0169002 A1 | 8/2005 | Steen et al. |
| 2005/0195602 A1 | 9/2005 | Pan |
| 2005/0213352 A1 | 9/2005 | Lys |
| 2005/0213353 A1 | 9/2005 | Lys |
| 2005/0218838 A1 | 10/2005 | Lys |
| 2005/0218870 A1 | 10/2005 | Lys |
| 2005/0219872 A1 | 10/2005 | Lys |
| 2005/0225976 A1 | 10/2005 | Zampini et al. |
| 2005/0231133 A1 | 10/2005 | Lys |
| 2005/0236029 A1 | 10/2005 | Dowling |
| 2005/0236998 A1 | 10/2005 | Mueller |
| 2005/0237746 A1 | 10/2005 | Yiu |
| 2005/0253533 A1 | 11/2005 | Lys et al. |
| 2005/0275626 A1 | 12/2005 | Mueller |
| 2005/0276053 A1 | 12/2005 | Nortrup |
| 2006/0002110 A1 | 1/2006 | Dowling |
| 2006/0012987 A9 | 1/2006 | Ducharme |
| 2006/0016960 A1 | 1/2006 | Morgan |
| 2006/0022214 A1 | 2/2006 | Morgan |
| 2006/0050509 A9 | 3/2006 | Dowling |
| 2006/0076908 A1 | 4/2006 | Morgan |
| 2006/0098438 A1 | 5/2006 | Ouderkirk et al. |

FOREIGN PATENT DOCUMENTS

| | | |
|---|---|---|
| WO | 2004/100265 | 11/2004 |
| WO | 2005/001943 | 1/2005 |

* cited by examiner

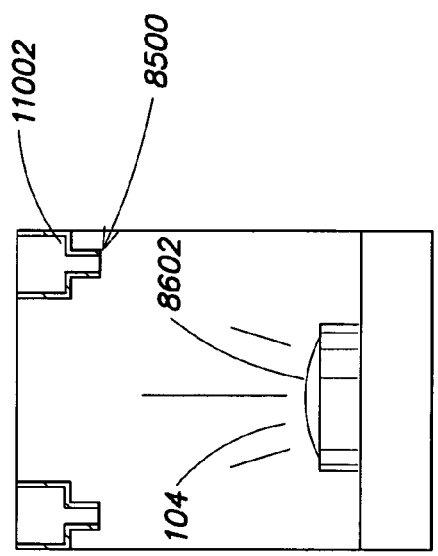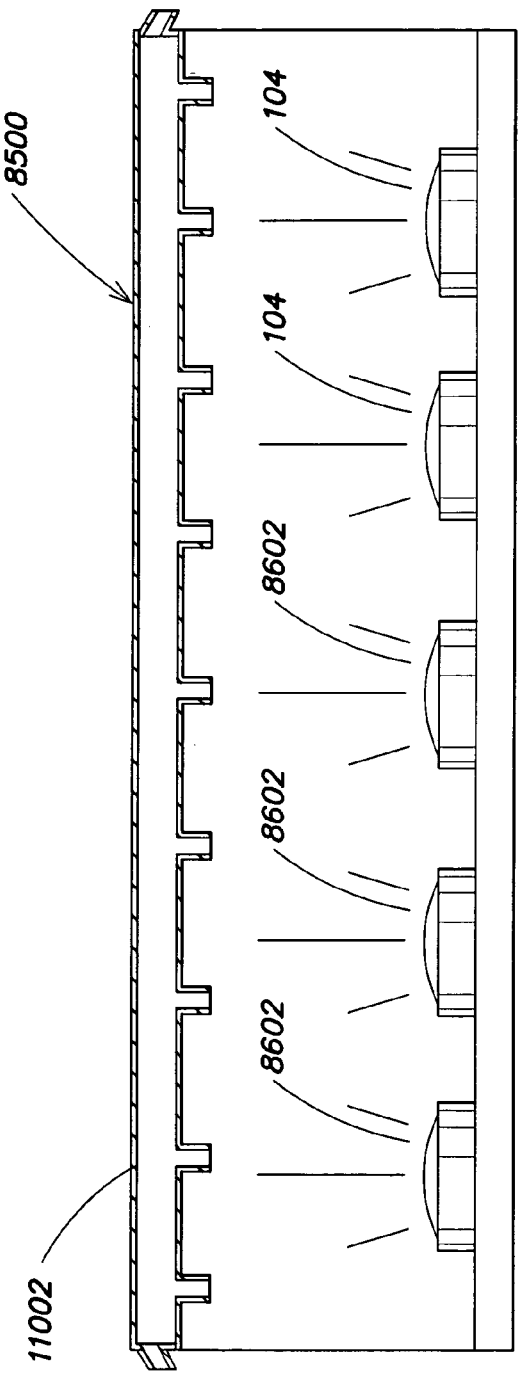
FIG. 110A
FIG. 110B

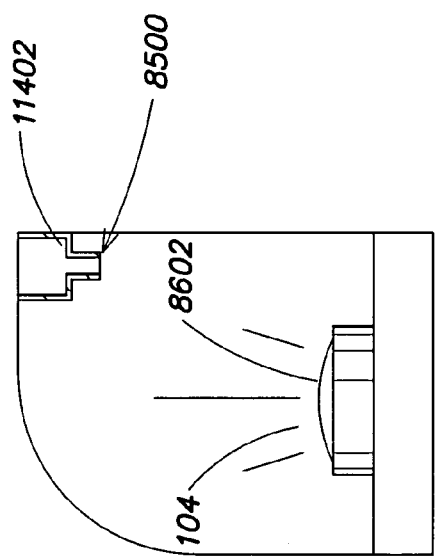
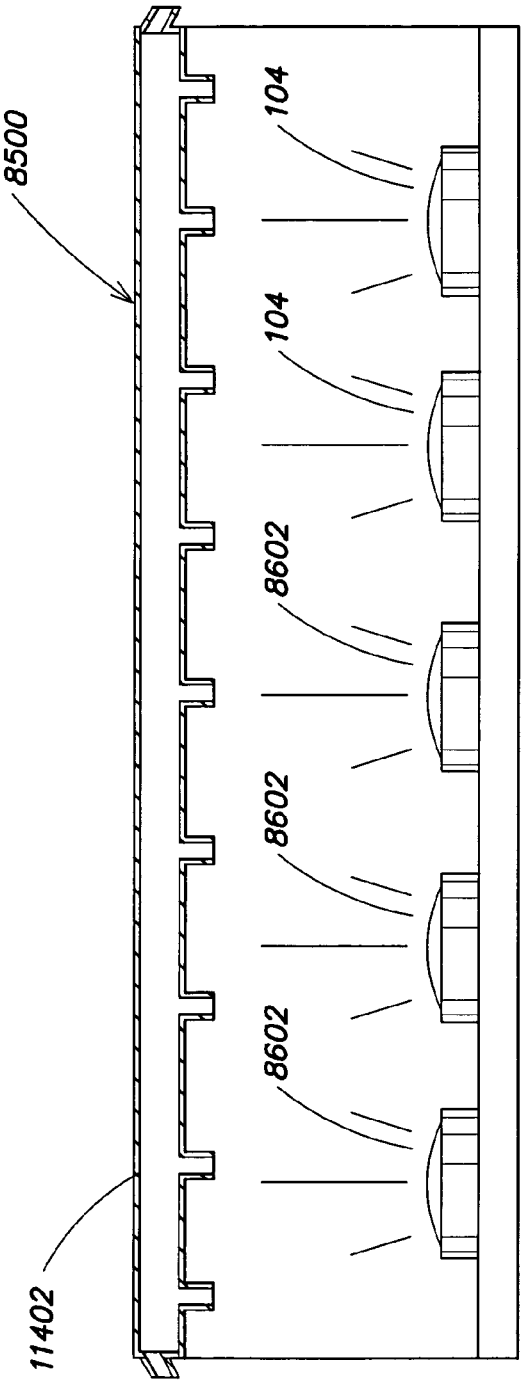
FIG. 114A
FIG. 114B

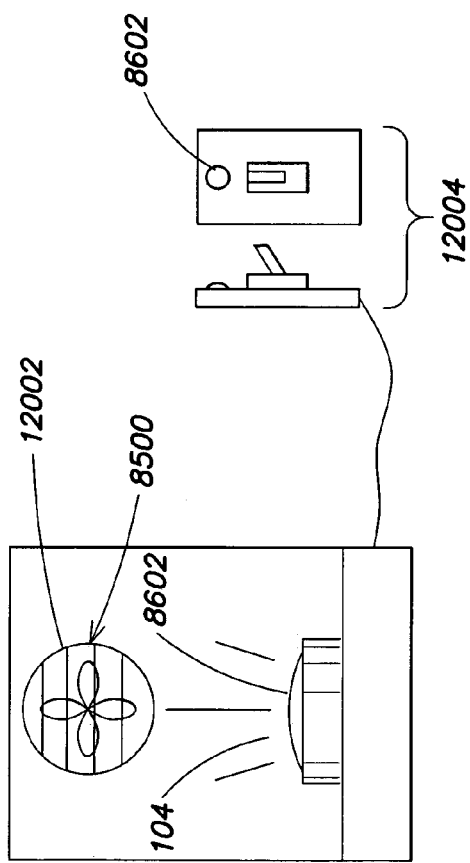
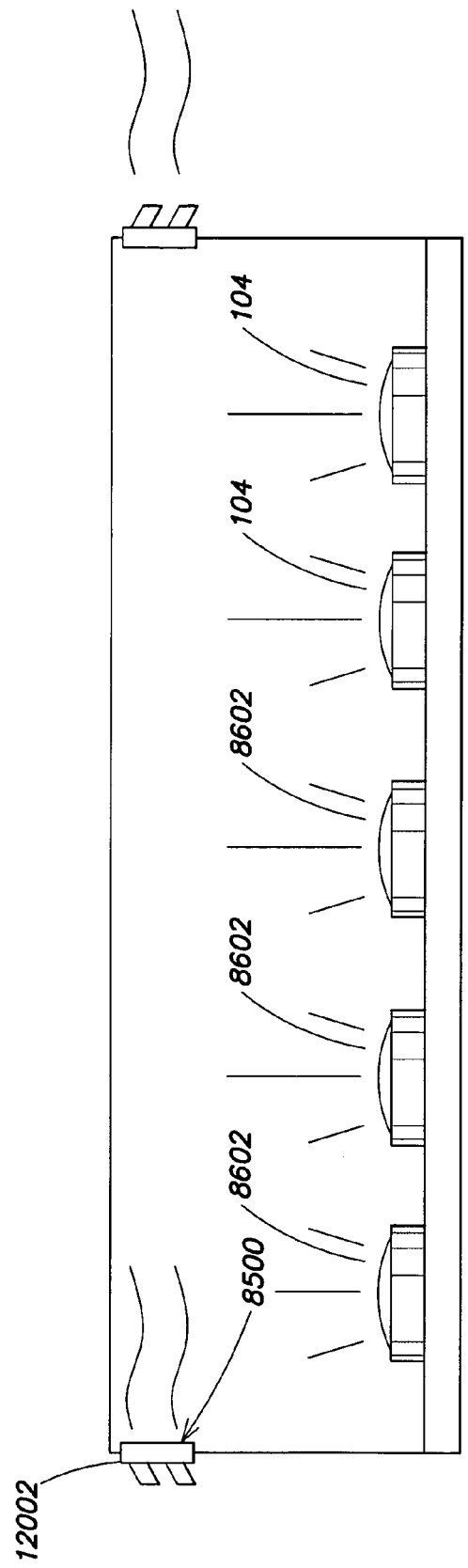
FIG. 120A
FIG. 120B

THERMAL MANAGEMENT METHODS AND APPARATUS FOR LIGHTING DEVICES

CROSS-REFERENCES TO RELATED APPLICATIONS

The present application claims the benefit, under 35 U.S.C. §119(e), of the following U.S. Provisional Applications:

Ser. No. 60/528,847, filed Dec. 11, 2003, entitled "Thermal Management Methods and Apparatus for Lighting Devices;"

Ser. No. 60/558,400, filed Mar. 31, 2004, entitled "Methods and Systems for Providing Lighting Components;" and Ser. No. 60/588,090, filed Jul. 15, 2004, entitled "LED Package Methods and Systems."

Each of the foregoing applications is incorporated herein by reference.

BACKGROUND

Methods and systems for providing color-controlled illumination are known to those of skill in the art, including those identified in patents and patent applications incorporated by reference herein. Such methods and systems can benefit from improved control over illumination, including control enabled by different combinations of light sources, different control protocols, optical facilities, software programs, lighting system configurations, and other improvements.

SUMMARY

Provided herein are methods and systems for providing controlled lighting, including methods and systems for providing both white and non-white colored lighting, including color temperature controlled lighting.

Methods and systems disclosed herein include optical facilities for modifying light from a lighting unit, such as an LED-based lighting unit, including variable optical facilities and fixed optical facilities.

Also provided are methods and systems for using multi-color lighting units in a variety of commercial applications.

Also provided are methods and systems for lighting control, including methods to assist lighting designers and installers to improve the quality of lighting in environments.

Also provided are intelligent dimmers, switches, sockets and fixtures, as well as facilities for programming and using them.

Also provided are various sensor-feedback applications of lighting technology, including sensor-feedback involving light sensors and forward voltage sensors. Also provided are lighting methods and systems that operate on time-based parameters.

Methods and systems disclosed herein include methods and systems for a lighting system that includes a plurality of LEDs selected from the group consisting of red, green, blue, amber, white, orange and UV LEDs, a controller for controlling the color of light coming from the LEDs, a sensor for sensing at least one of the color and the color temperature of the light coming from the LEDs and a feedback loop for adjusting the color of light coming from the LEDs based on input from the sensor.

Methods and systems disclosed herein include a lighting system that includes a plurality of LEDs selected from the group consisting of red, green, blue, amber, white, orange and UV LEDs, a controller for controlling the color of light coming from the LEDs and a variable optical facility for modifying the light coming from the LEDs in response to actuation by a user.

Methods and systems disclosed herein include a lighting system that includes a plurality of LEDs selected from the group consisting of red, green, blue, amber, white, orange and UV LEDs, a controller for controlling the color of light coming from the LEDs, an optical facility for modifying the light coming from the LEDs and an actuator for actuating a change in the optical facility.

Methods and systems further include a method of providing illumination, including providing a plurality of LEDs selected from the group consisting of red, green, blue, amber, white, orange and UV LEDs, controlling the color of light coming from the LEDs, sensing at least one of the color and the color temperature of the light coming from the LEDs and using a feedback loop to adjusting the color of light coming from the LEDs based on input from the sensor.

Methods and systems also includes a method of providing illumination that includes providing light from a plurality of LEDs selected from the group consisting of red, green, blue, amber, white, orange and UV LEDs, controlling at least one of the color and color temperature of light coming from the LEDs, providing an optical facility for modifying the light coming from the LEDs and actuating a change in the optical facility to change the modification of the light coming from the LEDs.

The optical facility can be a fluid-filled lens, a MEMs device, a digital mirror or other optical facility.

Methods and systems can also include a method of lighting a motion picture environment, including providing a camera, providing a processor to control the camera, providing a lighting system, the lighting system including a plurality of LEDs selected from the group consisting of red, green, blue, amber, white, orange and UV LEDs and using the processor to simultaneously control the camera and the lighting system.

Methods and systems include a method of providing control to a lighting system, including providing a lighting control facility for a lighting system that includes a processor and a plurality of LEDs, and providing a facility for requiring user authorization in order to allow a user to change the lighting condition generated by the lighting system.

Methods and systems include a method of providing a settable light, including providing a lighting unit, the lighting unit including a plurality of LEDs selected from the group consisting of red, green, blue, amber, white, orange and UV LEDs, providing a scale, the scale representing at least one of a plurality of color temperatures, a plurality of colors, and a plurality of intensities of light output from the lighting unit, and providing an interface, the interface allowing the user to set the light output from the lighting unit by setting the interface on a setting of the scale corresponding to that light output.

Methods and systems also include a configuring the scale to show a range of color temperatures of white light.

Methods and systems also include a method of providing lighting control, including providing a socket for a lighting unit, the socket including a processor and memory for storing and processing lighting control signals for a lighting unit that is adapted to be placed in the socket. Such methods and systems also include a method wherein the socket further comprises a communications facility for receiving a lighting control signal from an external signal source.

Semiconductor devices like LED light sources can be damaged by heat; accordingly, a system may include a thermal facility for removing heat from a lighting unit. The thermal facility may be any facility for managing the flow of heat, such as a convection facility, such as a fan or similar mechanism for providing air flow to the lighting unit, a pump or similar facility for providing flow of a heat-conducting fluid, a vent for allowing flow of air, or any other kind of convection facility. A fan or other convection facility can be under control of a processor and a temperature sensor such as a thermostat to provide cooling when necessary and to remain off when not necessary.

The thermal facility can also be a conduction facility, such as a conducting plate or pad of metal, alloy, or other heat-conducting material, a gap pad between a board bearing light sources and another facility, a thermal conduction path between heat-producing elements such as light sources and circuit elements, or a thermal potting facility, such as a polymer for coating heat-producing elements to receive and trap heat away from the light sources. The thermal facility may be a radiation facility for allowing heat to radiate away from a lighting unit. A fluid thermal facility can permit flow of a liquid or gas to carry heat away from a lighting unit. The fluid may be water, a chlorofluorocarbon, a coolant, or the like. In a preferred embodiment a conductive plate is aluminum or copper. In embodiments a thermal conduction path conducts heat from a circuit board bearing light sources to a housing, so that the housing radiates heat away from the lighting unit.

One form of light source is an LED module. An LED module may be used as a light source in a wide variety of components, subassemblies, boards, products, fixtures, housings, applications, methods of use and environments as described in this disclosure. In an embodiment, the LED module may comprise an LED package with a substrate, one or more LED die (which, as context permits, may comprise any other light emitting source, such as the light sources described above), a reflector for reflecting light from the LED die out from the module, a filler, such as a silicone or injection-molded plastic filler (which may have a hole or space in it to allow more light to pass through), a lens or other optical facility (which may be any type of optical facility described throughout this disclosure), and one or more leads for providing an external electrical connection from the module to other electronic components. In embodiments the reflector and the components held in the reflector are positioned on top of the leads. A wire bond may connect the LED die to the edge of the reflector. A submount may include one or more other electronic components for controlling the intensity of light emitted from the LED die as described below. Thus, the present invention encompasses a light source, such as an LED module, with at least one LED die, and a package for the LED die, the package including a submount, wherein the submount incorporates an electronic component for controlling the LED, wherein the electronic component facilitates control of at least one of the intensity and the apparent intensity of the LED die between at least three distinct levels of intensity.

A simple configuration of a conventional LED module may include an ESD protection diode serving as the submount in a circuit with the LED die. In embodiments, the submount may be augmented with other electronic components.

Another embodiment of an LED module may include a LED module used as a light source in a wide variety of components, subassemblies, boards, products, fixtures, housings, applications, methods of use and environments as described in this disclosure. In this embodiment, the LED module may again comprise an LED package with a substrate, one or more LED die (which, as context permits, may comprise any other light emitting source, such as the light sources described above), a reflector for reflecting light from the LED die out from the module, a filler, such as a silicone or injection-molded plastic filler (which may have a hole or space in it to allow more light to pass through), a lens or other optical facility (which may be any type of optical facility described throughout this disclosure), and one or more leads for providing an external electrical connection from the module to other electronic components. In this case one of the leads may connect to the side of the reflector. The entire package may include an injection molding, such as injection-molded plastic, for holding the components in place. A wire bond may connect the LED die to the edge of the reflector. A submount may include one or more other electronic components for controlling the intensity of light emitted from the LED die as described below. In this case the submount, rather than being located directly under the LED die and the reflector, is located in close proximity to the reflector cup on the substrate and is in electrical connection to the LED die.

In another embodiment the LED modules can be used as a light source in a wide variety of components, subassemblies, boards, products, fixtures, housings, applications, methods of use and environments as described in this disclosure. In this embodiment, the LED module may again comprise an LED package with a substrate, one or more LED die (which, as context permits, may comprise any other light emitting source, such as the light sources described above), a reflector for reflecting light from the LED die out from the module, a filler, such as a silicone or injection-molded plastic filler (which may have a hole or space in it to allow more light to pass through), a plastic encasing element, a lens or other optical facility (which may be any type of optical facility described throughout this disclosure), and one or more leads for providing an external electrical connection from the module to other electronic components. In this case the leads may connect to the side of the reflector. As in other embodiments, a wire bond may connect the LED die to the edge of the reflector. A submount may include one or more other electronic components for controlling the intensity of light emitted from the LED die as described below. In this case the submount, rather than being located directly under the LED die and the reflector, is located in the cup of the reflector with the LED die. In embodiments the LED module may be made by a mask process.

Other embodiments of LED packages that include an LED die and a submount may be understood by those of ordinary skill in the art and are encompassed herein. In embodiments the LED die may be a high-power LED die. In embodiments the LED die may be a five watt or greater LED die.

The substrate may be any conventional substrate for an LED package, such as a metal core substrate, a ceramic substrate, a ceramic on metal substrate, an FR4 substrate, a sapphire substrate, a silicon on sapphire substrate, or a silicon carbide substrate.

In the various embodiments described herein, an LED may be controlled by the electronic components of the submount. In addition to offering basic "on" and "off" or protection circuitry, in embodiments of the inventions electronic components located in the submount that is integrated with the LED in the package can control the intensity or apparent intensity of light coming from the LED, such as by controlling the level of current to the LED, by controlling the amplitude of pulses or current to the LED (pulse amplitude modulation), by controlling the width of pulses of current to the LED (pulse width modulation) or by a combination of any of the foregoing. Thus, the various embodiments described herein for providing such control can be embodied in the submount.

A submount and a group of LED dies may be in a package. It should be understood that the submount could be combined with a single LED die, and that the submount and LED die(s) could be integrated into a variety of physical packages.

In embodiments the submount of the LED package may include a thermal facility for cooling at least one of the LED die(s) and the submount. The thermal facility may be any thermal facility as described above. In embodiments the thermal facility may be a Peltier effect device, a fluid cooling facility, such as for cooling the submount with water or another cooling fluid, a potting facility, such as for surrounding the submount and accepting heat from the submount or the LED die, a thermally conductive plate or gap pad, such as for conducting heat away from the submount, a micromachine, such as a MEMs device fabricated from nano-materials and, for example, sprayed onto the submount for active cooling, a micro-fan or other thermal facility.

A MEMS active cooling element may be incorporated into the submount, such as to serve as a thermal facility for cooling the LED package.

Light may be provided by a plurality of LEDs or other light sources disposed in an environment that includes a platform for supporting the LEDs and a thermal facility, which may include or be composed of a graphite material, which may remove heat from the environment of the LEDs.

Light may be provided by a plurality of LEDs or other light sources disposed in an environment that includes a platform for supporting the LEDs and a thermal facility, which may include or be composed of a lamina board or lamina boards, which may remove heat from the environment of the LEDs.

Light may be provided by a plurality of LEDs or other light sources disposed in an environment that includes a platform for supporting the LEDs and a thermal facility, which may include or be composed of a phase change material, which may remove heat from the environment of the LEDs.

Light may be provided by a plurality of LEDs or other light sources disposed in an environment that includes a platform for supporting the LEDs and a thermal facility, which may include or be composed of at least one of a silicon carbide material, a diamond material and a gallium arsenide material, which may remove heat from the environment of the LEDs.

Light may be provided by a plurality of LEDs or other light sources disposed in an environment that includes a platform for supporting the LEDs and a thermal facility, which may include or be composed of a polymer and providing a thermally conductive material, which may remove heat from the environment of the LEDs.

Light may be provided by a plurality of LEDs or other light sources disposed in an environment that includes a platform for supporting the LEDs and a thermal facility, which may include or be composed of a ceramic material, which may remove heat from the environment of the LEDs.

Light may be provided by a plurality of LEDs or other light sources disposed in an environment that includes a platform for supporting the LEDs and a thermal facility, which may include or be composed of a thermal paste, or thermal interface material (TIM), which may remove heat from the environment of the LEDs.

Light may be provided by a plurality of LEDs or other light sources disposed in an environment that includes a platform for supporting the LEDs and a thermal facility, which may include or be composed of an epoxy, which may remove heat from the environment of the LEDs.

Light may be provided by a plurality of LEDs or other light sources disposed in an environment that includes a platform for supporting the LEDs and a thermal facility, which may include or be composed of a urethane, which may remove heat from the environment of the LEDs.

Light may be provided by a plurality of LEDs or other light sources disposed in an environment that includes a platform for supporting the LEDs and a thermal facility, which may include or be composed of berylium oxide, which may remove heat from the environment of the LEDs.

Light may be provided by a plurality of LEDs or other light sources disposed in an environment that includes a platform for supporting the LEDs and a thermal facility, which may include or be composed of an alumina material, which may remove heat from the environment of the LEDs.

Light may be provided by a plurality of LEDs or other light sources disposed in an environment that includes a platform for supporting the LEDs and a thermal facility, which may include or be composed of a control circuit for the LEDs which may be on the back of the platform that supports the LEDs, which may remove heat from the environment of the LEDs. The platform may include or be composed of a thermally conductive material.

Light may be provided by a plurality of LEDs or other light sources disposed in an environment that includes a platform for supporting the LEDs and a thermal facility, which may include or be composed of a thermal potting compound, which may remove heat from the environment of the LEDs.

Light may be provided by a plurality of LEDs or other light sources disposed in an environment that includes a platform for supporting the LEDs and a thermal facility, which may include or be composed of a fan, which may remove heat from the environment of the LEDs.

Light may be provided by a plurality of LEDs or other light sources disposed in an environment that includes a platform for supporting the LEDs and a thermal facility, which may include or be composed of a liquid cooling facility, which may remove heat from the environment of the LEDs. The liquid cooling facility may use a liquid. The liquid may be water, a chlorofluorocarbon, and/or a hydrocarbon.

Light may be provided by a plurality of LEDs or other light sources disposed in an environment that includes a platform for supporting the LEDs and a thermal facility, which may include or be composed of at least one vent for allowing air to exit the environment of the LEDs, which may remove heat from the environment of the LEDs.

Light may be provided by a plurality of LEDs or other light sources disposed in an environment that includes a platform for supporting the LEDs and a thermal facility, which may include or be composed of a fin connected to the platform for allowing heat to radiate away from the environment of the LEDs, which may remove heat from the environment of the LEDs.

Light may be provided by a plurality of LEDs or other light sources disposed in an environment that includes a platform for supporting the LEDs and a thermal facility, which may include or be composed of a duct for allowing air to exit the environment of the LEDs, which may remove heat from the environment of the LEDs. The LEDs are disposed in a lamp and the duct is positioned in the lamp.

Light may be provided by a plurality of LEDs or other light sources disposed in an environment that includes a platform for supporting the LEDs and a thermal facility, which may include or be composed of a hole in the light bulb, which may remove heat from the environment of the LEDs. The light bulb may include a miniature fan for moving air out of the environment of the light sources.

Light may be provided by a plurality of LEDs or other light sources disposed in an environment that includes a platform for supporting the LEDs and a thermal facility, which may include or be composed of disposing a fan in the lighting fixture for moving air out of the lighting fixture, which may remove heat from the environment of the LEDs.

Light may be provided by a plurality of LEDs or other light sources disposed in an environment that includes a platform for supporting the LEDs and a thermal facility, which may include or be composed of positioning a miniature fan in the LED-based lamp, which may remove heat from the environment of the LEDs. The platform may include an LED-based lamp designed to fit into a lighting fixture. The LED-based lamp may include a hole for allowing air to exit the lamp. The hole may be configured to come in through the center of the lighting fixture and exit the side of the lighting fixture.

Light may be provided by a plurality of LEDs or other light sources disposed in an environment that includes a platform for supporting the LEDs and a thermal facility, which may include or be composed of a duct for removing air from the environment of the LEDs, which may remove heat from the environment of the LEDs.

Light may be provided by a plurality of LEDs or other light sources disposed in an environment that includes a platform for supporting the LEDs and a thermal facility, which may include or be composed of a facility for moving air between the walls of the double-walled lighting fixture, which may remove heat from the environment of the LEDs. The platform may include a double-walled lighting fixture.

Light may be provided by a plurality of LEDs or other light sources disposed in an environment that includes a platform for supporting the LEDs and a thermal facility, which may include or be composed of a hole in the LED-lamp, which may remove heat from the environment of the LEDs. The platform may include a reflector-type lighting fixture. The LEDs may be disposed in a LED-lamp that is disposed in a reflector-type lighting fixture. The hole may be positioned to move air toward the edges of the lamp, so that cooler air may circulate to the middle of the lamp.

Light may be provided by a plurality of LEDs or other light sources disposed in an environment that includes a platform for supporting the LEDs and a thermal facility, which may include or be composed of a convection facility for encouraging the circulation of air in the environment of the LEDs, which may remove heat from the environment of the LEDs. The convection facility may be a directional convection facility. The convection facility may cause air to flow in a curved flow pattern. The convection facility may be a squirrel cage fan that circulates air to the center of the LED-based lamp and ejects air out the edges of the LED-based lamp. The LED-based lamp may be configured into a puck that can be surface-mounted to a ceiling.

Light may be provided by a plurality of LEDs or other light sources disposed in an environment that includes a platform for supporting the LEDs and a thermal facility, which may include or be composed of a variable speed fan, which may remove heat from the environment of the LEDs. The variable speed fan may be disposed in an LED-based lamp.

Light may be provided by a plurality of LEDs or other light sources disposed in an environment that includes a platform for supporting the LEDs and a thermal facility, which may include or be composed of a switchable fan disposed in the LED-based lamp, which may remove heat from the environment of the LEDs. The platform may comprise an LED-based lamp.

Among other things, variable speed and switchable fans allow for cooling to take place in different amounts at different times. For example, a fan can be switched off or turned down when people are present (and the noise would be disturbing) and turned on or up when they are not present. In embodiments the system can include a detector for detecting the presence of people, such as thermal detector, sound detector, weight detector or motion detector. Thus, under control of a processor, a lighting fixture can cool itself, with a convection facility, at times when cooling is most necessary (such as when the environment of the LEDs heats up), and at times when cooling is most convenient (such as when people are absent). The processor may respond to programming, such as programming that indicates a tradeoff between the negative effects of heat on the lifetime of the LEDs and the negative effects of noise on the environment.

Light may be provided by a plurality of LEDs or other light sources disposed in an environment that includes a platform for supporting the LEDs and a thermal facility, which may include or be composed of a fan, which may remove heat from the environment of the LEDs. An LED for indicating an alarm condition when a fan is not working may also be provided.

Light may be provided by a plurality of LEDs or other light sources disposed in an environment that includes a platform and a surface mounting facility for the platform, so that the platform can be disposed on a flat surface. The platform may comprise a puck-shaped housing. The puck-shaped housing may include a thermal facility. The thermal facility may be a fan. The fan may be a squirrel cage fan. A ceiling tile configured to receive the puck-shaped housing may also be provided. The ceiling tile may be integrated with the puck-shaped housing. The ceiling tile may include at least one of a power facility and a data facility for the lighting system. The ceiling tile may be associated with a duct for providing airflow to the fixture. The ceiling tile may include an active cooling facility. The cooling facility may be a liquid cooling facility. The cooling facility may be an air cooling facility.

Light may be provided by a plurality of LEDs or other light sources disposed in an environment that includes a platform for supporting the LEDs, where the platform may include a lighting fixture, and a thermal facility, which may include or be composed of an insert to the lighting fixture that allows heat to dissipate from the environment of the LEDs, which may remove heat from the environment of the LEDs. The lighting fixture may be a fluorescent lighting fixture and the thermal facility may include or be composed of an insert to the fluorescent lighting fixture that allows heat to dissipate from the environment of the LEDs.

Light may be provided by a plurality of LEDs or other light sources disposed in an environment that includes a platform for supporting the LEDs and a thermal facility, which may include or be composed of a pressure generating facility to maintain contact between the platform and a thermally conductive material for accepting heat away from the environment of the LEDs, which may remove heat from the environment of the LEDs. The pressure generating facility may comprise a plurality of springs. The springs may provide an electrical connection. The thermally conductive material may be a thermal pad. The thermally conductive material may be an epoxy. The thermally conductive material may be a thermal potting material.

Light may be provided by a plurality of LEDs or other light sources disposed in an environment that includes a platform for supporting the LEDs and a thermal facility, which may include or be composed of a metal core having a plurality of fins, which may remove heat from the environment of the LEDs. The fins may form part of a fan.

The fan or convection facilities discussed herein may include a noise dampening facility, which may reducing noise caused by the flow of air. The noise dampening facility may be a passive noise dampening facility. The passive noise dampening facility may be a noise absorbing material. The noise dampening facility may be an active noise dampening facility. The active noise dampening facility may include a plurality of blades for reflecting sound in different directions. The active noise dampening facility may include a noise canceling facility. The noise dampening facility may include adjusting the airflow rates of the thermal facility to make noise inaudible to the human ear. The making the noise inaudible may comprise shifting the frequency of the noise caused by the airflow.

The fan or convection facilities discussed herein may respond to a sensor-feedback facility. The sensor feedback facility may include a sound sensor. The sensor may be a vibration sensor or a motion sensor. The sensor may accelerate the thermal facility when motion is not detected. The sensor may diminish the activity of the thermal facility when motion is detected. The sensor may accelerate the noise canceling facility when motion is detected. The sensor may diminish the noise canceling facility when motion is not detected. The passive noise dampening facility may comprise a non-metallic fixture. The passive noise dampening facility may include providing a rubber feature of the fixture. The rubber feature may be a washer or a socket. The passive noise canceling feature may be a shape of the fixture. The fixture may be provided with an irregular shape to reduce reflected noise. The fixture may be provided with an insulating material. The insulating material may be positioned on the exterior of the fixture to absorb noise.

As used herein for purposes of the present disclosure, the term "LED" should be understood to include any light emitting diode or other type of carrier injection/junction-based system that is capable of generating radiation in response to an electric signal. Thus, the term LED includes, but is not limited to, various semiconductor-based structures that emit light in response to current, light emitting polymers, light-emitting strips, electro-luminescent strips, and the like.

In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured to generate radiation having various bandwidths for a given spectrum (e.g., narrow bandwidth, broad bandwidth).

For example, one implementation of an LED configured to generate essentially white light (e.g., a white LED) may include a number of dies which respectively emit different spectrums of luminescence that, in combination, mix to form essentially white light. In another implementation, a white light LED may be associated with a phosphor material that converts luminescence having a first spectrum to a different second spectrum. In one example of this implementation, luminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectrums of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, radial package LEDs, power package LEDs, LEDs including some type of encasement and/or optical element (e.g., a diffusing lens), etc.

The term "light source" should be understood to refer to any one or more of a variety of radiation sources, including, but not limited to, LED-based sources as defined above, incandescent sources (e.g., filament lamps, halogen lamps), fluorescent sources, phosphorescent sources, high-intensity discharge sources (e.g., sodium vapor, mercury vapor, and metal halide lamps), lasers, other types of luminescent sources, electro-lumiscent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

A given light source may be configured to generate electromagnetic radiation within the visible spectrum, outside the visible spectrum, or a combination of both. Hence, the terms "light" and "radiation" are used interchangeably herein. Additionally, a light source may include as an integral component one or more filters (e.g., color filters), lenses, or other optical components. Also, it should be understood that light sources may be configured for a variety of applications, including, but not limited to, indication and/or illumination. An "illumination source" is a light source that is particularly configured to generate radiation having a sufficient intensity to effectively illuminate an interior or exterior space.

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (essentially few frequency or wavelength components) or a relatively wide bandwidth (several frequency or wavelength components having various relative strengths). It should also be appreciated that a given spectrum may be the result of a mixing of two or more other spectrums (e.g., mixing radiation respectively emitted from multiple light sources).

For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to different spectrums having different wavelength components and/or bandwidths. It also should be appreciated that the term "color" may be used in connection with both white and non-white light.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. The color temperature of white light generally falls within a range of from approximately 700 degrees K (generally considered the first visible to the human eye) to over 10,000 degrees K.

Lower color temperatures generally indicate white light having a more significant red component or a "warmer feel," while higher color temperatures generally indicate white light having a more significant blue component or a "cooler feel." By way of example, a wood burning fire has a color temperature of approximately 1,800 degrees K, a conventional incandescent bulb has a color temperature of approximately 2848 degrees K, early morning daylight has a color temperature of approximately 3,000 degrees K, and overcast midday skies have a color temperature of approximately 10,000 degrees K. A color image viewed under white light having a color temperature of approximately 3,000 degree K has a relatively reddish tone, whereas the same color image viewed under white light having a color temperature of approximately 10,000 degrees K has a relatively bluish tone.

The terms "lighting unit" and "lighting fixture" are used interchangeably herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources.

The terms "processor" or "controller" are used herein interchangeably to describe various apparatus relating to the operation of one or more light sources. A processor or controller can be implemented in numerous ways, such as with dedicated hardware, using one or more microprocessors that are programmed using software (e.g., microcode or firmware) to perform the various functions discussed herein, or as a combination of dedicated hardware to perform some functions and programmed microprocessors and associated circuitry to perform other functions.

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers, including by retrieval of stored sequences of instructions.

The term "addressable" is used herein to refer to a device (e.g., a light source in general, a lighting unit or fixture, a controller or processor associated with one or more light sources or lighting units, other non-lighting related devices, etc.) that is configured to receive information (e.g., data) intended for multiple devices, including itself, and to selectively respond to particular information intended for it. The term "addressable" often is used in connection with a networked environment (or a "network," discussed further below), in which multiple devices are coupled together via some communications medium or media.

In one implementation, one or more devices coupled to a network may serve as a controller for one or more other devices coupled to the network (e.g., in a master/slave relationship). In another implementation, a networked environment may include one or more dedicated controllers that are configured to control one or more of the devices coupled to the network. Generally, multiple devices coupled to the network each may have access to data that is present on the communications medium or media; however, a given device may be "addressable" in that it is configured to selectively exchange data with (i.e., receive data from and/or transmit data to) the network, based, for example, on one or more particular identifiers (e.g., "addresses") assigned to it.

The term "network" as used herein refers to any interconnection of two or more devices (including controllers or processors) that facilitates the transport of information (e.g. for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present invention, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection). Furthermore, it should be readily appreciated that various networks of devices as discussed herein may employ one or more wireless, wire/cable, and/or fiber optic links to facilitate information transport throughout the network.

The term "user interface" as used herein refers to an interface between a human user or operator and one or more devices that enables communication between the user and the device(s). Examples of user interfaces that may be employed in various implementations of the present invention include, but are not limited to, switches, human-machine interfaces, operator interfaces, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

The following patents and patent applications are hereby incorporated herein by reference:

U.S. Pat. No. 6,016,038, issued Jan. 18, 2000, entitled "Multicolored LED Lighting Method and Apparatus;"

U.S. Pat. No. 6,211,626, issued Apr. 3, 2001 to Lys et al, entitled "Illumination Components,"

U.S. Pat. No. 6,608,453, issued Aug. 19, 2003, entitled "Methods and Apparatus for Controlling Devices in a Networked Lighting System;"

U.S. Pat. No. 6,548,967, issued Apr. 15, 2003, entitled "Universal Lighting Network Methods and Systems;"

U.S. patent application Ser. No. 09/886,958, filed Jun. 21, 2001, entitled Method and Apparatus for Controlling a Lighting System in Response to an Audio Input;"

U.S. patent application Ser. No. 10/078,221, filed Feb. 19, 2002, entitled "Systems and Methods for Programming Illumination Devices;"

U.S. patent application Ser. No. 09/344,699, filed Jun. 25, 1999, entitled "Method for Software Driven Generation of Multiple Simultaneous High Speed Pulse Width Modulated Signals;"

U.S. patent application Ser. No. 09/805,368, filed Mar. 13, 2001, entitled "Light-Emitting Diode Based Products;"

U.S. patent application Ser. No. 09/716,819, filed Nov. 20, 2000, entitled "Systems and Methods for Generating and Modulating Illumination Conditions;"

U.S. patent application Ser. No. 09/675,419, filed Sep. 29, 2000, entitled "Systems and Methods for Calibrating Light Output by Light-Emitting Diodes;"

U.S. patent application Ser. No. 09/870,418, filed May 30, 2001, entitled "A Method and Apparatus for Authoring and Playing Back Lighting Sequences;"

U.S. patent application Ser. No. 10/045,629, filed Oct. 25, 2001, entitled "Methods and Apparatus for Controlling Illumination;"

U.S. patent application Ser. No. 10/158,579, filed May 30, 2002, entitled "Methods and Apparatus for Controlling Devices in a Networked Lighting System;"

U.S. patent application Ser. No. 10/163,085, filed Jun. 5, 2002, entitled "Systems and Methods for Controlling Programmable Lighting Systems;"

U.S. patent application Ser. No. 10/325,635, filed Dec. 19, 2002, entitled "Controlled Lighting Methods and Apparatus;" and U.S. patent application Ser. No. 10/360,594, filed Feb. 6, 2003, entitled "Controlled Lighting Methods and Apparatus."

It should be appreciated that all combinations of the foregoing concepts and additional concepts discussed in greater detail below are contemplated as being part of the inventive subject matter disclosed herein.

BRIEF DESCRIPTION OF THE DRAWINGS

FIG. 110 depicts LEDs, a platform and a duct-based thermal facility.

FIG. 114 depicts LEDs, a platform and a thermal facility.

FIG. 120 depicts LEDs, a platform and a switchable fan thermal facility.

FIG. 121 depicts LEDs, a platform and a thermal facility in a puck-shaped housing.

FIG. 122 depicts LEDs, a platform and a thermal facility for insertion into a fluorescent lighting fixture.

FIG. 123 depicts LEDs, a platform and a thermal facility with springs for improving the contact between the LED platform and the thermal facility.

FIG. 124 depicts LEDs, a platform and a fan-based thermal facility where the blades of the fan provide a radiating thermal facility as well as a convective thermal facility.

DETAILED DESCRIPTION

Various embodiments of the present invention are described below, including certain embodiments relating particularly to LED-based light sources. It should be appreciated, however, that the present invention is not limited to any particular manner of implementation, and that the various embodiments discussed explicitly herein are primarily for purposes of illustration. For example, the various concepts discussed herein may be suitably implemented in a variety of environments involving LED-based light sources, other types of light sources not including LEDs, environments that involve both LEDs and other types of light sources in combination, and environments that involve non-lighting-related devices alone or in combination with various types of light sources.

Figure 1:
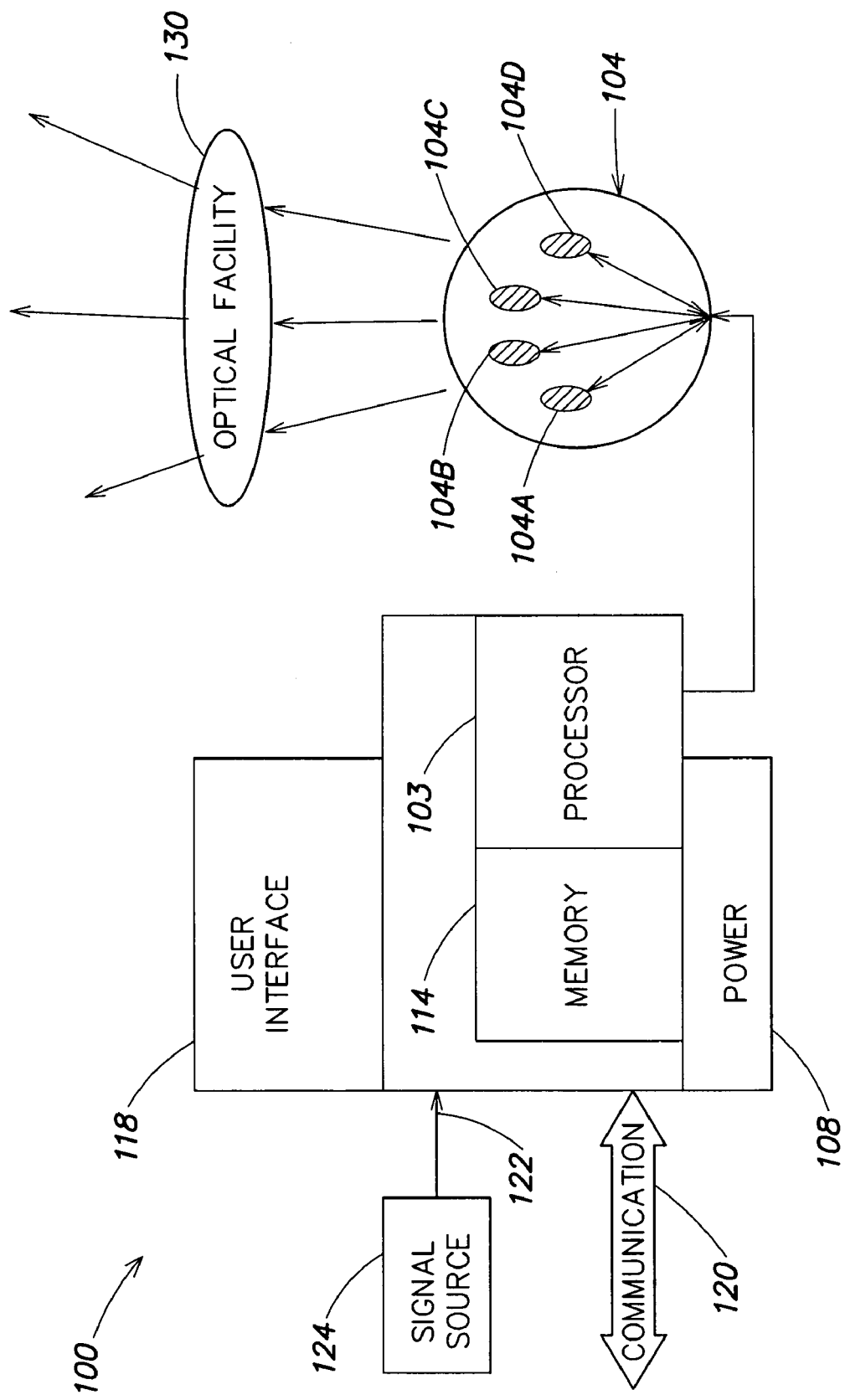
FIG. 1 illustrates one example of a lighting unit that may serve as a device in a lighting environment according to one embodiment of the present invention.

FIG. 1 illustrates one example of a lighting unit 100 that may serve as a device in a lighting environment according to one embodiment of the present invention. Some examples of LED-based lighting units similar to those that are described below in connection with FIG. 1 may be found, for example, in U.S. Pat. No. 6,016,038, issued Jan. 18, 2000 to Mueller et al., entitled "Multicolored LED Lighting Method and Apparatus," and U.S. Pat. No. 6,211,626, issued Apr. 3, 2001 to Lys et al, entitled "Illumination Components," which patents are both hereby incorporated herein by reference.

In various embodiments of the present invention, the lighting unit 100 shown in FIG. 1 may be used alone or together with other similar lighting units in a system of lighting units (e.g., as discussed further below in connection with FIG. 2). Used alone or in combination with other lighting units, the lighting unit 100 may be employed in a variety of applications including, but not limited to, interior or exterior space illumination in general, direct or indirect illumination of objects or spaces, theatrical or other entertainment-based/special effects illumination, decorative illumination, safety-oriented illumination, vehicular illumination, illumination of displays and/or merchandise (e.g. for advertising and/or in retail/consumer environments), combined illumination and communication systems, etc., as well as for various indication and informational purposes.

Additionally, one or more lighting units similar to that described in connection with FIG. 1 may be implemented in a variety of products including, but not limited to, various forms of light modules or bulbs having various shapes and electrical/mechanical coupling arrangements (including replacement or "retrofit" modules or bulbs adapted for use in conventional sockets or fixtures), as well as a variety of consumer and/or household products (e.g., night lights, toys, games or game components, entertainment components or systems, utensils, appliances, kitchen aids, cleaning products, etc.).

In one embodiment, the lighting unit 100 shown in FIG. 1 may include one or more light sources 104A, 104B, 104C, and 104D (collectively 104) wherein one or more of the light sources may be an LED-based light source that includes one or more light emitting diodes (LEDs). In one aspect of this embodiment, any two or more of the light sources 104A, 104B, 104C and 104D may be adapted to generate radiation of different colors (e.g. red, green, and blue, respectively). Although FIG. 1 shows four light sources 104A, 104B, 104C, and 104D, it should be appreciated that the lighting unit is not limited in this respect, as different numbers and various types of light sources (all LED-based light sources, LED-based and non-LED-based light sources in combination, etc.) adapted to generate radiation of a variety of different colors, including essentially white light, may be employed in the lighting unit 100, as discussed further below.

As shown in FIG. 1, the lighting unit 100 also may include a processor 102 that is configured to output one or more control signals to drive the light sources 104A, 104B, 104C and 104D so as to generate various intensities of light from the light sources. For example, in one implementation, the processor 102 may be configured to output at least one control signal for each light source so as to independently control the intensity of light generated by each light source. Some examples of control signals that may be generated by the processor to control the light sources include, but are not limited to, pulse modulated signals, pulse width modulated signals (PWM), pulse amplitude modulated signals (PAM), pulse displacement modulated signals, analog control signals (e.g., current control signals, voltage control signals), combinations and/or modulations of the foregoing signals, or other control signals. In one aspect, the processor 102 may control other dedicated circuitry (not shown in FIG. 1), which in turn controls the light sources so as to vary their respective intensities.

Lighting systems in accordance with this specification can operate LEDs in an efficient manner. Typical LED performance characteristics depend on the amount of current drawn by the LED. The optimal efficacy may be obtained at a lower current than the level where maximum brightness occurs. LEDs are typically driven well above their most efficient operating current to increase the brightness delivered by the LED while maintaining a reasonable life expectancy. As a result, increased efficacy can be provided when the maximum current value of the PWM signal may be variable. For example, if the desired light output is less than the maximum required output the current maximum and/or the PWM signal width may be reduced. This may result in pulse amplitude modulation (PAM), for example; however, the width and amplitude of the current used to drive the LED may be varied to optimize the LED performance. In an embodiment, a lighting system may also be adapted to provide only amplitude control of the current through the LED. While many of the embodiments provided herein describe the use of PWM and PAM to drive the LEDs, one skilled in the art would appreciate that there are many techniques to accomplish the LED control described herein and, as such, the scope of the present invention is not limited by any one control technique. In embodiments, it is possible to use other techniques, such as pulse frequency modulation (PFM), or pulse displacement modulation (PDM), such as in combination with either or both of PWM and PAM.

Pulse width modulation (PWM) involves supplying a substantially constant current to the LEDs for particular periods of time. The shorter the time, or pulse-width, the less brightness an observer will observe in the resulting light. The human eye integrates the light it receives over a period of time and, even though the current through the LED may generate the same light level regardless of pulse duration, the eye will perceive short pulses as "dimmer" than longer pulses. The PWM technique is considered on of the preferred techniques for driving LEDs, although the present invention is not limited to such control techniques. When two or more colored LEDs are provided in a lighting system, the colors may be mixed and many variations of colors can be generated by changing the intensity, or perceived intensity, of the LEDs. In an embodiment, three colors of LEDs are presented (e.g., red, green and blue) and each of the colors is driven with PWM to vary its apparent intensity. This system allows for the generation of millions of colors (e.g., 16.7 million colors when 8-bit control is used on each of the PWM channels).

Figure 15:
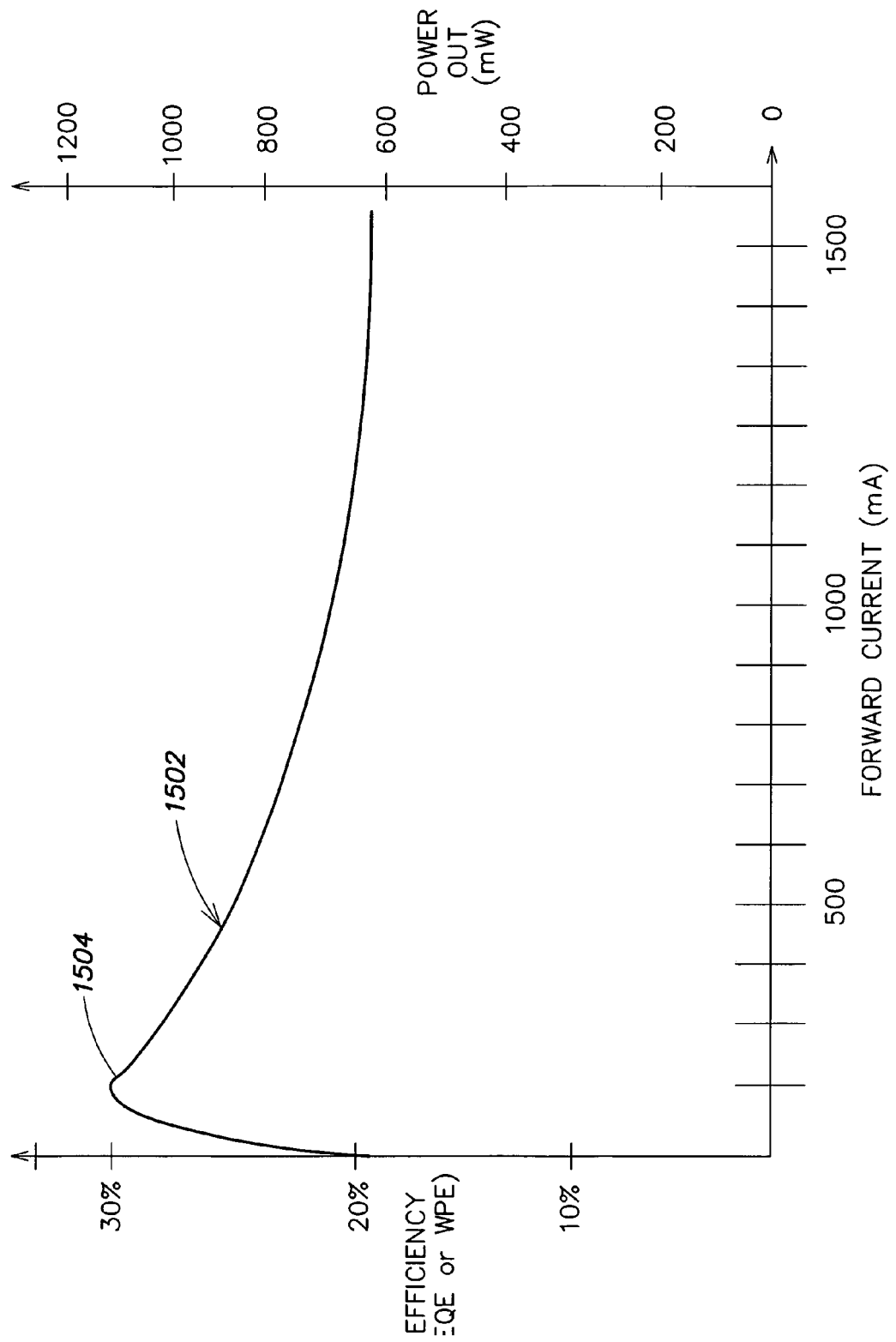
FIG. 15 depicts a pattern of LED efficiency that varies with intensity.

In an embodiment the LEDs are modulated with PWM as well as modulating the amplitude of the current driving the LEDs (Pulse Amplitude Modulation, or PAM). FIG. 15 illustrates an LED efficiency curve 1502. As can be seen from FIG. 15, the LED efficiency increases to a maximum followed by decreasing efficiency. Typically, LEDs are driven at a current level beyond its maximum efficiency to attain greater brightness while maintaining acceptable life expectancy. The objective is typically to maximize the light output from the LED while maintaining an acceptable lifetime. In an embodiment, the LEDs may be driven with a lower current maximum when lower intensities are desired. PWM may still be used, but the maximum current intensity may also be varied depending on the desired light output. For example, to decrease the intensity of the light output from a maximum operational point such as 1504, the amplitude of the current may be decreased until the maximum efficiency is achieved. If further reductions in the LED brightness are desired the PWM activation may be reduced to reduce the apparent brightness.

In one embodiment of the lighting unit 100, one or more of the light sources 104A, 104B, 104C and 104D shown in FIG. 1 may include a group of multiple LEDs or other types of light sources (e.g., various parallel and/or serial connections of LEDs or other types of light sources) that are controlled together by the processor 102. Additionally, it should be appreciated that one or more of the light sources 104A, 104B, 104C and 104D may include one or more LEDs that are adapted to generate radiation having any of a variety of spectra (i.e., wavelengths or wavelength bands), including, but not limited to, various visible colors (including essentially white light), various color temperatures of white light, ultraviolet, or infrared.

In another aspect of the lighting unit 100 shown in FIG. 1, the lighting unit 100 may be constructed and arranged to produce a wide range of variable color radiation. For example, the lighting unit 100 may be particularly arranged such that the processor-controlled variable intensity light generated by two or more of the light sources combines to produce a mixed colored light (including essentially white light having a variety of color temperatures). In particular, the color (or color temperature) of the mixed colored light may be varied by varying one or more of the respective intensities of the light sources (e.g., in response to one or more control signals output by the processor 102). Furthermore, the processor 102 may be particularly configured (e.g., programmed) to provide control signals to one or more of the light sources so as to generate a variety of static or time-varying (dynamic) multi-color (or multi-color temperature) lighting effects.

As shown in FIG. 1, the lighting unit 100 also may include a memory 114 to store various information. For example, the memory 114 may be employed to store one or more lighting programs for execution by the processor 102 (e.g., to generate one or more control signals for the light sources), as well as various types of data useful for generating variable color radiation (e.g., calibration information, discussed further below). The memory 114 also may store one or more particular identifiers (e.g., a serial number, an address, etc.) that may be used either locally or on a system level to identify the lighting unit 100. In various embodiments, such identifiers may be pre-programmed by a manufacturer, for example, and may be either alterable or non-alterable thereafter (e.g., via some type of user interface located on the lighting unit, via one or more data or control signals received by the lighting unit, etc.). Alternatively, such identifiers may be determined at the time of initial use of the lighting unit in the field, and again may be alterable or non-alterable thereafter.

One issue that may arise in connection with controlling multiple light sources in the lighting unit 100 of FIG. 1, and controlling multiple lighting units 100 in a lighting system (e.g., as discussed below in connection with FIG. 2), relates to potentially perceptible differences in light output between substantially similar light sources. For example, given two virtually identical light sources being driven by respective identical control signals, the actual intensity of light output by each light source may be perceptibly different. Such a difference in light output may be attributed to various factors including, for example, slight manufacturing differences between the light sources, normal wear and tear over time of the light sources that may differently alter the respective spectrums of the generated radiation, etc. For purposes of the present discussion, light sources for which a particular relationship between a control signal and resulting intensity are not known are referred to as "uncalibrated" light sources.

The use of one or more uncalibrated light sources in the lighting unit 100 shown in FIG. 1 may result in generation of light having an unpredictable, or "uncalibrated," color or color temperature. For example, consider a first lighting unit including a first uncalibrated red light source and a first uncalibrated blue light source, each controlled by a corresponding control signal having an adjustable parameter in a range of from zero to 255 (0-255). For purposes of this example, if the red control signal is set to zero, blue light is generated, whereas if the blue control signal is set to zero, red light is generated. However, if both control signals are varied from non-zero values, a variety of perceptibly different colors may be produced (e.g., in this example, at very least, many different shades of purple are possible). In particular, perhaps a particular desired color (e.g., lavender) is given by a red control signal having a value of 125 and a blue control signal having a value of 200.

Now consider a second lighting unit including a second uncalibrated red light source substantially similar to the first uncalibrated red light source of the first lighting unit, and a second uncalibrated blue light source substantially similar to the first uncalibrated blue light source of the first lighting unit. As discussed above, even if both of the uncalibrated red light sources are driven by respective identical control signals, the actual intensity of light output by each red light source may be perceptibly different. Similarly, even if both of the uncalibrated blue light sources are driven by respective identical control signals, the actual intensity of light output by each blue light source may be perceptibly different.

With the foregoing in mind, it should be appreciated that if multiple uncalibrated light sources are used in combination in lighting units to produce a mixed colored light as discussed above, the observed color (or color temperature) of light produced by different lighting units under identical control conditions may be perceivably different. Specifically, consider again the "lavender" example above; the "first lavender" produced by the first lighting unit with a red control signal of 125 and a blue control signal of 200 indeed may be perceptibly different than a "second lavender" produced by the second lighting unit with a red control signal of 125 and a blue control signal of 200. More generally, the first and second lighting units generate uncalibrated colors by virtue of their uncalibrated light sources.

In view of the foregoing, in one embodiment of the present invention, the lighting unit 100 includes calibration means to facilitate the generation of light having a calibrated (e.g., predictable, reproducible) color at any given time. In one aspect, the calibration means is configured to adjust the light output of at least some light sources of the lighting unit so as to compensate for perceptible differences between similar light sources used in different lighting units.

For example, in one embodiment, the processor 102 of the lighting unit 100 is configured to control one or more of the light sources 104A, 104B, 104C and 104D so as to output radiation at a calibrated intensity that substantially corresponds in a predetermined manner to a control signal for the light source(s). As a result of mixing radiation having different spectra and respective calibrated intensities, a calibrated color is produced. In one aspect of this embodiment, at least one calibration value for each light source is stored in the memory 114, and the processor is programmed to apply the respective calibration values to the control signals for the corresponding light sources so as to generate the calibrated intensities.

In one aspect of this embodiment, one or more calibration values may be determined once (e.g., during a lighting unit manufacturing/testing phase) and stored in the memory 114 for use by the processor 102. In another aspect, the processor 102 may be configured to derive one or more calibration values dynamically (e.g. from time to time) with the aid of one or more photosensors, for example. In various embodiments, the photosensor(s) may be one or more external components coupled to the lighting unit, or alternatively may be integrated as part of the lighting unit itself. A photosensor is one example of a signal source that may be integrated or otherwise associated with the lighting unit 100, and monitored by the processor 102 in connection with the operation of the lighting unit. Other examples of such signal sources are discussed further below, in connection with the signal source 124 shown in FIG. 1.

One exemplary method that may be implemented by the processor 102 to derive one or more calibration values includes applying a reference control signal to a light source, and measuring (e.g., via one or more photosensors) an intensity of radiation thus generated by the light source. The processor may be programmed to then make a comparison of the measured intensity and at least one reference value (e.g., representing an intensity that nominally would be expected in response to the reference control signal). Based on such a comparison, the processor may determine one or more calibration values for the light source. In particular, the processor may derive a calibration value such that, when applied to the reference control signal, the light source outputs radiation having an intensity that corresponds to the reference value (i.e., the "expected" intensity).

In various aspects, one calibration value may be derived for an entire range of control signal/output intensities for a given light source. Alternatively, multiple calibration values may be derived for a given light source (i.e., a number of calibration value "samples" may be obtained) that are respectively applied over different control signal/output intensity ranges, to approximate a nonlinear calibration function in a piecewise linear manner.

In another aspect, as also shown in FIG. 1, the lighting unit 100 optionally may include one or more user interfaces 118 that are provided to facilitate any of a number of user-selectable settings or functions (e.g., generally controlling the light output of the lighting unit 100, changing and/or selecting various pre-programmed lighting effects to be generated by the lighting unit, changing and/or selecting various parameters of selected lighting effects, setting particular identifiers such as addresses or serial numbers for the lighting unit, etc.). In various embodiments, the communication between the user interface 118 and the lighting unit may be accomplished through wire or cable, or wireless transmission.

In one implementation, the processor 102 of the lighting unit monitors the user interface 118 and controls one or more of the light sources 104A, 104B, 104C and 104D based at least in part on a user's operation of the interface. For example, the processor 102 may be configured to respond to operation of the user interface by originating one or more control signals for controlling one or more of the light sources. Alternatively, the processor 102 may be configured to respond by selecting one or more pre-programmed control signals stored in memory, modifying control signals generated by executing a lighting program, selecting and executing a new lighting program from memory, or otherwise affecting the radiation generated by one or more of the light sources.

In particular, in one implementation, the user interface 118 may constitute one or more switches (e.g., a standard wall switch) that interrupt power to the processor 102. In one aspect of this implementation, the processor 102 is configured to monitor the power as controlled by the user interface, and in turn control one or more of the light sources 104A, 104B, 104C and 104D based at least in part on a duration of a power interruption caused by operation of the user interface. As discussed above, the processor may be particularly configured to respond to a predetermined duration of a power interruption by, for example, selecting one or more pre-programmed control signals stored in memory, modifying control signals generated by executing a lighting program, selecting and executing a new lighting program from memory, or otherwise affecting the radiation generated by one or more of the light sources.

FIG. 1 also illustrates that the lighting unit 100 may be configured to receive one or more signals 122 from one or more other signal sources 124. In one implementation, the processor 102 of the lighting unit may use the signal(s) 122, either alone or in combination with other control signals (e.g., signals generated by executing a lighting program, one or more outputs from a user interface, etc.), so as to control one or more of the light sources 104 (104A, 104B, 104C and 104D) in a manner similar to that discussed above in connection with the user interface.

Examples of the signal(s) 122 that may be received and processed by the processor 102 include, but are not limited to, one or more audio signals, video signals, power signals, various types of data signals, signals representing information obtained from a network (e.g., the Internet), signals representing some detectable/sensed condition, signals from lighting units, signals consisting of modulated light, etc. In various implementations, the signal source(s) 124 may be located remotely from the lighting unit 100, or included as a component of the lighting unit. For example, in one embodiment, a signal from one lighting unit 100 could be sent over a network to another lighting unit 100.

Some examples of a signal source 124 that may be employed in, or used in connection with, the lighting unit 100 of FIG. 1 include any of a variety of sensors or transducers that generate one or more signals 122 in response to some stimulus. Examples of such sensors include, but are not limited to, various types of environmental condition sensors, such as thermally sensitive (e.g., temperature, infrared) sensors, humidity sensors, motion sensors, photosensors/light sensors (e.g., sensors that are sensitive to one or more particular spectra of electromagnetic radiation), sound or vibration sensors or other pressure/force transducers (e.g., microphones, piezoelectric devices), and the like.

Additional examples of a signal source 124 include various metering/detection devices that monitor electrical signals or characteristics (e.g., voltage, current, power, resistance, capacitance, inductance, etc.) or chemical/biological characteristics (e.g., acidity, a presence of one or more particular chemical or biological agents, bacteria, etc.) and provide one or more signals 122 based on measured values of the signals or characteristics. Yet other examples of a signal source 124 include various types of scanners, image recognition systems, voice or other sound recognition systems, artificial intelligence and robotics systems, and the like.

A signal source 124 could also be a lighting unit 100, a processor 102, or any one of many available signal generating devices, such as media players, MP3 players, computers, DVD players, CD players, television signal sources, camera signal sources, microphones, speakers, telephones, cellular phones, instant messenger devices, SMS devices, wireless devices, personal organizer devices, and many others.

In one embodiment, the lighting unit 100 shown in FIG. 1 also may include one or more optical facilities 130 to optically process the radiation generated by the light sources 104A, 104B, 104C and 104D. For example, one or more optical facilities may be configured so as to change one or both of a spatial distribution and a propagation direction of the generated radiation. In particular, one or more optical facilities may be configured to change a diffusion angle of the generated radiation. In one aspect of this embodiment, one or more optical facilities 130 may be particularly configured to variably change one or both of a spatial distribution and a propagation direction of the generated radiation (e.g., in response to some electrical and/or mechanical stimulus). Examples of optical facilities that may be included in the lighting unit 100 include, but are not limited to, reflective materials, refractive materials, translucent materials, filters, lenses, mirrors, and fiber optics. The optical facility 130 also may include a phosphorescent material, luminescent material, or other material capable of responding to or interacting with the generated radiation.

As also shown in FIG. 1, the lighting unit 100 may include one or more communication ports 120 to facilitate coupling of the lighting unit 100 to any of a variety of other devices. For example, one or more communication ports 120 may facilitate coupling multiple lighting units together as a networked lighting system, in which at least some of the lighting units are addressable (e.g., have particular identifiers or addresses) and are responsive to particular data transported across the network.

In particular, in a networked lighting system environment, as discussed in greater detail further below (e.g., in connection with FIG. 2), as data is communicated via the network, the processor 102 of each lighting unit coupled to the network may be configured to be responsive to particular data (e.g., lighting control commands) that pertain to it (e.g., in some cases, as dictated by the respective identifiers of the networked lighting units). Once a given processor identifies particular data intended for it, it may read the data and, for example, change the lighting conditions produced by its light sources according to the received data (e.g., by generating appropriate control signals to the light sources). In one aspect, the memory 114 of each lighting unit coupled to the network may be loaded, for example, with a table of lighting control signals that correspond with data the processor 102 receives. Once the processor 102 receives data from the network, the processor may consult the table to select the control signals that correspond to the received data, and control the light sources of the lighting unit accordingly.

In one aspect of this embodiment, the processor 102 of a given lighting unit, whether or not coupled to a network, may be configured to interpret lighting instructions/data that are received in a DMX protocol (as discussed, for example, in U.S. Pat. Nos. 6,016,038 and 6,211,626), which is a lighting command protocol conventionally employed in the lighting industry for some programmable lighting applications. However, it should be appreciated that lighting units suitable for purposes of the present invention are not limited in this respect, as lighting units according to various embodiments may be configured to be responsive to other types of communication protocols so as to control their respective light sources.

In one embodiment, the lighting unit 100 of FIG. 1 may include and/or be coupled to one or more power sources 108.

In various aspects, examples of power source(s) 108 include, but are not limited to, AC power sources, DC power sources, batteries, solar-based power sources, thermoelectric or mechanical-based power sources and the like. Additionally, in one aspect, the power source(s) 108 may include or be associated with one or more power conversion devices that convert power received by an external power source to a form suitable for operation of the lighting unit 100.

While not shown explicitly in FIG. 1, the lighting unit 100 may be implemented in any one of several different structural configurations according to various embodiments of the present invention. For example, a given lighting unit may have any one of a variety of mounting arrangements for the light source(s), enclosure/housing arrangements and shapes to partially or fully enclose the light sources, and/or electrical and mechanical connection configurations. In particular, a lighting unit may be configured as a replacement or "retrofit" to engage electrically and mechanically in a conventional socket or fixture arrangement (e.g., an Edison-type screw socket, a halogen fixture arrangement, a fluorescent fixture arrangement, etc.).

Additionally, one or more optical facilities as discussed above may be partially or fully integrated with an enclosure/housing arrangement for the lighting unit. Furthermore, a given lighting unit optionally may be associated with (e.g., include, be coupled to and/or packaged together with) various other components (e.g., control circuitry such as the processor and/or memory, one or more sensors/transducers/signal sources, user interfaces, displays, power sources, power conversion devices, etc.) relating to the operation of the light source(s).

Figure 2:
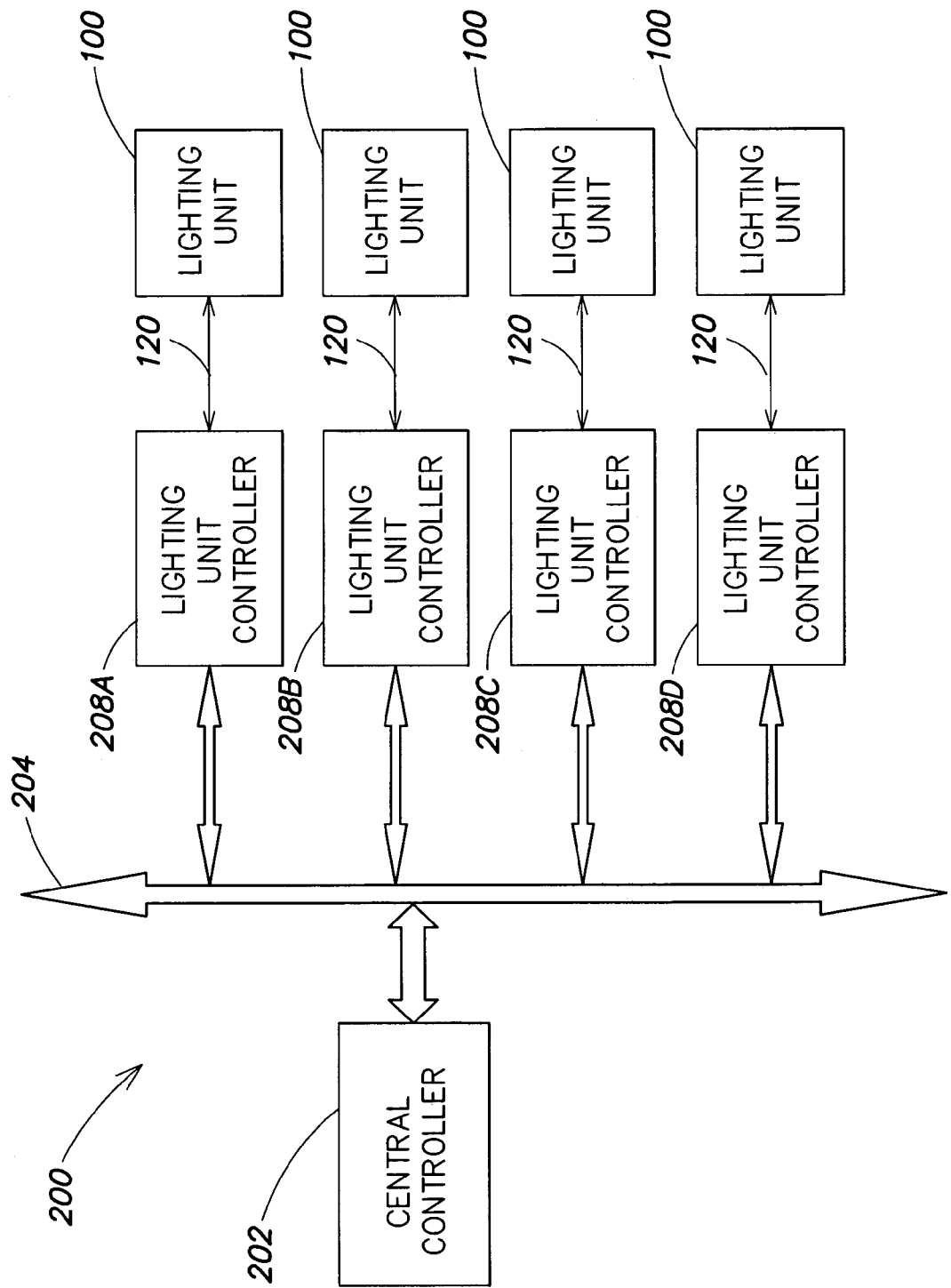
FIG. 2 depicts a lighting system with a plurality of lighting units and a central controller.

FIG. 2 illustrates an example of a networked lighting system 200 according to one embodiment of the present invention. In the embodiment of FIG. 2, a number of lighting units 100, similar to those discussed above in connection with FIG. 1, are coupled together to form the networked lighting system. It should be appreciated, however, that the particular configuration and arrangement of lighting units shown in FIG. 2 is for purposes of illustration only, and that the invention is not limited to the particular system topology shown in FIG. 2.

Additionally, while not shown explicitly in FIG. 2, it should be appreciated that the networked lighting system 200 may be configured flexibly to include one or more user interfaces, as well as one or more signal sources such as sensors/transducers. For example, one or more user interfaces and/or one or more signal sources such as sensors/transducers (as discussed above in connection with FIG. 1) may be associated with any one or more of the lighting units of the networked lighting system 200. Alternatively (or in addition to the foregoing), one or more user interfaces and/or one or more signal sources may be implemented as "stand alone" components in the networked lighting system 200. Whether stand alone components or particularly associated with one or more lighting units 100, these devices may be "shared" by the lighting units of the networked lighting system. Stated differently, one or more user interfaces and/or one or more signal sources such as sensors/transducers may constitute "shared resources" in the networked lighting system that may be used in connection with controlling any one or more of the lighting units of the system.

As shown in the embodiment of FIG. 2, the lighting system 200 may include one or more lighting unit controllers (hereinafter "LUCs") 208A, 208B, 208C and 208D, wherein each LUC is responsible for communicating with and generally controlling one or more lighting units 100 coupled to it. Although FIG. 2 illustrates four lighting units 100 coupled in a serial fashion to a given LUC, it should be appreciated that the invention is not limited in this respect, as different numbers of lighting units 100 may be coupled to a given LUC in a variety of different configurations using a variety of different communication media and protocols.

In the system of FIG. 2, each LUC in turn may be coupled to a central controller 202 that is configured to communicate with one or more LUCs. Although FIG. 2 shows four LUCs coupled to the central controller 202 via a switching or coupling device 204, it should be appreciated that according to various embodiments, different numbers of LUCs may be coupled to the central controller 202. Additionally, according to various embodiments of the present invention, the LUCs and the central controller may be coupled together in a variety of configurations using a variety of different communication media and protocols to form the networked lighting system 200. Moreover, it should be appreciated that the interconnection of LUCs and the central controller, and the interconnection of lighting units to respective LUCs, may be accomplished in different manners (e.g., using different configurations, communication media, and protocols).

For example, according to one embodiment of the present invention, the central controller 202 shown in FIG. 2 may by configured to implement Ethernet-based communications with the LUCs, and in turn the LUCs may be configured to implement DMX-based communications with the lighting units 100. In particular, in one aspect of this embodiment, each LUC may be configured as an addressable Ethernet-based controller and accordingly may be identifiable to the central controller 202 via a particular unique address (or a unique group of addresses) using an Ethernet-based protocol. In this manner, the central controller 202 may be configured to support Ethernet communications throughout the network of coupled LUCs, and each LUC may respond to those communications intended for it. In turn, each LUC may communicate lighting control information to one or more lighting units coupled to it, for example, via a DMX protocol, based on the Ethernet communications with the central controller 202.

More specifically, according to one embodiment, the LUCs 208A, 208B, 208C and 208D shown in FIG. 2 may be configured to be "intelligent" in that the central controller 202 may be configured to communicate higher level commands to the LUCs that need to be interpreted by the LUCs before lighting control information can be forwarded to the lighting units 100. For example, a lighting system operator may want to generate a color changing effect that varies colors from lighting unit to lighting unit in such a way as to generate the appearance of a propagating rainbow of colors ("rainbow chase"), given a particular placement of lighting units with respect to one another. In this example, the operator may provide a simple instruction to the central controller 202 to accomplish this, and in turn the central controller may communicate to one or more LUCs using an Ethernet-based protocol high-level command to generate a "rainbow chase." The command may contain timing, intensity, hue, saturation or other relevant information, for example. When a given LUC receives such a command, it may then interpret the command so as to generate the appropriate lighting control signals which it then communicates using a DMX protocol via any of a variety of signaling techniques (e.g., PWM) to one or more lighting units that it controls.

It should again be appreciated that the foregoing example of using multiple different communication implementations (e.g., Ethernet/DMX) in a lighting system according to one embodiment of the present invention is for purposes of illustration only, and that the invention is not limited to this particular example.

Figure 3:
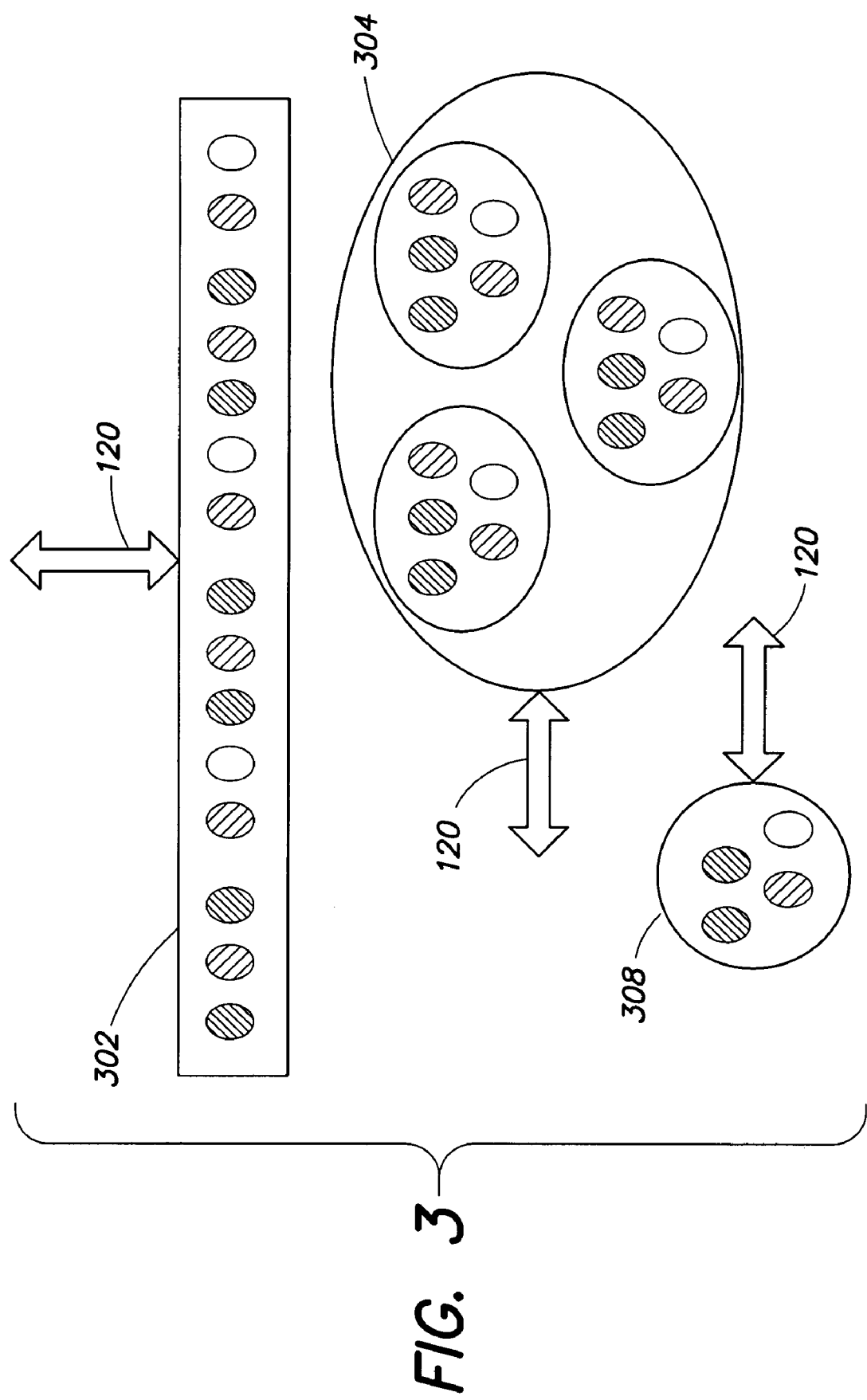
FIG. 3 depicts various configurations of lighting systems 100.

Referring to FIG. 3, various configurations can be provided for lighting units 100, in each case with an optional communications facility 120. Configurations include a linear configuration 302 (which may be curvilinear in embodiments), a circular configuration 308, an oval configuration 304, or a collection of various configurations 302, 304, 308. Lighting units 100 can also include a wide variety of colors of LED, in various mixtures, including red, green, and blue LEDs to produce a color mix, as well as one or more other LEDs to create varying colors and color temperatures of white light. For example, red, green and blue can be mixed with amber, white, UV, orange, IR or other colors of LED. Amber and white LEDs can be mixed to offer varying colors and color temperatures of white. Any combination of LED colors can produce a gamut of colors, whether the LEDs are red, green, blue, amber, white, orange, UV, or other colors. The various embodiments described throughout this specification encompass all possible combinations of LEDs in lighting units 100, so that light of varying color, intensity, saturation and color temperature can be produced on demand under control of a processor 102. Combinations of LEDs with other mechanisms, such as phosphors, are also encompassed herein.

Although mixtures of red, green and blue have been proposed for light due to their ability to create a wide gamut of additively mixed colors, the general color quality or color rendering capability of such systems are not ideal for all applications. This is primarily due to the narrow bandwidth of current red, green and blue emitters. However, wider band sources do make possible good color rendering, as measured, for example, by the standard CRI index. In some cases this may require LED spectral outputs that are not currently available. However, it is known that wider-band sources of light will become available, and such wider-band sources are encompassed as sources for lighting units 100 described herein.

Additionally, the addition of white LEDs (typically produced through a blue or UV LED plus a phosphor mechanism) does give a 'better' white it is still limiting in the color temperature that is controllable or selectable from such sources.

The addition of white to a red, green and blue mixture may not increase the gamut of available colors, but it can add a broader-band source to the mixture. The addition of an amber source to this mixture can improve the color still further by 'filling in' the gamut as well.

This combinations of light sources as lighting units 100 can help fill in the visible spectrum to faithfully reproduce desirable spectrums of lights. These include broad daylight equivalents or more discrete waveforms corresponding to other light sources or desirable light properties. Desirable properties include the ability to remove pieces of the spectrum for reasons that may include environments where certain wavelengths are absorbed or attenuated. Water, for example tends to absorb and attenuate most non-blue and non-green colors of light, so underwater applications may benefit from lights that combine blue and green sources for lighting units 100.

Amber and white light sources can offer a color temperature selectable white source, wherein the color temperature of generated light can be selected along the black body curve by a line joining the chromaticity coordinates of the two sources. The color temperature selection is useful for specifying particular color temperature values for the lighting source.

Orange is another color whose spectral properties in combination with a white LED-based light source can be used to provide a controllable color temperature light from a lighting unit 100.

The combination of white light with light of other colors as light sources for lighting units 100 can offer multipurpose lights for many commercial and home applications, such as in pools, spas, automobiles, building interiors (commercial and residential), indirect lighting applications, such as alcove lighting, commercial point of purchase lighting, merchandising, toys, beauty, signage, aviation, marine, medical, submarine, space, military, consumer, under cabinet lighting, office furniture, landscape, residential including kitchen, home theater, bathroom, faucets, dining rooms, decks, garage, home office, household products, family rooms, tomb lighting, museums, photography, art applications, and many others.

Figure 4:
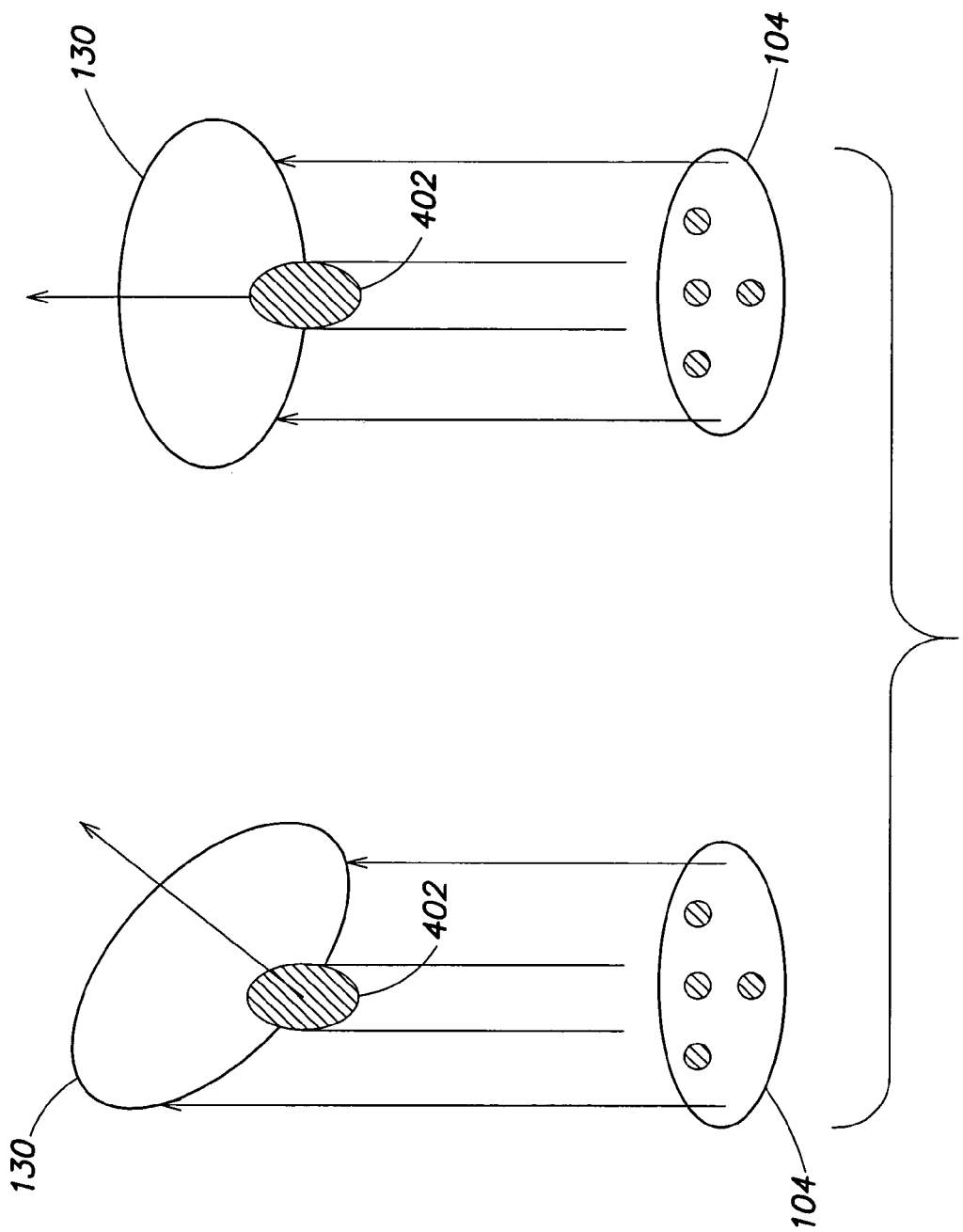
FIG. 4 depicts optical facilities for optically operating on light from a lighting unit 100.

Referring to FIG. 4 and the subsequent figures, light sources 104 (e.g., LED system and most luminaries) can utilize fixed or static as well as dynamic or variable optical facilities 130 to shape and control the beam of light from the fixture. In particular, variable optics provide discrete or continuous adjustment of beam spread or angle or simply the profile of the light beam emitted from a fixture. Properties can include, but are not limited to, adjusting the profile for surfaces that vary in distance from the fixture, such as wall washing fixtures. In various embodiments, the variable nature of the optic can be manually adjusted, adjusted by motion control or automatically be controlled dynamically.

Actuation of variable optics can be through any kind of actuator, such as an electric motor, piezoelectric device, thermal actuator, motor, gyro, servo, lever, gear, gear system, screw drive, drive mechanism, flywheel, wheel, or one of many well-known techniques for motion control. Manual control can be through an adjustment mechanism that varies the relative geometry of lens, diffusion materials, reflecting surfaces or refracting elements. The adjustment mechanism may use a sliding element, a lever, screws, or other simple mechanical devices or combinations of simple mechanical devices. A manual adjustment or motion control adjustment may allow the flexing of optical surfaces to bend and shape the light passed through the system or reflected or refracted by the optical system.

Actuation can also be through an electromagnetic motor or one of many actuation materials and devices. Optical facilities 130 can also include other actuators, such as piezo-electric devices, MEMS devices, thermal actuators, processors 102, and many other forms of actuators.

A wide range of optical facilities 130 can be used to control light. Such devices as Bragg cells or holographic films can be used as optical facilities 130 to vary the output of a fixture. A Bragg cell or acoustic-optic modulator can provide for the movement of light with no other moving mechanisms. The combination of controlling the color (hue, saturation and value) as well as the form of the light beam brings a tremendous amount of operative control to a light source. The use of polarizing films can be used to reduce glare and allow the illumination and viewing of objects that present specular surfaces, which typically are difficult to view. Moving lenses and shaped non-imaging surfaces can provide optical paths to guide and shape light.

In other embodiments, fluid-filled surfaces and shapes can be manipulated to provide an optical path. In combination with light sources 104, such shapes can provide varying optical properties across the surface and volume of the fluid-filled material. The fluid-filled material can also provide a thermal dissipation mechanism for the light-emitting elements. The fluid can be water, polymers, silicone or other transparent or translucent liquid or a gas of any type and mixture with desirable optical or thermal properties.

In other embodiments, gelled, filled shapes can be used in conjunction with light sources 104 to evenly illuminate said shapes. Light propagation and diffusion is accomplished through the scattering of light through the shape.

In other embodiments, spinning mirror systems such as those used in laser optics for scanning (E.g. bar code scanners or 3D terrain scanners) can be used to direct and move a beam of light. That combined with the ability to rapidly turn on and off a light source 104 can allow a beam of light to be spread across a larger area and change colors to 'draw' shapes of varying patterns. Other optical facilities 130 for deflecting and changing light patterns are known and described in the literature. They include methods for beam steering, such as mechanical mirrors, driven by stepper or galvanometer motors and more complex robotic mechanisms for producing sophisticated temporal effects or static control of both color (HS&V) and intensity. Optical facilities 130 also include acousto-optic modulators that use sound waves generated via piezoelectrics to control and steer a light beam. They also include digital mirror devices and digital light processors, such as available from Texas Instruments. They also include grating light valve technology (GLV), as well as inorganic digital light deflection. They also include dielectric mirrors, such as developed at Massachusetts Institute of Technology.

Control of form and texture of the light can include not only control of the shape of the beam but control of the way in which the light is patterned across its beam. An example of a use of this technology may be in visual merchandising, where product 'spotlights' could be created while other media is playing in a coordinated manner. Voice-overs or music-overs or even video can be played during the point at which a product is highlighted during a presentation. Lights that move and 'dance' can be used in combination with A/V sources for visual merchandising purposes. Additional material on variable optical facilities can be found in the following documents and publications, which are herein incorporated by reference: Optoelectronics, Fiber Optics, and Laser Cookbook by Thomas Petruzzellis 322 pages; McGraw-Hill/TAB Electronics; ISBN: 0070498407; (May 1, 1997); Digital Diffractive Optics: An Introduction to Planar Diffractive Optics and Related Technology by B. Kress, Patrick Meyrueis. John Wiley & Sons; ISBN: 0471984477; 1 edition (Oct. 25, 2000); Optical System Design by Robert E. Fischer, Biliana Tadic-Galeb, McGraw-Hill Professional; ISBN: 0071349162; 1st edition (Jun. 30, 2000); and Feynman Lectures On Physics (3 Volume Set) by Richard Phillips Feynman Addison-Wesley Pub Co; ISBN: 0201021153; (June 1970).

Optical facilities 130 can also comprise secondary optics, namely, optics (plastic, glass, imaging, non-imaging) added to an array of LEDs to shape and form the light emission. It can be used to spread, narrow, diffuse, diffract, refract or reflect the light in order that a different output property of the light is created. These can be fixed or variable. These can be light pipes, lenses, light guides and fibers and any other light transmitting materials.

In other embodiments, non-imaging optics are used as an optical facility 130. Non-imaging optics do not use traditional lenses. They use shaped surfaces to diffuse and direct light. A fundamental issue with fixtures using discrete light sources is mixing the light to reduce or eliminate color shadows and to produce uniform and homogenous light output. Part of the issue is the use of high efficiency surfaces that do not absorb light but bounce and reflect the light in a desired direction or manner. Optical facilities 130 can be used to direct light to create optical forms of illumination from lighting units 100.

Specific optical facilities 130 are of a wide variety. FIG. 4 depicts one example of an optical facility 130 for optically operating on light from a light source 104. Included is an actuator 402 for actuating a change in the optical effect that is caused by the optical facility 130. For example, as shown in FIG. 4, the actuator 402 can be an electromechanical actuator that changes the direction of the optical facility 130, in this case a lens 130. The actuator 402 tilts, changing the direction of light that is received by the optical facility 130 from a light source 104.

Figure 5:
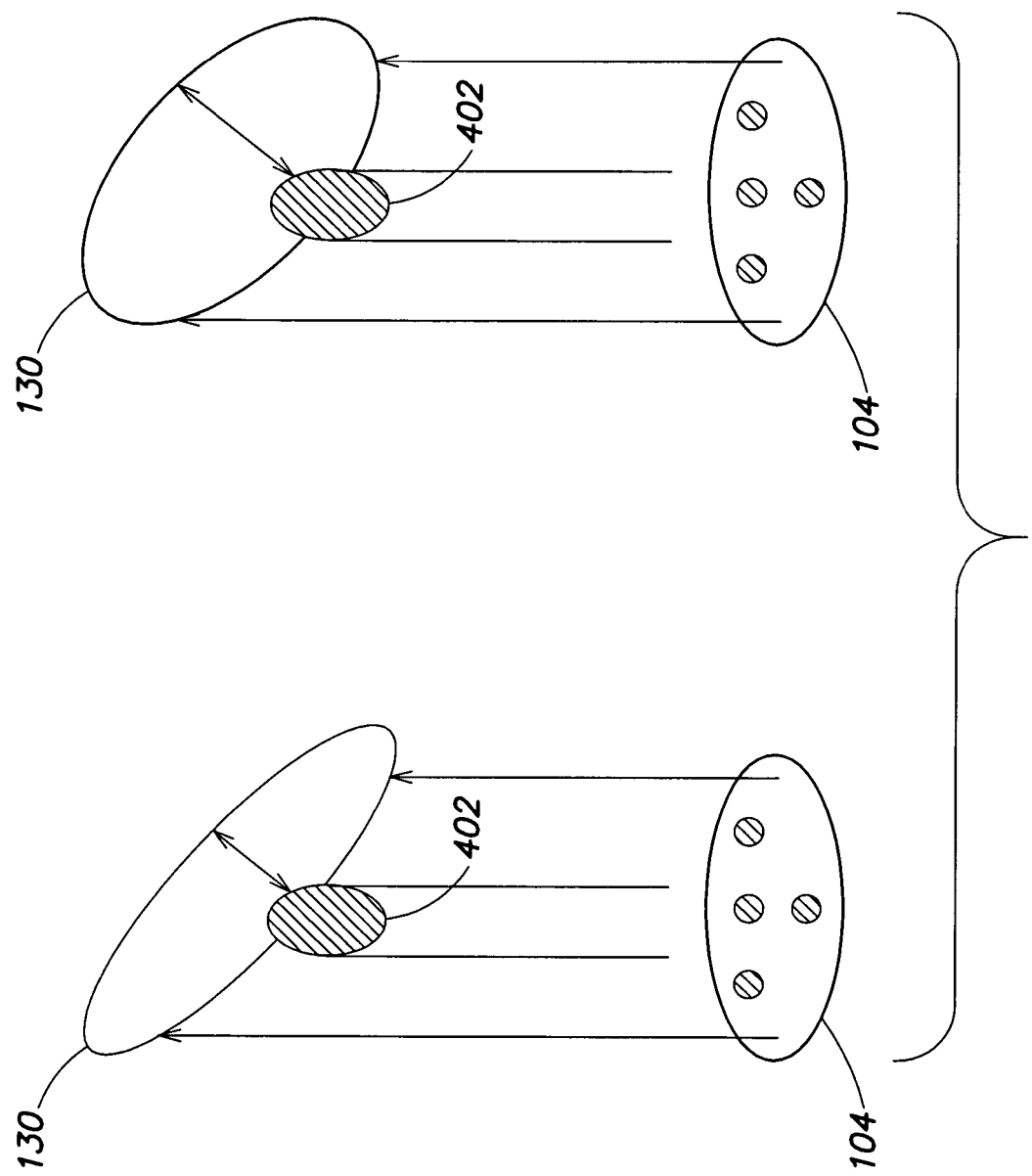
FIG. 5 depicts another embodiment of an optical facility.

FIG. 5 shows another form of actuation by an actuator 402. In this case the actuator actuates a change in the optical facility, in this case a change in the width of the lens 130. The lens can optionally include a compressible fluid, so that upon actuation it expands. Upon expansion the optical effect of the optical facility 130 is different than it was in the unexpanded state. The actuator 402 can actuate such a change by changing temperature of the material include in the optical facility, by mechanically changing a dimension of the optical facility 130, by compressing a gas or other fluid material into the optical facility 130, or the like. The actuator 402 can be under control of a processor or similar facility. The optical facility 130 can also tilt like the actuator 402 of FIG. 4, so that a wide range of optical effects can be created, in each case operating on light from the lighting unit 100.

Figure 6:
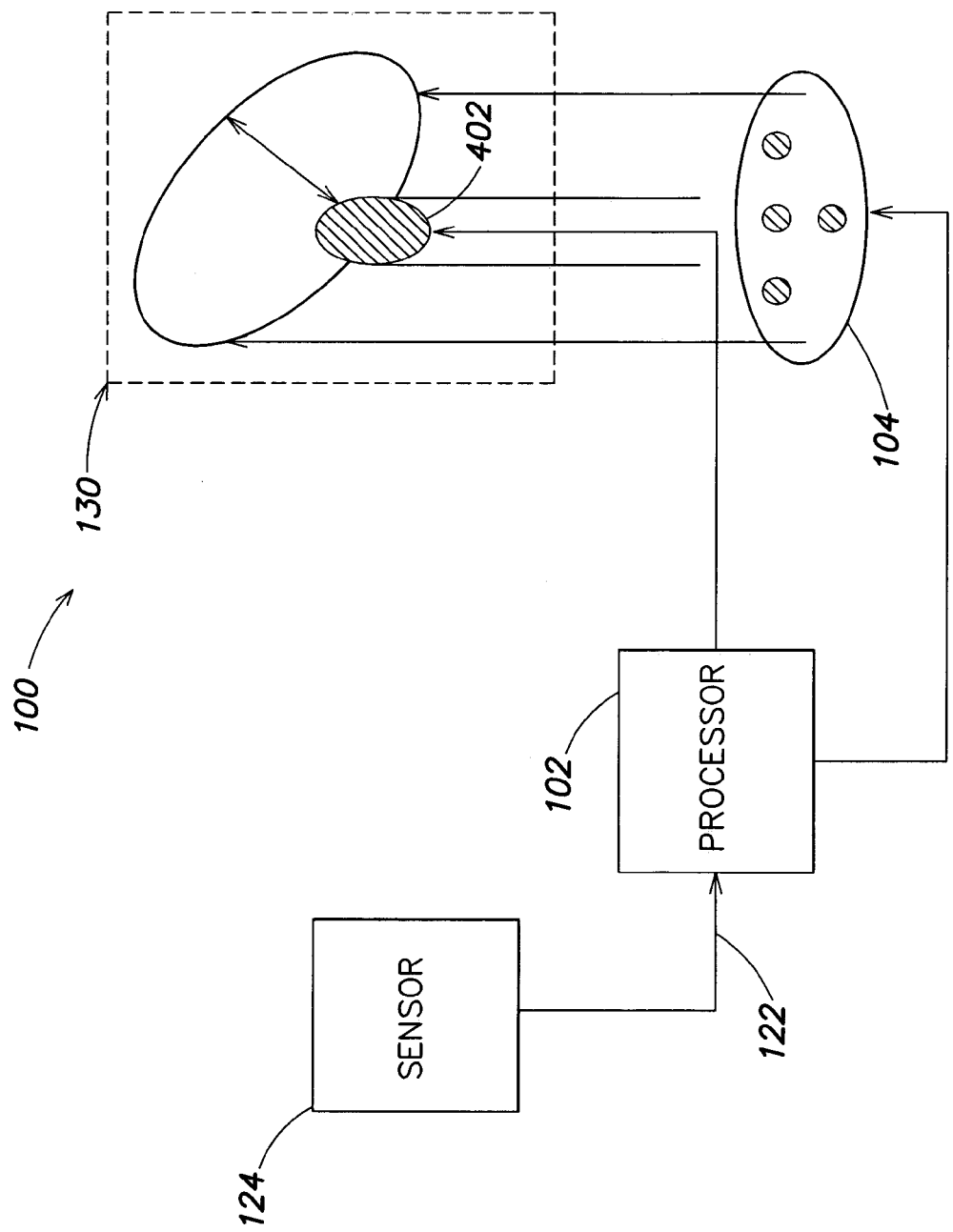
FIG. 6 depicts a schematic diagram for an optical facility that is controlled by a processor in conjunction with control of a lighting system, and that is capable of receiving input from a sensor.

Referring to FIG. 6, a processor 102 is used to operate both a light source 104 and the actuator 402 of the optical facility 130. Optionally, two processors 102 could be used in conjunction with the two elements. The processor 102 is in operative connection to a signal source 124, so that that the processor 102 can receive input from the signal source 124 (and, optionally, operate in a feedback loop with the signal source 124). In embodiments the signal source 124 is a sensor. Thus, the processor 102 can provide control signals to the light source 104 and the actuator 402, to coordinate the light source 104 with the optical facility 130 to produce a desired type of illumination or display. For example, the actuator 402 can be used to adjust the angle of the beam of light coming out of the light source 104, such as to diffuse light across a given portion of a surface, such as a wall. In embodiments the light source 104 can be part of a linear lighting system, such as a cove light system, with the optical facility 130 setting the angle of the light from the cove light system to diffuse smoothly across a wall, providing a color wash on the wall.

Many types of signal sources 124 can be used, for sensing any condition or sending any kind of signal, such as temperature, force, electricity, heat flux, voltage, current, magnetic field, pitch, roll, yaw, acceleration, rotational forces, wind, turbulence, flow, pressure, volume, fluid level, optical properties, luminosity, electromagnetic radiation, radio frequency radiation, sound, acoustic levels, decibels, particulate density, smoke, pollutant density, positron emissions, light levels, color, color temperature, color saturation, infrared radiation, x-ray radiation, ultraviolet radiation, visible spectrum radiation, states, logical states, bits, bytes, words, data, symbols, and many others described herein, described in the documents incorporated by reference herein, and known to those of ordinary skill in the arts.

Figure 7:
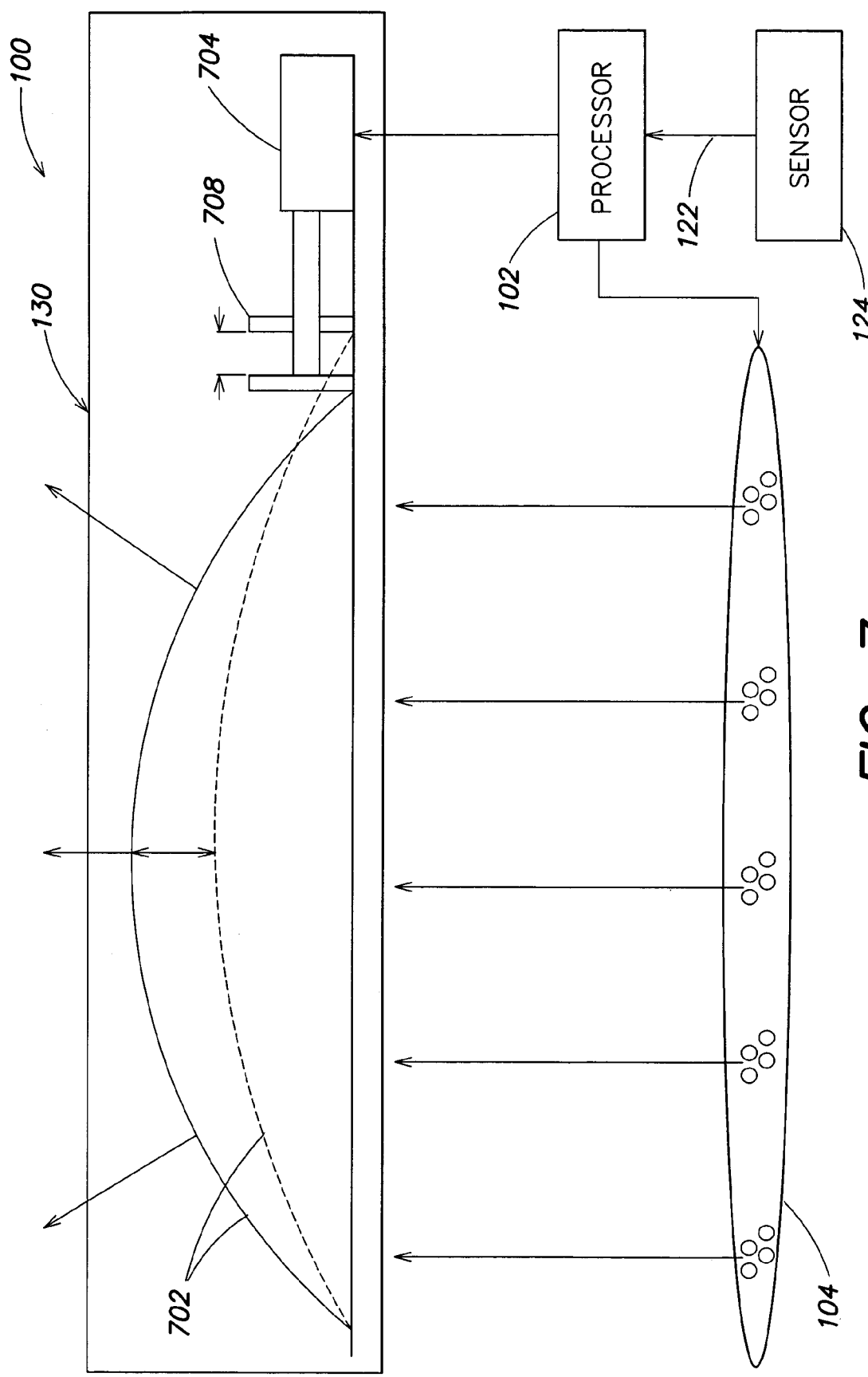
FIG. 7 depicts a mechanical actuator for changing the operative effect of an optical facility.

FIG. 7 depicts a mechanical actuator 704 for changing the operative effect of an optical facility 702, in this case a lens 702 that alters the optical path of light from a light source 104. In this case the shape of the lens 702 is altered by the linear movement of is the actuator 704, which moves a linear element 708 under the control of a processor 102, which may be integrated with the actuator 704 or may be part of a separate system, such as a remote control. The processor 102 optionally controls the light source 104 as well, so that both the lens and the light source 104 can be controlled simultaneously to provide coordinated changes in the illumination coming from the lighting unit 100. The processor 102 is also optionally responsive to a signal source 124, which can be any sensor, such as those described in connection with FIG. 6. The actuator 704 thus slides the linear element 708 to bend the lens 702, changing the index of refraction of the light that the lens 702 receives from the light source 104. The light source 104 can be arranged as a linear source, circular source, rectangular source, or other shapes. The lens 702 can change the beam angle of the light coming from the light source 104, to produce a variety of lighting effects, such as casting different patterns of light on a wall or object. The actuator 704 can be any type of actuator for providing linear movement, such as an electromechanical element, a screw drive mechanism (such as used in computer printers), a screw drive, or other element for linear movement known to those of ordinary skill in the art.

Figure 8:
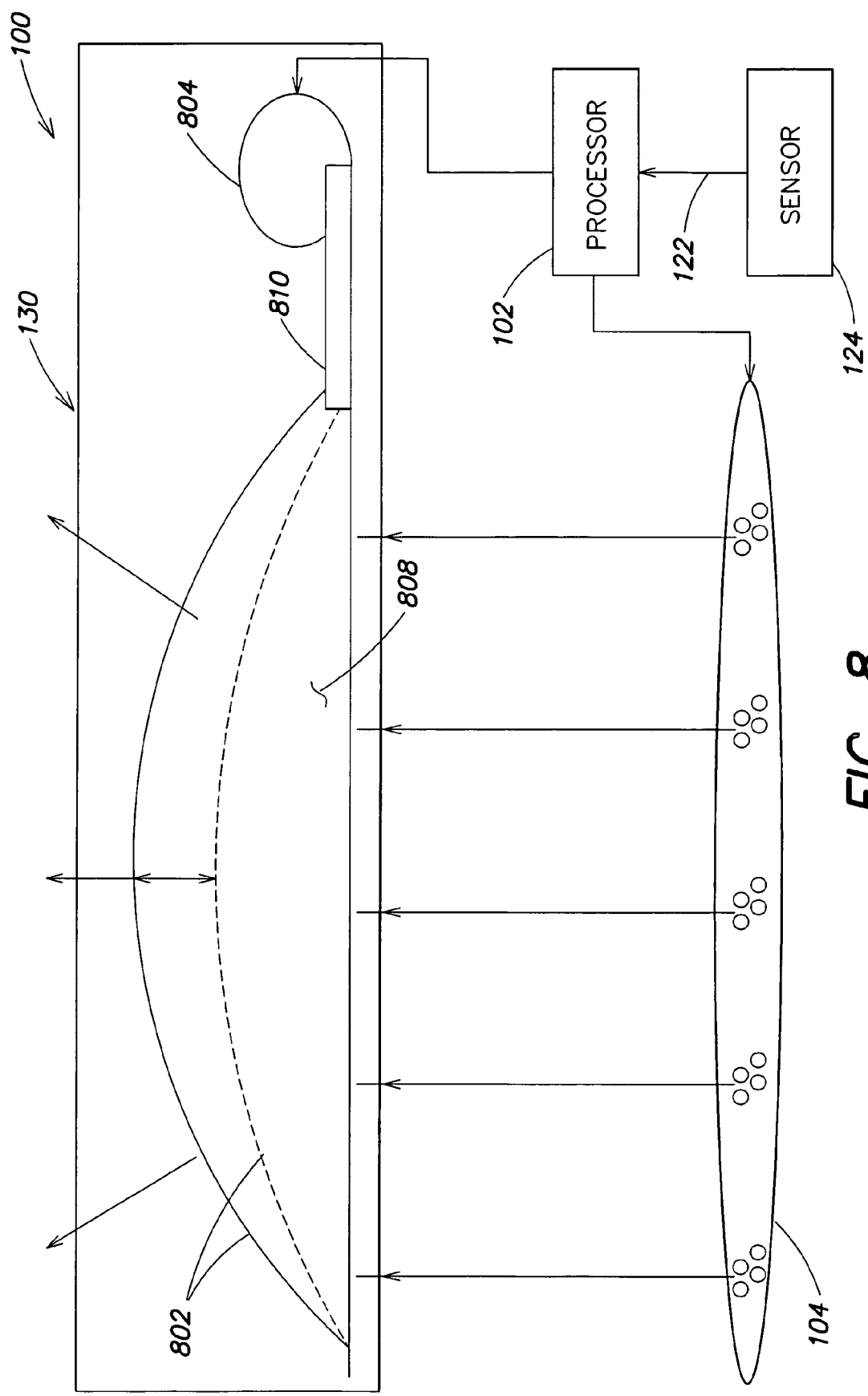
FIG. 8 depicts another system for actuating an optical facility to change under the control of a processor.

FIG. 8 depicts another system for actuating an optical facility 130 to change under the control of a processor. In this case the optical facility is a fluid filled lens 802, which contains a compressible fluid 808, such as a gas or liquid. The actuator 804 includes a valve 810 for delivering fluid to the interior chamber of the lens 802. The actuator 804 is a pump or similar facility, which may be electromechanical, electrical or mechanical in nature. The actuator 804 pumps fluid 808 into or out of the interior of the lens 802, causing the lens 802 to change in shape and thus bend light differently as it transmits through the lens 802. In embodiments the fluid 808 may be selected to have an effect on the light; for example, it may be semi-opaque, so that it produces a glowing effect, or it may have bubbles that refract portions of the light. Any of a wide variety of fluids can be used, such as water, air, fluid polymers and the like. The actuator 804 is optionally controlled by a processor 102, which may be integrated with it or separate from it and which in turn may optionally be responsive to a signal source 124. The processor 102 optionally controls the light source 104, so that coordinated control of the light source (e.g., color, intensity, saturation, and color temperature of light) as well as the effect on the light due to the lens 802 may be achieved.

Figure 9:
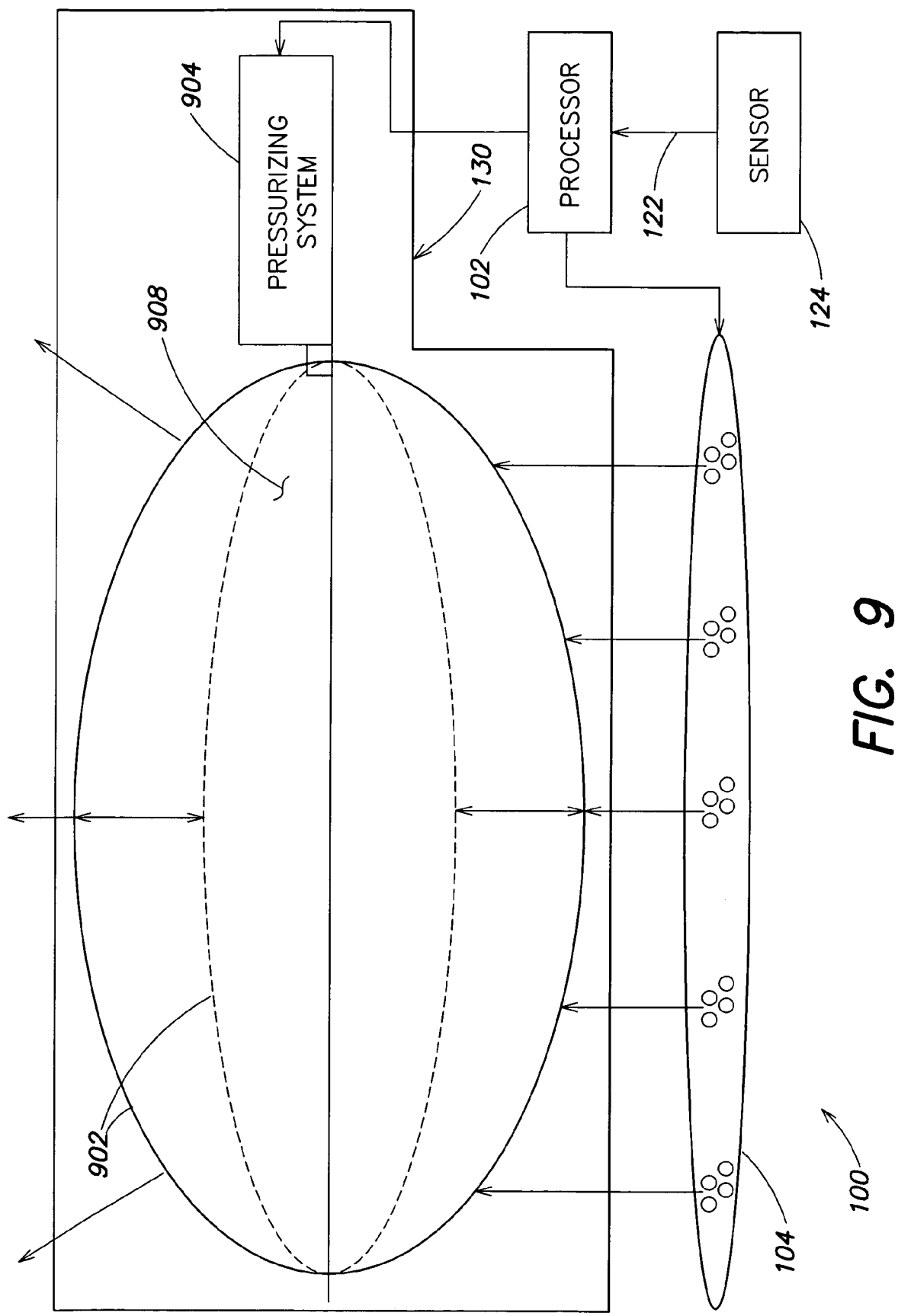
FIG. 9 depicts another system for actuating an optical facility to change configuration under the control of a processor.

FIG. 9 depicts another optical facility 130, in this case a fluid-filled lens 902 that operates in response to a pressurizing system 904, which induces pressure changes in the interior chamber 908 of the lens, such as by increasing the amount of fluid in the chamber 908 or by changing the temperature of the chamber, thus inducing a volume expansion of a gas inside the chamber 908. The pressurizing system 904 can be controlled by a processor 102, which can control the light source 104, optionally under control from a signal source 124, such as a sensor of the types mentioned above.

Figure 10:
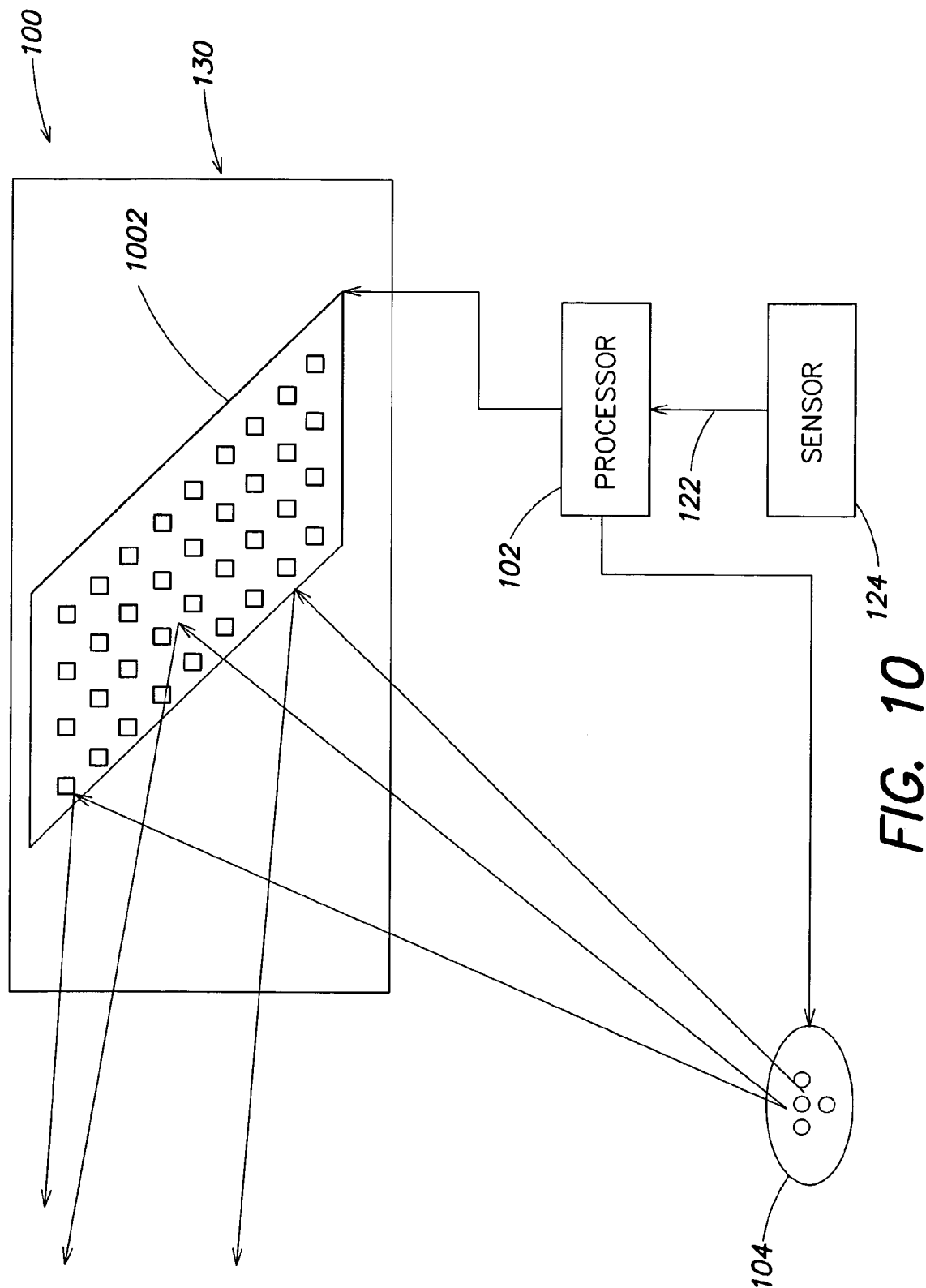
FIG. 10 depicts a digital mirror optical facility for reflecting light from a light system.

Referring to FIG. 10, a digital mirror 1002 may serve as an optical facility 130. The digital mirror reflects light from the light source 104. The digital mirror is optionally under control of a processor 102, which governs the reflective properties of the digital mirror. The processor 102 optionally controls the light source 104 and is optionally responsive to a signal 122 from a source 124, such as a sensor. Thus, the processor 102 facilitates coordination of the light generated from the light source 104 with the reflective properties of the digital mirror 1002. Any known digital mirror technology can be used, such as the DMD/DLP digital mirror commercially available from Texas Instruments.

Figure 11:
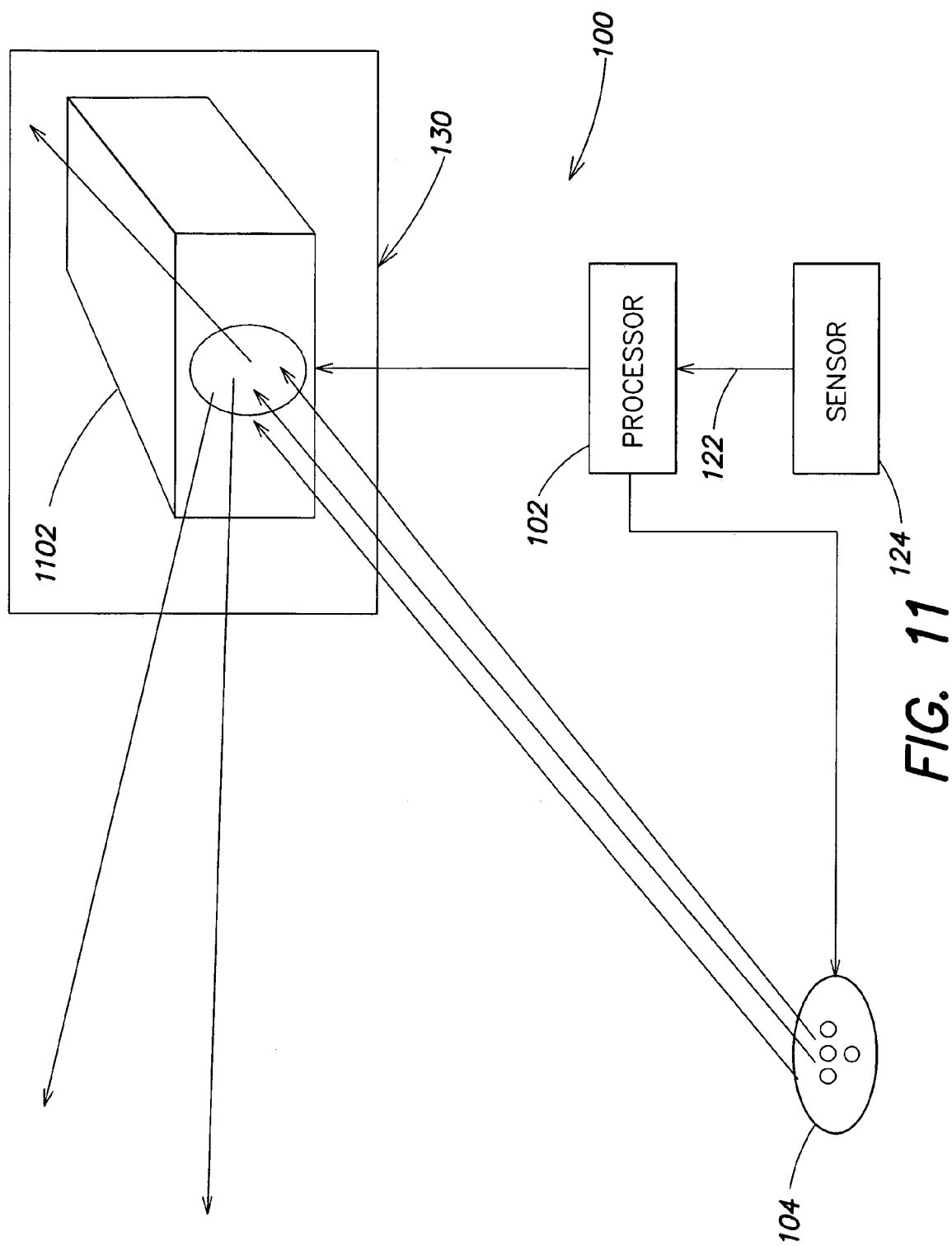
FIG. 11 depicts a spinning mirror system optical facility.

Referring to FIG. 11, a spinning mirror system 1102 may serve as an optical facility 130. As in other embodiments, the spinning mirror system is responsive to the control of a processor 102, which may be integrated with it or separate. The processor optionally controls the light source 104, which generates light that is reflected by the spinning mirror system 1102. The processor is optionally responsive to a signal source 124, and receives a signal 122, such as from a sensor 124. In embodiments the sensor 124 senses lighting conditions, allowing a closed loop feedback to the processor 102 to control both the light source 104 and the spinning mirror system 1102 in a coordinated way to generate optimum conditions of light reflected from the spinning mirror system. Spinning mirror systems are known features of many other industrial or commercial systems, such as bar code scanners and 3D terrain scanners. They can be used to direct and control a beam of light in a desired direction. Combined with the ability to precisely control the timing of light generated from the light source 104 under control of the processor 102, the combination of the light source 104 and the spinning mirror system 1102 allows improved control of the direction of a beam of light, such as to spread the beam over a larger area, to change colors, and to "draw" shapes of varying patterns.

The spinning mirror system 1102 of FIG. 11, and the digital mirror system 1002 of FIG. 10 are examples of devices designed to steer beams of light. Many such devices are known to those of skill in the optical arts, and any such devices are intended to be encompassed herein.

Figure 12:
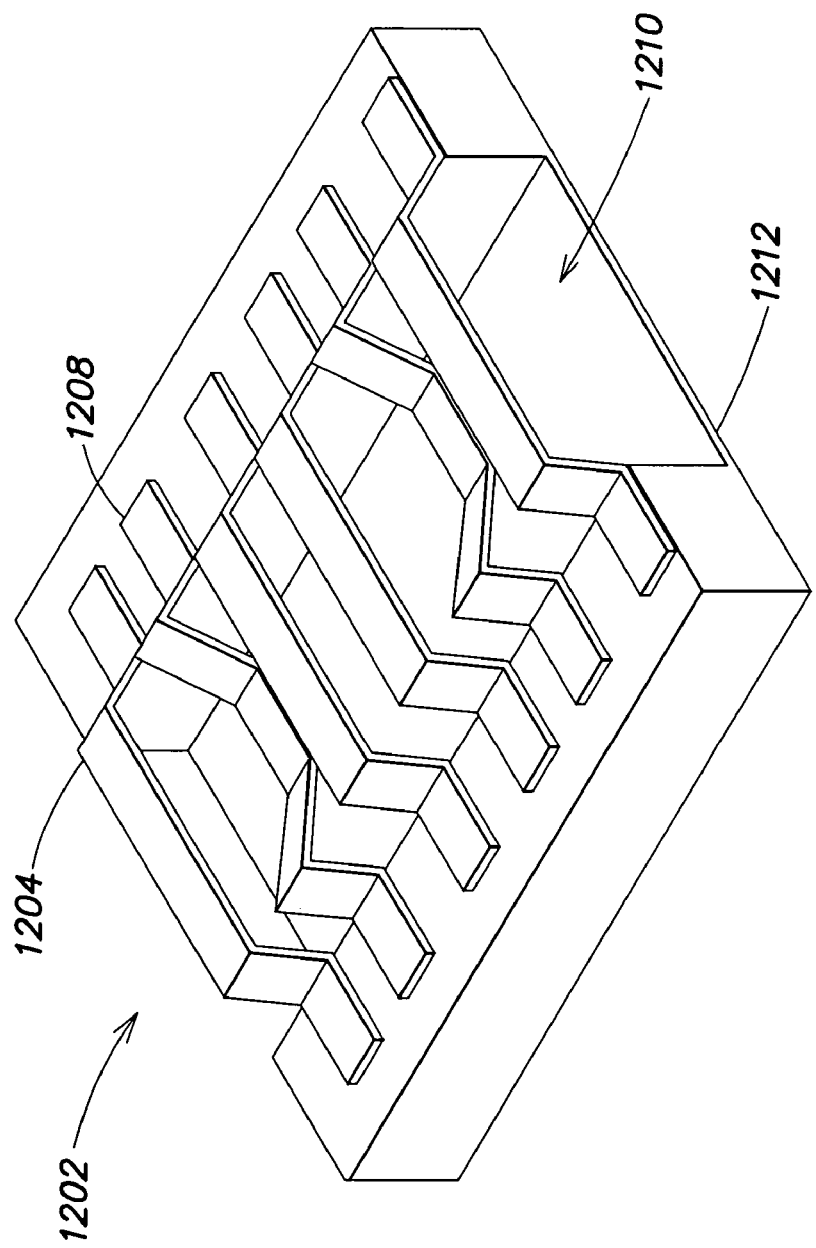
FIG. 12 depicts a grating light valve optical facility.

Referring to FIG. 12, a grating light valve (GLV) 1202 may serve as an optical facility 130 in the lighting unit 100 of FIG. 1. The grating light valve 1202 can receive light from a light source 104 (not shown) under control of a processor 102 (not shown). GLV uses micro-electromechanical systems (MEMS) technology and optical physics to vary how light is reflected from each of multiple ribbon-like structures 1204, 1208 that represent a particular "image point" or pixel. The ribbons can move a tiny distance, such as between an initial state 1204 and a depressed state 1208 as seen in FIG. 12. When the ribbons move, they change the wavelength of reflected light. Grayscale tones can also be achieved by varying the speed at which given pixels are switched on and off. The resulting image can be projected in a wide variety of environments, such as a large arena with a bright light source or on a small device using low power light sources. In the GLV, picture elements (pixels) are formed on the surface of a silicon chip and become the source for projection.

Additional information about GLV techniques can be found in "Diffractive Optical MEMs Use Grating Light Valve Technique," by Christopher Gudeman, Electrical Engineering Times, Mar. 18, 2002, which is herein incorporated by reference.

Referring still to FIG. 12, the GLV 1202 is a spatial light modulator. The GLV 1202 consists of an array of parallel micro-ribbons suspended above an air gap 1210. The GLV 1202 is configured so the ribbons can be actuated between different states. The ribbons 1204, 1208 are under high tension so that they remain tight when not actuated. The top layer of the ribbon is typically a metal, such as aluminum, which serves as both the reflective layer for light and as an electrode for electrostatic actuation. When a voltage is applied to the ribbon, electrostatic attraction deflects the ribbon downward to a state such as the ribbon 1208 in FIG. 12. The sub-layers of the ribbon can be a set of layers of materials such as stoichiometric Si3N4 and SiO2 films that provide a restoration force like a spring that balances the electrostatic force and provides stiffness and stress balance so the ribbon remains flat across its width. In embodiments, ribbons are about 500 mm long, 10 mm wide, 300 nm thick and closely spaced, such as with a gap of less than 0.5 mm.

A GLV 1202 can have alternate "active" ribbons and "bias" ribbons. The bias ribbons can have a single common control connection and can be held at ground potential, the same as the bottom electrode 1212. Individual electrical connections to each active ribbon electrode can provide for independent actuation.

When the voltage of the active ribbons is set to ground potential, all ribbons are undeflected, and the device acts as a mirror. As the voltage to an active ribbon is increased, this region of the array begins to diffract light, thus attenuating the light that is reflected specularly.

In embodiments of a GLV 1202, the ribbons are replicated several thousand times to form a one-dimensional array of diffracting elements. In embodiments, the diffraction elements are seamless, with no spaces between elements.

Figure 13:
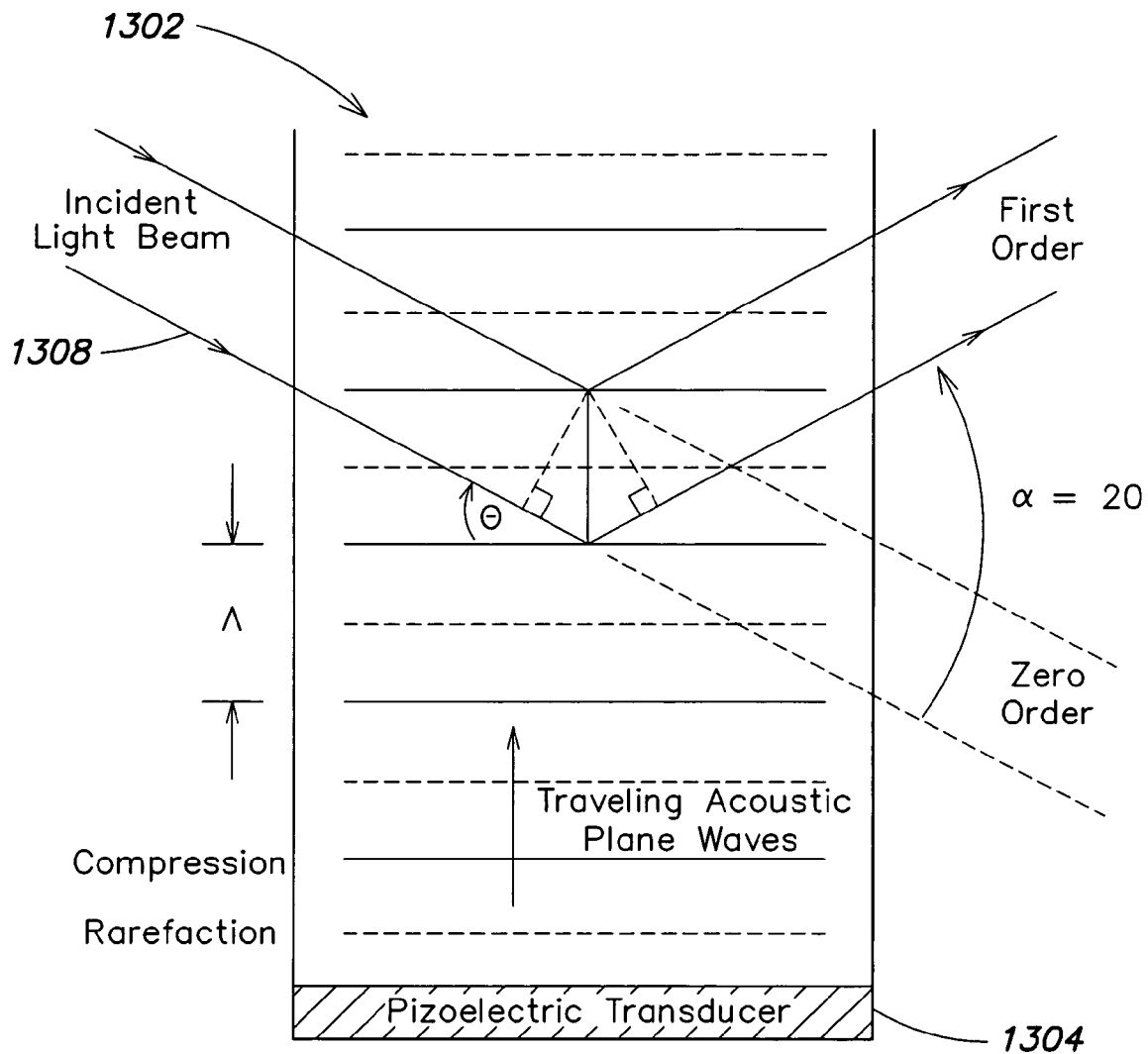
FIG. 13 depicts an acousto-optical modulator as an optical facility.

Referring to FIG. 13, an acousto-optical modulator 1302 may serve as an optical facility 130. Also known as a tunable filter and as a Bragg cell, the acousto-optical modulator 1302 consists of a crystal that is designed to receive acoustic waves generated, for example, by a transducer 1304, such as a piezoelectric transducer 1304. The acoustic standing waves produce index of refraction changes in the crystal, essentially due to a Doppler shift, so that the crystal serves as a tunable diffraction grating. Incident light 1308, such as from a light source 104, is reflected in the crystal by varying degrees, depending on the wavelength of the acoustic standing waves induced by the transducer 1304. The transducer 1304 can be responsive to a processor 102, such as to convert a signal of any type into an acoustic signal that is sent through the crystal. Thus, the modulator 1302 can coordinate effects with changes in the light from the light source 104.

Figure 14:
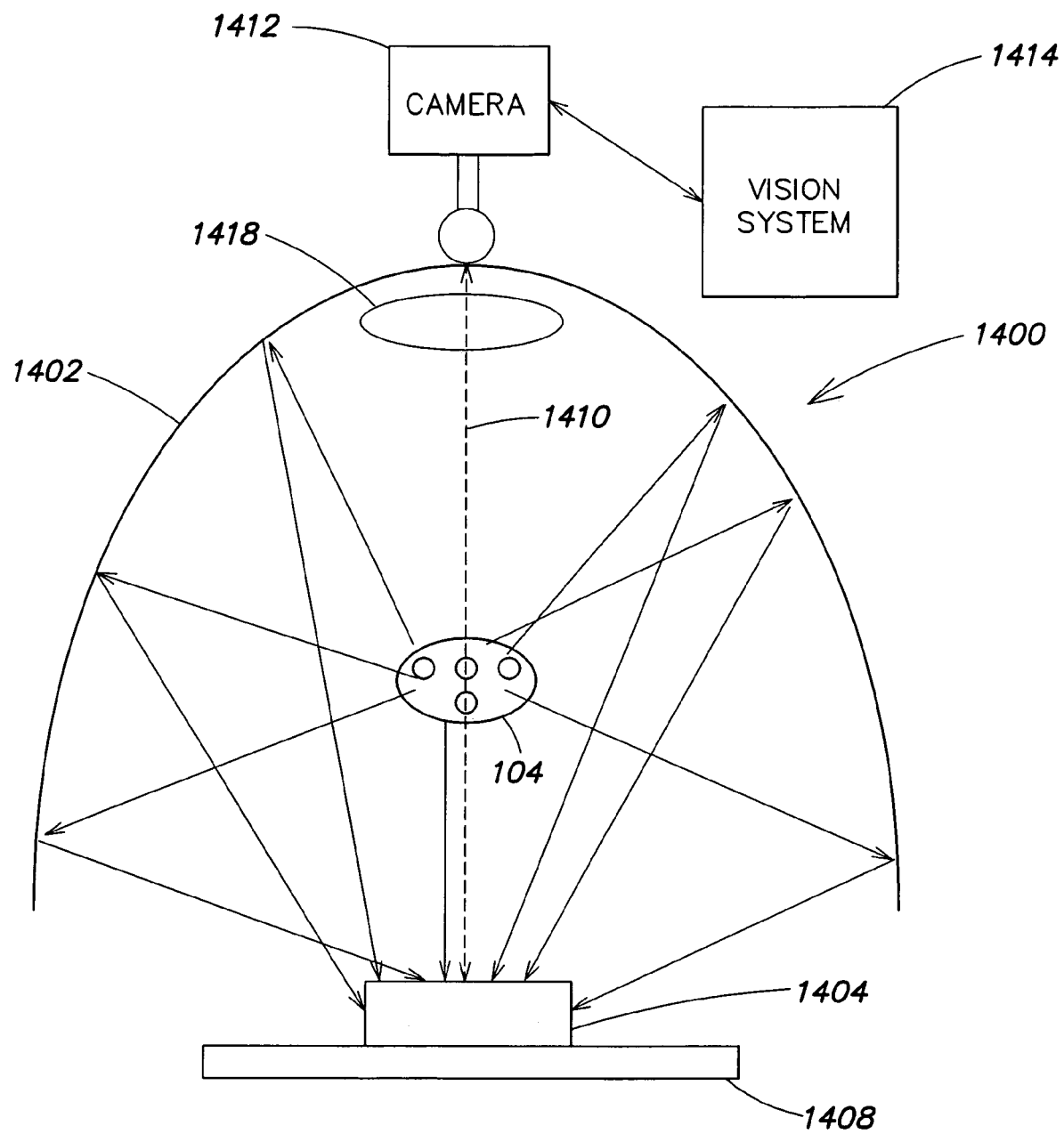
FIG. 14 depicts an illumination system for reflecting light on an object from a wide variety of beam angles.

Referring to FIG. 14, an illumination system 1400 is designed to reflect light from light source 104 onto an object 1404. The object 1404 might be an object to be viewed under a machine vision system, such as an object on which a bar code is to be read, a semiconductor element to be placed on a circuit board, or the like. In machine vision systems and other systems where objects are lit, it can be desirable to provide illumination from a wide variety of beam angles, rather than from one or a small number of beam angles. Providing many beam angles reduces harsh reflections and provides a smoother view of an object. A system for producing such beam angles can be seen in FIG. 14. In FIG. 14, a reflective surface 1402 is provided for reflecting light from a light source 104 to the object 1404. The reflective surface 1402 is substantially parabolic, so that light from the light source 104 is reflected substantially to the object 1404, regardless of the angle at which it hits the reflective surface 1402 from the light source 104. The surface could be treated to a mirror surface, or to a matte Lambertian surface that reflects light substantially equally in all directions. As a result, the object 1404 is lit from many different angles, making it visible without harsh reflections. The object 1404 may optionally be viewed by a camera 1412, which may optionally be part of or in operative connection with a vision system 1414. The camera may view the object through a space 1418 in the reflective surface 1402, such as located along an axis of viewing 1410 from above the object. The object 1404 may rest on a platform 1408, which may be a moving platform 1408. The platform 1408, light source 104, vision system 1414 and camera 1412 may each be under control of a processor 102, so that the viewing of the object and the illumination of the object may be coordinated, such as to view the object under different colors of illumination. A system such as that depicted in FIG. 14 can produce continuous diffuse illumination. Such systems can be seen in patents issued to Tim White, such as U.S. Pat. No. 5,604,550, issued Feb. 18, 1997 and U.S. Pat. No. 6,059,421, issued May 9, 2000, which are incorporated by reference herein.

Figure 16:
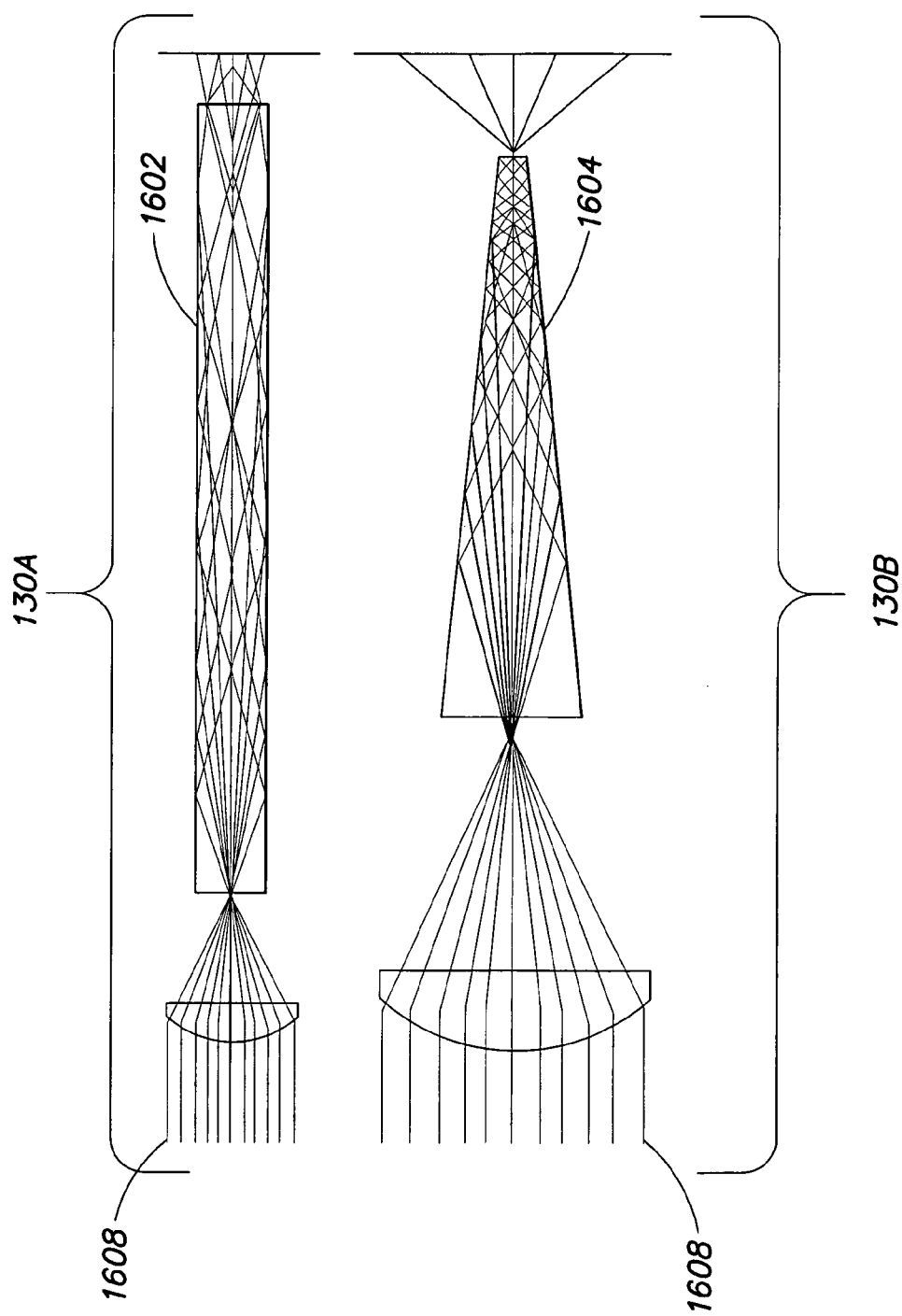
FIG. 16 depicts an example of a secondary optical facility for shaping and forming light emission from a lighting system.

Referring to FIG. 16, optical facilities 130A and 130B are provided for shaping and forming incident light 1608. Provided is a light pipe 1602 that reflects light to produce a particular pattern of light at the output end. A different shape of light pipe 1604 produces a different pattern. In general, such secondary optics, whether imaging or non-imaging, and made of plastic, glass, mirrors or other materials, can be added to a lighting unit 100 to shape and form the light emission. Such optical facilities 130A and 130B can be used to spread, narrow, diffuse, diffract, refract or reflect the light in order that a different output property of the light is created. These can be fixed or variable. Examples can be light pipes, lenses, light guides and fibers and any other light transmitting materials, or a combination of any of these.

Figure 17:
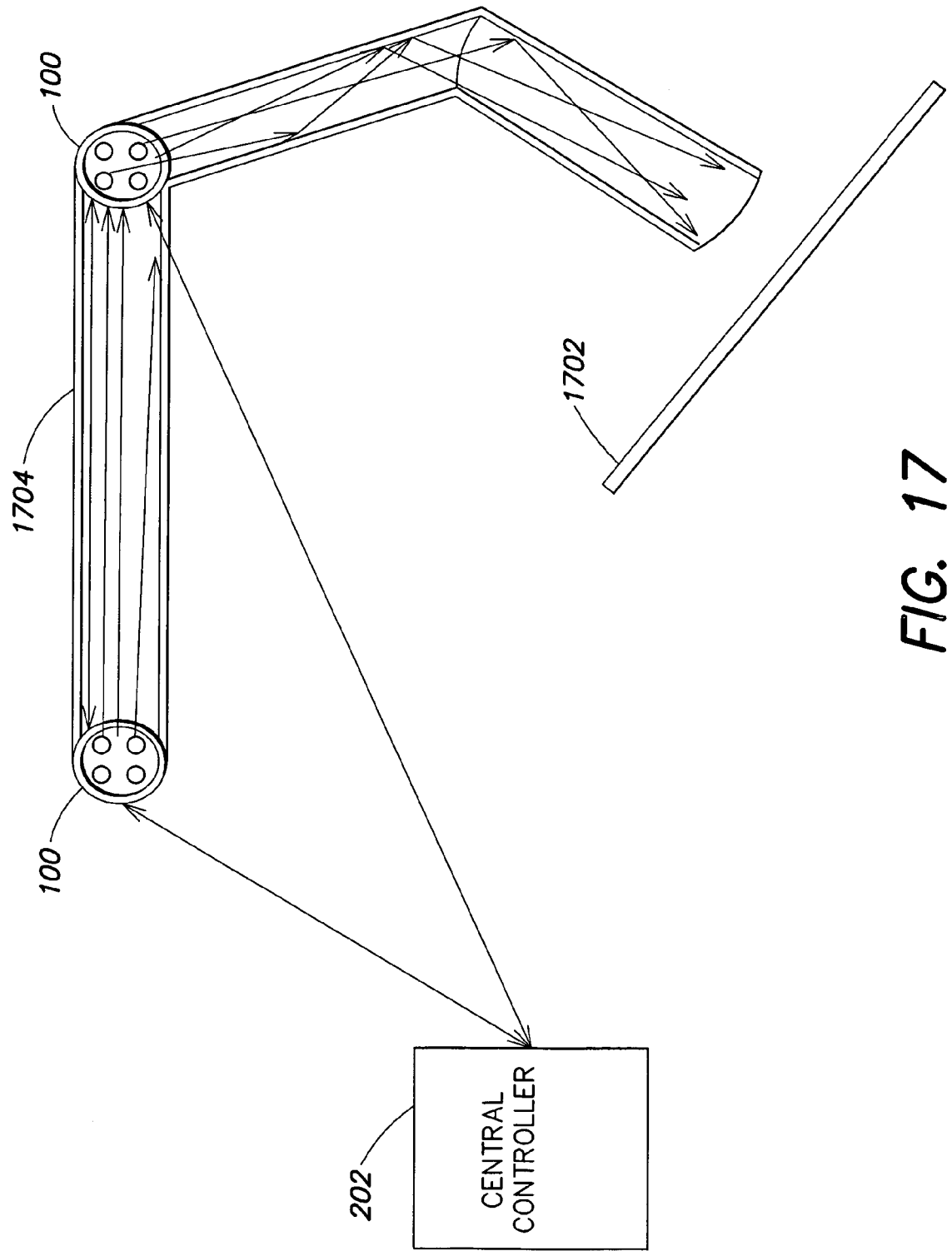
FIG. 17 depicts a configuration for a lighting system with a light pipe optical facility.

Referring to FIG. 17, a light pipe 1704 serves as an optical facility, delivering light from one or more lighting units 100 to an illuminated material 1702. The lighting units 100 are optionally controlled by a central controller 202, which controls the lighting units 100 to send light of selected colors, color temperatures, intensities and the like into the interior of the light pipe 1704. In other embodiments a central controller 202 is not required, such as in embodiments where the lighting units 100 include their own processor 102. In embodiments one or more lighting units 100 may be equipped with a communications facility, such as a data port, receiver, transmitter, or the like. Such lighting units 100 may receive and transmit data, such as to and from other lighting units 100. Thus, a chain of lighting units 100 in a light pipe may transmit not only light, but also data along the pipe 1704, including data that sends control signals for the lighting units disposed in the pipe 1704. The material 1702 can be any material, such as one chosen for illumination, including an object of any type. The central controller 202 can control the illumination sent through the pipe to illuminate based on a feature of the material 1702. In embodiments the interior 1704 may be filled with a substantially light-transmissive material, such as a fluid, gel, polymer, gas, liquid, vapor, solid, crystal, fiber optic material, or other material. In embodiments the material may be a flexible material, so that the light pipe 1704 may be made flexible. The light pipe 1704 may be made of a flexible material or a rigid material, such as a plastic, rubber, a crystal, PVC, glass, a polymer, a metal, an alloy or other material.

Figure 18:
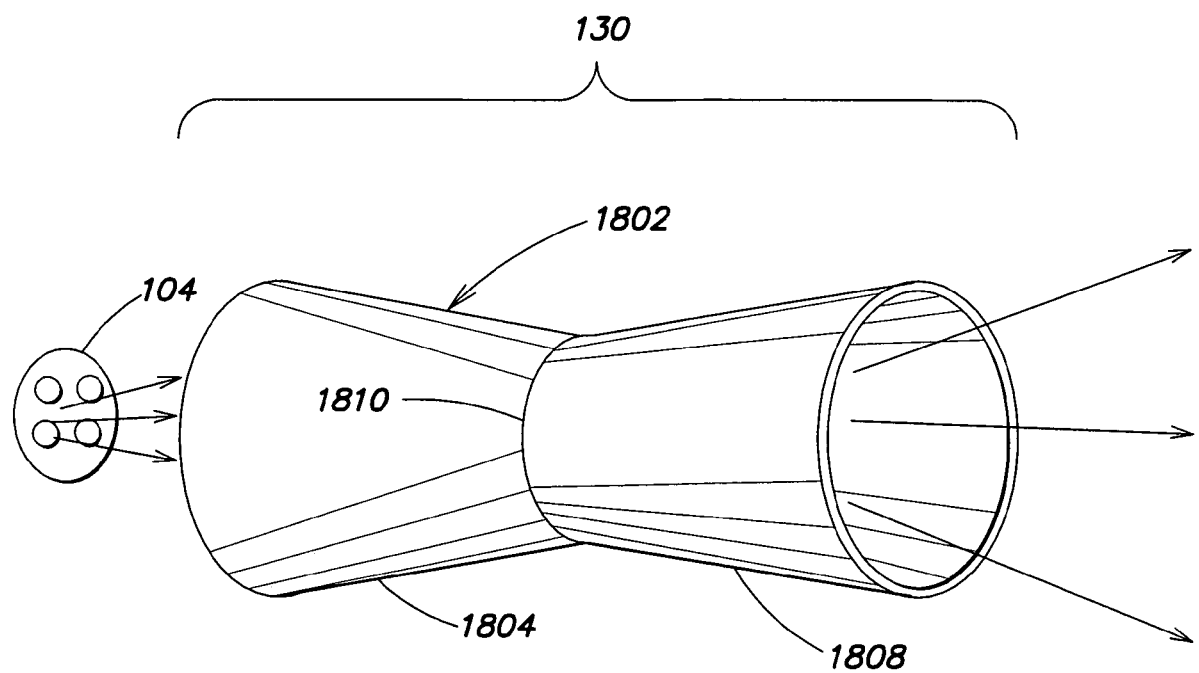
FIG. 18 depicts a color mixing system.

Referring to FIG. 18, a color mixing system 1802 is provided for mixing color from a light source 104. The color mixing system consists of two opposing truncated conical sections 1804, 1808, which meet at a boundary 1810. Light from a light source 104 is delivered into the color mixing system and reflected from the interior surfaces of the two sections 1804, 1808. The reflections mix the light and produce a mixed light from the distal end of the color mixing system 1802. U.S. Pat. No. 2,686,866 to Williams, incorporated by reference herein, shows a color mixing lighting apparatus utilizing two inverted cones to reflect and mix the light from multiple sources. By combining a color mixing system such as this with color changes from the light source 104, a user can produce a wide variety of lighting effects.

Other color mixing systems can work well in conjunction with color changing light sources 104. For example, U.S. Pat. No. 2,673,923 to Williams, also incorporated by reference herein, uses a series of lens plates for color mixing.

Figure 19:
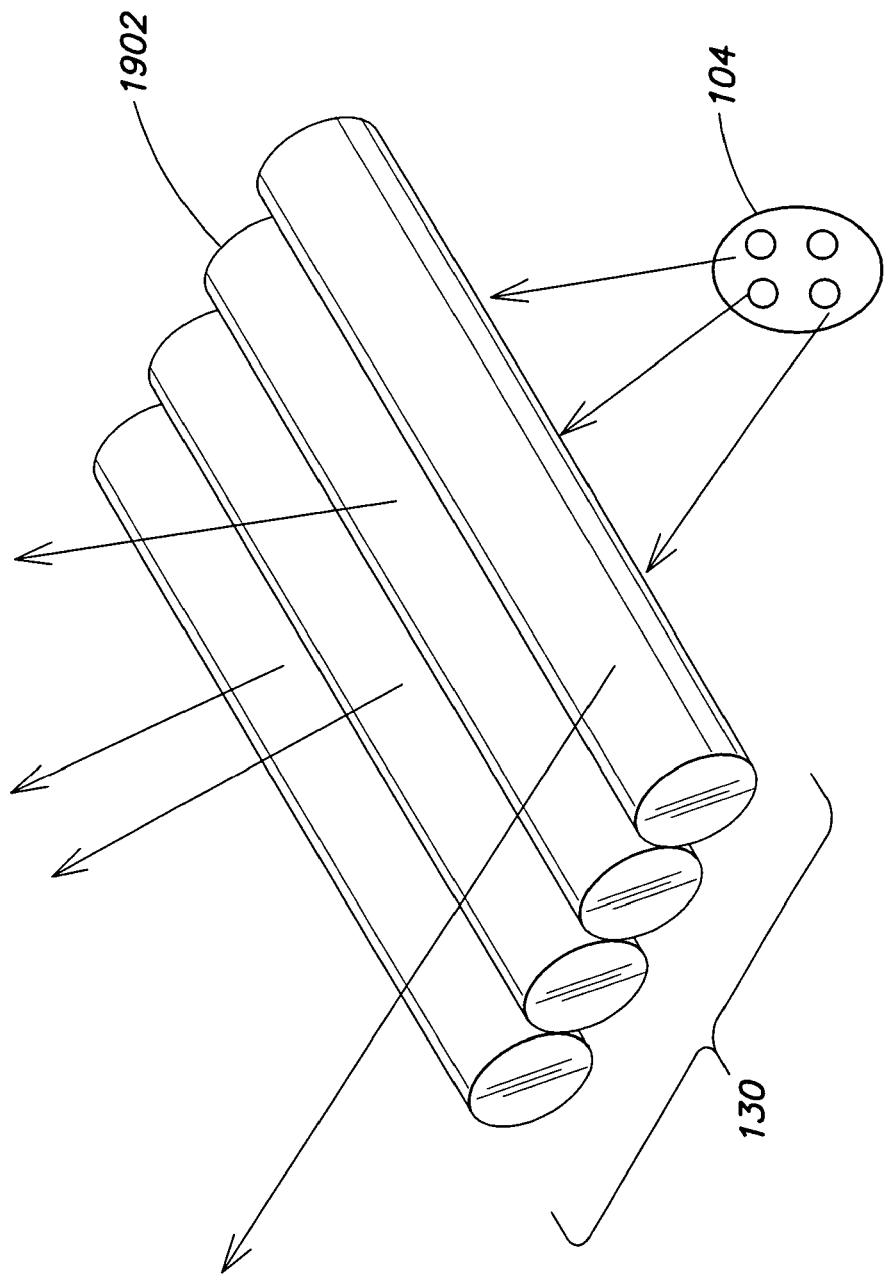
FIG. 19 depicts an optical facility with a plurality of cylindrical elements.

Referring to FIG. 19, an optical facility 130 is depicted comprising a plurality of cylindrical lens elements 1902. These cylindrical elements diffract light from a light source 104, producing a variety of patterns of different colors, based on the light from the light source 104. The cylinders may be of a wide variety of sizes, ranging from microlens materials to conventional lenses.

Figure 20:
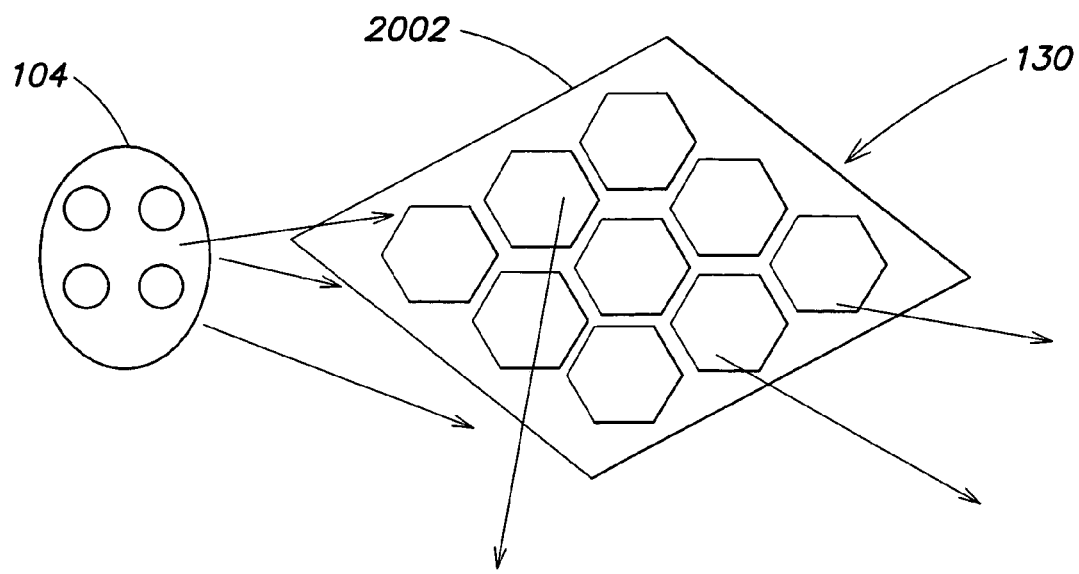
FIG. 20 depicts a microlens array optical facility.

Referring to FIG. 20, a microlens array 2002 is depicted as an optical facility 130. The microlens array 2002 comprises a plurality of microscopic hexagonal lenses, aligned in a honeycomb configuration. Microlenses are optionally either refractive or diffractive, and can be as small as a few microns in diameter. Microlens arrays can be made using standard materials such as fused silica and silicon and newer materials such as Gallium Phosphide, making possible a very wide variety of lenses. Microlenses can be made on one side of a material or with lenses on both sides of a substrate aligned to within as little as one micron. Surface roughness values of 20 to 80 angstroms RMS are typical, and the addition of various coatings can produce optics with very high transmission rates. The microlens array 2002 can refract or diffract light from a light source 104 to produce a variety of effects.

Figure 21:
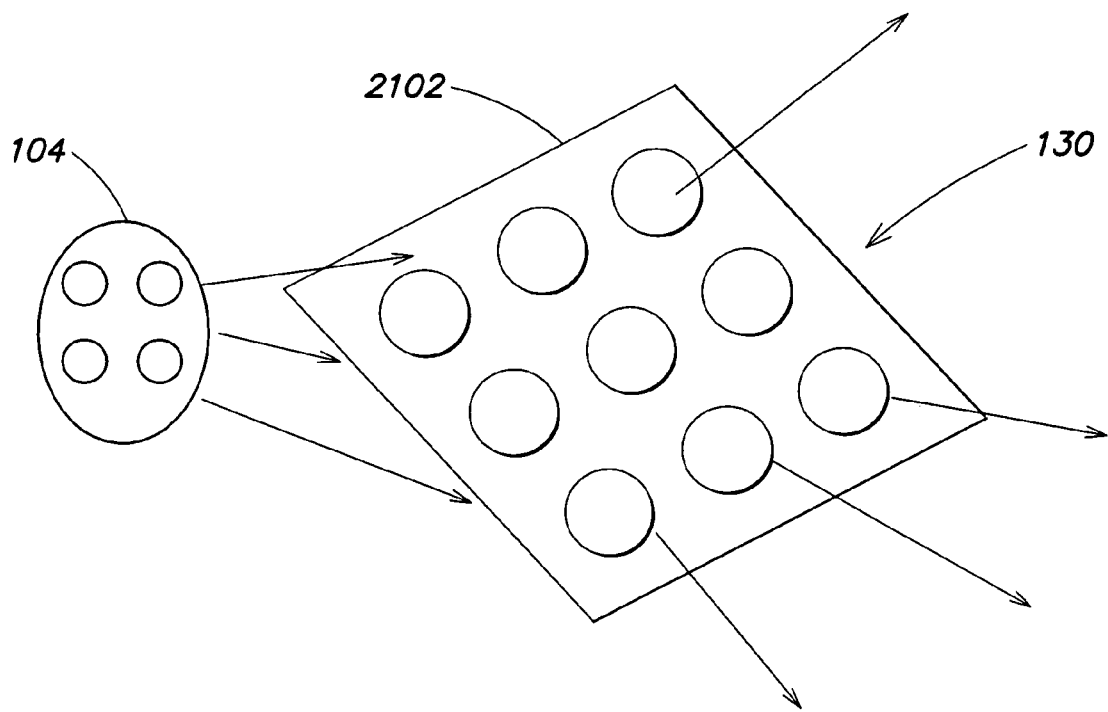
FIG. 21 depicts another configuration of a microlens array optical facility.

Referring to FIG. 21, another microlens array 2102 comprises a plurality of substantially circular lens elements. Again, the array 2102 can be constructed of conventional materials such as silica, with lens diameters on the range of a few microns. The array 2102 can operate on light from a light source 104 to produce a variety of colors and optical effects.

Figure 22:
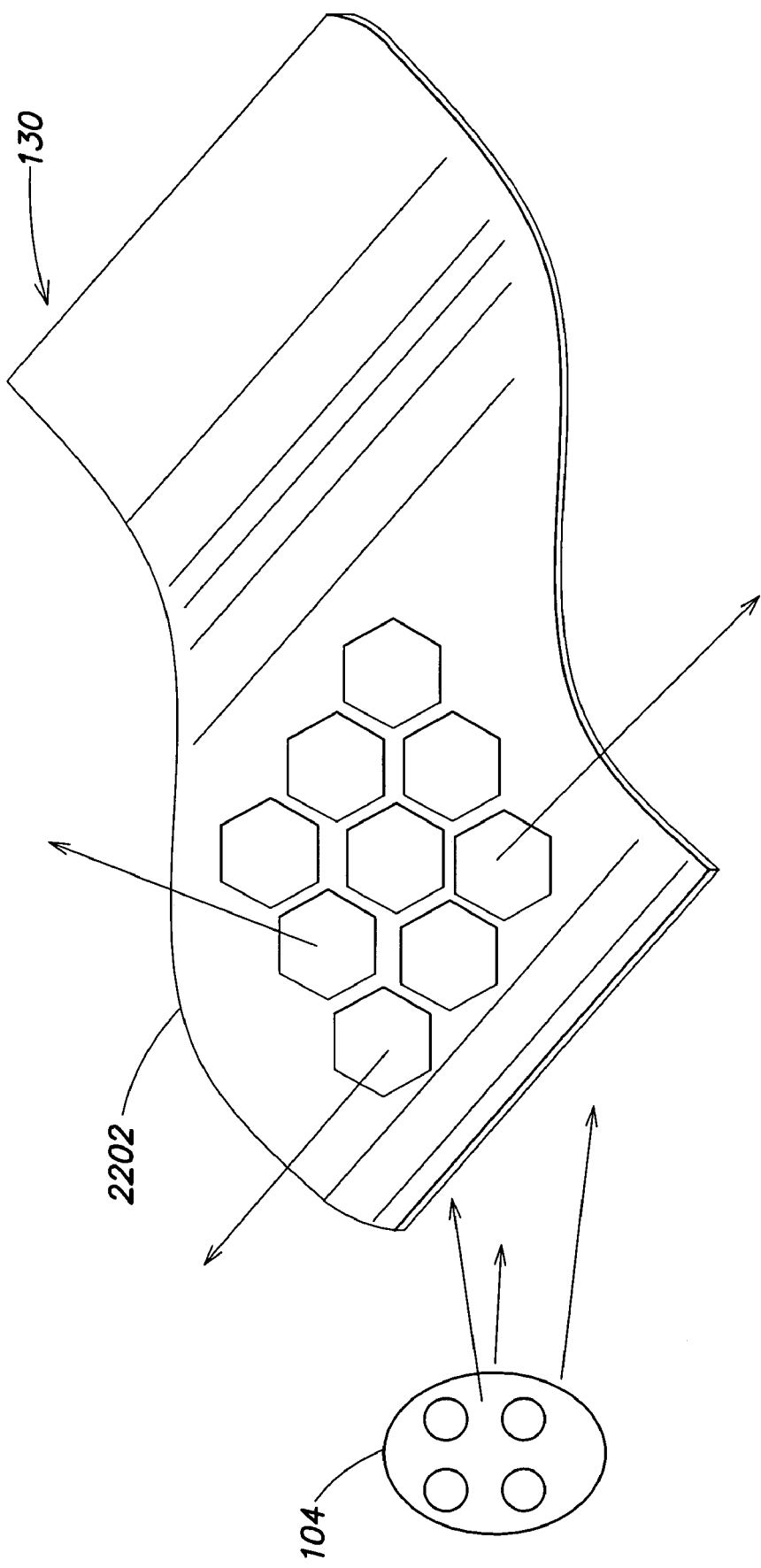
FIG. 22 depicts a flexible materials bearing a microlens array optical facility.

Referring to FIG. 22, a microlens array is disposed in a flexible material 2202, so that the optical facility 130 can be configured by bending and shaping the material that includes the array.

Figure 23:
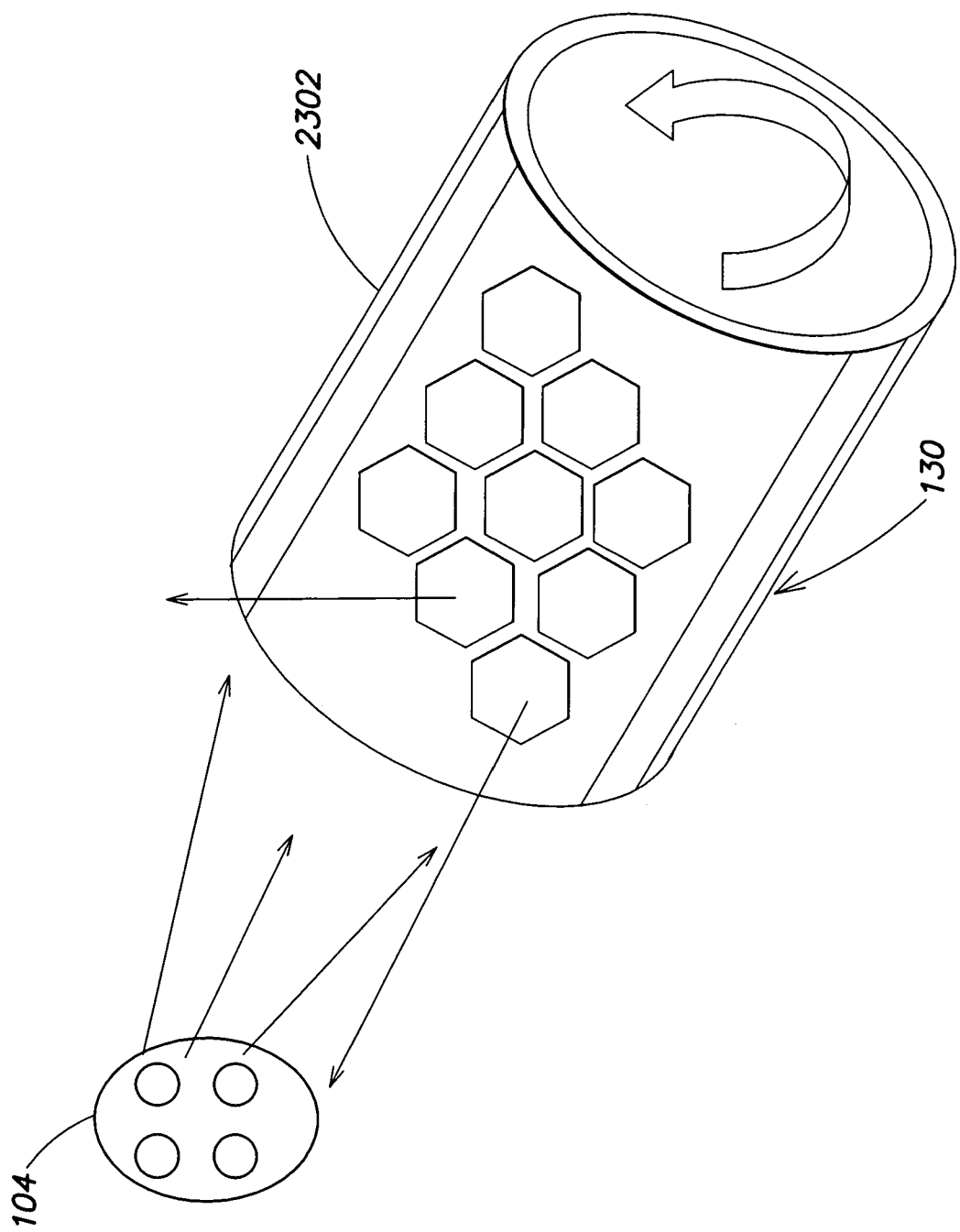
FIG. 23 depicts a cylindrical configuration of a flexible microlens array optical facility.

Referring to FIG. 23, a flexible material microlens array 2302 is rolled to form a cylindrical shape for receiving light from a light source 104. The configuration could be used, for example, as a light-transmissive lamp shade with a unique appearance.

Figure 24:
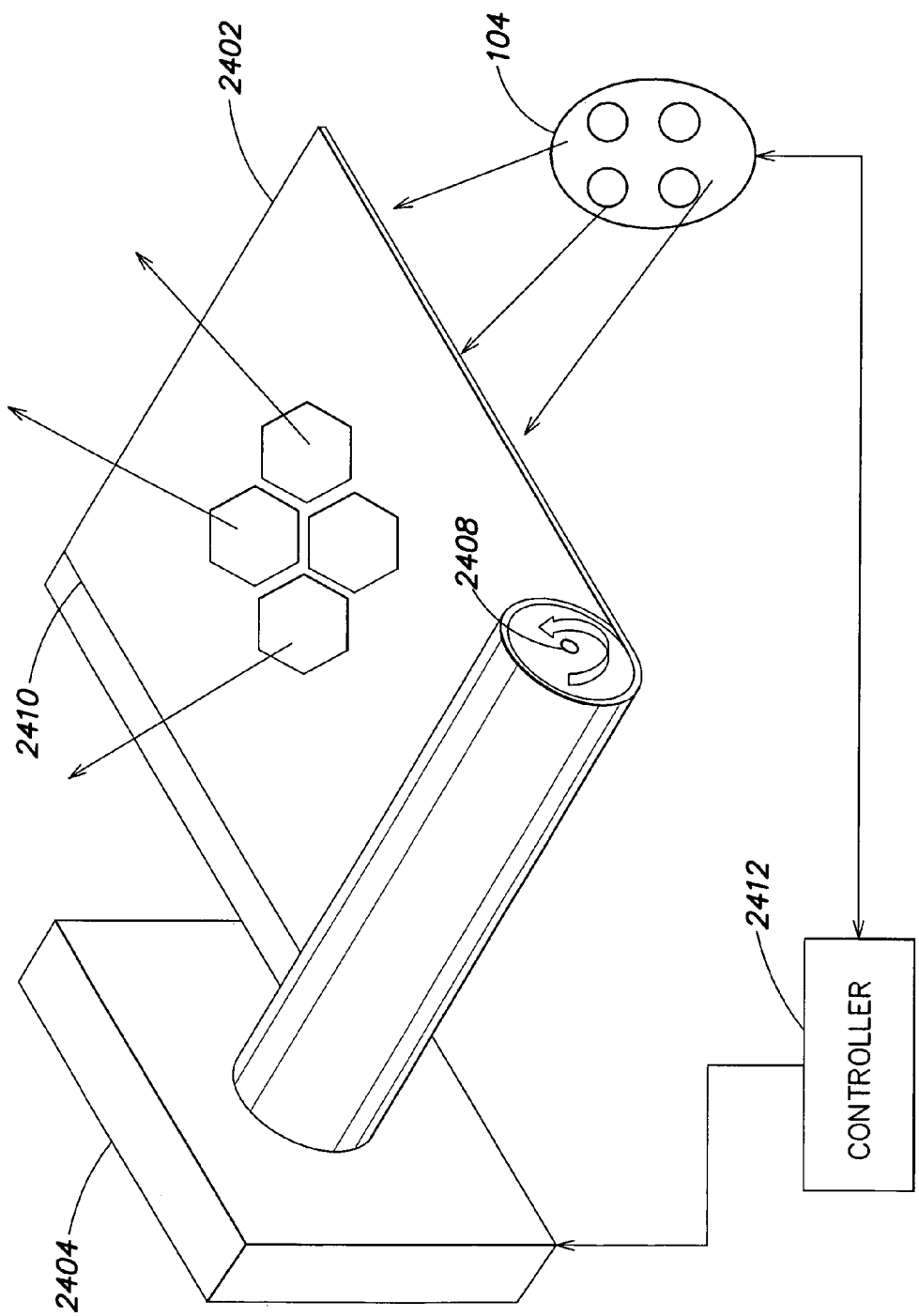
FIG. 24 depicts a system for rolling a flexible microlens array optical facility.

Referring to FIG. 24, a system can be provided to roll a microlens array 2402 about an axis 2408. A drive mechanism 2404 can roll or unroll the flexible array 2402 under control of a controller 2412. The controller can also control a lighting unit 100 (e.g., see the configuration of FIG. 2 and central controller 202), so that the array 2402 is disposed in front of the lighting unit 100 or rolled away from it, as selected by the user. A substantially rigid member 2410 can provide tensile strength to the edge of the flexible material 2402, making it easier to roll the flexible array 2402 as driven by the drive mechanism 2404. The system can be used to alternately offer direct light from the lighting unit 100 or light that is altered by the operation of the array 2402.

Figure 25:
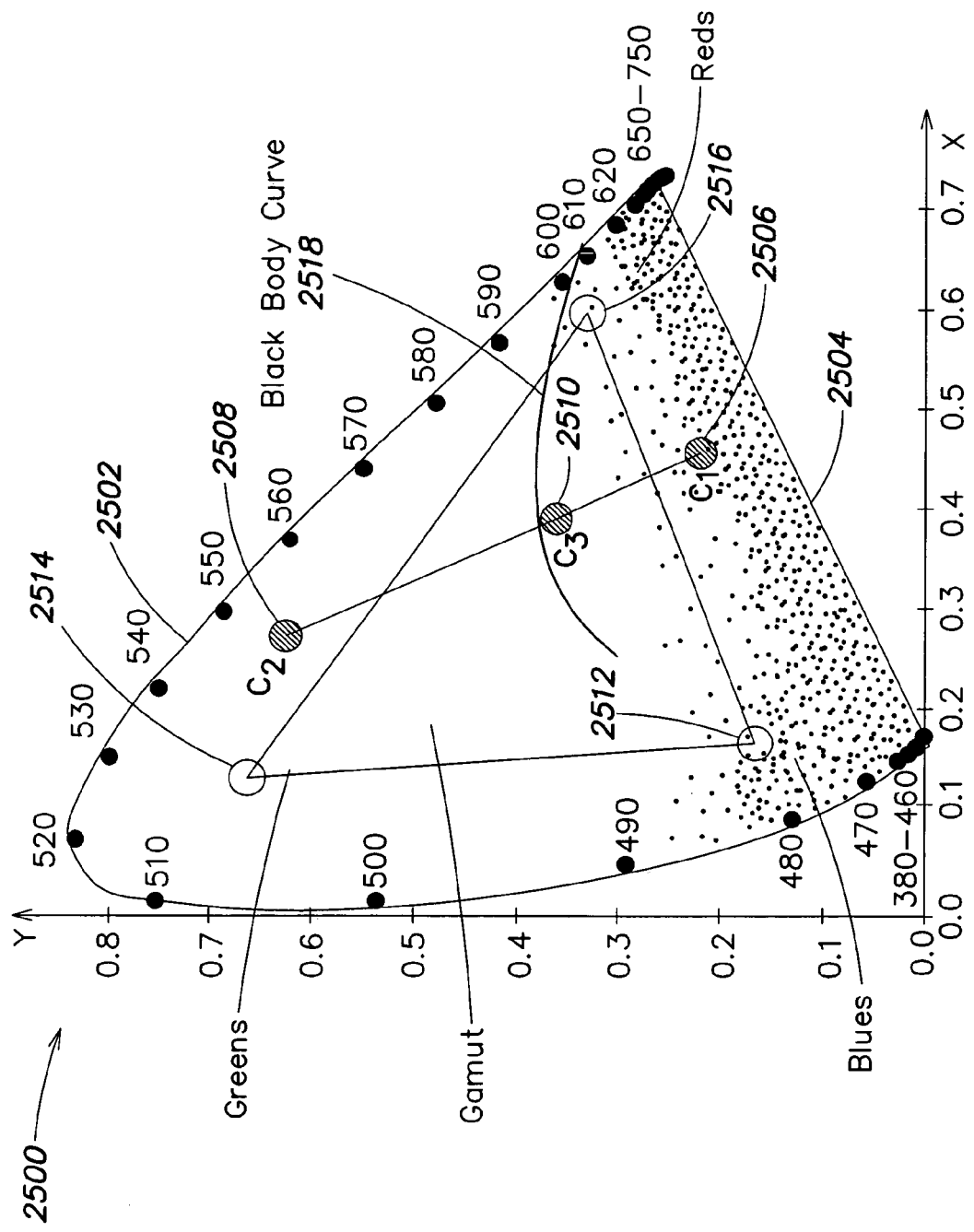
FIG. 25 depicts a chromaticity diagram.

Referring to FIG. 25, a chromaticity chart 2500 represents colors from the 3D color space of human visual perception. Because it is a 2D chart, the diagram 2500 represents only two of the axes, hue and saturation. The form of the chart 2500 is derived from the tri-stimulus values, which are based on measurements of human visual perception. The outer horseshoe curve 2502 is a pure spectral line representing pure wavelengths of color or hue ranging from around 400 nm wavelengths to 700 nm. The line 2504 is the 'purple line' that joins the ends of the spectral curve. No spectral wavelength stimulates these colors in the eye.

All colors that humans perceive fall inside the area defined by the spectral line 2502 and purple line 2504. Given any two source colors, all of the colors that can be made by blending those colors in different amounts will fall on the line that connects them. Binary complementary white for example can be made by two sources C1 2506 and C2 2508 in the diagram 2500 which, in appropriate amounts can form C3 2510.

An extension of this to three colors broadens the gamut of colors considerably. Points 2512, 2514, and 2516 for example form a red, green and blue (RGB) gamut. The three points are the primary colors of the system. The colors inside the triangle represent the color gamut, the colors that can be generated by the system. The exact primary colors are carefully selected to typically give a large gamut.

The outer spectral line 2502 represents the highest degree of purity possible for a color. Moving toward the middle of the area or gamut colors become less saturated; essentially this is adding white to the colors.

A good quality white light, however, is also defined by a color rendering index (CRI) which matches a light source to a palette of colors and provides a weighting across a spectrum of color. An RGB triad of colors typically produces a low CRI, but through the use of white LEDs and phosphors the CRI can be improved greatly. By offering control of different sources, a white lighting unit 100 can move along the black body curve, 2518, generating different color temperatures of white light.

Figure 26:
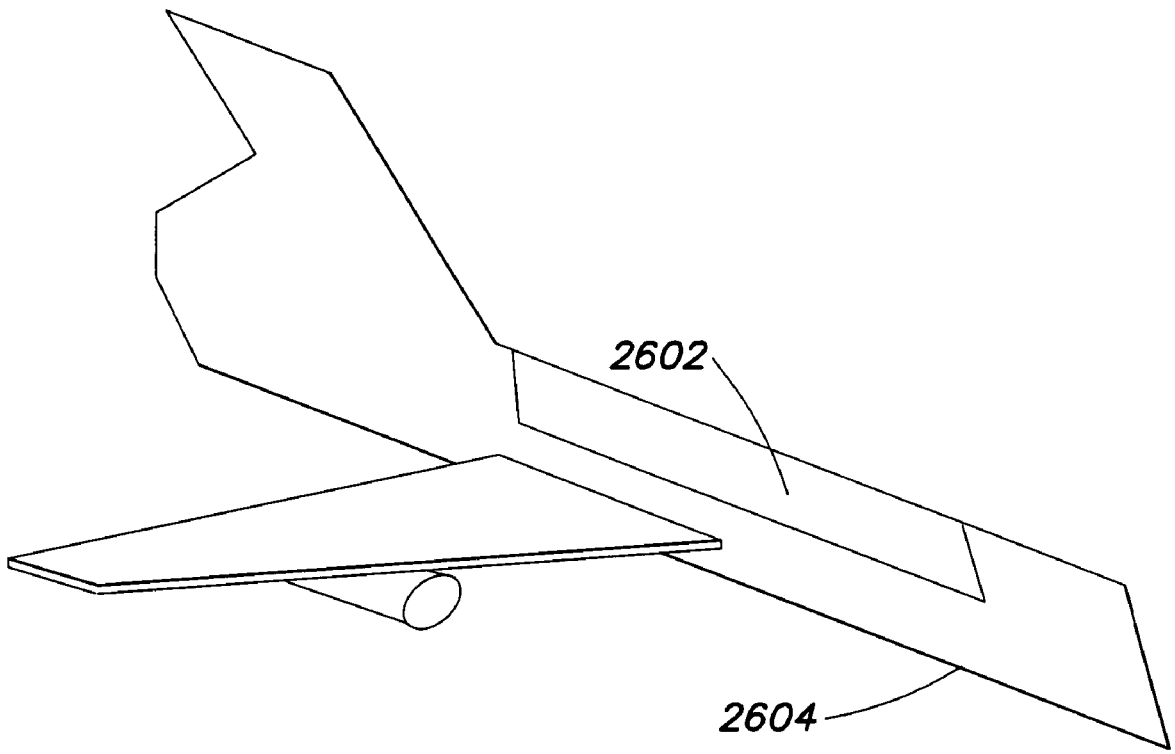
FIG. 26 depicts an airplane environment for a lighting system.

FIG. 26 depicts an airplane environment 2604 for a lighting system of the various embodiments described herein. One or more lighting units 100 can be disposed in the interior cabin 2602 or on the exterior to produce color-changing illumination. Further details are described in the applications incorporated by reference herein.

Figure 27:
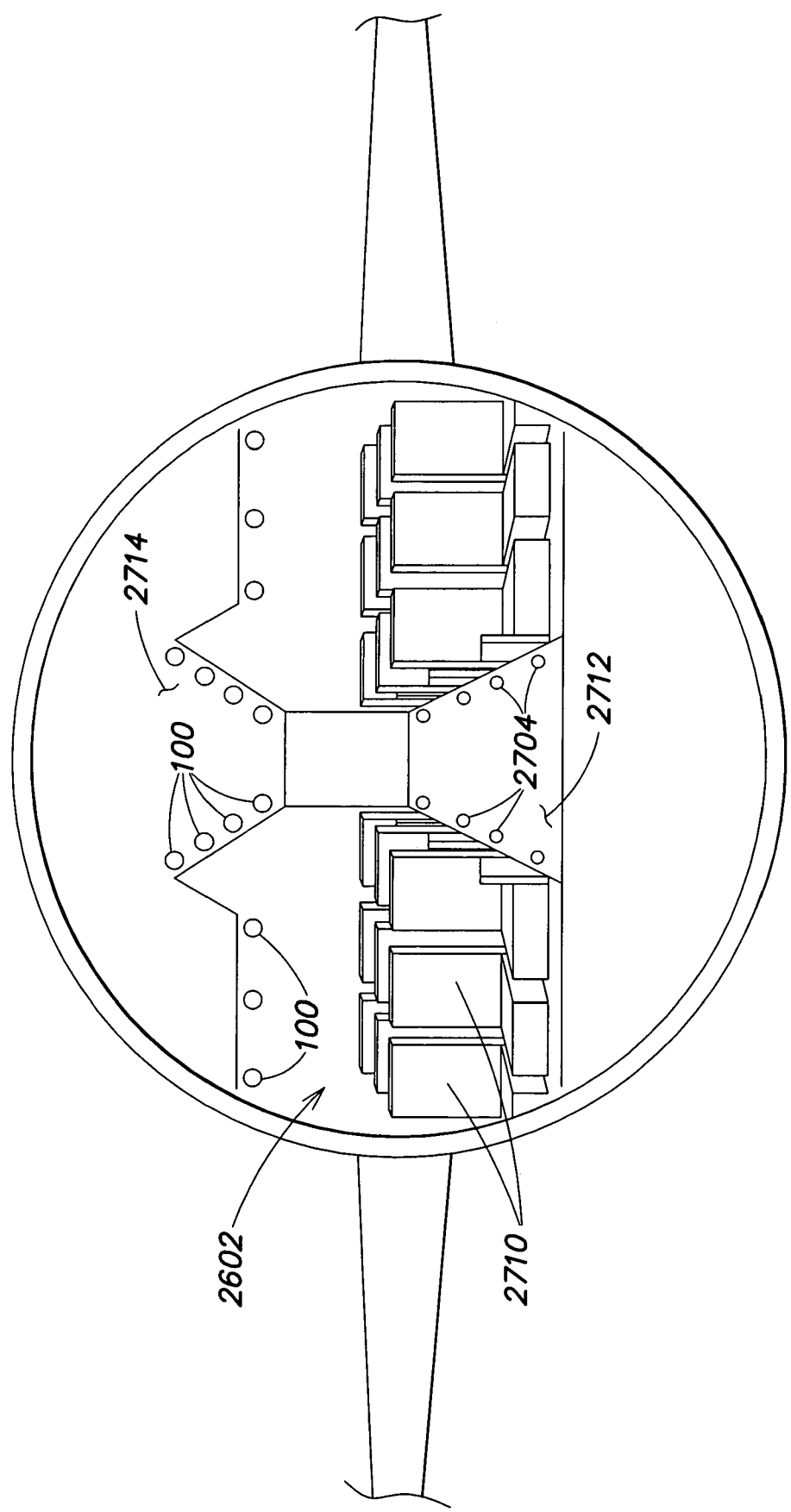
FIG. 27 depicts an airplane interior environment for a multi-purpose lighting system.

FIG. 27 depicts an airplane interior 2602 with a plurality of lighting units 100. The lighting units can be used on the interior ceiling 2714 or along the floor 2712, such as being used as directional lights 2704. The lights can be used to light the seating environment 2710. In embodiments, lighting units 100 can alternatively provide white light illumination or colored light illumination to the environment 2602, such as under the control of a central controller 202 as described in connection with FIG. 2. In embodiments the lighting can be controlled in coordination with other computer systems, such as the airplanes primary computer system. The lighting units 100 can thus be used to provide aesthetic lighting, alarm lighting, safety lighting, lighting entertainment, indication of conditions or data, or many other purposes. In embodiments the lights can change color and color temperature to mimic the daylight cycle, offering a variety of conditions based on time of day.

Figure 28:
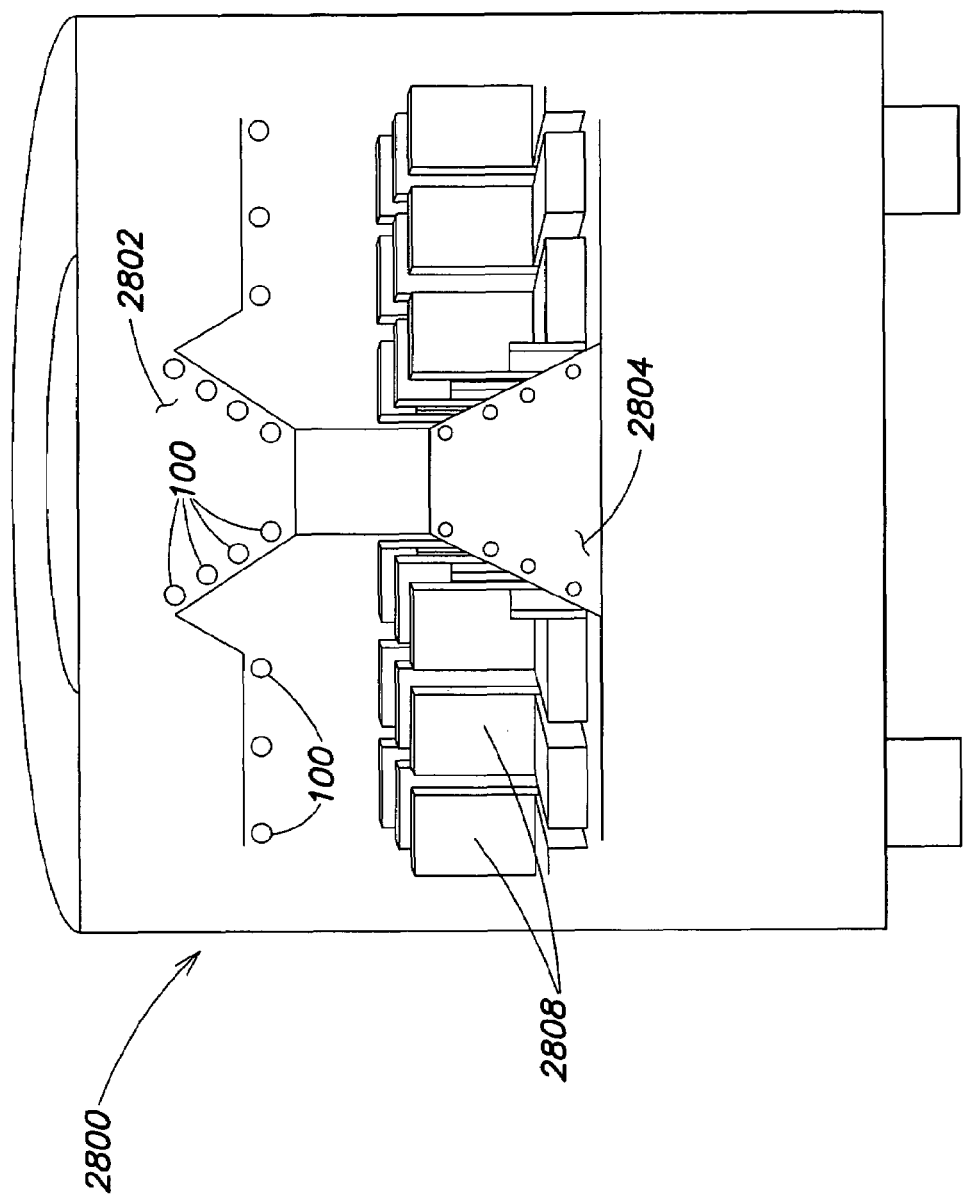
FIG. 28 depicts a vehicle environment for a multi-purpose lighting system.

FIG. 28 depicts the interior of a vehicle, such as a bus 2800. Lighting units 100 can be disposed along the ceiling 2802, above seats 2808, or along the aisle 2804, to provide a variety of illumination effects, ranging from white light illumination or varying color temperatures to colored lighting for aesthetic, indication, safety, data, warning, entertainment or other purposes. In each case the lights can have separate controllers or can be governed by a central controller 202, which may optionally be made part of the control system for the vehicle 2800.

Figure 29:
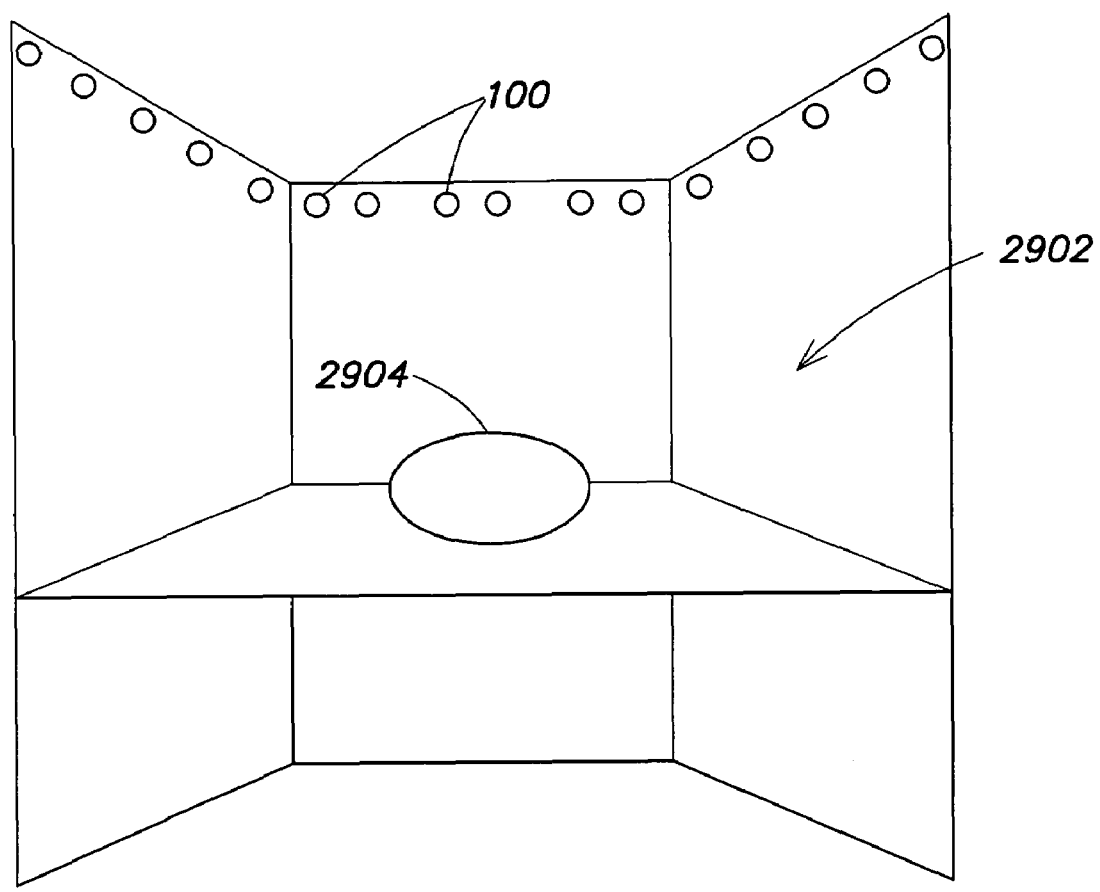
FIG. 29 depicts an environment for lighting an object under display.

FIG. 29 depicts a system 2902 for lighting an object 2904 to be displayed. Lighting units 100 can light the object 2904, such as under control of a processor 102. In embodiments the processor 102 may be integrated with another computer system, such as a conventional lighting system, or a computer system for controlling an environment, such as a safety system, a heating or cooling system, a security system, or the like. The lighting units 100 for lighting the object can include elements for producing both multi-colored light and white light, such as described in connection with FIG. 3. Thus, the lighting systems can light the object 2904 with conventional white light (including of selected color temperatures) as well as with non-white light (such as to produce aesthetic effects, to provide a warning, to provide an indication of a condition, or the like).

One such environment 2902 where objects are displayed is a retail environment. The object 2904 might be an item of goods to be sold, such as apparel, accessories, electronics, toys, food, or any other retail item. The lighting units 100 can be controlled to light the object 2904 with a desired form of lighting. For example, the right color temperature of white light can render the item in a true color, such as the color that it will appear in daylight. This may be desirable for food items or for apparel items, where color is very significant. In other cases, the lighting units 100 can light the item with a particular color, to draw attention to the items, such as by flashing, by washing the item with a chasing rainbow, or by lighting the item with a distinctive color. In other cases the lighting can indicate data, such as rendering items that are on sale in a particular color, such as green. The lighting can be controlled by a central controller, so that different items are lit in different colors and color temperatures along any timeline selected by the user. Lighting systems can also interact with other computer systems, such as cards or handheld devices of a user. For example, a light can react to a signal from a user's handheld device, to indicate that the particular user is entitled to a discount on the object 2904 that is lit in a particular color when the user is in proximity. The lighting units 100 can be combined with various sensors that produce a signal source 124. For example, an object 2904 may be lit differently if the system detects proximity of a shopper.

Objects 2904 to be displayed under controlled lighting conditions also appear in other environments, such as entertainment environments, museums, galleries, libraries, homes, workplaces, and the like.

Figure 30:
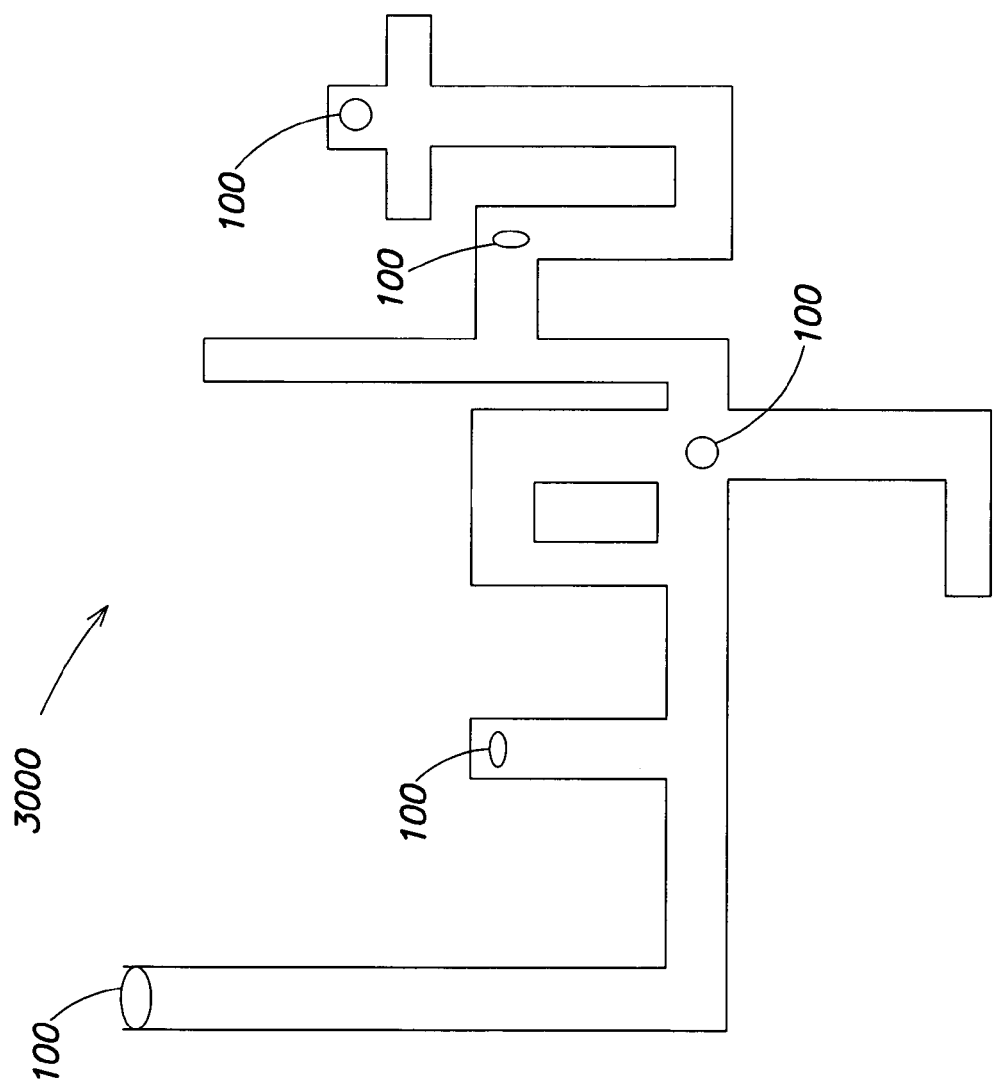
FIG. 30 depicts a sign that includes one or more lighting units.

Referring to FIG. 30, lighting units 100 can be configured to light a sign 3000. In embodiments the sign 3000 can be made of light-transmissive materials, such as disclosed in connection with FIG. 17. Thus, a sign 3000 can glow with light from the lighting units 100, similar to the way a neon light glows. The sign 3000 can be configured in letters, symbols, numbers, or other configurations, either by constructing it that way, or by providing sub-elements that are fit together to form the desired configuration. The light from the lighting units 100 can be white light, other colors of light, or light of varying color temperatures. In an embodiment the sign 3000 can be made from a kit that includes various sub-elements, such as curved elements, straight elements, "T" junctions, "V-" and "U-" shaped elements, and the like.

Figure 31:
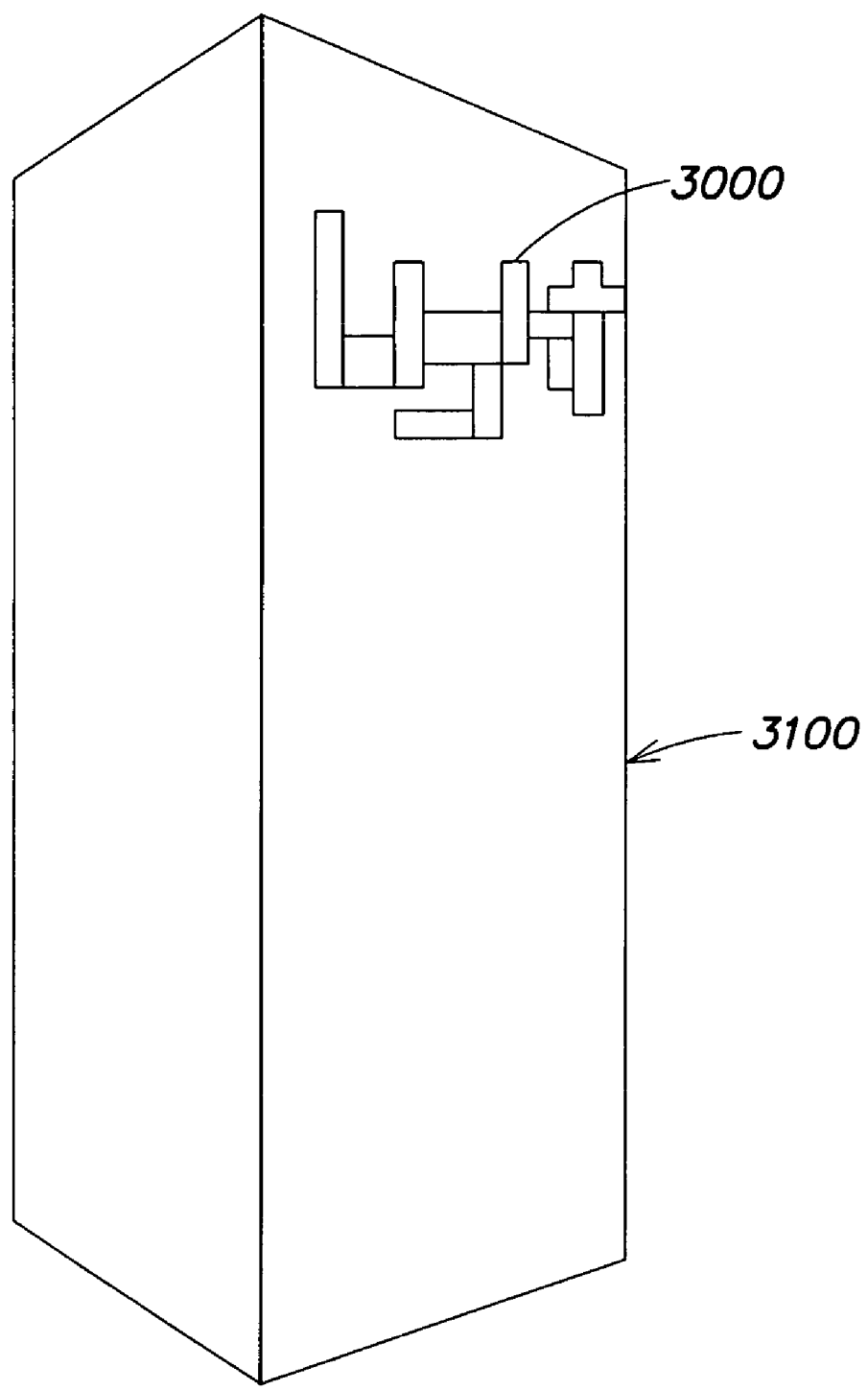
FIG. 31 depicts an exterior sign with one or more lighting units.

Referring to FIG. 31, a sign 3000 can be disposed on the exterior of a building 3100. Such a sign 3000 can be displayed many other places, such as inside a building, on a floor, wall, or ceiling, in a corridor, underwater, submerged in a liquid other than water, or in many other environments.

Figure 32:
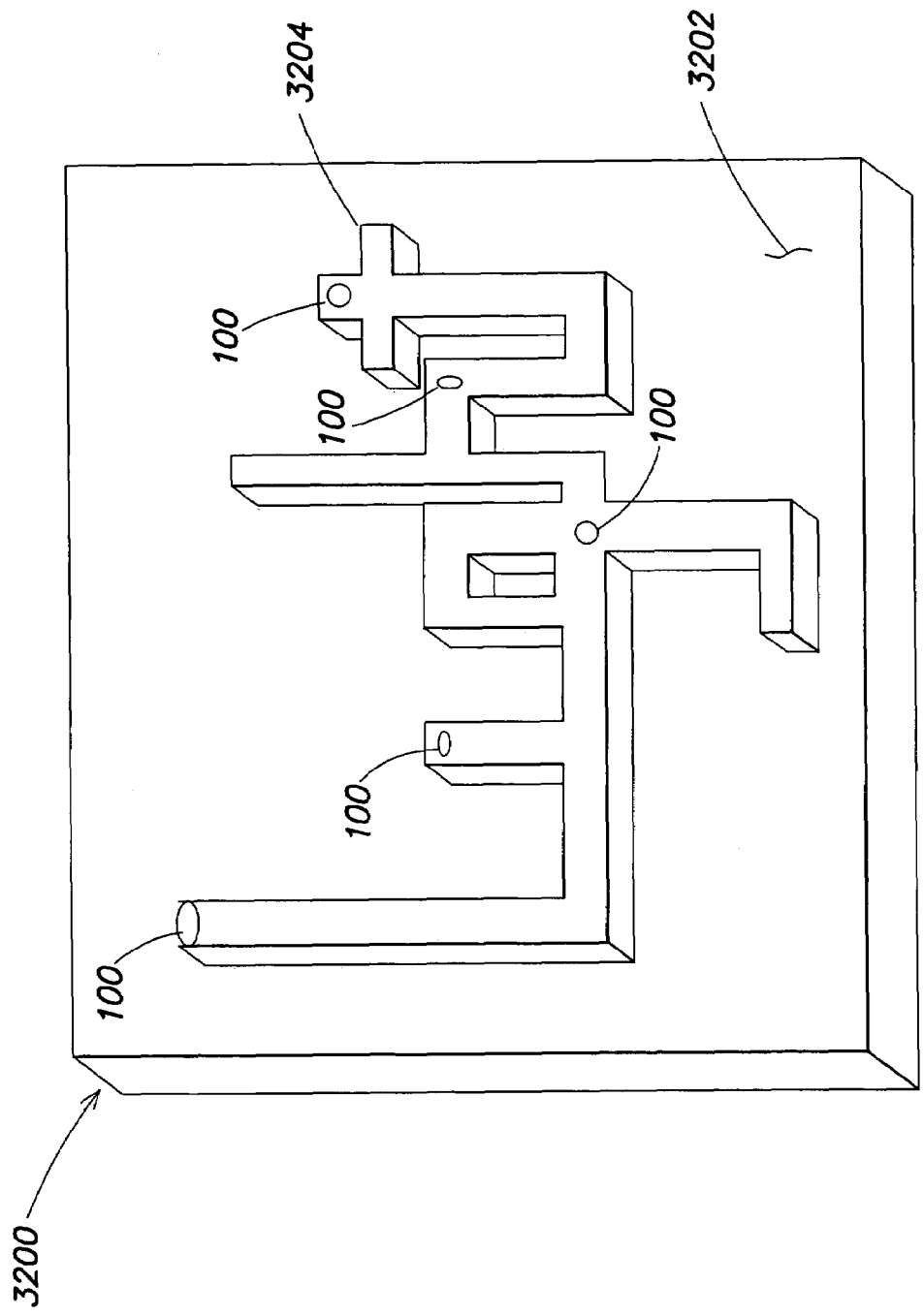
FIG. 32 depicts another embodiment of a sign lighting system.

Referring to FIG. 32, a sign 3200 can comprise of a backlit display portion 3202 and a configuration 3204, such as of letters, numbers, logos, pictures, or the like. The lighting of the backlit portion 3202 and the configuration 3204 can be coordinated to provide contrasting colors and various aesthetic effects.

Figure 33:
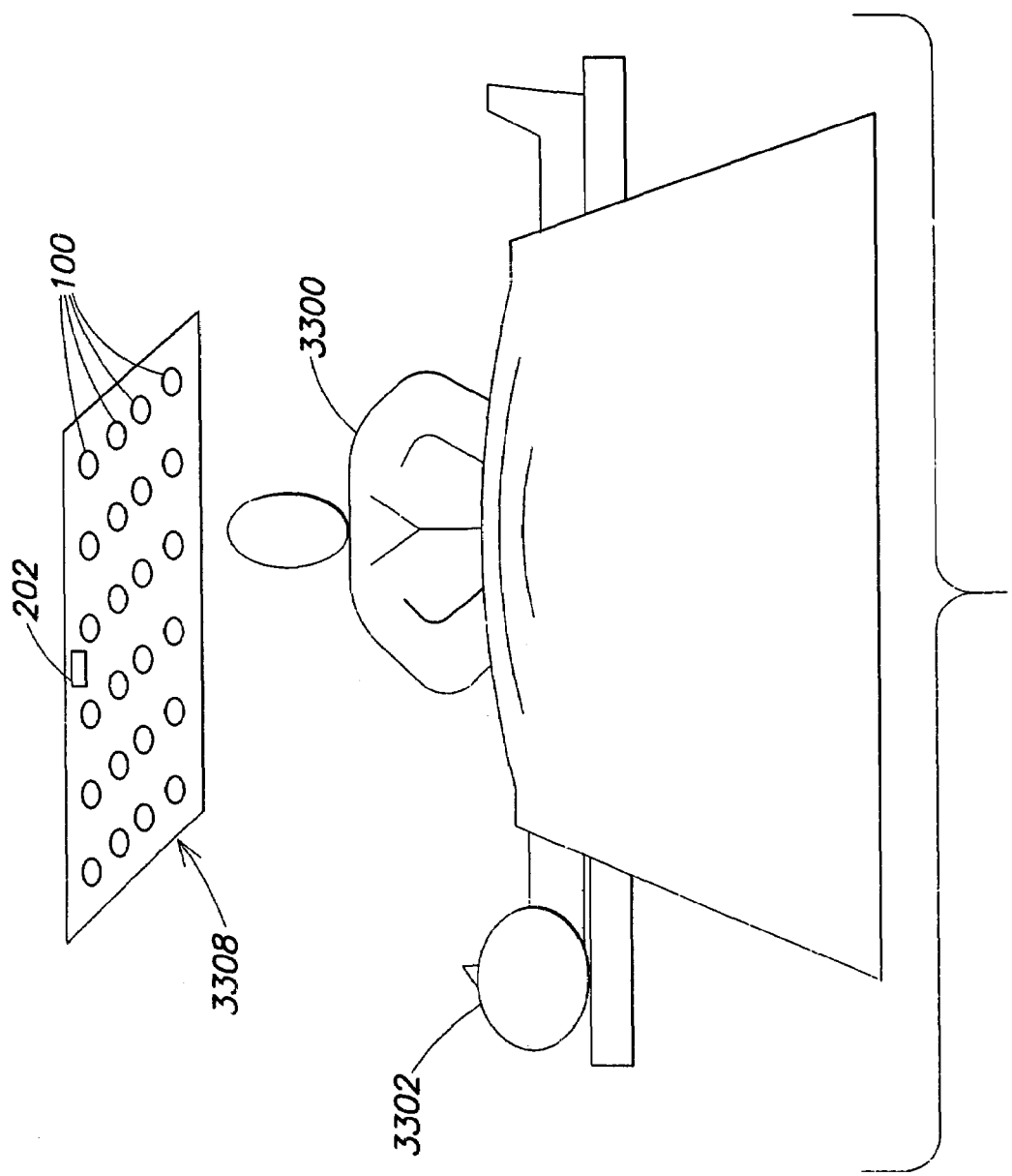
FIG. 33 depicts a medical environment for a lighting system.

Referring to FIG. 33, a medical environment is depicted in which a health care provider 3300 provides health care services to a patient 3302 under a lighting system 3308 that includes a plurality of lighting units 100. The lighting units 100 can produce white light, such as white light of a selected color temperature, as well as colored light. In embodiments, the lighting system 3308 can provide both white and non-white light under control of a processor 202. The processor 202 can be part of another lighting system, such as the lighting system for an operating theatre, emergency room, or other medical environment. The lighting system 3308 can be used to provide controlled light to the area of the patient 3302. Control of the light can be by direct control or by remote control. The health care provider 3300 or other operator can control the light system 3308 to provide exactly the desired lighting conditions. For example, a surgeon may have strong preferences for a given color or color or color temperature of light, while another surgeon may have different preferences. The system 3308 allows each one to select a preferred color and color temperature. Also, during a procedure, such as a surgery, it may be desirable to change the lighting conditions. For example, an artery, being red, will appear more vivid under red light, while a vein would appear more vivid under blue light. Accordingly, depending on the particular system being viewed, the health care provider may change the light to fit the circumstances. Other medical applications may also benefit from changing lighting conditions under control; for example, a provider may wish to view an x-ray, chart, graph, picture, or other test result under ideal illumination conditions, or to view a patient under such conditions, such as to observe skin color or the like.

Figure 34:
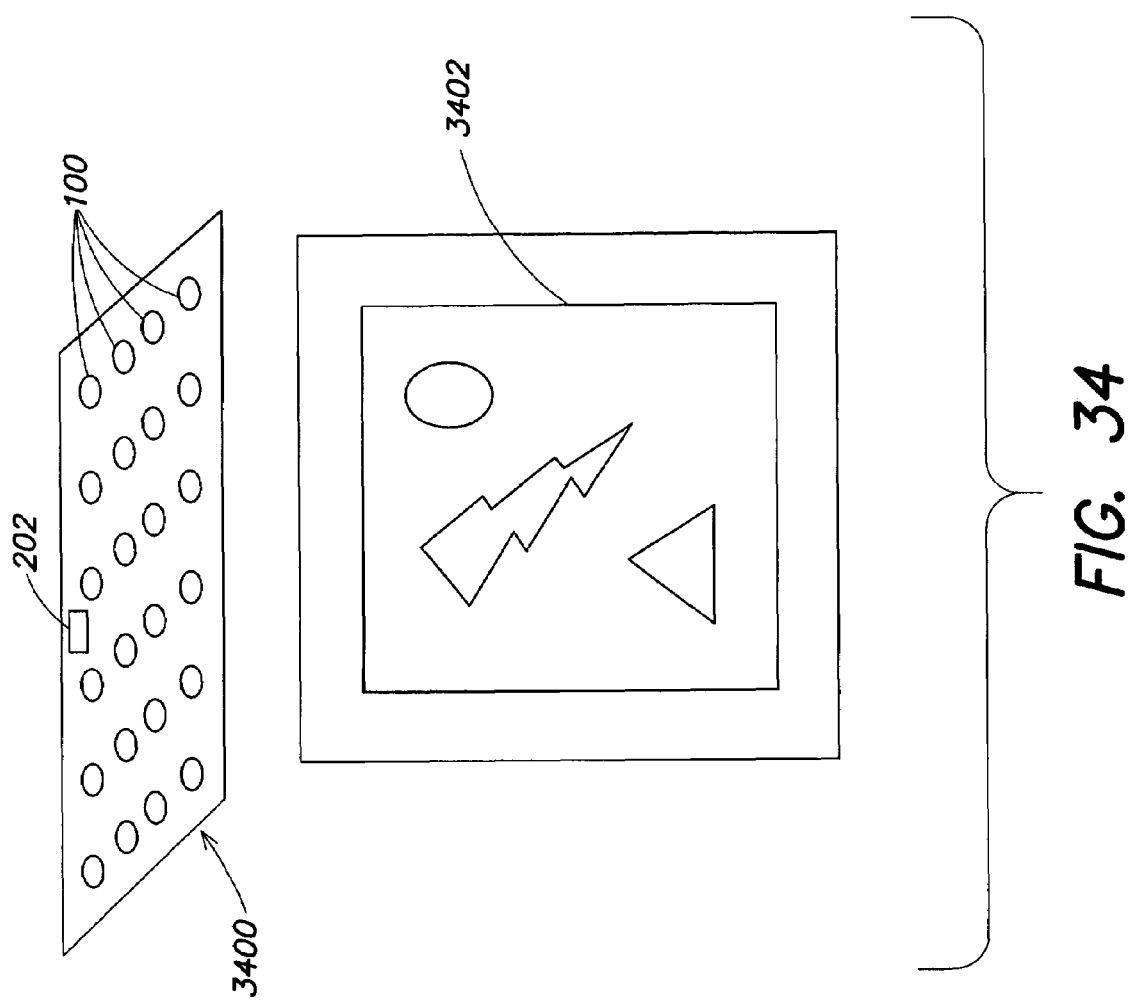
FIG. 34 depicts an art object under a lighting system.

Referring to FIG. 34, a lighting system 3400 with lighting units 100 under control of a processor 202 is used to light an object of art 3402. In environments where art is displayed, such as museums, galleries, homes, workplaces, theatres and the like, it may be desirable to show an object under a selected color temperature of white light, which is allowed by the lighting units 100. However, the ideal color and color temperature may vary according to the time of day, the ambient lighting conditions, the object being viewed, and the preferences of the viewer. Thus, it is preferable to allow for control of the color and color temperature, to produce ideal viewing conditions. In embodiments, the lighting system 3400 is integrated with another computer system, such as the lighting system for the environment, a security system, an alarm system, or the like, so that a caretaker for the environment can provide the desired lighting conditions for each object 3402, across various timelines. In embodiments the art object 3402 may be designed to take advantage of color changes, such as by including various different colors that emerge or recede depending on the color of light illuminating them from the lighting system 3400. Thus, the art object 3402 can be dynamic, based on the lighting from the lighting units 100, and the dynamic aspect of the object 3402 can be part of the design of the art object 3402.

Figure 35:
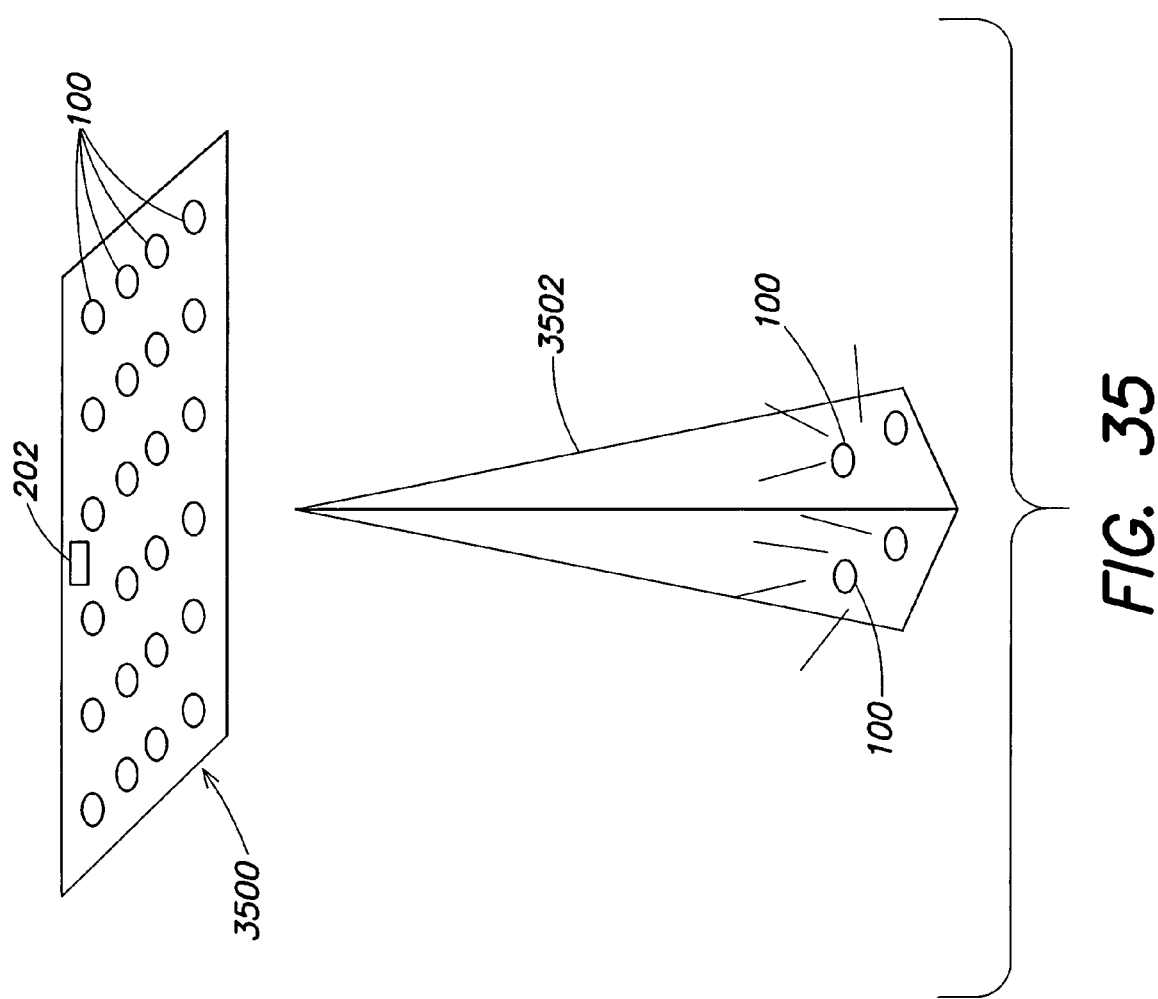
FIG. 35 depicts a three-dimensional object under a lighting system.

Referring to FIG. 35, an object 3502 is lit by a lighting system 3402. In this case the object 3502 is a three-dimensional object. The object 3502 can also be lit internally, to provide its own illumination. Thus, the object 3502 can include color and color temperature of light as a medium, which can interact with changes in color and color temperature from the lighting system 3402.

Figure 36:
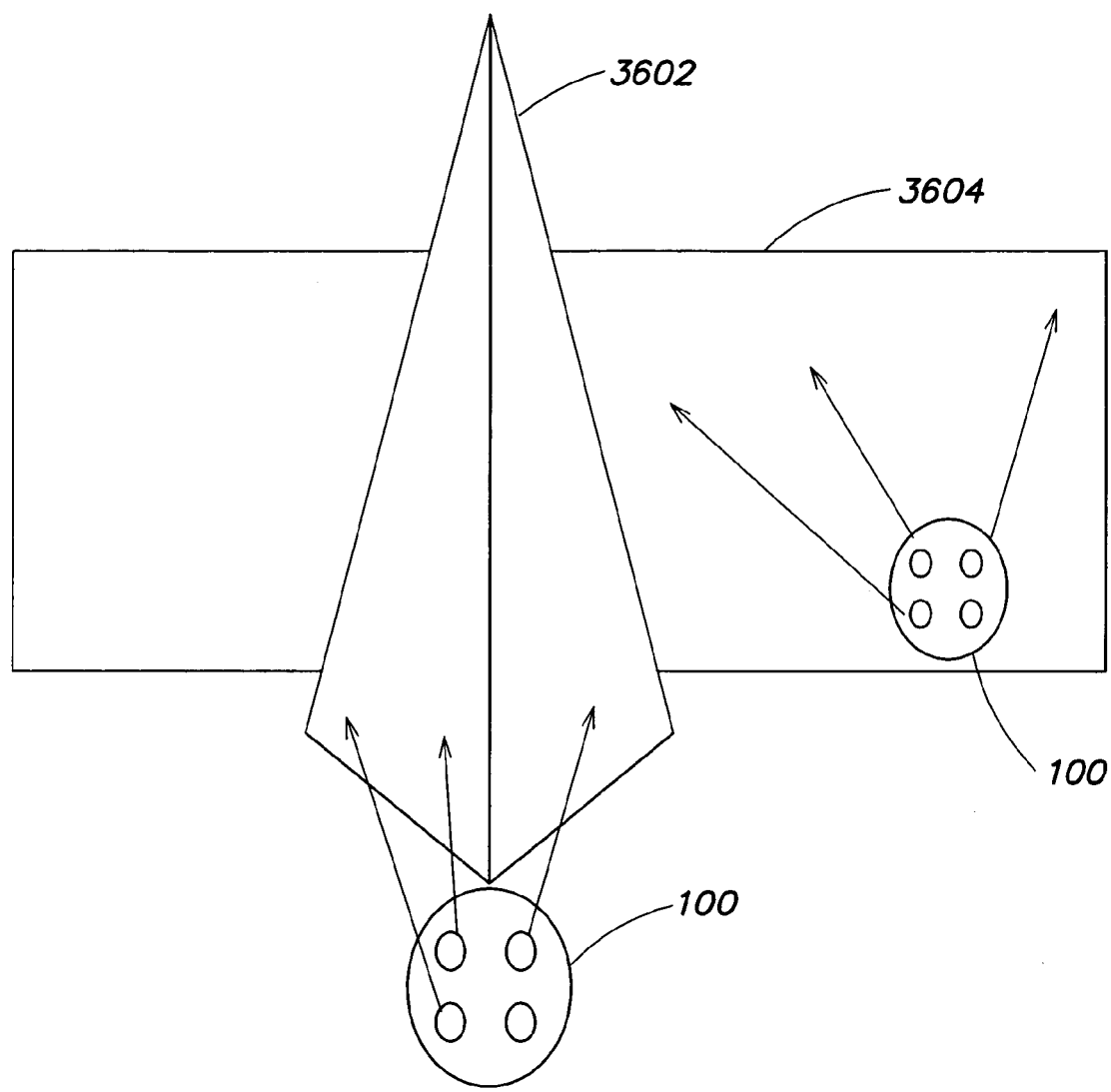
FIG. 36 depicts a foreground object and a background, both with lighting systems.

FIG. 36 depicts a foreground object 3602 and a background 3604, both with lighting units 100. Thus, both the foreground object 3602 and the background 3604 can be illuminated in various colors, intensities or color temperatures. In an embodiment, the illumination of the foreground object 3602 and the background 3604 can be coordinated by a processor 102, such as to produce complementary illumination. For example, the colors of the two can be coordinated so that the color of the background 3604 is a complementary color to the color of the foreground object 3602, so when the background 3604 is red, the foreground object 3602 is green, etc. Any object 3602 in any environment can serve as a foreground object 3602. For example, it might be an item of goods in a retail environment, an art object in a display environment, an emergency object in a safety environment, a tool in a working environment, or the like. For example, if a processor 102 is part of a safety system, the object 3602 could be a fire extinguisher, and the background 3604 could be the case that holds the extinguisher, so that the extinguisher is illuminated upon a fire alert to make it maximally noticeable to a user. Similarly, by managing the contrast between the background 3604 and the object 3602, an operator of a retail environment can call attention to the object 3602 to encourage purchasing.

Figure 37:
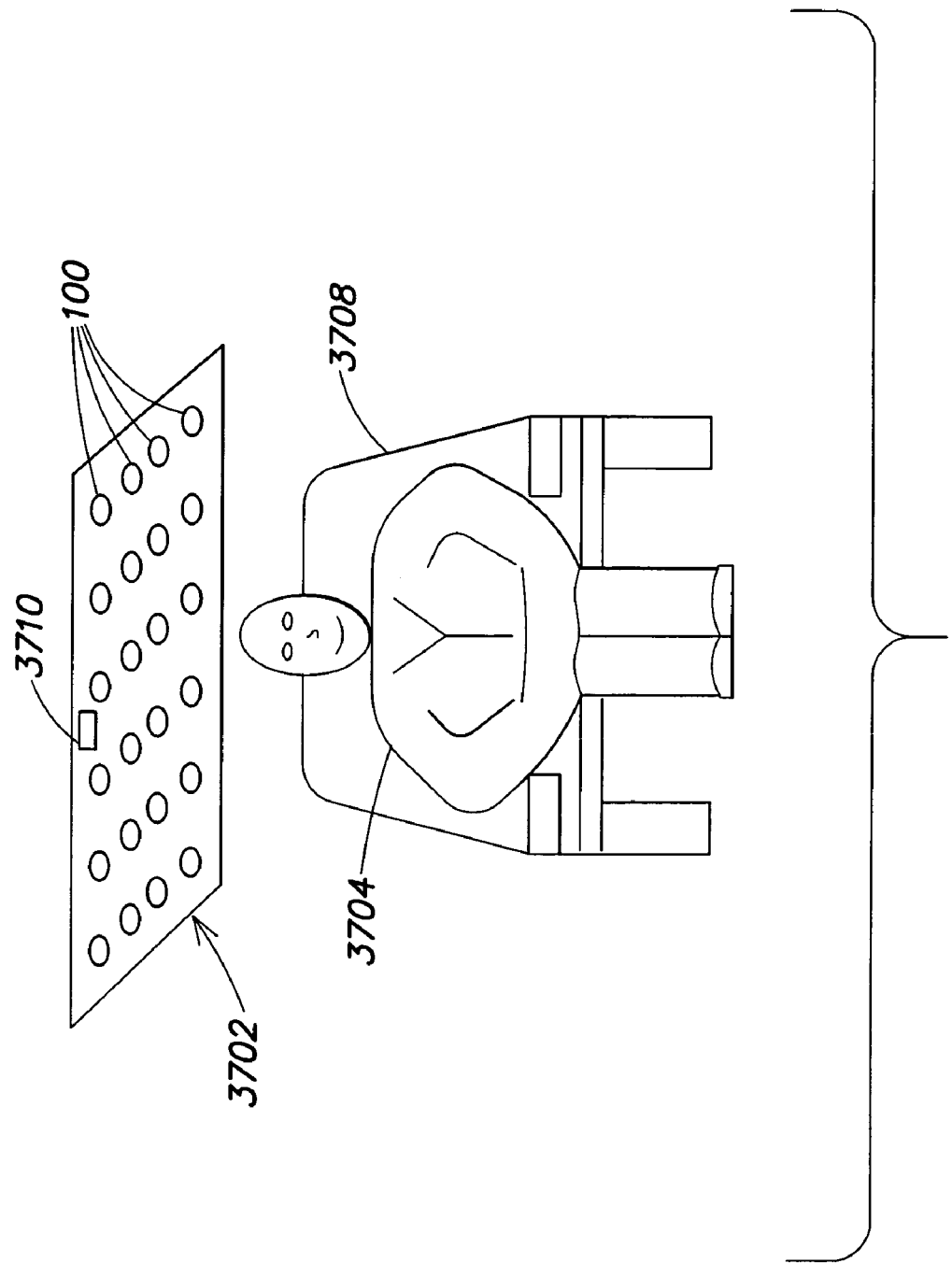
FIG. 37 depicts a person in a seat under a lighting system.

FIG. 37 depicts a person 3704 in a seat 3708 under a lighting system 3702 that has a processor 3710. The seat 3708 is positioned to allow illumination of the person 3704 by the lighting system 3702, which can contain lighting units 100 to provide color-controlled illumination, including white, as well as non-white illumination of varying intensity and color temperatures. The seat 3708 could be any type of seat in any environment, such as a barber's chair, a beauty shop chair, a dental chair, a chair in a retail shop, a health care chair, a theatre seat, a transportation seat, an airline seat, a car seat, a bus seat, or the like. Under control of the processor 3710, the lighting system 3702 can light the seat 3708 and the area of the person 3704 as desired by the operator of the system 3702, which may be the person 3704 or another person. For example, a dentist can adjust the color or color temperature of light to provide an accurate rendition of the appearance of the mouth of the user, such as to show tooth color as it will appear under sunlight. Similarly, a beauty shop operator or barber can show hair color, makeup color, or the like, as those features will appear in various lighting environments, ranging from sunlight to indoor environments. The operator of a seating environment for an entertainment venue, such as a movie theatre, playhouse, airline seat, other transportation seat, or the like, can produce light shows with the system 3702, on any desired timeline, including in coordination with other entertainment, such as music, television programming, movies, video games, or the like. Thus, the methods and systems described throughout this specification can be applied more generally to provide lighting to a seating environment with a seat 3708.

Figure 38:
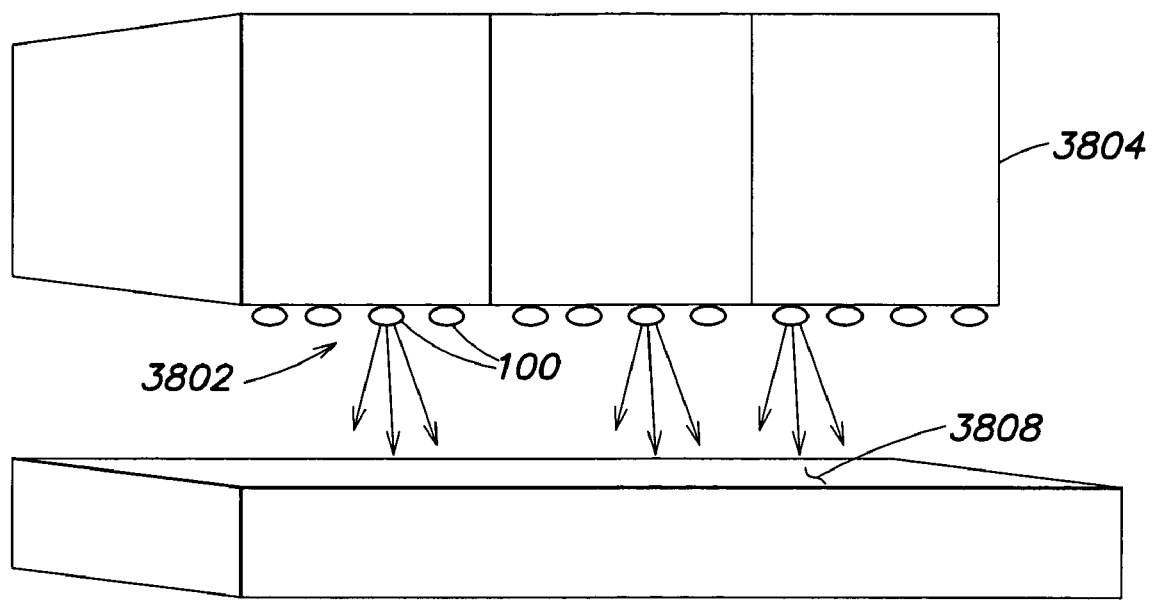
FIG. 38 depicts a lighting system in a cabinet environment.

FIG. 38 depicts a lighting system 3802 with lighting units 100 in the environment of a cabinet 3804. In one preferred embodiment, a linear cabinet lighting system 3802 provides both white and non-white colored lighting under control of a controller 202 as shown in FIG. 2, for example. The environment optionally contains a surface 3808 below the cabinet 3804, such as a counter or workspace. The cabinet 3802 can have doors, or it could be an open cabinet 3802, such as with shelves. It is often desirable to have under-cabinet lighting, to light a surface or workspace. Depending on the environment, it may be desirable to have a lighting system 3802 designed to illuminate the under-cabinet region with light of varying color, color temperature, intensity and saturation, such as lighting of both white and non-white colors. Lighting systems of varying configurations can be used, such as a linear lighting system 3802, a curvilinear system, or lights of various configurations, such as described in connection with FIG. 3. In embodiments, the lighting system 3802 can be designed with a low profile, to minimize incursion in the under-cabinet area. In other embodiments, the surface 3808 can be configured, designed, or modified to interact with the lighting system 3802, such as to highlight color changes, such as by including thereon patterns that animate in the presence of color changes.

Figure 39:
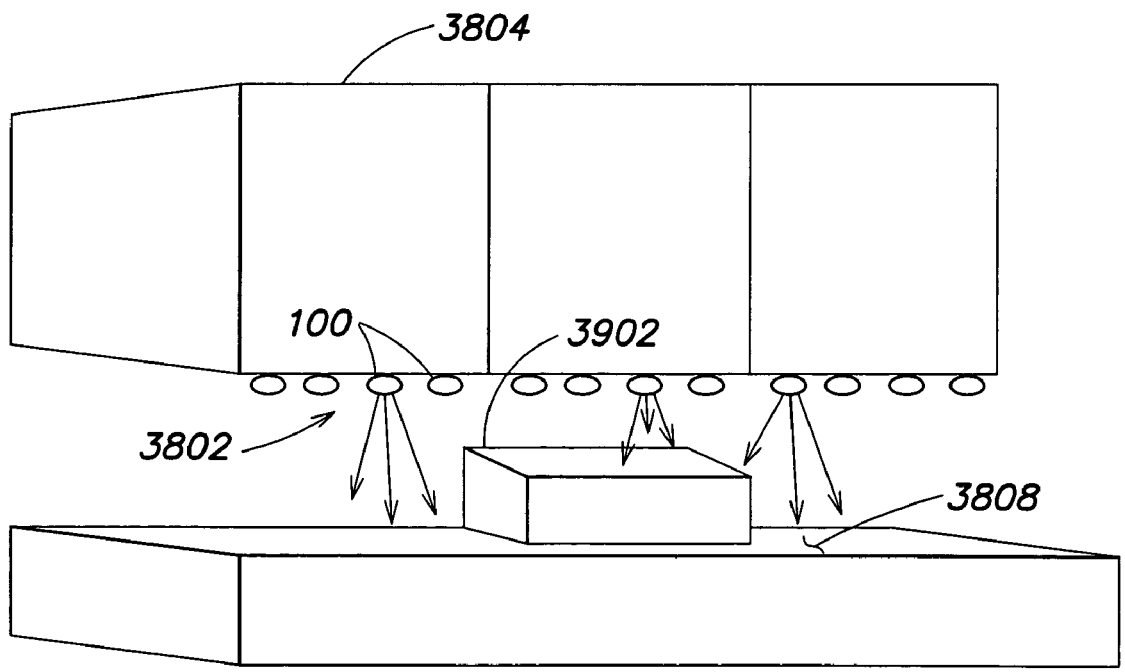
FIG. 39 depicts a lighting system for an object in a cabinet environment.

FIG. 39 depicts using an under-cabinet lighting system 3802 such as described in connection with FIG. 38 to light an object 3902 in a cabinet environment. The object 3902 may be any object that benefits from controlled lighting, such as a work-piece, display, appliance, tool, food, or the like. The illumination from the lighting system 3802 can be configured to be suitable to illuminate that object 3902, based on a feature of the object, such as its material, pattern, or other characteristic.

Figure 40:
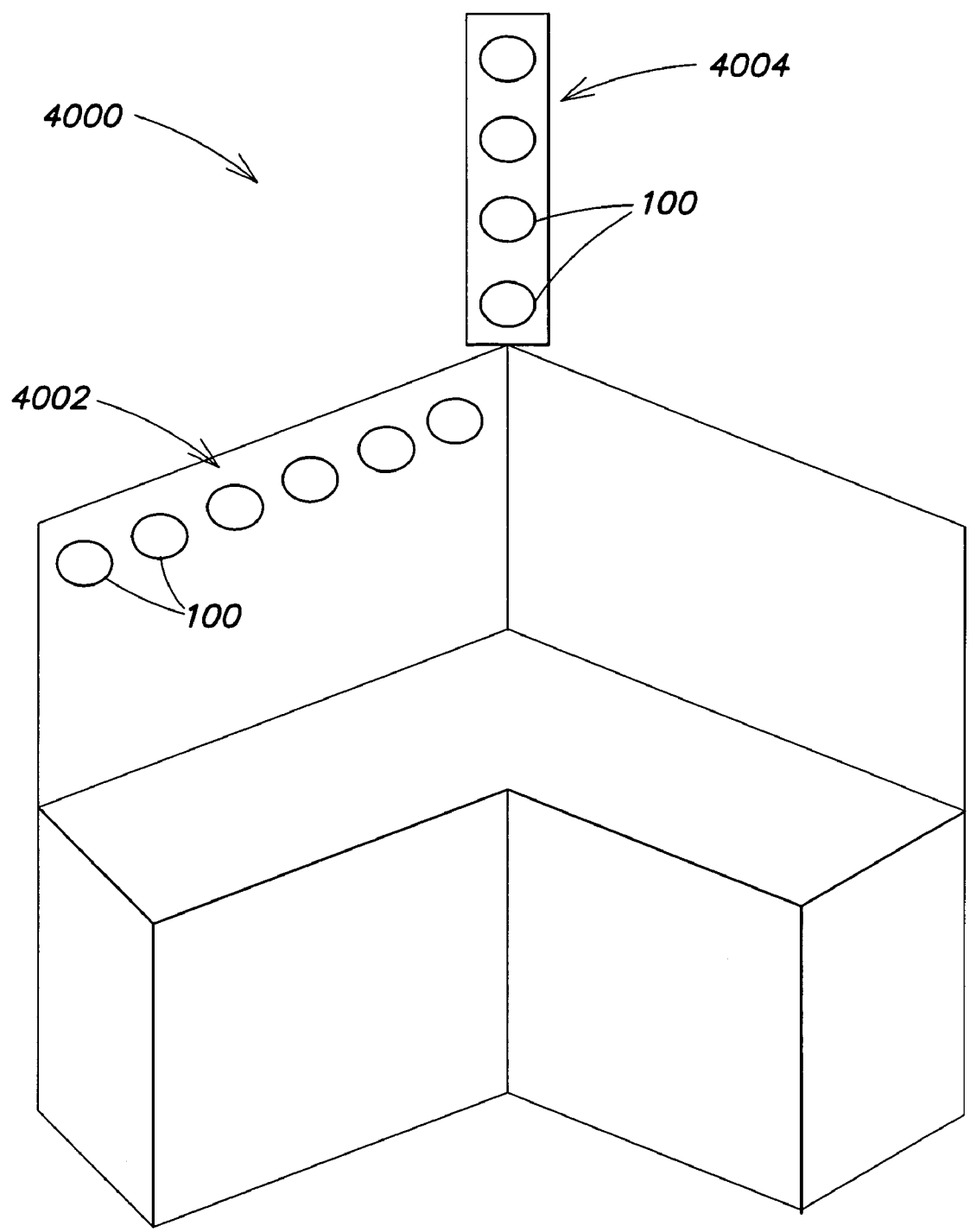
FIG. 40 depicts a lighting system for a workplace environment.

FIG. 40 depicts a lighting system for a workplace environment 4000. The environment can include one or more lighting systems 4002, 4004. For example, a first lighting system 4002 may consist of one or more lighting units 100 in a substantially horizontal line. A second lighting system 4004 might consist of lighting units 100 in a substantially vertical configuration. The lighting systems 4002, 4004 can be used to light the environment 4000, such as a desk, cubicle, office, workbench, laboratory bench, or similar workplace environment. The lighting systems 4002, 4004 can provide white and non-white color illumination of various colors, color temperatures, and intensities, so that the systems 4002, 4004 can be used for conventional illumination as well as for aesthetic, entertainment, or utilitarian effects, such as illuminating workplace objects with preferred illumination conditions, such as for analysis or inspection, presenting light shows or other entertainment effects, or indicating data or status. For example, coupled with a signal source 124, such as a sensor, the workplace lighting systems 4002, 4004 could illuminate in a given color or intensity to indicate a data condition, such as speed of a factory line, size of a stock portfolio, outside temperature, presence of a person in an office, whether someone is available to meet, or the like.

Figure 41:
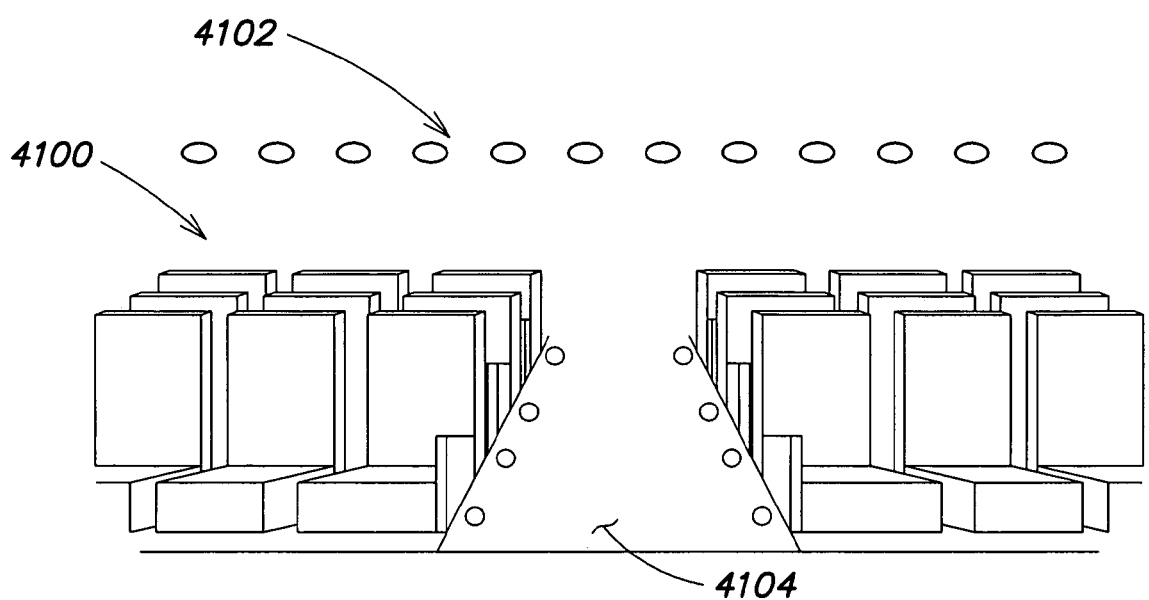
FIG. 41 depicts a lighting system for a seating environment.

FIG. 41 depicts a lighting system for a seating environment 4100. The seating environment could be a theatre, home theatre, movie theatre, transportation environment, or other environment where individuals are seated in a group. A lighting system 4102 can light the environment 4100 with white and non-white color illumination of various colors, color temperatures, and intensities, to produce aesthetic, entertainment and utilitarian effects, such as to complement an entertainment presentation, to indicate a data condition (such as presence of an alarm) or the like. The lighting system 4102 can be above the seats, or elsewhere in the environment 4100, such as along a floor 4104.

Figure 42:
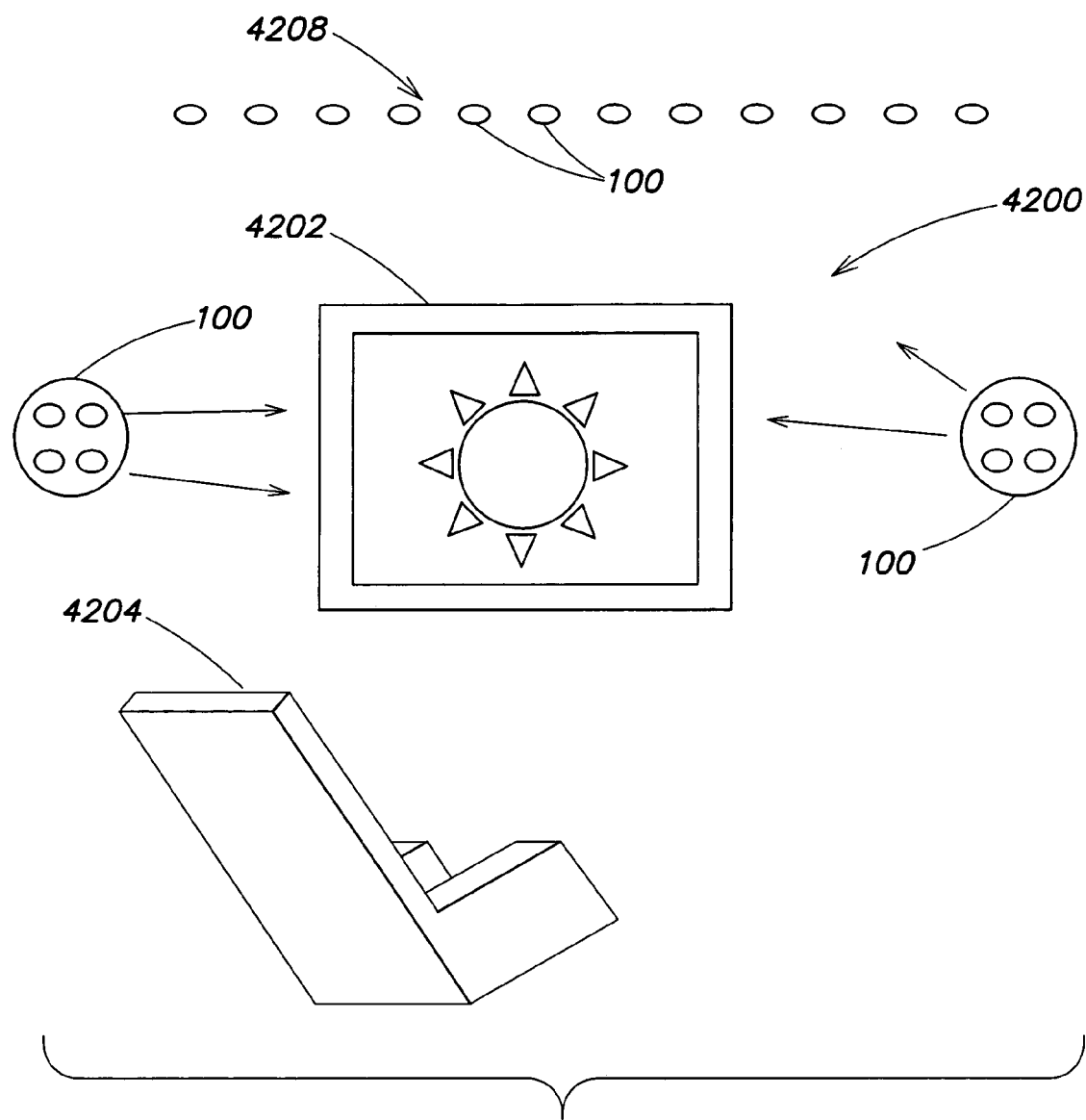
FIG. 42 depicts a lighting system for an entertainment environment.

FIG. 42 depicts a lighting system for another entertainment environment 4200. A seat 4204 is placed in proximity to a display 4202. The seat could be a home entertainment seat, such as a couch or recliner, or an airline seat, other transportation seat, movie or theatre seat, video game console seat, or other entertainment seat 4204. The display could be a television, video projector screen, work of art, liquid crystal display, plasma screen display, movie theatre screen, or other display 4202. A lighting system 4208 with lighting units 100 can supply white and non-white color illumination of various colors, color temperatures, and intensities, to produce aesthetic, entertainment and utilitarian effects, such as a colored light show to complement entertainment presentations on the display 4202, while also supplying ambient lighting, such as white light of selected color temperatures. Like other systems described herein, the lighting system 4208 can be used to indicate a data condition, such as an upcoming time of day, an upcoming program, the ringing of a phone, or the like.

Figure 43:
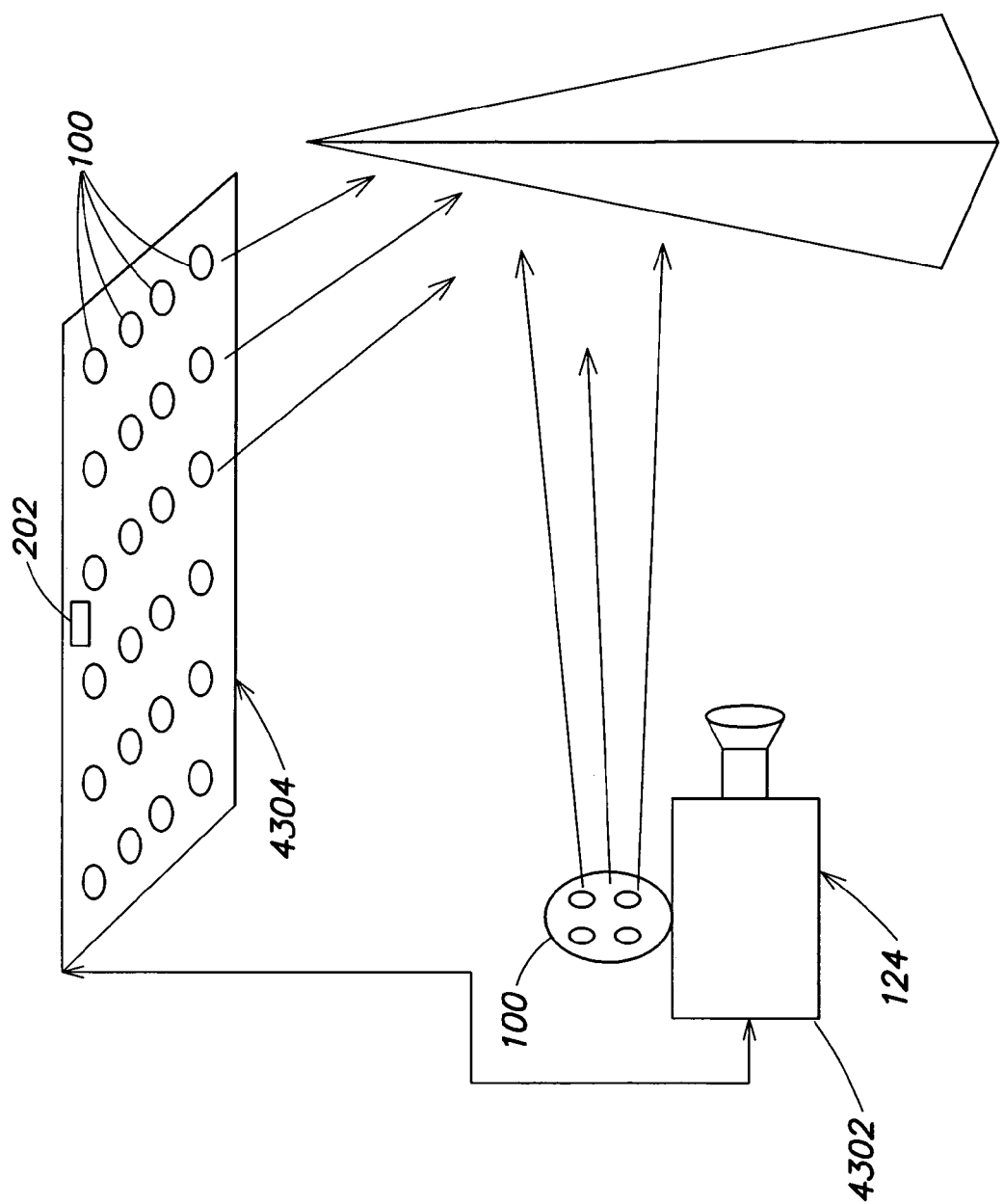
FIG. 43 depicts a lighting system for a camera environment.

FIG. 43 depicts a lighting system 4304 in an environment with a camera 4302. The lighting system 4304 can be an array of lighting units 100, or could be a single lighting unit 100, such as a flash attachment for the camera 4302. The lighting units 100 and lighting system 4304 can include a central controller 202, for providing color, color temperature, saturation and intensity control of white and non-white light to the lighting units 100, such as to illuminate the environment or an object in the environment. The controller 202 can control the illumination in conjunction with controlling the camera 4302, such as to coordinate the illumination with settings of the camera 4302. In embodiments, the camera 4302 may be a smart camera with processing functions linked to a vision system, so that the lighting system 4304 is controlled in response to processing of images by the vision system. That is, the camera 4302 can serve as a signal source 124 to generate a lighting control signal for the lighting system 4304. The lighting can thus be coordinated to be appropriate for the object being filmed or recorded by the camera. The camera 4302 could be a film camera, a digital camera, a video camera, a still camera, a motion picture camera, or other camera of any type. In a preferred embodiment, the camera 4302 is a motion picture camera under coordinated control by a user who simultaneously controls via the controller 202 the camera's exposure characteristics and the lighting conditions generated by the lighting system 4304. In another embodiment the camera 4304 is a projector, and the lighting system 4304 serves as a projector lamp, as well as an illumination system for generating controlled lighting conditions.

The methods and systems disclosed herein also include a variety of methods and systems for light control, including central controllers 202 as well as lighting unit controllers 208. One grouping of lighting controls includes dimmer controls, including both wired and wireless dimmer control. Traditional dimmers can be used with lighting units 100, not just in the traditional way using voltage control or resistive load, but rather by using a processor 102 to scale and control output by interpreting the levels of voltage. In combination with a style and interface that is familiar to most people because of the ubiquity of dimmer switches, one aspect of the present specification allows the position of a dimmer switch (linear or rotary) to indicate color temperature or intensity through a power cycle control. That is, the mode can change with each on or off cycle. A special switch can allow multiple modes without having to turn off the lights. An example of a product that uses this technique is the Color Dial, available from Color Kinetics.

Figure 44:
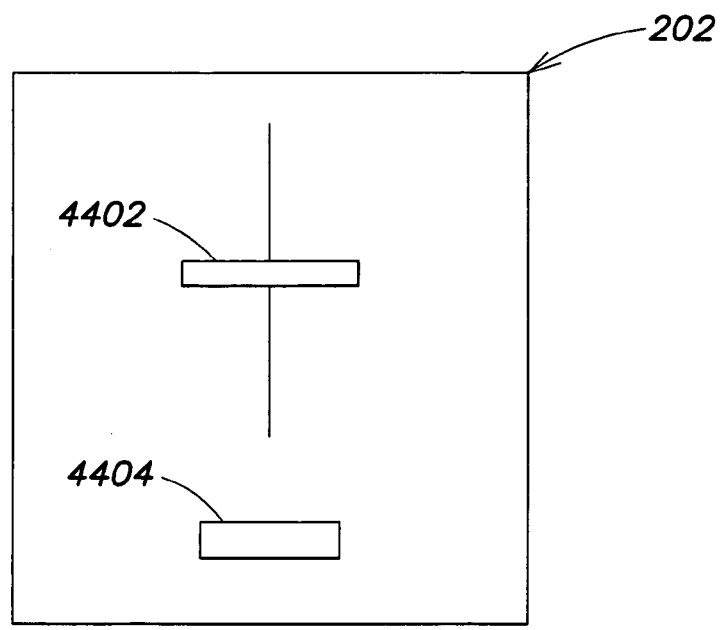
FIG. 44 depicts a light controller with a slide and a switch.

Referring to FIG. 44, a controller 202 includes a slide 4402 and a switch 4404. The slide can provide voltage input to a lighting unit 100, and the switch 4404 can allow the user to switch between modes of operation, such as by selecting a color wash, a specific color or color temperature, a flashing series of colors, or the like.

Figure 45:
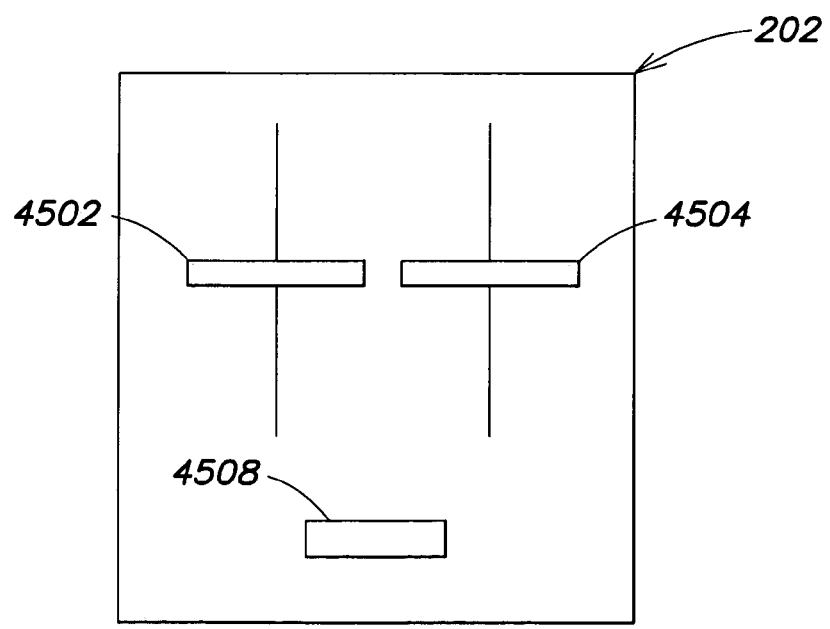
FIG. 45 depicts a light controller with dual slides and a switch.

FIG. 45 depicts a controller 202 with two slides 4502, 4504 and a switch 4508. The slides allow multiple dimensions of control, and the switch allows the user to switch modes of operation. For example, one slide 4502 could control intensity, while the other 4504 controls color temperature. The switch 4508 can control modes of operation. In various embodiments the slides 4502, 4504 and switch 4508 could be used to control a wide range of variables, such as color, color temperature, intensity, hue, and triggering of lighting shows of varying attributes.

Figure 46:
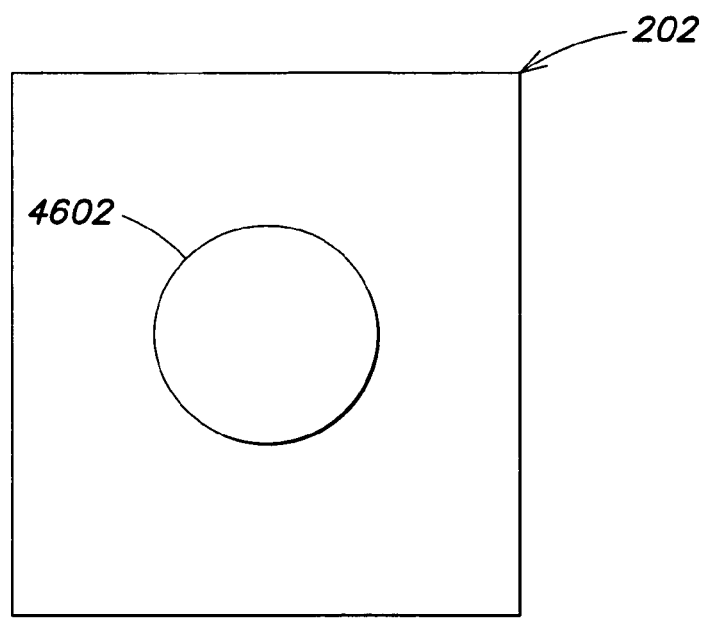
FIG. 46 depicts a light controller with a dial.

FIG. 46 shows a dial 4602 that can serve as a controller 202 for a lighting unit 100. The dial 4602 can allow a user to adjust a variable, such as color, color temperature, intensity, or the like. The dial 4602 can include a switch mechanism (actuated by pushing the dial 4602), to switch between modes of control, such as to facilitate a variety of light shows.

Figure 47:
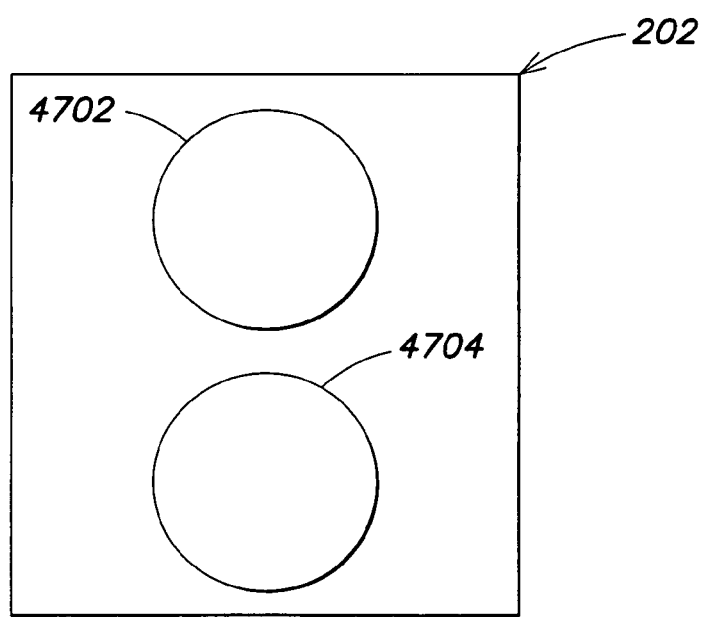
FIG. 47 depicts a dual-dial light controller.

FIG. 47 shows a controller 202 with two dials 4702, 4704. The dials 4702, 4704 can each have switches to actuate different modes, such as by pushing the dials 4702, 4704. The dials 4702, 4704 can control any of a wide variety of variables, such as voltage, color, color temperature, intensity, saturation or other attributes of one or more lighting units 100.

Figure 48:
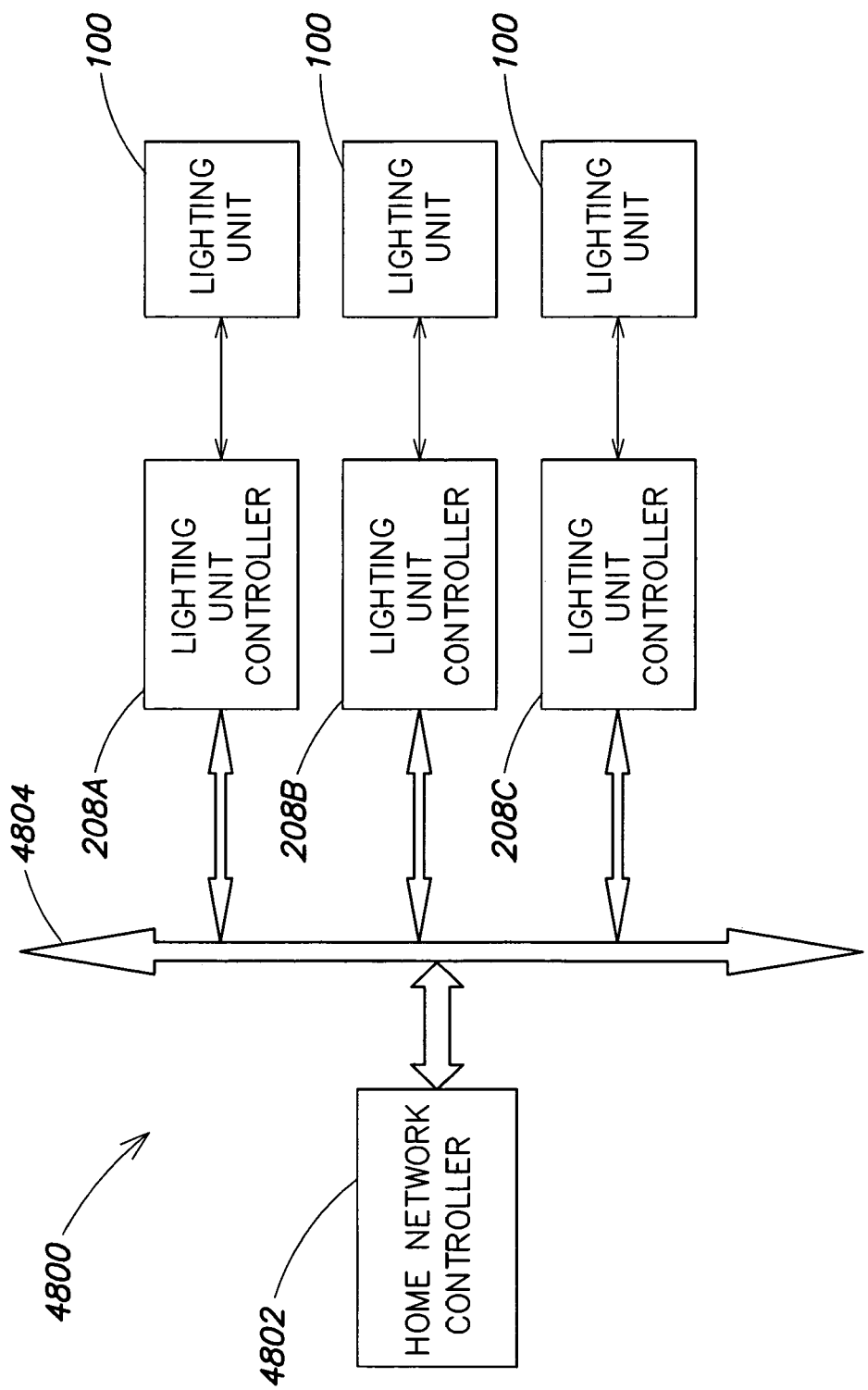
FIG. 48 is a schematic diagram for a home network control system that controls a lighting system.

FIG. 48 shows a system 4800 for controlling a plurality of lighting units 100 in a home network. A home network controller 4802 delivers control signals through a network 4804 (which may be a conventional network, a wire, a power line, a wireless network or other data facility). Each lighting unit 100 is responsive to a lighting unit controller 208A, 208B, 208C, 208D to provide illumination changes in response to signals from the home network controller 4802. Examples of home network controllers include a centralized control system 4802 to control lighting units 100. Other examples include Lutron's RadioRA and the like, as well as distributed control systems like LiteTouch's HomeTouch system.

Figure 49:
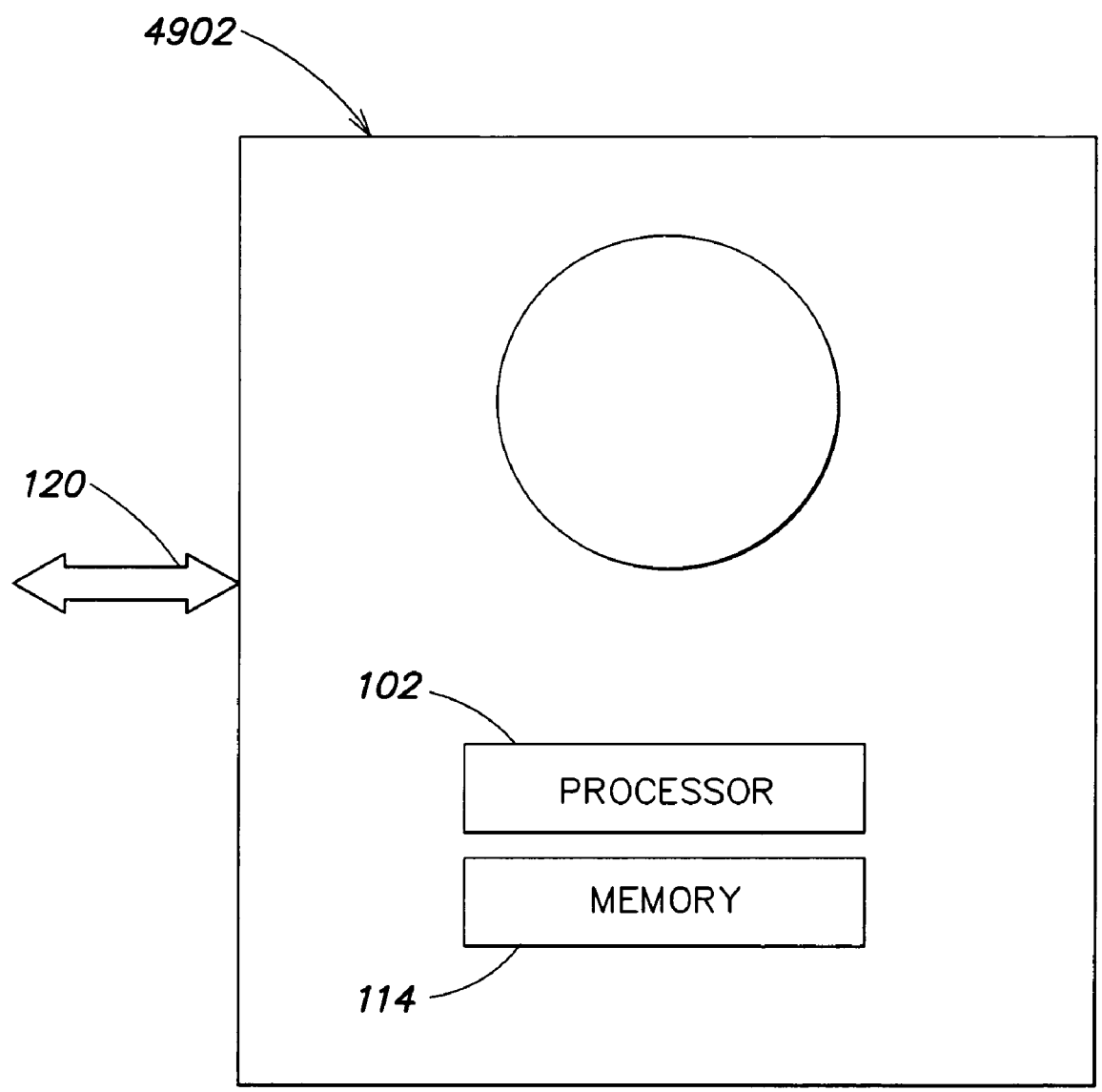
FIG. 49 is a schematic diagram for a dial-based lighting control unit.

Referring to FIG. 49, a switch 4902 includes a processor 102, memory 114 and a communications facility 120. The switch 4902 can be linked to a network, such as an office network, Internet, or home network 4804. Each switch 4902 (which can appear in various forms such as those depicted in FIGS. 44-47) can be an intelligent device that responds to communication signals via the communications facility 120 to provide control of any lighting units 100 from any location where another switch 4902 or device may be located. Such a switch 4902 can be integrated through smart interfaces and networks to trigger shows (such as using a lighting control player, such as iPlayer 2 available from Color Kinetics) as with a lighting controller such as a ColorDial from Color Kinetics. Thus, the switch 4902 can be programmed with light shows to create various aesthetic, utilitarian or entertainment effects, of white or non-white colors. In embodiments, an operator of a system 4800 can process, create or download shows, including from an external source such as the Internet. Shows can be sent to the switch over a communication facility 120 of any kind. Various switches 4902 can be programmed to play back and control any given lighting unit 100. In embodiments, settings can be controlled through a network 4804 or other interface, such as a web interface.

A switch 4902 with a processor 102 and memory 114 can be used to enable upgradeable lighting units 100. Thus, lighting units 100 with different capabilities, shows, or features can be supplied, allowing users to upgrade to different capabilities, as with different versions of commercial software programs. Upgrade possibilities include firmware to add features, fix bugs, improve performance, change protocols, add capability and compatibility and many others.

Figure 50:
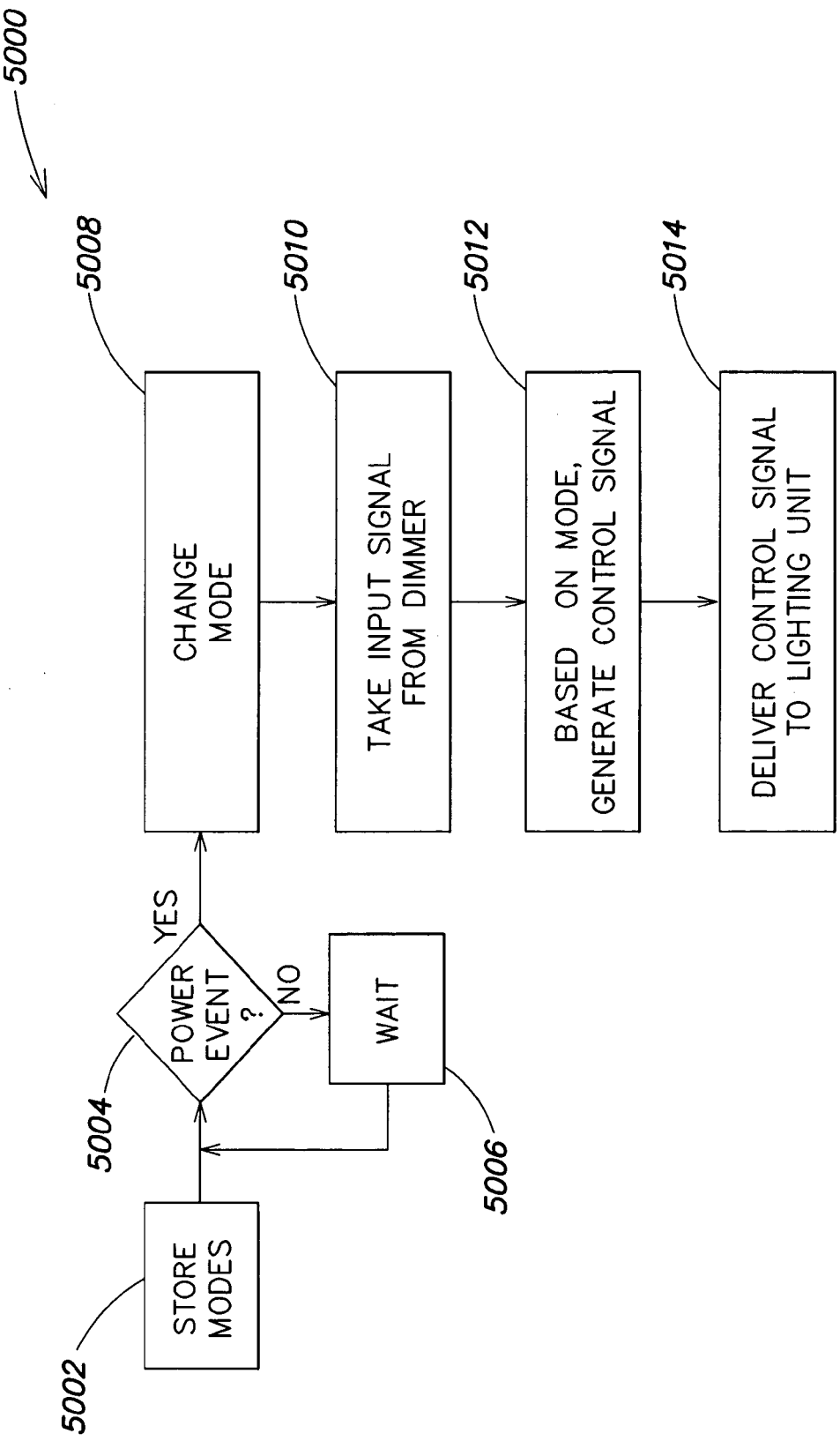
FIG. 50 is a flow diagram showing steps for lighting control using a dimmer having memory.

Referring to FIG. 50, a flow diagram 5000 shows steps for delivering a control signal to a lighting unit 100 based on stored modes and a power cycle event. At a step 5002, the operator can store modes for lighting control, such as on a memory 114. The system can then look, at a step 5004, for a power event, such as turning the power on or off. If there is no power event at the step 5004, then the system waits at a step 5006 for such an event. When there is a power event at the step 5004, then at a step 5008 the system changes mode. The mode can be a resting mode, with no signal to the lighting unit 100, or it can be any of a variety of different modes, such as a steady color change, a flashing mode, a fixed color mode, or modes of different intensity. Modes can include white and non-white illumination modes. The modes can be configured in a cycle, so that upon a mode change at the step 5008, the next stored mode is retrieved from memory 114 and signals for that mode are delivered to the lighting control unit 5008. In embodiments, such as using a switch, such as the switch 4902 or another switch such as a switch, slide, dial, or dimmer described in connection with FIGS. 44-47. The system can, at a step 5010, take an input signal, such as from the switch. Depending on the current mode, the input signal from the switch 4902 can be used to generate a different control signal at a step 5012. For example, if the mode is a steady color change, the input from the dimmer could accelerate of decelerate the rate of change. If the mode were a single color, then the dimmer signal could change the mode by increasing or decreasing the intensity of light. Of course, the step 5012 could take multiple inputs from multiple switches, dials, dimmers, sliders or the like, to provide more modulation of the different modes. Finally, at a step 5014, the modulated signal can be sent to the lighting unit 100.

Figure 51:
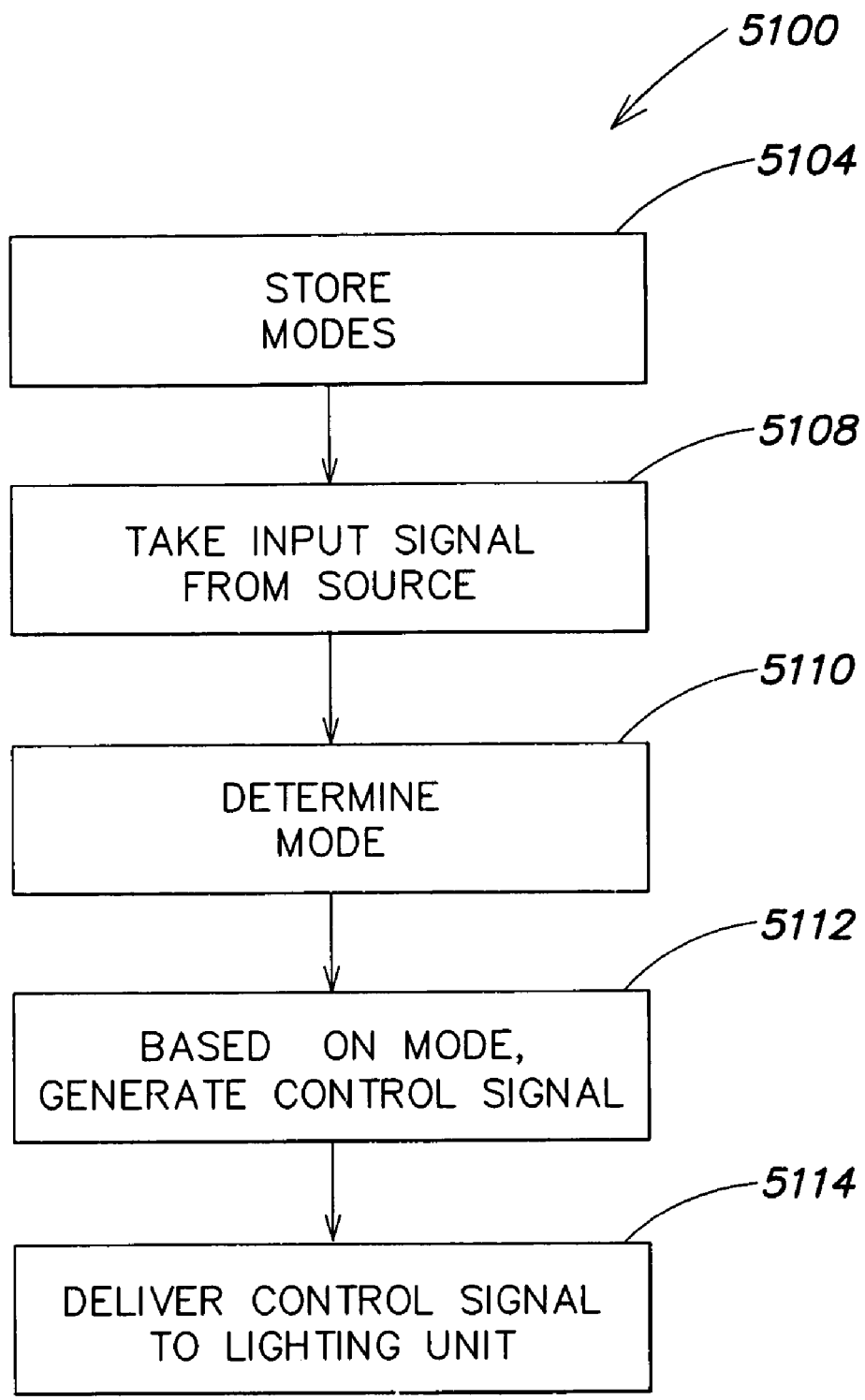
FIG. 51 is a flow diagram showing steps for lighting control based on stored modes.

Referring to FIG. 51, a flow diagram 5100 illustrates steps for generating a lighting control signal. At a step 5104 the system can store modes, such as in memory 114. Then at a step 5108 the system can take input, such as from a signal source 124, such as a sensor, a computer, or other signal source. At a step 5110 the system can determine the mode of the system 5110, such as based on a cycle of modes, or by recalling modes from memory, including based on the nature of the signal from the signal source 124. Then at a step 5112 the system can generate a control signal for a lighting unit, based on the mode determined at the previous step. Finally, at a step 5114, the system can deliver a control signal to the lighting unit 100.

Figure 52:
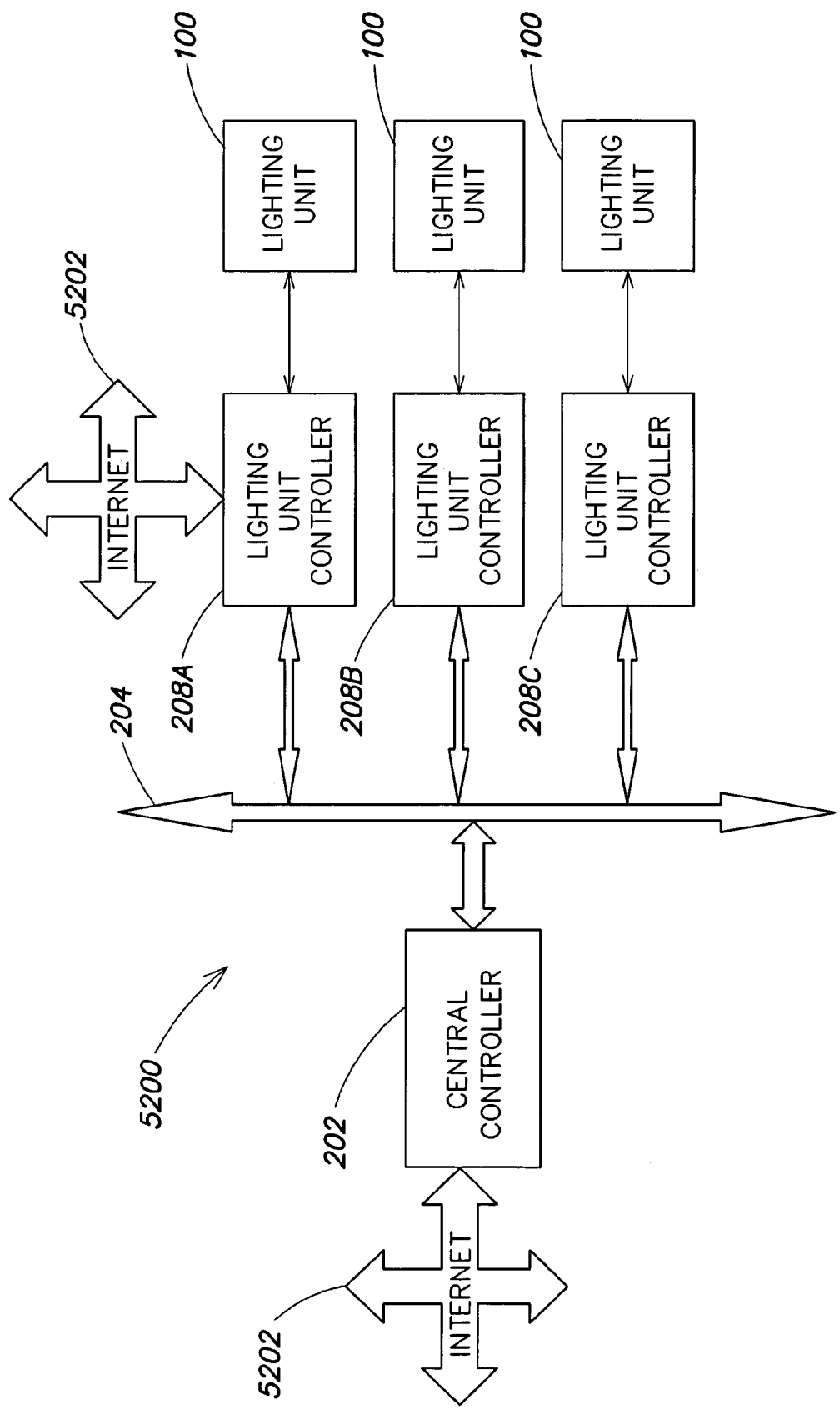
FIG. 52 is a schematic diagram for a lighting control system with inputs from a computer network.

FIG. 52 depicts an embodiment of a lighting system 5200 that includes a central controller 202, a communications facility 204, such as a bus, wire, network, power line or circuit, for delivering signals from the controller 202 to a lighting unit controller 208A, 208B, 208C or 208D, and lighting units 100 that respond to the signals by providing illumination, such as white or non-white illumination of varying colors, color temperatures, intensities and the like. FIG. 52 also depicts a connection of the central controller 202 to a network, such as the Internet 5202. It should be noted that an individual lighting unit controller 208A, 208B, 208C, 208D could also be connected directly to the computer network 5202. Thus, the central controller 202 or individual lighting unit controller 208A, 208B, 208C, 208D could each obtain lighting control signals from an external source, such as an operator connected to the Internet 5202.

In other embodiments of the present invention it may be desirable to limit user control. Lighting designers, interior decorators and architects often prefer to create a certain look to their environment and wish to have it remain that way over time. Unfortunately, over time, the maintenance of an environment, which includes light bulb replacement, often means that a lighting unit, such as a bulb, is selected whose properties differ from the original design. This may include differing wattages, color temperatures, spectral properties, or other characteristics. It is desirable to have facilities for improving the designer's control over future lighting of an environment.

Figure 53:
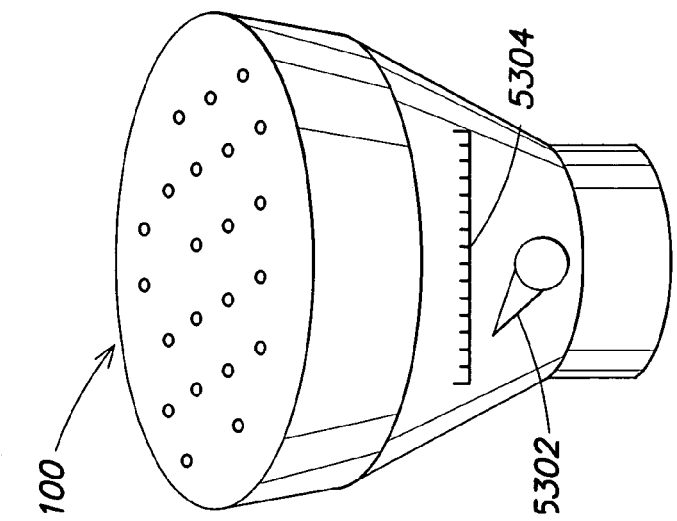
FIG. 53 illustrates a lighting unit with a dial for setting a lighting condition.

Referring to FIG. 53 a lighting unit 100 includes a dial 5302 that allows a user to select one or more colors or color temperatures from a scale 5304. For example, the scale could include different color temperatures of white light. The lighting designer can specify use of a particular color temperature of light, which the installer can select by setting the right position on the scale 5304 with the dial.

Figure 54:
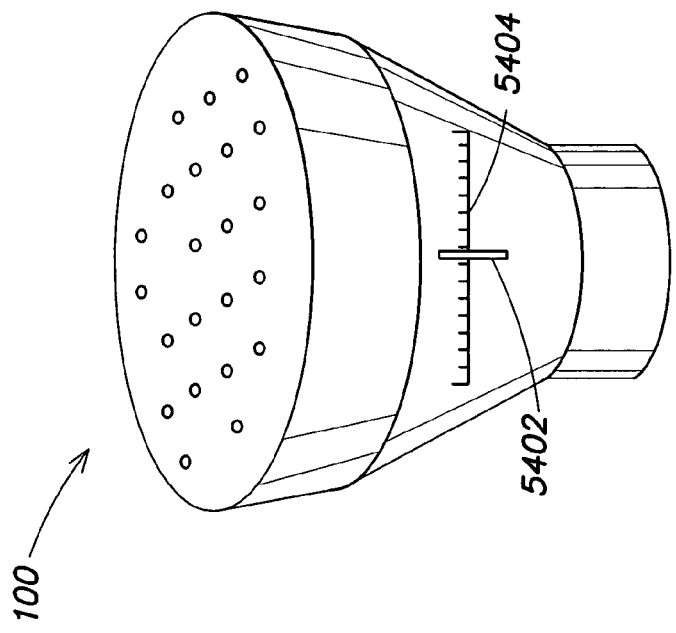
FIG. 54 illustrates a lighting unit with a slide for setting a lighting condition.

FIG. 54 shows a slide mechanism 5402 that can be used like the dial of FIG. 53 to set a particular color temperature of white light, or to select a particular color of non-white light, in either case on a scale 5304. Again, the designer can specify a particular setting, and the installer can set it according to the design plan. Providing adjustable lighting units 100 offers designers and installers much greater control over the correct maintenance of the lighting of the environment.

Figure 55:
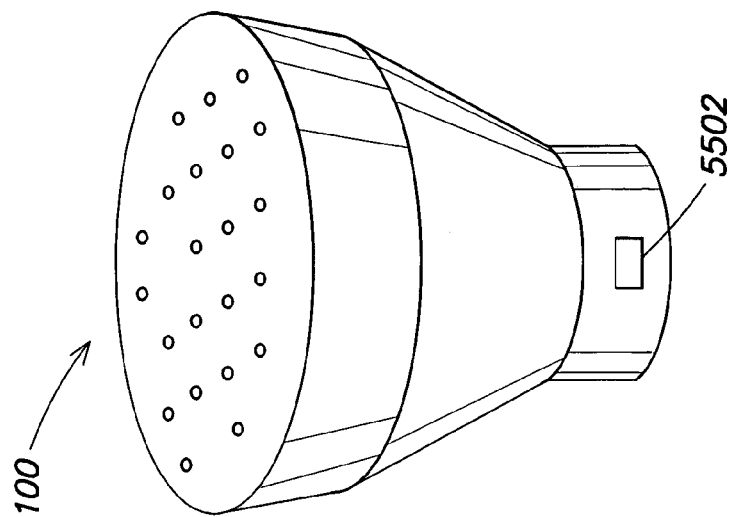
FIG. 55 illustrates a lighting unit with a port for receiving data to control a lighting condition.

FIG. 55 shows a lighting unit 100 with a data port 5502 for receiving a data cable, such as a standard CAT 5 cable type used for networking. Thus, the lighting unit 100 can receive data, such as from a network. By allowing connection of the lighting unit 100 to a communications facility 120, the system allows a lighting designer or installer to send data to a plurality of lighting units 100 to put them in common modes of control and illumination, providing more consistency to the lighting of the overall environment.

Figure 56:
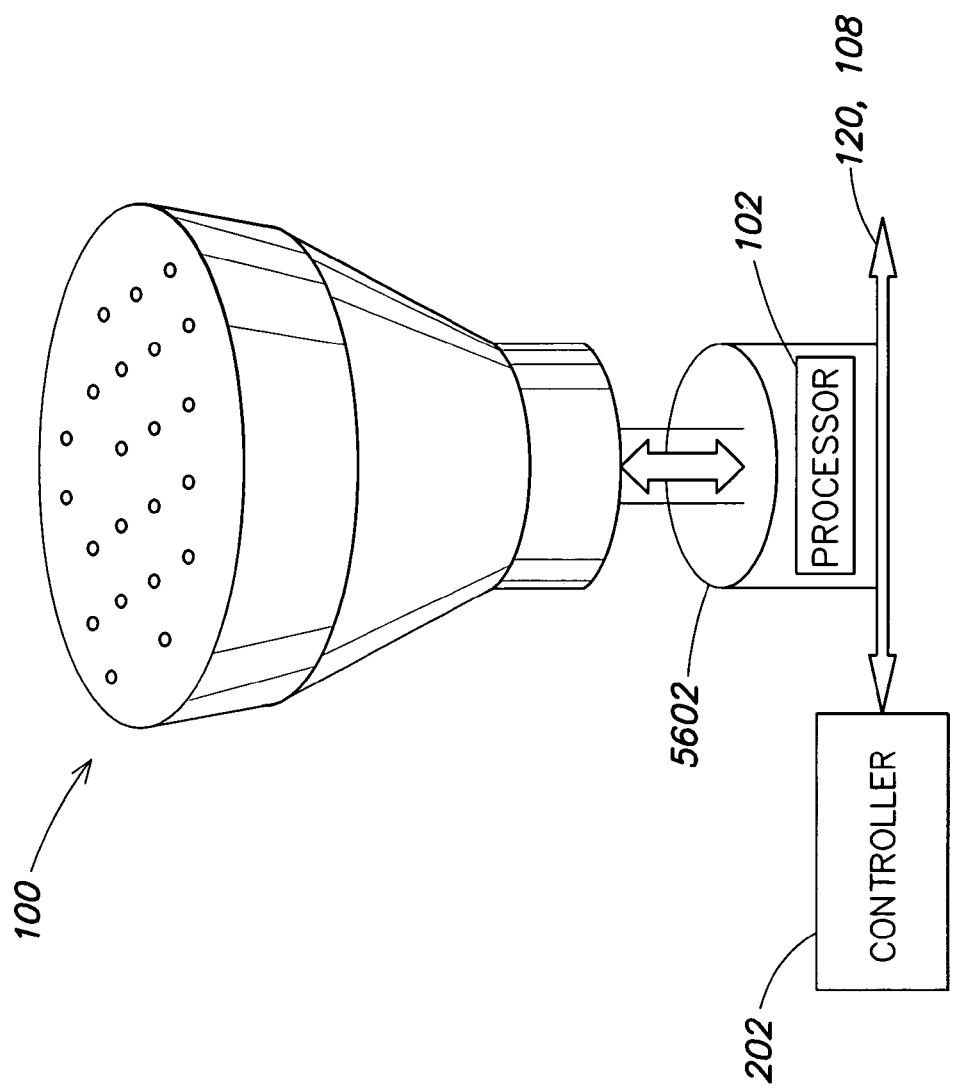
FIG. 56 illustrates a lighting unit with a base that includes a processor for controlling a lighting condition.

FIG. 56 shows a socket 5602 or fixture for receiving a lighting unit 100. In this case the socket 5602 includes a processor 102, such as to providing control signals to the lighting unit 100. The socket 5602 can be connected to a communications facility 120, 108, so that it can receive signals, such as from a controller 202. Thus, the socket 5602 can serve as a lighting unit controller. By placing control in the socket 5602, it is possible for a lighting designer or installer to provide control signals to a known location, regardless of what bulbs are removed or replaced into the socket 5602. Thus, an environmental lighting system can be arranged by the sockets 5602, then any different lighting units 100 can be installed, responsive to control signals sent to the respective sockets 5602. Sockets 5602 can be configured to receive any kind of light bulb, including incandescent, fluorescent, halogen, metal halide, LED-based lights, or the like. Thus, intelligence can be provided by the processor 102 to a conventional socket. In embodiments, data can be provided over power lines, thus avoiding the need to rewire the environment, using power line carrier techniques as known in the art, the X10 system being one such example, and the HomeTouch system being another.

In the preceding embodiments, a fixture or network can give a lighting unit 100 a command to set to a particular look including, color, color temperature, intensity, saturation, and spectral properties. Thus, when the designer sets the original design he or she may specify a set of particular light bulb parameters so that when a lighting unit 100 is replaced the fixture or network can perform a startup routine that initializes that lighting unit 100 to a particular set of values which are then controlled. In embodiments, the lighting unit 100 identifies itself to the network when the power is turned on. The lighting unit 100 or fixture or socket 5602 can be assigned an address by the central controller 202, via a communications facility 120. Thus, there is an address associated with the fixture or socket 5602, and the lighting unit 100 control corresponds to that address. The lighting unit 100 parameters can be set in memory 114, residing in either the lighting unit 100, socket 5602 or fixture, cable termination or in a central controller 202. The lighting unit 100 can now be set to those parameters. From then on, when the lighting unit 100 is powered up it receives a simple command value already set within the set of parameters chosen by the designer.

In embodiments, the fixture, socket 5602 or lighting unit 100 can command color setting at installation, either a new setting or a fine adjustment to provide precise color control. In embodiments, the lighting unit 100 allows color temperature control as described elsewhere. The lighting unit 100 is settable, but the fixture itself stores an instruction or value for the setting of a particular color temperature or color. Since the fixture is set, the designer or architect can insure that all settable lighting units 100 will be set correctly when they are installed or replaced. An addressable fixture can be accomplished through a cable connection where the distal end of the cable, at the fixture, has a value programmed or set. The value is set through storage in memory 114 or over the power lines. A physical connection can be made with a small handheld device, such as a Zapi available from Color Kinetics, to create and set the set of parameters for that fixture and others. If the environment changes over time, as for example during a remodeling, then those values can be updated and changed to reflect a new look for the environment. A person could either go from fixture to fixture to reset those values or change those parameters remotely to set an entire installation quickly. Once the area is remodeled or repainted, as in the lobby of a hotel for example, the color temperature or color can be reset and, for example, have all lighting units 100 in the lobby set to white light of 3500K. Then, in the future, is any lighting unit 100 is replaced or upgraded, any bulb plugged in can be set to that new value. Changes to the installation parameters can be done in various ways, such as by network commands, or wireless communication, such as RF or IR communication.

In various embodiments, the setting can occur in the fixture or socket 5602, in the distal end of a cable, in the proximal end of the cable, or in a central controller. The setting can be a piece of memory 114 embedded in any of those elements with a facility for reading out the data upon startup of the lighting unit 100.

Figure 57:
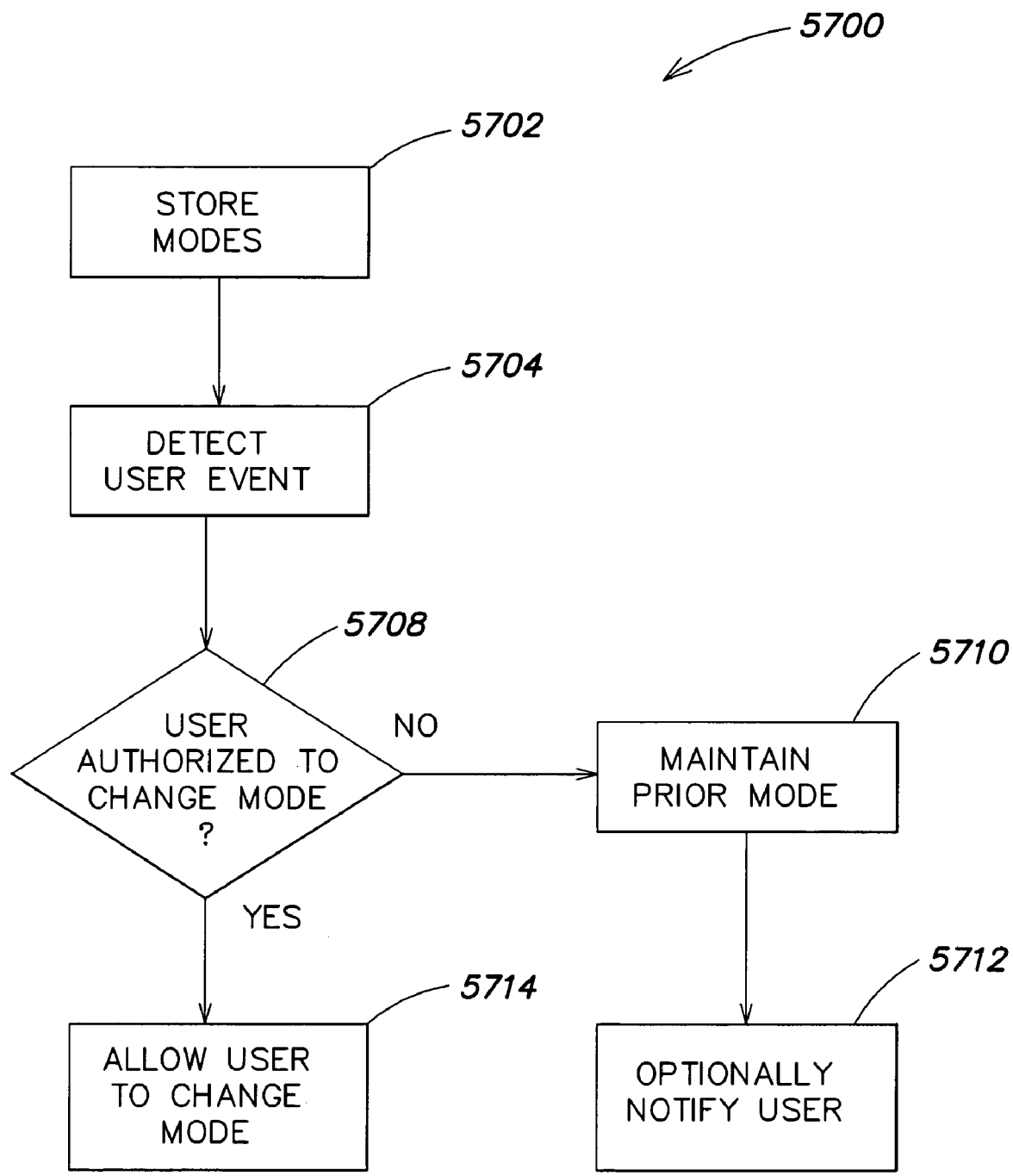
FIG. 57 is a flow diagram showing steps for allowing only authorized users to change a lighting condition.

Referring to FIG. 57, in other embodiments it may be desirable to prevent or deter user adjustment. A lighting unit 100 can be programmed to allow adjustment and changes to parameters by a lighting designer or installer, but not by other users. Such systems can incorporate a lockout facility to prevent others from easily changing the settings. This can take the form of memory 114 to store the current state but allow only a password-enabled user to make changes. One embodiment is a lighting unit 100 that is connected to a network or to a device that allows access to the lighting unit 100 or network. The device can be an authorized device whose initial communication establishes trust between two devices or between the device and network. This device can, once having established the connection, allow for the selection or modification of pattern, color, effect or relationship between other devices such as ambient sensors or external devices. FIG. 57 is a flow diagram 5700 showing steps for only allowing authorized users to change lighting conditions from a lighting unit 100. The system can store modes at a step 5702, such as in memory 114. The system can detect a user event 5704, such as an attempt by the user to change modes, such as sending an instruction over a network or wireless device. At a step 5708, the system queries whether the user is authorized to change the mode of the lighting unit 100, such as by asking for a password, searching for a stored password, or checking a device identifier for the device through which the user is seeking to change the mode of the lighting unit 100. If the user is not authorized at the step 5708, then the system maintains the previous mode at a step 5710 an optionally notifies the lighting designer, installer, or other individual of the unauthorized attempt to change the mode. If the user is authorized at the step 5708, then the user is allowed to change the mode at the step 5714. Facilities for allowing only authorized users to trigger events are widely known in the arts of computer programming, and any such facilities can be used with a processor 102 and memory 114 used with a lighting unit 100.

Figure 58:
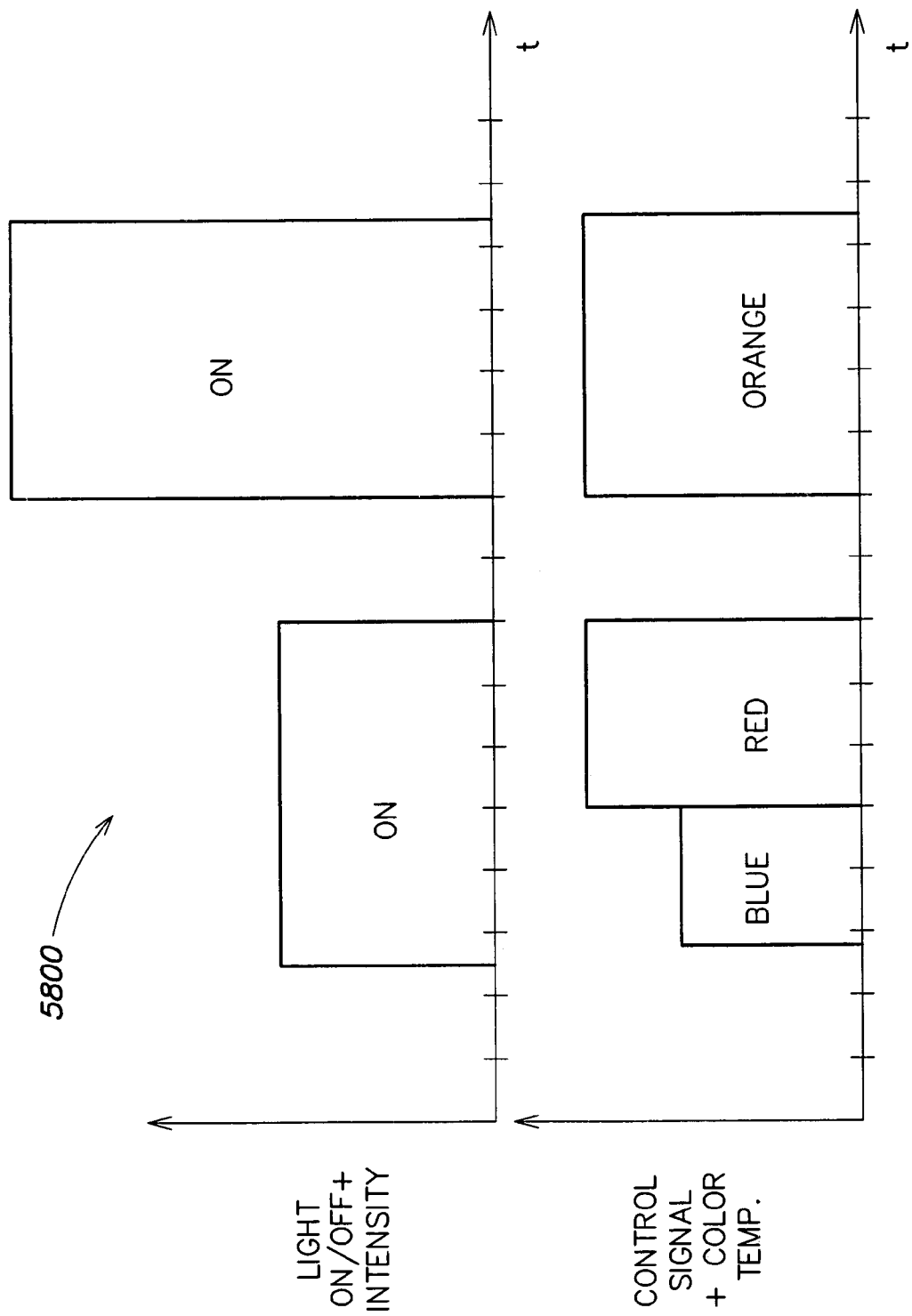
FIG. 58 illustrates modes for controlling a lighting condition.

In other embodiments, the lighting designer can specify changes in color over time or based on time of day or season of year. It is beneficial for a lighting unit 100 to measure the amount of time that it has been on and store information in a compact form as to its lighting history. This provides a useful history of the use of the light and can be correlated to use lifetime and power draw, among other measurements. An intelligent networked lighting unit 100 can store a wide variety of useful information about its own state over time and the environmental state of its surroundings. Referring to FIG. 58, a lighting unit can store a histogram 5800, a chart representing value and time of lighting over time. The histogram can be stored in memory 114. A histogram can chart on time versus off time for a lighting unit 100. A histogram can be correlated to other data, such as room habitation, to develop models of patterns of use, which can then be tied into a central controller 202, such as integrated with a building control system. While FIG. 58 shows abruptly changing values, a histogram 5800 could also show smoothly changing values over time, such as sunrise to sunset transitions, etc.

In embodiments the lighting unit 100 can include a timing feature based on an astronomical clock, which stores not simply time of day, but also solar time (sunrise, sunset) and can be used to provide other time measurements such as lunar cycles, tidal patterns and other relative time events (harvest season, holidays, hunting season, fiddler crab season, etc.) In embodiments, using a timing facility, a controller 202 can store data relating to such time-based events and make adjustments to control signals based on them. For example, a lighting unit 100 can allow 'cool' color temperature in the summer and warm color temperatures in the winter.

Figure 61:
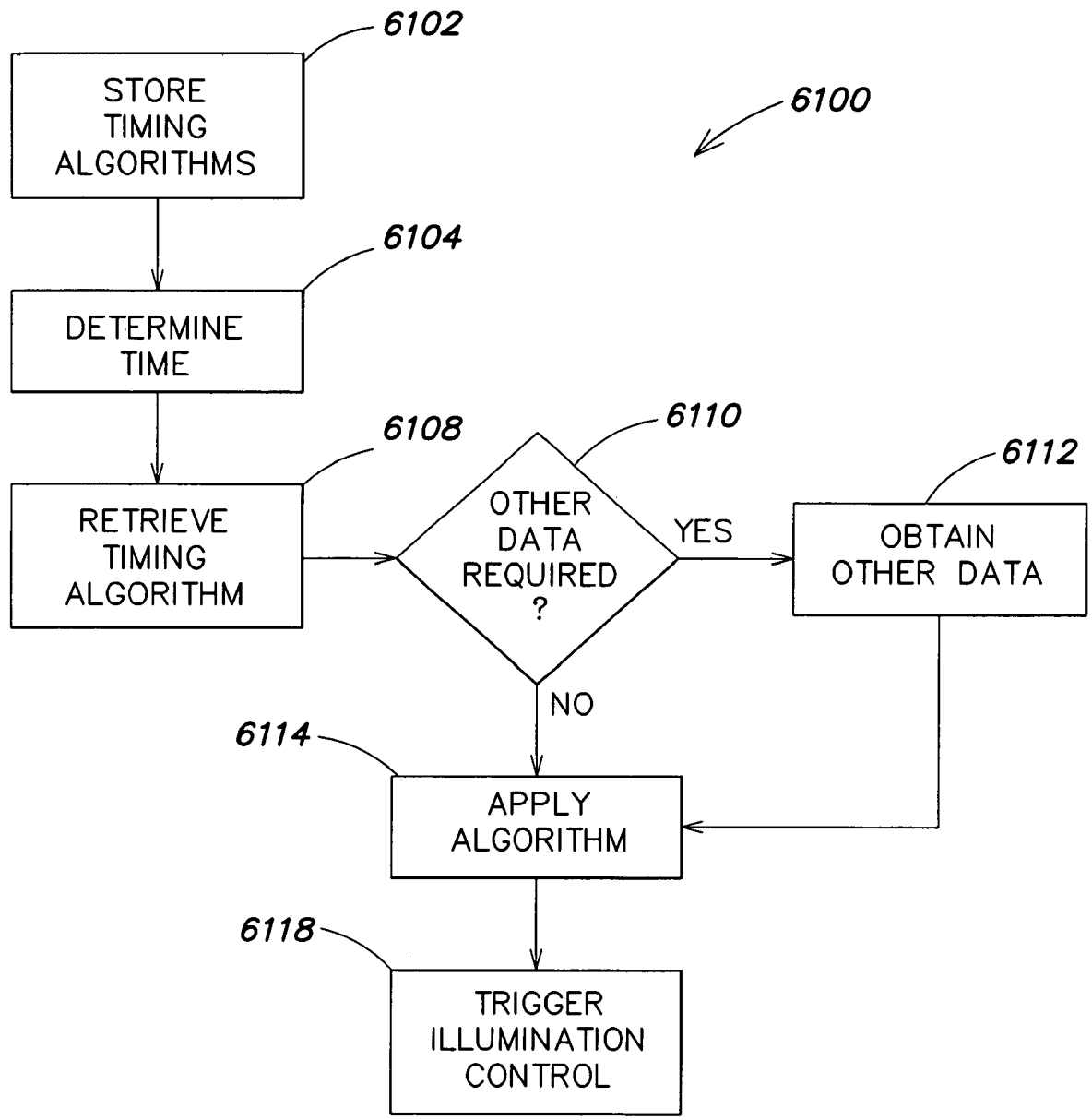
FIG. 61 is a flow diagram with steps for applying timing algorithms to control lighting conditions.

Referring to FIG. 61, a flow diagram 6100 shows steps for applying a timing algorithm to generate a lighting control signal. At a step 6102 the system can store timing algorithms, such as in memory 114. At a step 6104 the system can determine time, such as from timing facility like a system clock or other timing facility. At a step 6108 the system can retrieve the timing algorithm from memory. At a step 6110 the system can determine whether other data is required to execute the algorithm, such as data from a sensor or the like. If so, then at a step 6112 the system can fetch the other data. If at the step 6110 no other data is required, or once other necessary data is obtained, then at a step 6114 the system applies the algorithm, either to the timing data alone or, if applicable, to the other data as well. Then at a step 6118 the system can trigger a lighting control signal based on the output of the algorithm.

In embodiments, the lighting control unit can receive a timing signal based on a software program, such as a calendar program like Outlook from Microsoft, so that lighting units 100 can display or indicate illumination based on warning for appointments, or can produce particular shows on special days, such as holidays. For example, a lighting unit 100 could show green shows on St. Patrick's day, etc. Similar time or date-based signals can come from PDAs, PCs and other devices running software that includes time and date-based data.

Figure 59:
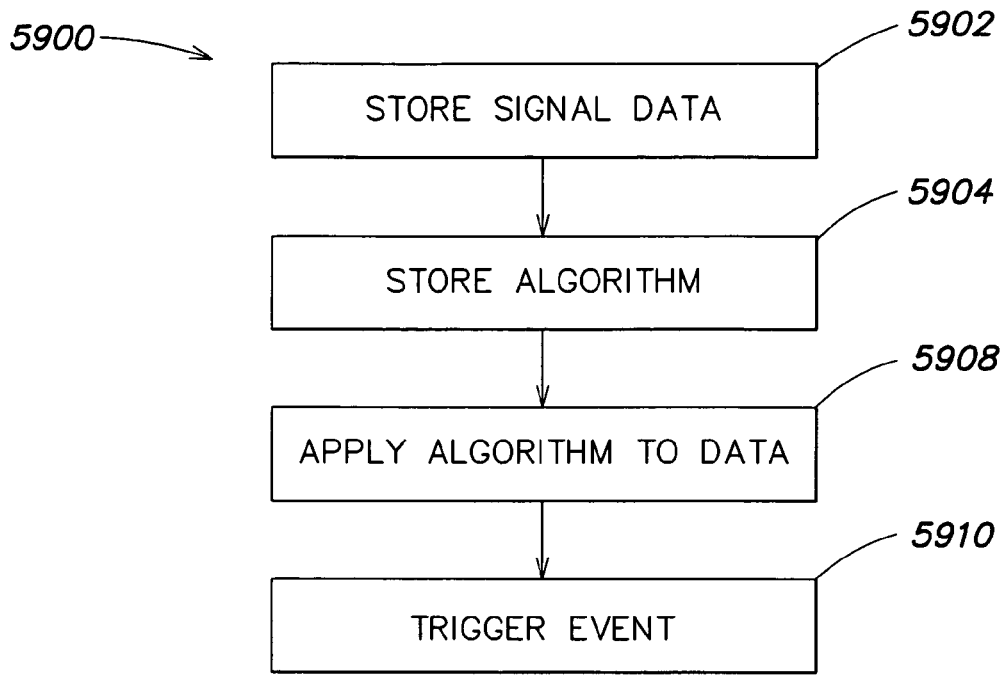
FIG. 59 is a flow diagram that illustrates using a stored algorithm to operate on data to trigger a lighting event.

Referring to FIG. 59, a flow diagram 5900 shows steps for triggering a lighting unit control event based on an item of data. At a step 5902 a system can store data, such as in memory 114. At a step 5904 the system can store an algorithm for operating on the data, again in memory 114. At a step 5908 the system can apply the algorithm to the data, then at a step 5910 trigger an event, such as a particular lighting control signal. The flow diagram 5900 illustrates that lighting control signals can be triggered based on any kind of data, applying a wide range of algorithms that convert raw data into control signals. For example, the data might be a level of a stock portfolio, a temperature, an on-off status, a voltage, a current, a magnetic field level, or any other kind of data.

Figure 60:
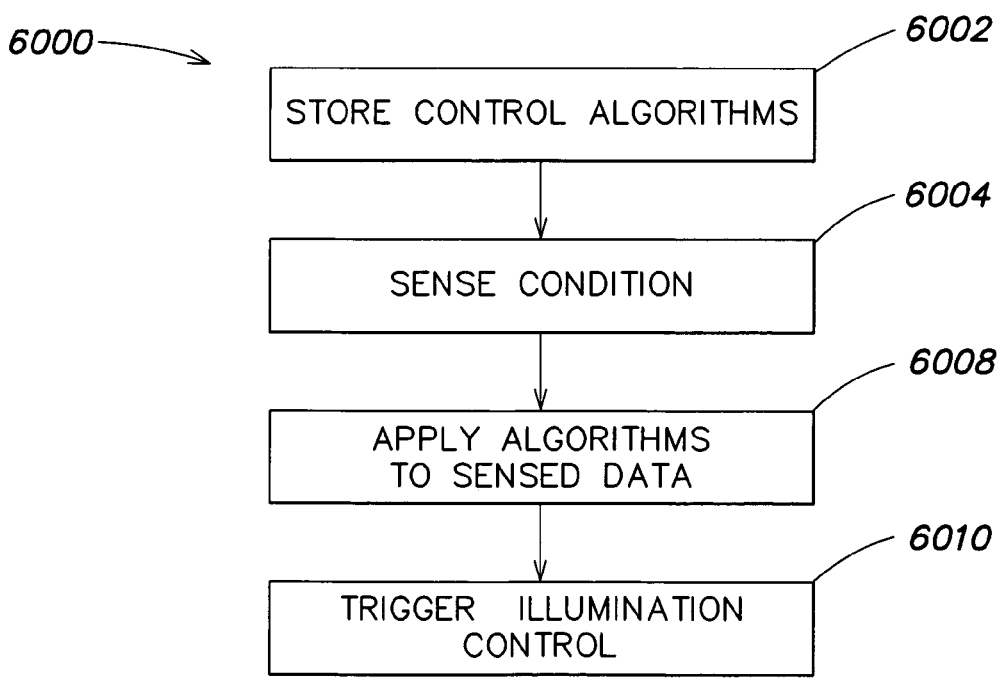
FIG. 60 is a flow diagram that illustrates applying algorithms to sensed conditions to trigger illumination control signals.

Referring to FIG. 60, a flow diagram 6000 shows steps for triggering illumination control based on data from a sensor. At a step 6002 the system can store control algorithms for generating lighting control signals. At a step 6004 the system can sense a condition, such as by receiving data from a signal source 124 in the form of a sensor. Any kind of sensor can be used. Then at a step 6008 the system can apply an algorithm to the sensed data. Finally, at a step 6010 the output of the algorithm is used to trigger control of the lighting signal to a lighting unit 100. In embodiments the sensor can be a light sensor, and the sensor can provide control of a lighting signal based on a feedback loop, in which an algorithm at the step 6008 modifies the lighting control signal based on the lighting conditions measured by the sensor. In embodiments, a closed-loop feedback system can read spectral properties and adjust color rendering index, color temperature, color, intensity, or other lighting characteristics based on user inputs or feedback based on additional ambient light sources to correct or change light output.

A feedback system, whether closed loop or open loop, can be of particular use in rendering white light. Some LEDs, such as those containing amber, can have significant variation in wavelength and intensity over operating regimes. Some LEDs also deteriorate quickly over time. To compensate for the temperature change, a feedback system can use a sensor to measure the forward voltage of the LEDs, which gives a good indication of the temperature at which the LEDs are running. In embodiments the system could measure forward voltage over a string of LEDs rather than the whole fixture and assume an average value. This could be used to predict running temperature of the LED to within a few percent. Lifetime variation would be taken care of through a predictive curve based on experimental data on performance of the lights.

Degradation can be addressed through an LED that produces amber or red through another mechanism such as phosphor conversion and does this through a more stable material, die or process. Consequently, CRI could also improve dramatically. That LED plus a bluish white or Red LED then enables a color temperature variable white source with good CRI.

In other embodiments, with line voltage power supply integrated into LED systems, power line carrier (PLC) allows such systems to simplify further. Installing LED systems are complex and currently often require a power supply, data wiring and the installation of these devices so that they are not visible. For example, 10 pieces of cove lights require a device to deliver data (controller) and a power supply that must be installed and hidden. Additional costs are incurred by the use of these devices. To improve the efficiency of such a system, an LED fixture or line of fixtures can be made capable of being plugged into line voltage. An LED-based system that plugs directly into line voltage offers overall system cost savings and eases installation greatly. Such a system ties into existing power systems (120 or 220VAC), and the data can be separately wired or provided through wireless control (one of several standards IR, RF, acoustic etc). Such systems are automatically not considered low voltage systems. Regulatory approvals may be different. Recent low power developments allow for line voltage applications to be used directly with integrated circuits with little additional componentry. While a protocol such as DMX can be used to communicate with lighting units 100, there is no requirement for a particular protocol.

Lighting units 100 encompassed herein include lighting units 100 configured to resemble all conventional light bulb types, so that lighting units 100 can be conveniently retrofitted into fixtures and environments suitable for such environments. Such retrofitting lighting units 100 can be designed, as disclosed above and in the applications incorporated herein by reference, to use conventional sockets of all types, as well as conventional lighting switches, dimmers, and other controls suitable for turning on and off or otherwise controlling conventional light bulbs. Retrofit lighting units 100 encompassed herein include incandescent lamps, such as A15 Med, A19 Med, A21 Med, A21 3C Med, A23 Med, B10 Blunt Tip, B10 Crystal, B10 Candle, F15, GT, C7 Candle C7 DC Bay, C15, CA10, CA8, G16/1/2 Cand, G16-1/2 Med, G25 Med, G30 Med, G40 Med, S6 Cand, S6 DC Bay, S11 Cand, S11 DC Bay, S11 Inter, S11 Med, S14 Med, S19 Med, LINESTRA 2-base, T6 Cand, T7 Cand, T7 DC Bay, T7 Inter, T8 Cand, T8 DC Bay, T8 Inter, T10 Med, T6-1/2 Inter, T6-1/2 DC Bay, R16 Med, ER30 Med, ER40 Med, BR30 Med, BR40 Med, R14 Inter, R14 Med, K19, R20 Med, R30 Med, R40 Med, R40 Med Skrt, R40 Mog, R52 Mog, P25 Med, PS25 3C, PS25 Med, PS30 Med, PS35 Mog, PS52 Mog, PAR38 Med Skrt, PAR38 Med Sid Pr, PAR46 Scrw Trm, PAR46 Mog End Pr, PAR 46 Med Sid Pr, PAR56 Scrw Trm, PAR56 Mog End Pr, PAR 64 Scrw Trm, and PAR64 Ex Mog End Pr. Also, retrofit lighting units 100 include conventional tungsten/halogen lamps, such as BT4, T3, T4 BI-PIN, T4 G9, MR16, MR11, PAR14, PAR16, PAR16 GU10, PAR20, PAR30, PAR30LN, PAR36, PAR38 Medium Skt., PAR38 Medium Side Prong, AR70, AR111, PAR56 Mog End Pr, PAR64 Mog End Pr, T4 DC Bayonet, T3, T4 Mini Can, T3, T4 RSC Double End, T10, and MB19. Lighting units 100 can also include retrofit lamps configured to resemble high intensity discharge lamps, such as E17, ET18, ET23.5, E25, BT37, BT56, PAR20, PAR30, PAR38, R40, T RSC base, T Fc2 base, T G12 base, T G8.5 base, T Mogul base, and TBY22d base lamps. Lighting units 100 can also be configured to resemble fluorescent lamps, such as T2 Axial Base, T5 Miniature Bipin, T8 Medium Bipin, T8 Medium Bipin, T12 Medium Bipin, U-shaped t-12, OCTRON T-8 U-shaped, OCTRON T8 Recessed Double Contact, T12 Recessed Double Contact, T14-1/2 Recessed Double Contact, T6 Single Pin, T8 Single Pin, T12 Single Pin, ICETRON, Circline 4-Pin T-19, PENTRON CIRCLINE 4-pin T5, DULUX S, DULUX S/E, DULUX D, DULUX D/E, DULUX T, DULUX T/E, DULUX T/E/IN, DULUX L, DULUX F, DULUX EL Triple, DULUX EL TWIST DULUX EL CLASSIC, DULUX EL BULLET, DULUX EL Low Profile GLOBE, DULUX EL GLOBE, DULUE EL REFLECTOR, and DULUX EL Circline. Lighting units 100 can also include specialty lamps, such as for medical, machine vision, or other industrial or commercial applications, such as airfield/aircraft lamps, audio visual maps, special purpose heat lamps, studio, theatre, TV and video lamps, projector lamps, discharge lamps, marine lamps, aquatic lamps, and photo-optic discharge lamps, such as HBO, HMD, HMI, HMP, HSD, HSR, HTI, LINEX, PLANON, VIP, XBO and XERADEX lamps. Other lamps types can be found in product catalog for lighting manufacturers, such as the Sylvania Lamp and Ballast Product Catalog 2002, from Sylvania Corporation or similar catalogs offered by General Electric and Philips Corporation.

Figure 62:
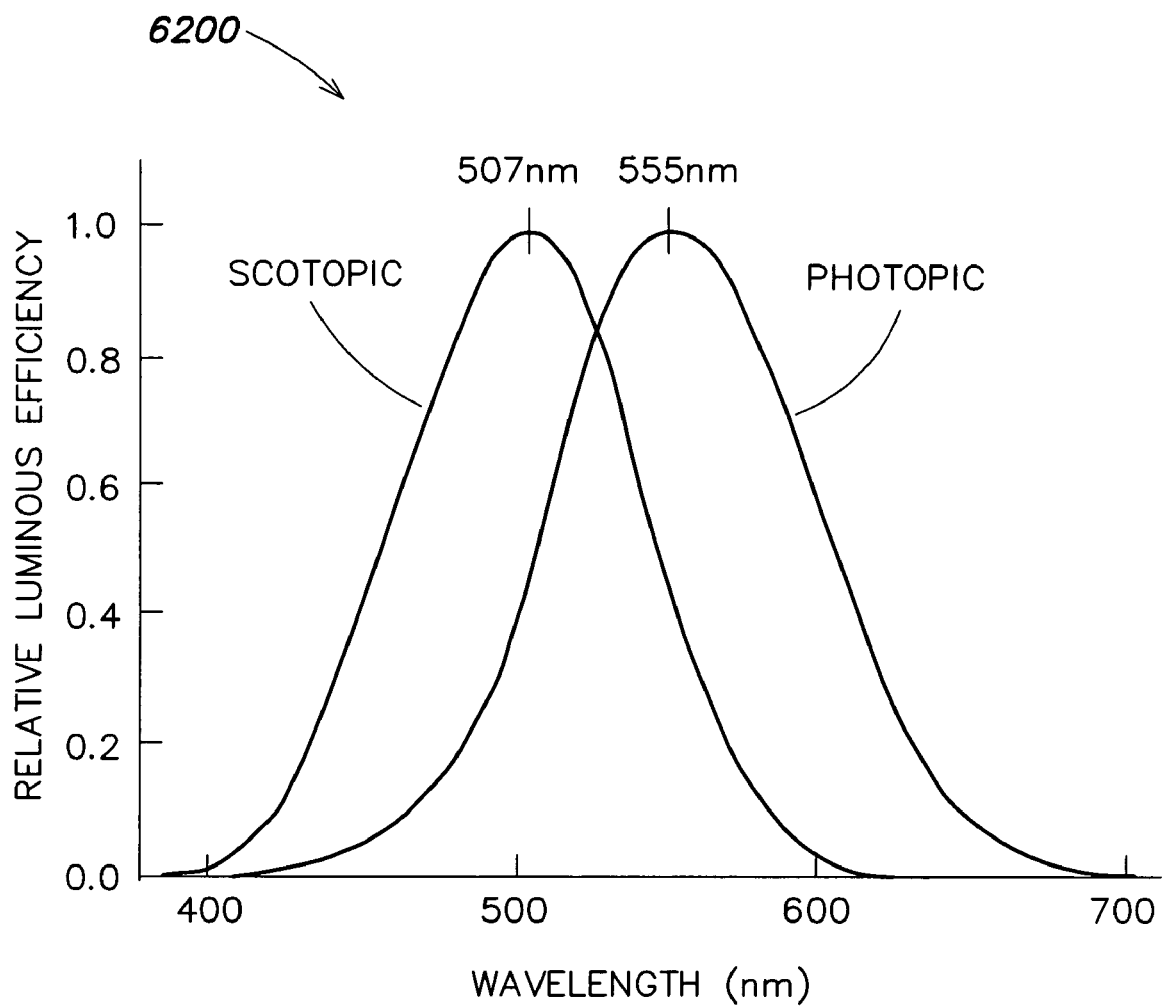
FIG. 62 is a schematic diagram showing responses of the eye to light.

Referring to FIG. 62 and the subsequent figures, typically an LED produces a narrow emission spectrum centered on a particular wavelength; i.e. a fixed color. Through the use of multiple LEDs and additive color mixing a variety of apparent colors can be produced, as described elsewhere herein.

In conventional LED-based light systems, constant current control is often preferred because of lifetime issues. Too much current can destroy an LED or curtail useful life. Too little current produces little light and is an inefficient or ineffective use of the LED.

It has also been known that the light output from and LED may shift in wavelength as a result in changes in current. In general, the shift in output has been thought to be undesirable for most applications, since a stable light color has previously been preferred to an unstable one.

Recent developments in LED light sources with higher power ratings (>100 mA) have made it possible to operate LED systems effectively without supplying maximum current. Such operational ranges make it possible to provide LED-based lighting units 100 that have varying wavelength outputs as a function of current. Thus, embodiments of the present invention include methods and systems for supplying light of different wavelengths by changing the current supplied to the LEDs in a manner that is intended to generate different wavelengths of light. These embodiments can help produce improved quality colors and improved quality white light.

Turning a constant-current source on and off very rapidly can control apparent LED output intensity. Control techniques are varied, but one such technique is pulse-width modulation (PWM), described elsewhere herein and in the documents incorporated by reference herein.

Conventional PWM output is a digital signal (square wave) whose width can be varied under microprocessor control. Other techniques, such as changing current, or analog control, can be used, but sometimes have drawbacks because of lifetime effects, poor control and output variations across a number of LED devices. Analog control also has system ramifications with long distances potentially attenuating the light output.

Recent developments in LEDs include higher power packages that can produce significant light output. LEDs have shifted from producing fractional lumens to many 10's of lumens of light output in just a few years. As with other LEDs, with the recent higher power package developments such as the Luxeon line from Lumileds, as the current supplied to the LED varies, the output wavelength shifts. However, unlike previous generation of LEDs, the current change required will not damage the device. Although earlier lower power devices exhibit a similar characteristic wavelength shift, the amount of shift was small and not easily controllable without adverse effects on the LED itself. The current control in the new power packages can be significant without damage to the device. Thus, it can produce a much wider spectrum shift. In some systems, that shift can be undesirable. However, the shift enables certain novel methods and systems described herein.

Described herein are embodiments for controlling LEDs to produce a variable white color temperature and for controlling and calibrating LED-based lighting units 100 to produce consistent color from unit to unit during production and even use.

The calibration technique is not simply changing the modulation of the LEDs but actually shifting the output wavelength or color. The sensitivity of the eye varies over the spectrum, as described, for example, in Wyszecki and Stiles, Color Science $2^{nd}$ Edition, Section 5.4, which is incorporated by reference herein. Current change can also broaden the narrow emission of the source and this shifts the saturation of the light source towards a broader spectrum source. Thus, current control of LEDs allows controlled shift of wavelength for both control and calibration purposes.

Referring to FIG. 62, in the visible spectrum, roughly 400 to 700 nm, the sensitivity of the eye varies according to wavelength. As shown in the chart 6200, the sensitivity of the eye is least at the edges of that range and peaks at around 555 nm in the middle of the green.

Figure 63:
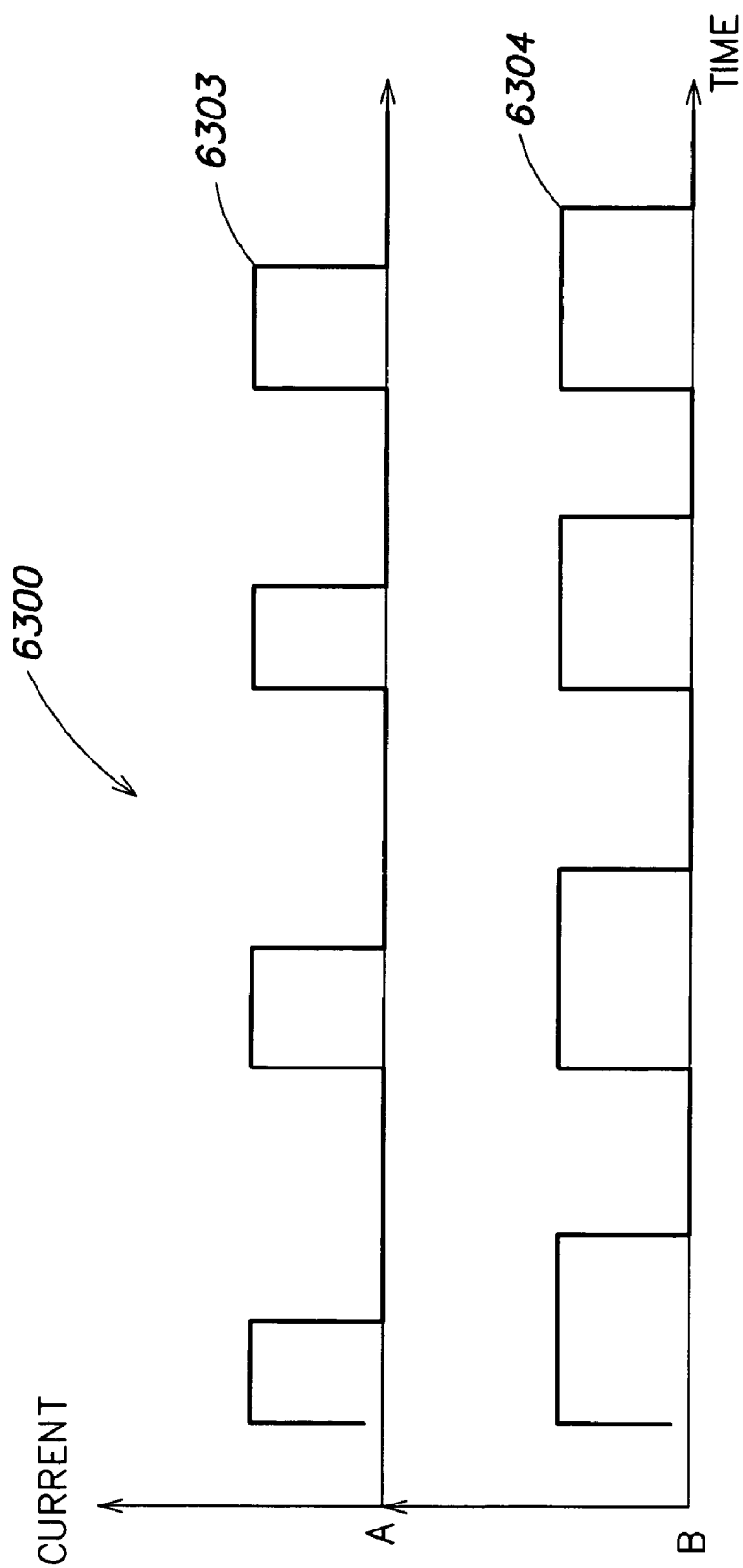
FIG. 63 is a schematic diagram showing square waves for a PWM signal.

Referring to FIG. 63, a schematic diagram 6300 shows pulse shapes for a PWM signal. By rapidly changing the current and simultaneously adjusting the intensity via PWM a broader spectrum light source can be produced. FIG. 63 shows two PWM signals 6302, 6304. Both control signals provide identical current levels to an LED(s) when on, and the width of the pulse varies to change the apparent or perceived intensity. The top PWM signal A, 6302, is narrower than the bottom signal, B, 6304. As a result, the top signal 6302 has less apparent output. This happens at sufficient speeds so there is no perceptible flicker. This rate is typically hundreds of Hertz or more. The overall duty cycle, the time between two 'on' times, could be 10 milliseconds or less.

Figure 64:
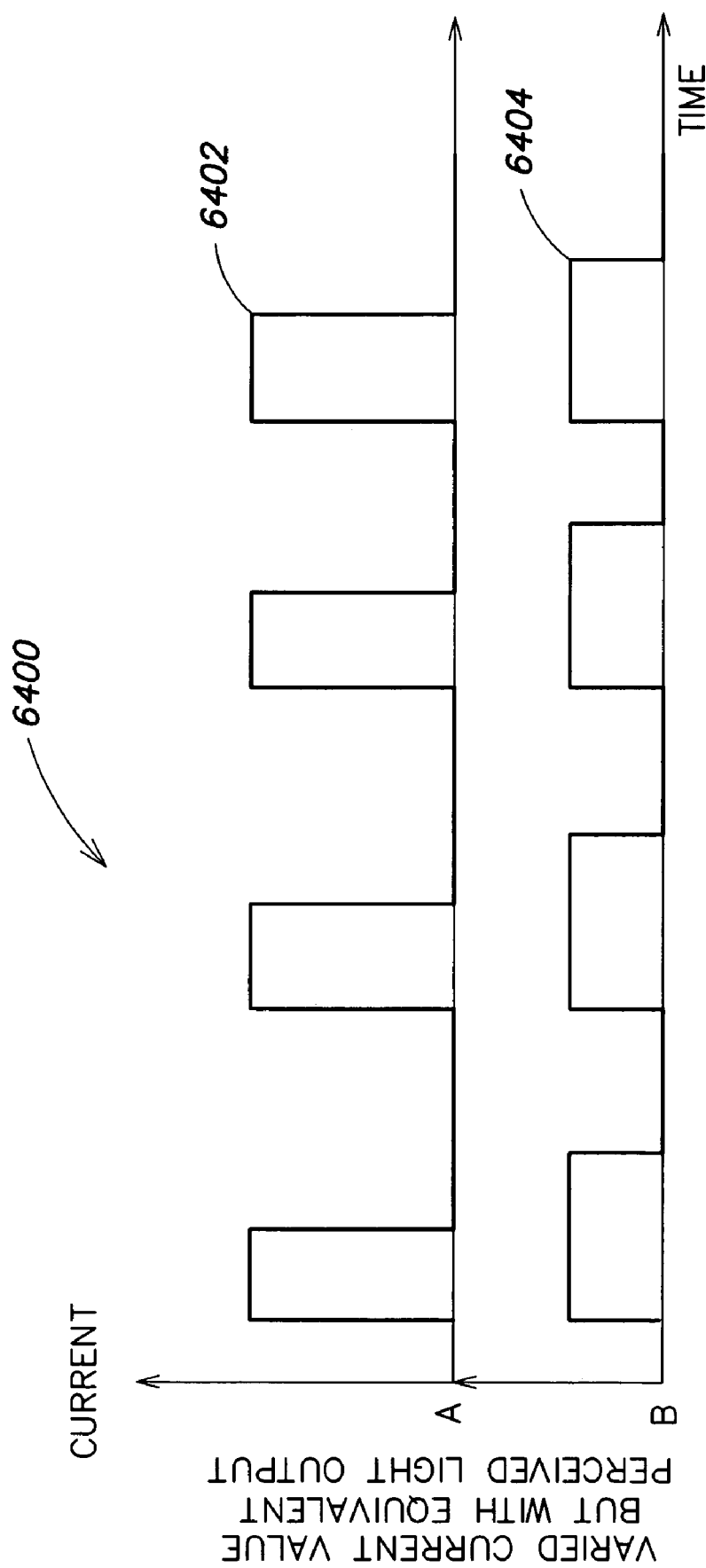
FIG. 64 is a schematic diagram showing square waves for a PAM/PWM signal.

Referring to FIG. 64, a schematic diagram 6400 again shows two PWM signals 6402, 6404. In this case the two PWM signals 6402, 6404 vary both in current level and width. The top one 6402 has a narrower pulse-width, but a higher current level than the bottom one 6404. The result is that the narrower pulse offsets the increased current level in the top signal 6402. As a result, depending on the adjustment of the two factors (on-time and current level) both light outputs could appear to be of similar brightness. The control is a balance between current level and the on time.

However, as noted above, one of the properties of many of the higher power LEDs is a significant wavelength shift that is a function of current. Thus, using the PWM together with coordinated current control, a lighting unit 100 can be created that varies in color (wavelength) by small amounts to produce several advantages. First, a change in color (hue) can be made with no change in intensity from a single LED. Second, rapidly changing the current levels can produce multiple emission spectra, which, when observed, produce a less saturated, broader spectrum source. Third, changes can be induced in multiple lighting units 100 to produce better additive mixing through the control of multiple strings or channels of LEDs in the combined light from the lighting units 100. Thus, multiple, narrow-spectra, saturated LED lighting units 100 can be combined to provide a high-quality, broad spectrum LED-based light source.

Figure 65:
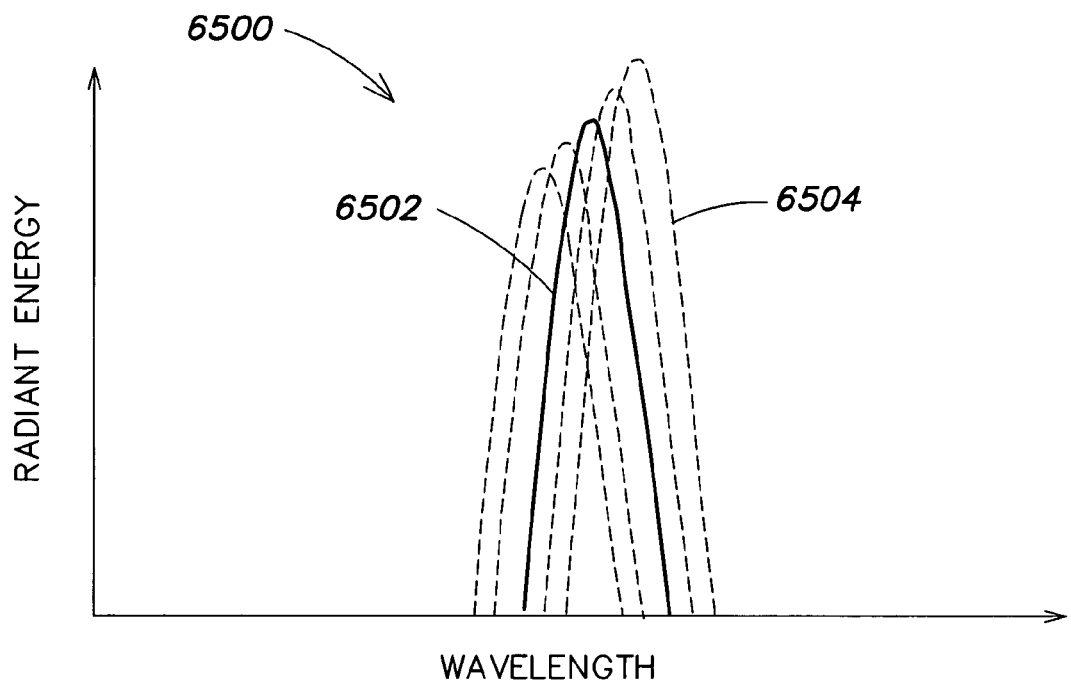
FIG. 65 is a schematic diagram showing spectral shift in light output from an LED as a result of current shift.

The schematic diagram 6500 of FIG. 65 shows the result of using a rapid shift in wavelength to shift the hue of an LED. The original emission spectrum 6502 is a relatively narrow-band emission. The resulting spectrum 6504 shows a shift that can result by changing the current. Note, however that simply changing the current will also change the LED output, which is why the dashed-line, current-modulated outputs 6504 differ in peak value. Higher current produces more light, and vice versa. Note that there is another effect from the V(lambda) curve, but over the relatively small shifts this may not be significant. This sensitivity adjustment could be incorporated into the control signals as well. The perceived output intensity can be changed by adjustment of the modulation of the signal such as by using the PWM method as shown below.

Figure 66:
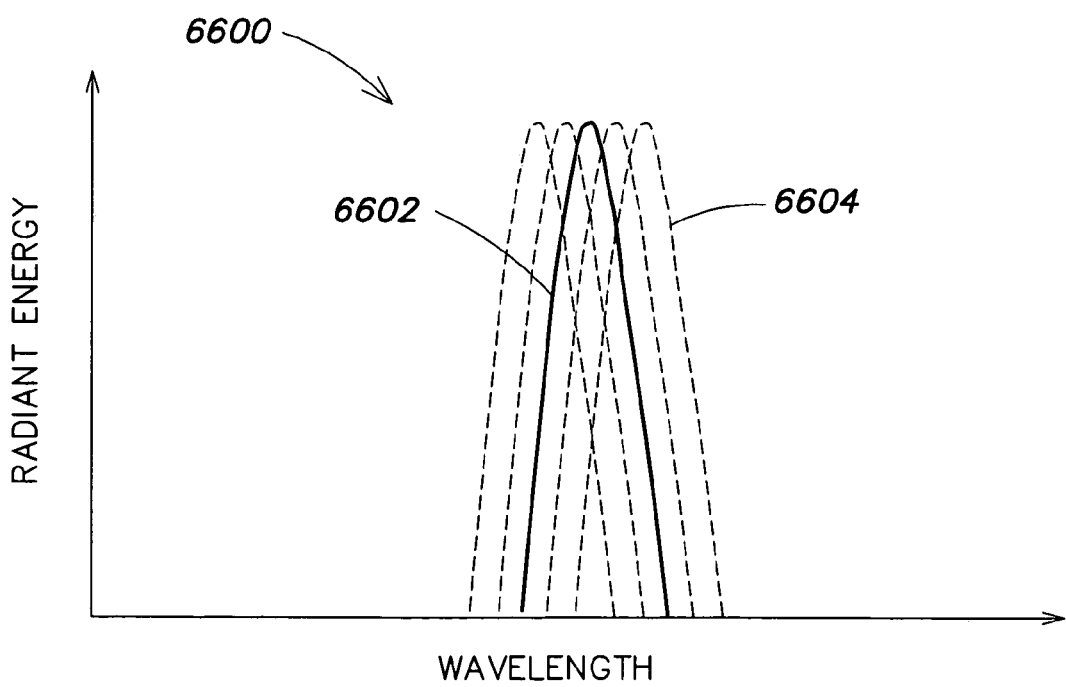
FIG. 66 is a schematic diagram showing a modulated spectral shift in light output from an LED based on a combination of current control and PWM control.

The schematic diagram 6600 of FIG. 66 shows the effect of changing both the current and adjusting the PWM for the purposes of creating a better quality white by shifting current and pulse-widths simultaneously and then mixing multiple sources, such as RG & B, to produce a high quality white. High quality can be determined through such metrics as Color Rendering Index or direct comparisons with traditional white light sources. In essence, the spectrum is built up by rapidly controlling the current and on-times to produce multiple shifted spectra. The wavelength is wiggled back and forth and this produces a broader spectrum output. Thus, the original spectrum 6602 is shifted to a broader-spectrum 6604 by current shifts, while coordinated control of intensity is augmented by changes in PWM.

The control described in connection with FIGS. 62 through 66 can be provided with various embodiments, including feedback loops, such as using a light sensor as a signal source 124, or a lookup table or similar facility that stores light wavelength and intensity output as a function of various combinations of pulse-width modulation and pulse amplitude modulation.

In embodiments, a lighting system can produce saturated colors for one purpose (entertainment, mood, effects), while for another purpose it can produce a good quality variable white light whose color temperature can be varied along with the spectral properties. Thus a single fixture can have narrow bandwidth light sources for color and then can change to a current and PWM control mode to get broad spectra to make good white or to make non-white light with broader spectrum color characteristics. In addition, the control mode can be combined with various optical facilities 120 described above to further control the light output from the system.

Figure 67:
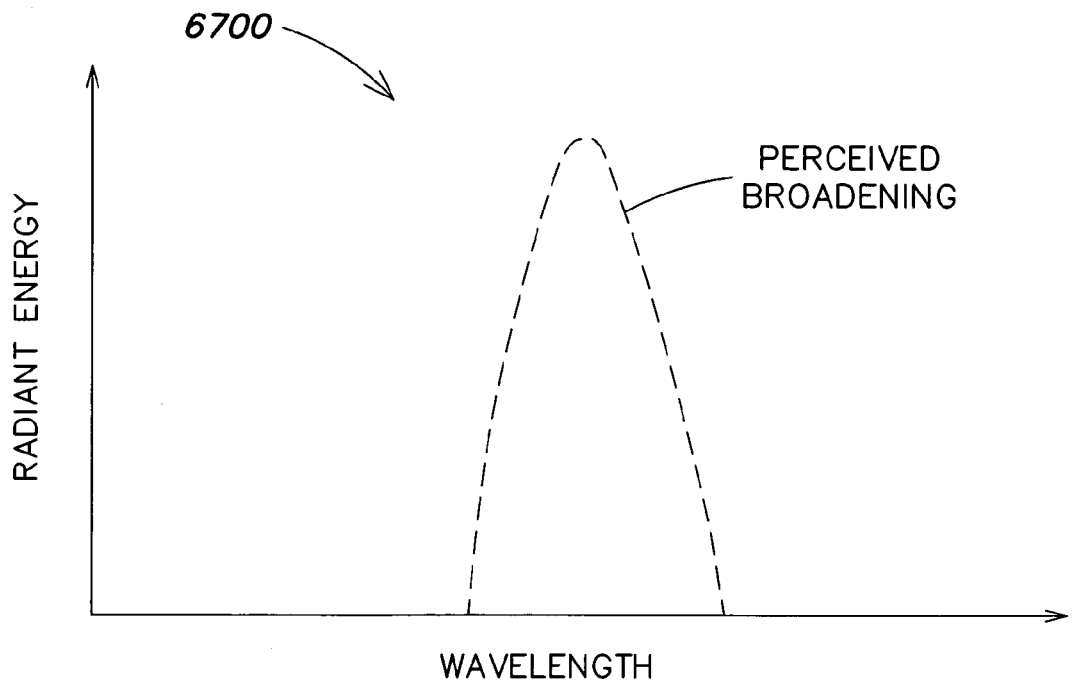
FIG. 67 is a schematic diagram showing a perceived broadening of wavelength based on modulated control of current and pulse width in an LED system.
Figure 68:
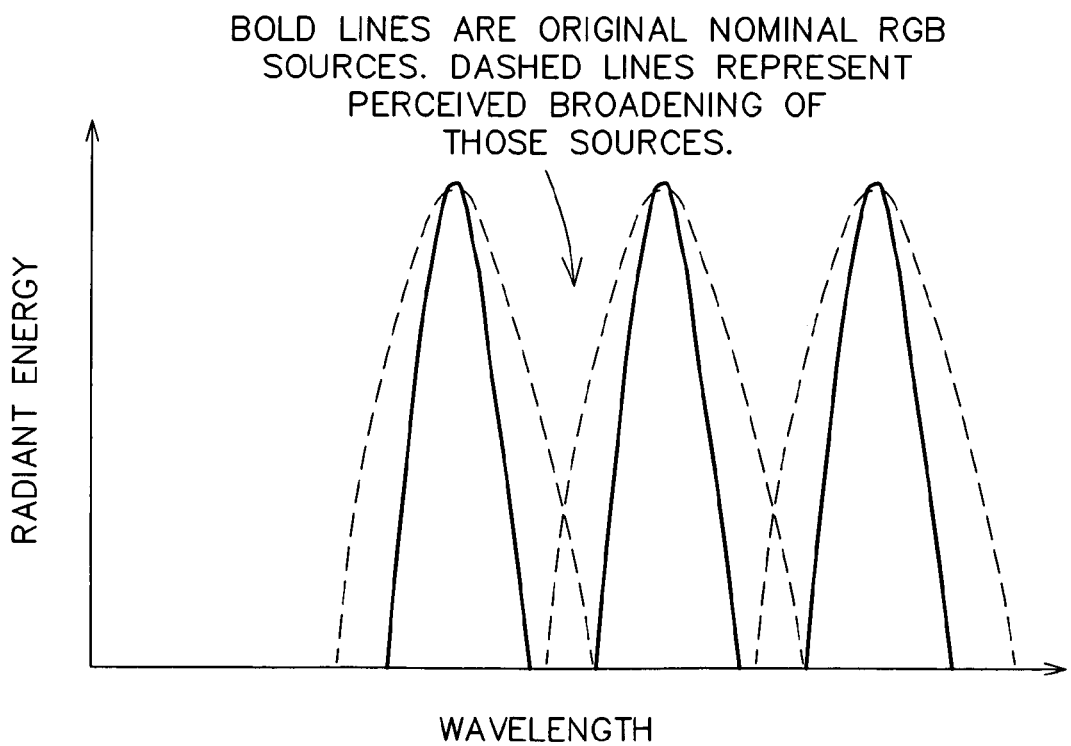
FIG. 68 shows a spectrum that can result from modulating multiple LEDs with both current and pulse width.

Referring to FIG. 67, a schematic diagram 6700 shows that current control can provide perceived broadening of a narrow-band source, such as a color LED. Referring to FIG. 68, with multiple LEDs as light sources, combined with perceived broadening as a result of varying the current supplied to the LEDs, a much broader-band source can be provided.

In embodiments, the methods and systems can include a control loop and fast current sources to allow an operator to sweep about a broad spectrum. This could be done in a feed-forward system or with feedback to insure proper operation over a variety of conditions.

Figure 69:
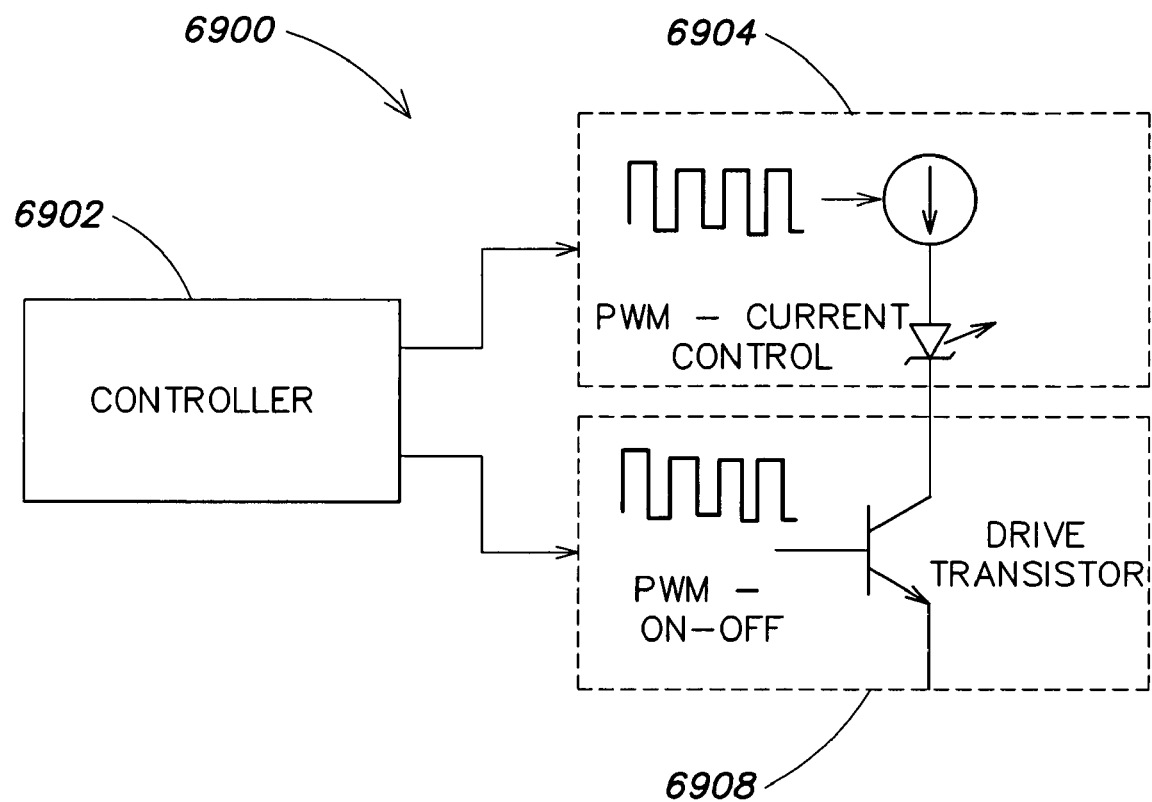
FIG. 69 is a schematic diagram of a controller that can offer both current control and PWM control.

Referring to FIG. 69, a control system 6900 embodiment can use a variety of well-known methods. Thus, the control facility 6902 can switch between a current-control mode 6904 (which itself could be controlled by a PWM stream) and a separate PWM mode 6908. Such a system can include simultaneous current control via PWM for wavelength and PWM control balanced to produce desired output intensity and color. FIG. 69 shows a schematic diagram 6900 with one possible embodiment for creating the two control signals from a controller, such as a microprocessor to control one or more LEDs in a string. Multiple such strings can be used to create a light fixture that can vary in color (HSB) and spectrum based on the current and on-off control. The PWM signal can also be a PWM Digital-to-analog converter (DAC) such as those from Maxim and others.

Note that the functions that correspond to particular values of output can be calibrated ahead of time by determining nominal values for the PWM signals and the resultant variations in the LED output. These can be stored in lookup tables or a function created that allows the mapping of desired values from LED control signals.

Another aspect of the present invention relates to the thermal management of a lighting system. In embodiments, a thermal management system may be employed as part of a lighting system to remove heat from heat sensitive portions of the lighting system. In embodiments, the thermal management system may be used in a light bulb, retrofit light bulb, or custom lighting solution. In an embodiment, a lighting system with proper thermal management, may be operated at higher light outputs, achieve greater life times, and or otherwise be improved.

Figure 70:
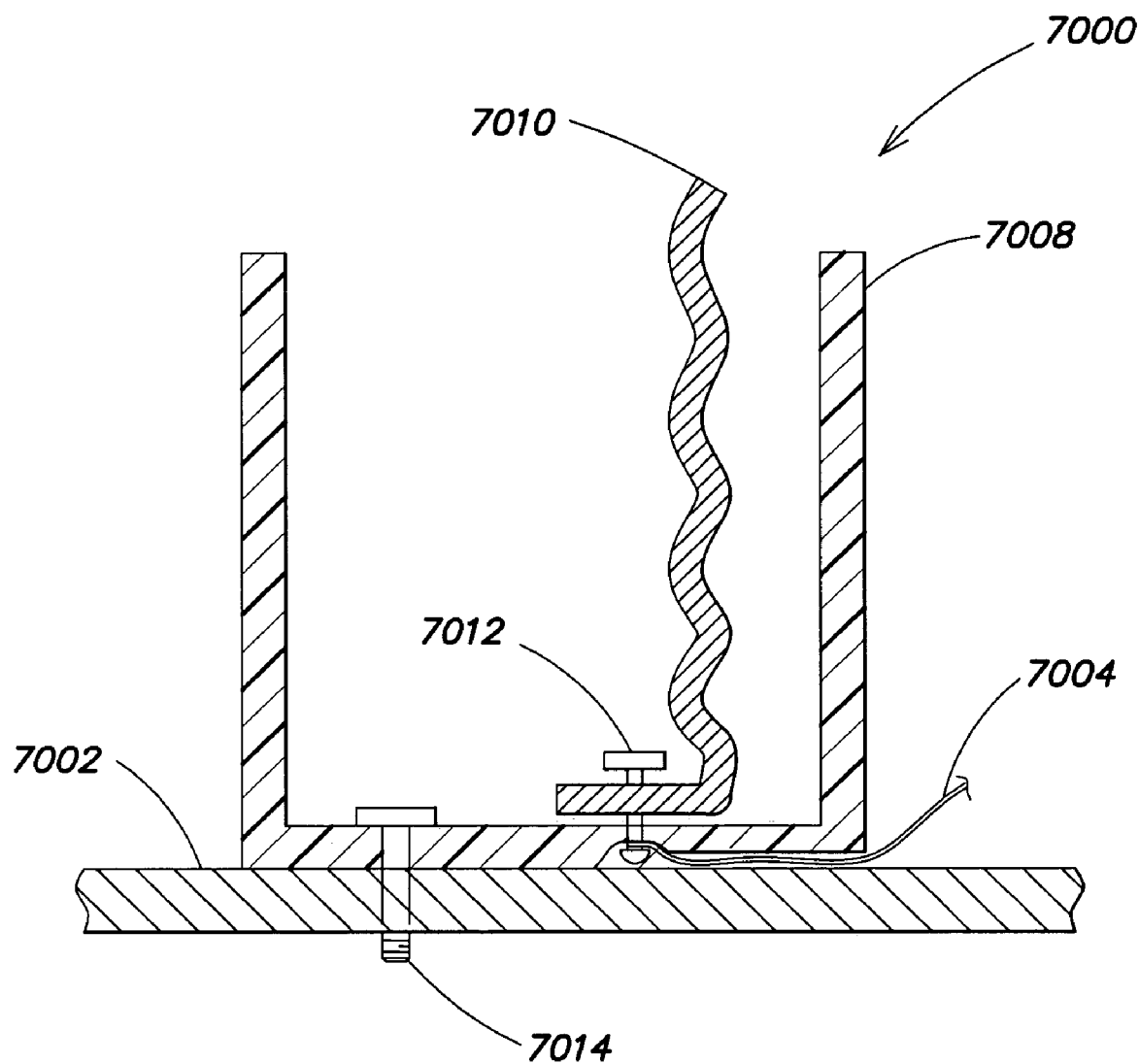
FIG. 70 illustrates a portion of a conventional Edison style light bulb socket.

FIG. 70 illustrates a portion of a conventional Edison style light bulb socket 7000. The socket includes an outer portion 7008, typically plastic, ceramic or other electrically insulating material. Generally mounted in the outer portion resides an inner shell 7010 that is attached to the outer portion 7008 by a fastener 7012. The shell is typically connected to an electrically conductive member 7004 (e.g. a wire) to electrically energize the shell to facilitate the transfer of power to an associated light bulb (not shown in this figure). The socket 7000 may also be mounted to a plate, fixture, or other platform through fastener 7014. As will be appreciated by one skilled in the art, an associated bulb would screw into a socket of this type and the socket 7000 would be associated with a lighting fixture or platform 7002. The heat generated by a conventional light bulb would partially be transmitted to the socket 7000 through the inner shell 7010 and pass through the wire 7004 and to the outer portion and eventually to the platform 7002 itself. While many of the embodiments herein are described in connection with screw bases and sockets, it should be understood that the base/socket connection may be any number of mechanical and or electrical interfaces designed to accomplish the objective. In an embodiment, this base/socket interface may be a simple set of conductors (e.g. wires).

Applicants recognized and appreciated that it would be useful to design a lighting system that transfers more of its generated heat to a socket and or platform to reduce the heat trapped in the lighting system itself. In embodiments, a lighting system is designed to transfer the heat through a conventional lighting socket (e.g. socket 7000). In embodiments, a lighting system is designed to transfer its generated heat more directly to a platform or fixture 7002 associated with the lighting system. In embodiments, a lighting system is designed to transfer its heat from more sensitive portions of the lighting system to areas that are less sensitive. In embodiments, the lighting system is an LED based lighting system.

Figure 71:
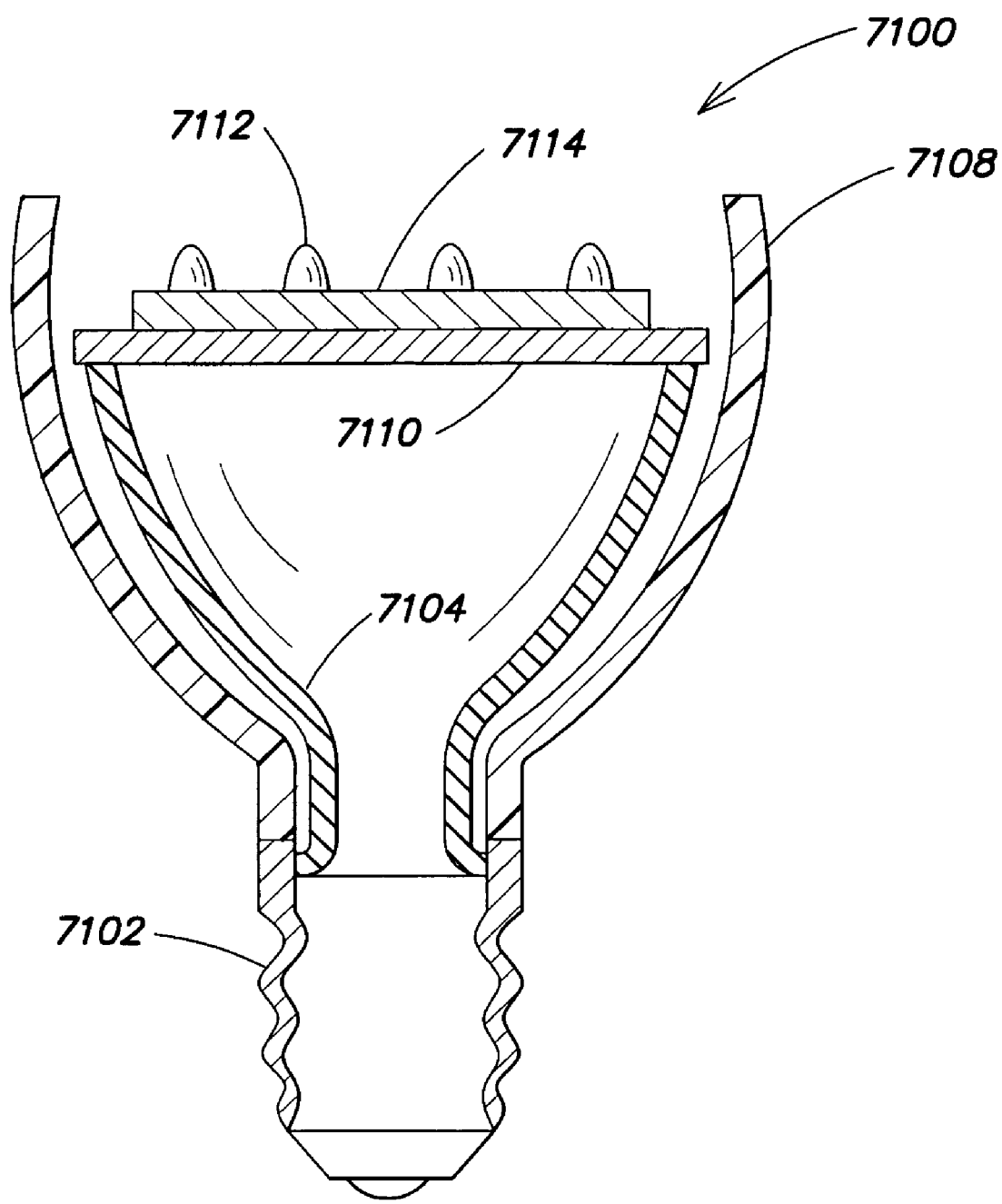
FIG. 71 illustrates a lighting system according to the principles of the present invention, including an internal heat transfer member.

FIG. 71 illustrates a lighting system 7100 according to the principles of the present invention, including an internal heat transfer member. The lighting system includes a base member 7102 adapted to be associated with a conventional light bulb socket (e.g. the socket illustrated in FIG. 70). The lighting system 7100 also includes a housing 7108. Mounted within the housing 7108, resides an LED lighting system including LEDs 7112, a circuit board 7114 and a thermally conductive back plate 7110 (e.g. a metal plate mounted on a circuit board or a metal core circuit board). The thermally conductive back plate 7110 is thermally associated with another thermally conductive transfer plate 7104, which is in turn thermally associated with the base member 7102.

The lighting system 7100 is designed to facilitate the transfer of internally generated heat to an area that is not sensitive to heat loads. For example, the LEDs 7112 may generate significant heat but be sensitive to the heat if it is not properly removed from the LEDs. The construction illustrated in FIG. 71 is provided to illustrate how the heat generated by the LEDs may be passed to the thermally conductive back plate 7110, to the transfer plate 7104 and to the base member 7102. Once the heat is transferred to the base member 7102 it may also be transferred to the inner shell of a socket (e.g. inner shell 7010). This system effectively removes heat from a sensitive area of the lighting system (e.g. the LEDs) and transfers it to a less sensitive area and possibly out to an associated lighting fixture (e.g. 7002). In an embodiment, assemblies 7110 and 7104 may be designed to be a one-piece assembly.

Figure 72:
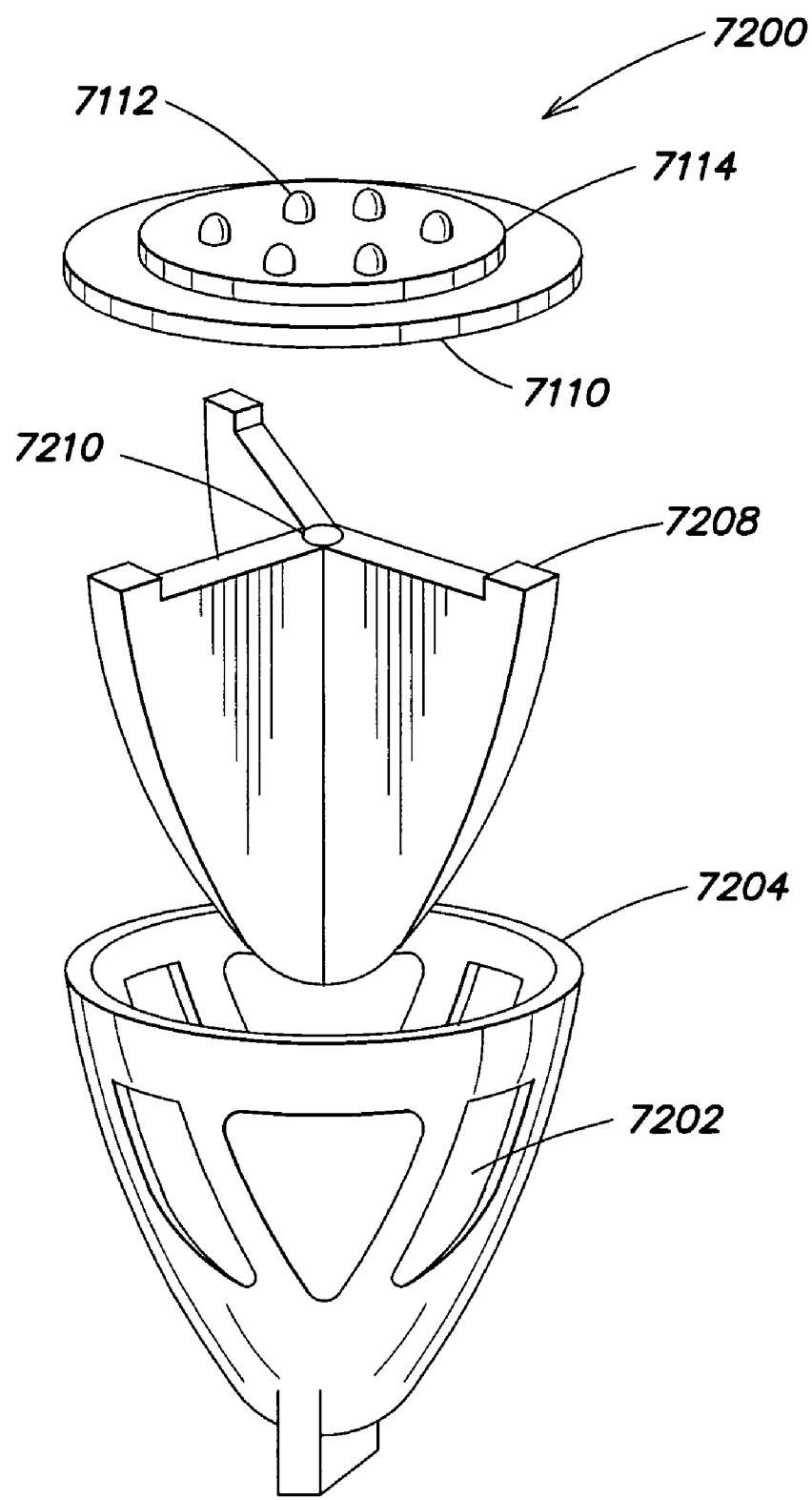
FIG. 72 illustrates another embodiment of the present invention, including a heat sink.

FIG. 72 illustrates another embodiment of the present invention, including a heat sink. An LED lighting system similar to the one illustrated in FIG. 71 is employed in this embodiment. The LED lighting system may include LEDs 7112, a circuit board 7114 and a thermally conductive back plate 7110. The thermally conductive back plate may be associated with a thermally conductive heat sink 7208. The lighting system may include a housing 7204 with vents 7202 to provide for air flow over the heat sink 7208. As illustrated, the heat would be transferred from the LEDs to the heat sink and the vents would allow for air flow to remove heat from the heat sink. One skilled in the art would appreciate that the heat sink 7208 may take many forms. In embodiments, the housing 7204 may not be vented as the thermal capacity of the heat sink may be adequate to remove the required heat from the lighting system. In embodiments, the heat sink may be the housing 7204 itself. The back plate 7110 may be associated with a thermally conductive form of housing 7204 with no other internal heat sink required. In an embodiment, the housing or shell design may be contoured or designed with specific surface treatments to provide for maximum heat transfer.

Figure 73:
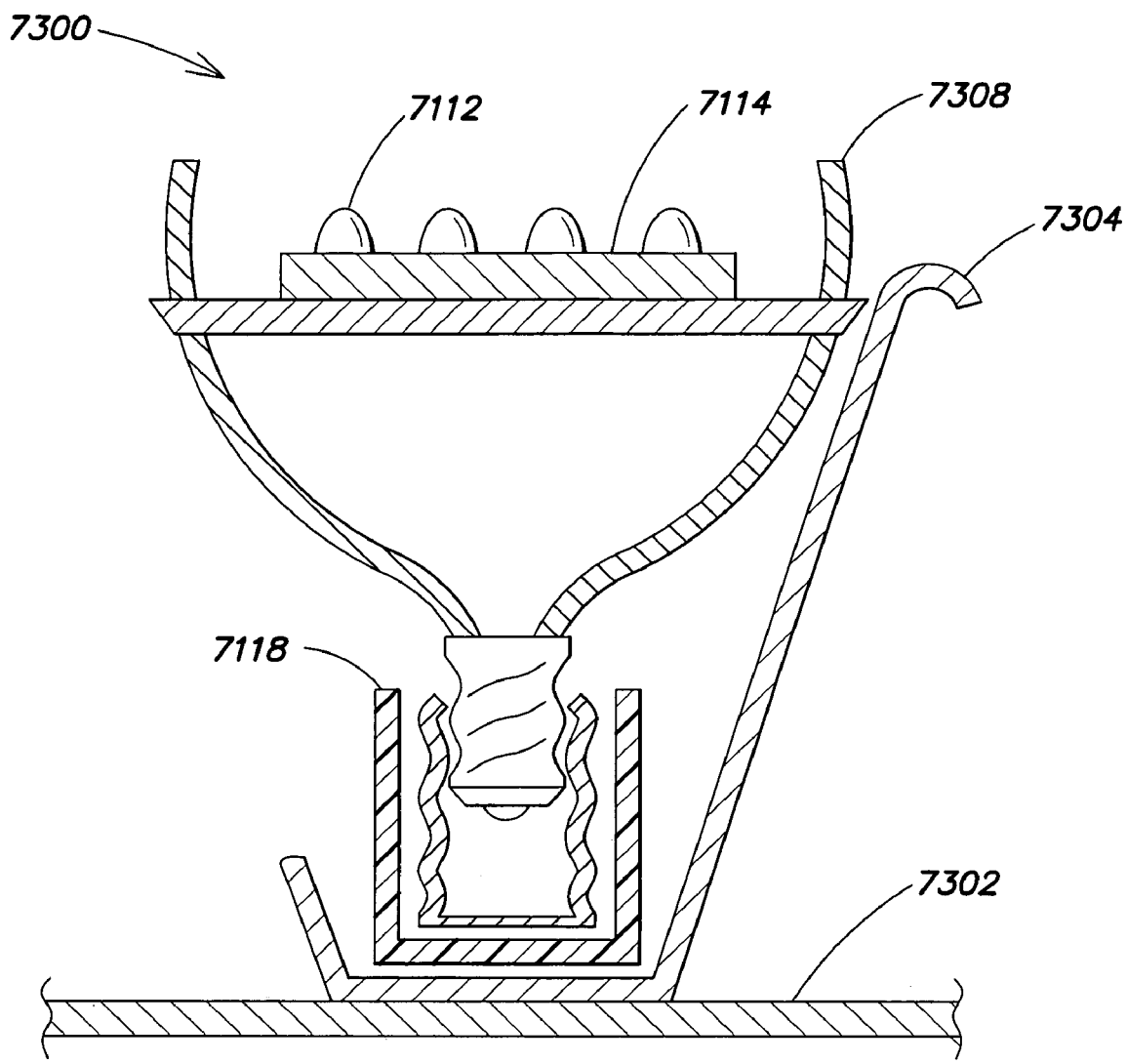
FIG. 73 illustrates a lighting system according to the principles of the present invention, which is associated with a socket heat transfer member.

FIG. 73 illustrates a lighting system according to the principles of the present invention, which is associated with a socket heat transfer member 7304. The lighting system 7300 is adapted to transfer a significant amount of heat from the internal lighting system to socket heat transfer member 7304. The socket heat transfer member 7304 is thermally associated with plate 7302 (e.g. a thermally conductive portion of a lighting fixture). The lighting system 7300 includes a back plate 7110, along with LEDs 7112 and a circuit board 7114 as previously described, and the back plate 7110 passes through the housing 7308 and is adapted to make contact with the socket heat transfer member 7302 as the lighting system is screwed into the socket 7118 (which may be similar to previously described socket 7000). The heat generated by the lighting system can thus be, in some significant part, transferred to the lighting fixture so it is removed from the more sensitive areas of the lighting system.

Figure 74:
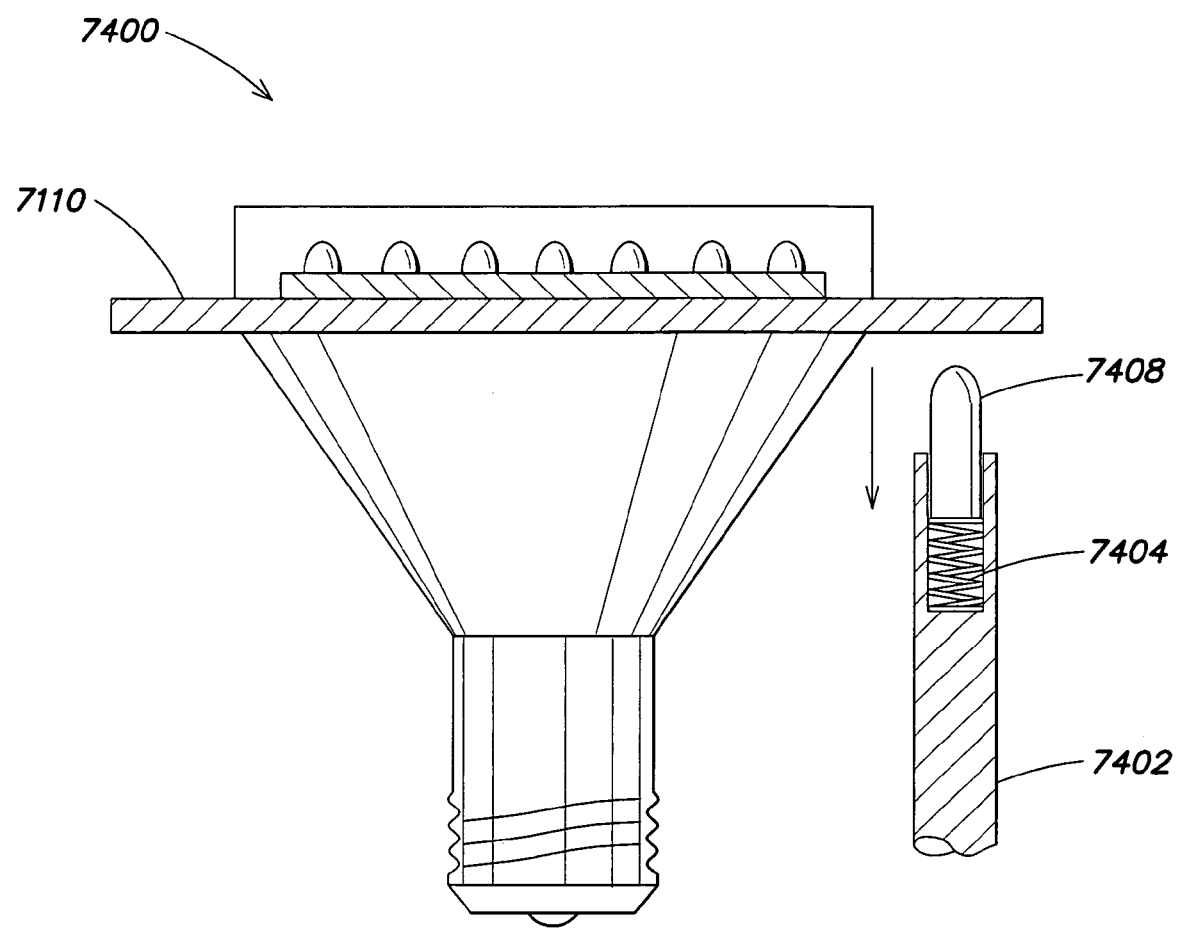
FIG. 74 illustrates a lighting system according to the principles of the present invention, which is associated with a flexible thermal transfer member.

FIG. 74 illustrates a lighting system 7400 according to the principles of the present invention, which is associated with a flexible thermal transfer member. The lighting system 7400 includes a flexible thermal transfer member 7402. The flexible thermal transfer member 7402 includes a contact 7408 and a flexible positive load device (e.g. a spring). As the lighting system is screwed into a socket (not shown in this figure), the back plate 7110 will make contact with the contact 7408 and the contact 7408 will compress the load device until the lighting system is properly seated in the socket. Lighting system generated heat will then be transferred to the thermal transfer member 7402 and possibly out to another system.

Figure 75:
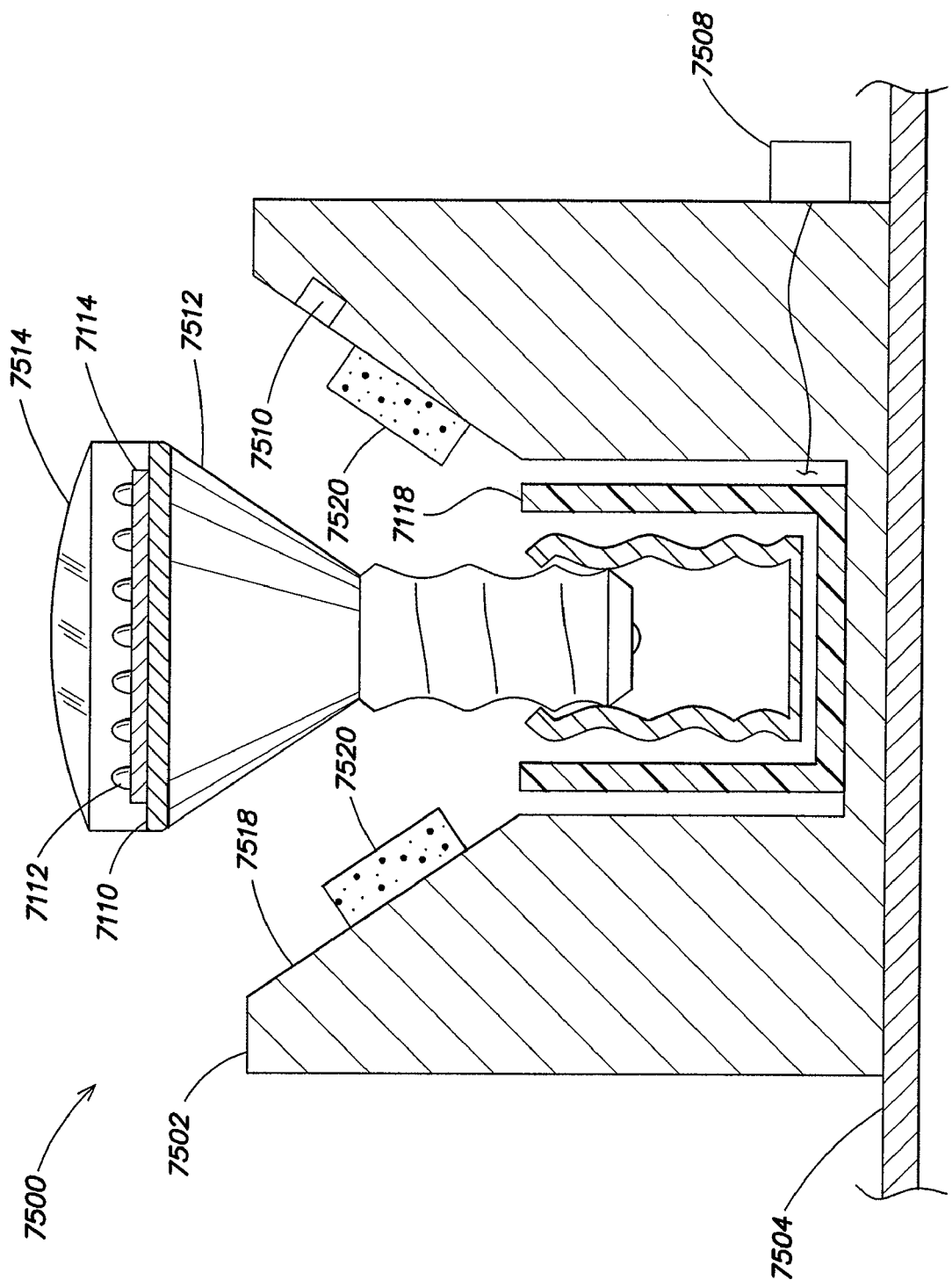
FIG. 75 illustrates a lighting system according to the principles of the present invention, including a thermal transfer facility.

FIG. 75 illustrates a lighting system 7500 according to the principles of the present invention, including a thermal transfer facility 7502. The lighting system 7500 includes an LED light comprising LEDs 7112, a circuit board 7114 and a back plate 7110. The back plate is thermally associated with a thermally conductive housing 7512. The housing is associated with a lens 7514. The lighting system is associated with a thermal transfer facility 7502 which includes an inner surface 7518. The inner surface 7518 mates, or otherwise becomes thermally associated with, the housing 7512 as the light becomes mechanically associated with the electrical facility (e.g. as the light is screwed into the socket 7118, pressed into the socket, or otherwise engaged). The socket 7118 may be associated with electrical conductors that pass through the thermal transfer facility 7502 at point 7508. The thermal transfer facility 7502 may also include a sensor 7510 to indicate if a lamp is present or not. The lighting system (e.g. light bulb) may include such a sensor (not shown) as well or in place of one in the thermal transfer facility. The sensor may indicate to a lighting system processor (not shown in this view but similar to processor 102 of FIG. 1) that the lighting system is properly engaged with the thermal transfer facility 7502. In embodiments, this permits the intelligent regulation of the lighting system. For example, a lighting system may operate properly when not associated with a thermal transfer facility 7502, but only when the lighting system is operated at less than optimal power loadings (e.g. 75% of optimal power). If the sensing system senses that the lighting system is not properly associated with the thermal transfer facility 7502, the processor may decrease the power dissipated by the lighting system. If the sensing system senses that the lighting system is properly associated with the thermal transfer facility 7502, the processor may increase the power dissipated by the lighting system to an intended or optimal power. A temperature sensor in the lamp or the socket may be used to determine heat flow of the system and a processor may regulate the power delivered to the lamp for regulation.

In embodiments, a lighting system is presented that is optimized to operate while associated with a thermal transfer facility 7502 and optimized to operate when not associated with a thermal transfer facility 7502. The mechanism for determining the association of the lighting system with the thermal transfer facility 7502 may be manual (e.g. a switch on the side of the lighting system) or automatic (e.g. a sensor system as described above). As indicated above, a sensing system may be associated with the lighting system or the thermal transfer facility. If it is associated with the thermal transfer facility, power regulation control may occur outside of the lighting system (e.g. power is turned down outside of the light) or the sensor may transmit a signal to the lighting system (e.g. through the power line, IR, RF, wired or wireless).

In embodiments, sensor 7510 may be a proximity sensor, ultrasonic sensor, magnetic sensor, electrical sensor, electromechanical sensor, mechanical sensor, or other style and it may be located in the lighting system, in the thermal transfer facility, or otherwise located to perform the intended function.

In embodiments, the lighting system 7500 may include a thermally conductive material 7520 (e.g. gap pad) positioned between the lamp housing 7512 and the socket surface 7518. The thermally conductive material 7520 may be mechanically forgiving such that it compresses while the lamp is seated into the socket to ensure better thermal contact of the lamp to the material to the socket. In an embodiment, the thermally conductive material 7520 may be attached to the lamp. In an embodiment, the thermally conductive material 7520 may be attached to the socket. In an embodiment, a user may place the thermally conductive material 7520 between the lamp and the socket. In an embodiment, the surface of the lamp and or the surface of the socket may be treated or altered to make the thermal contact between the lamp and socket better. For example, the lamp surface may include metal bristles to better mate with the socket surface.

Figure 76:
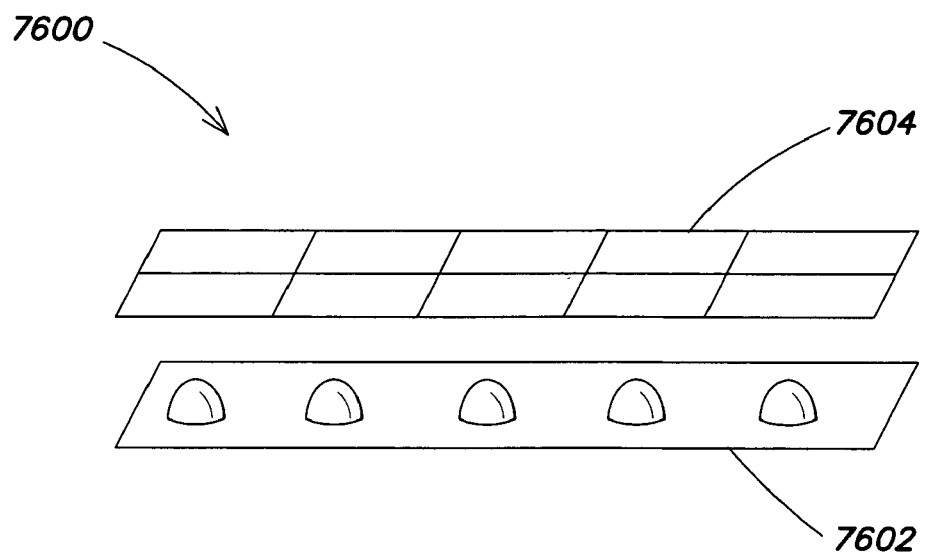
FIG. 76 illustrates a lighting system according to the principles of the present invention, which is associated with a building ventilation system.

FIG. 76 illustrates a system 7600 according to the principles of the present invention, which is associated with a building ventilation system 7604. In embodiments, the association is a thermal association and designed to transfer heat from the lighting system to the ventilation system. For example, the thermal association may be mechanical in nature as typical ventilation systems are made of materials with good thermal transfer properties (e.g. aluminum) or the thermal association may be convective in nature as the air flow from the ventilation system can be used to cool the lighting system. The ventilation system 7604 may have surface features (e.g. air channels) to disrupt or redirect the flow of the air onto the LED lighting system 7602. Such a lighting system may be integrated into a plenum system and or suspended ceiling.

Figure 77:
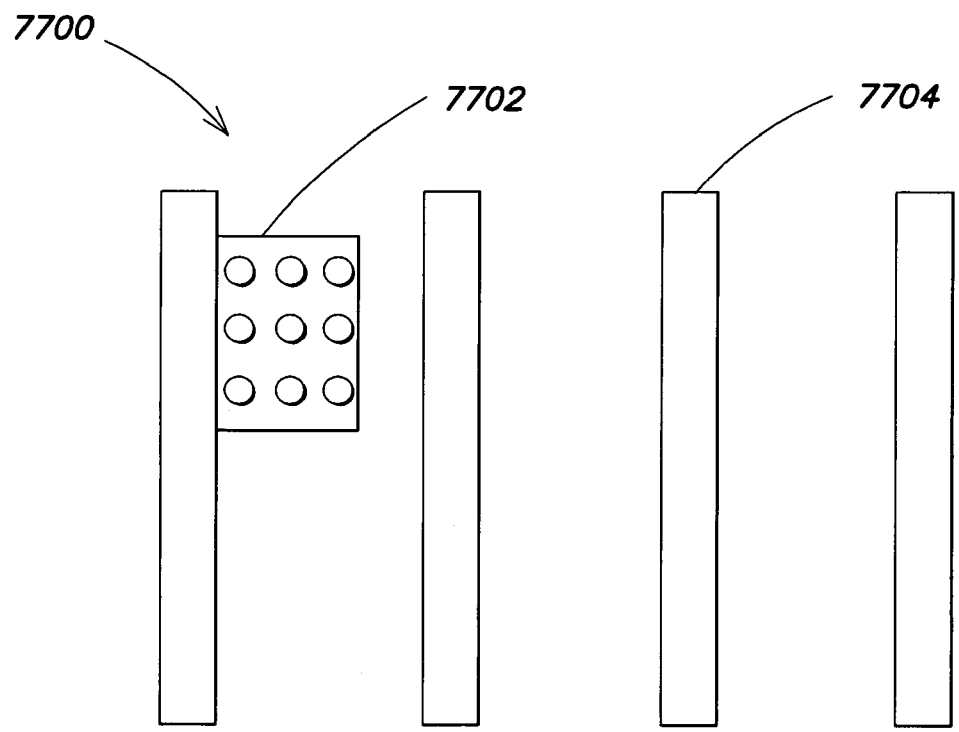
FIG. 77 illustrates a lighting system according to the principles of the present invention, which is associated with thermally conductive building material.

FIG. 77 illustrates a system 7700 according to the principles of the present invention, which is associated with thermally conductive building material 7704. In embodiments, the LED lighting system 7702 is thermally associated with beams, studs, wall construction material, ceiling construction material, floor construction material or other thermally conductive building materials. In a construction according to the present invention, heat generated by the lighting system may be transferred to the building material. In an embodiment, the building material may be associated with other building materials.

Figure 78:
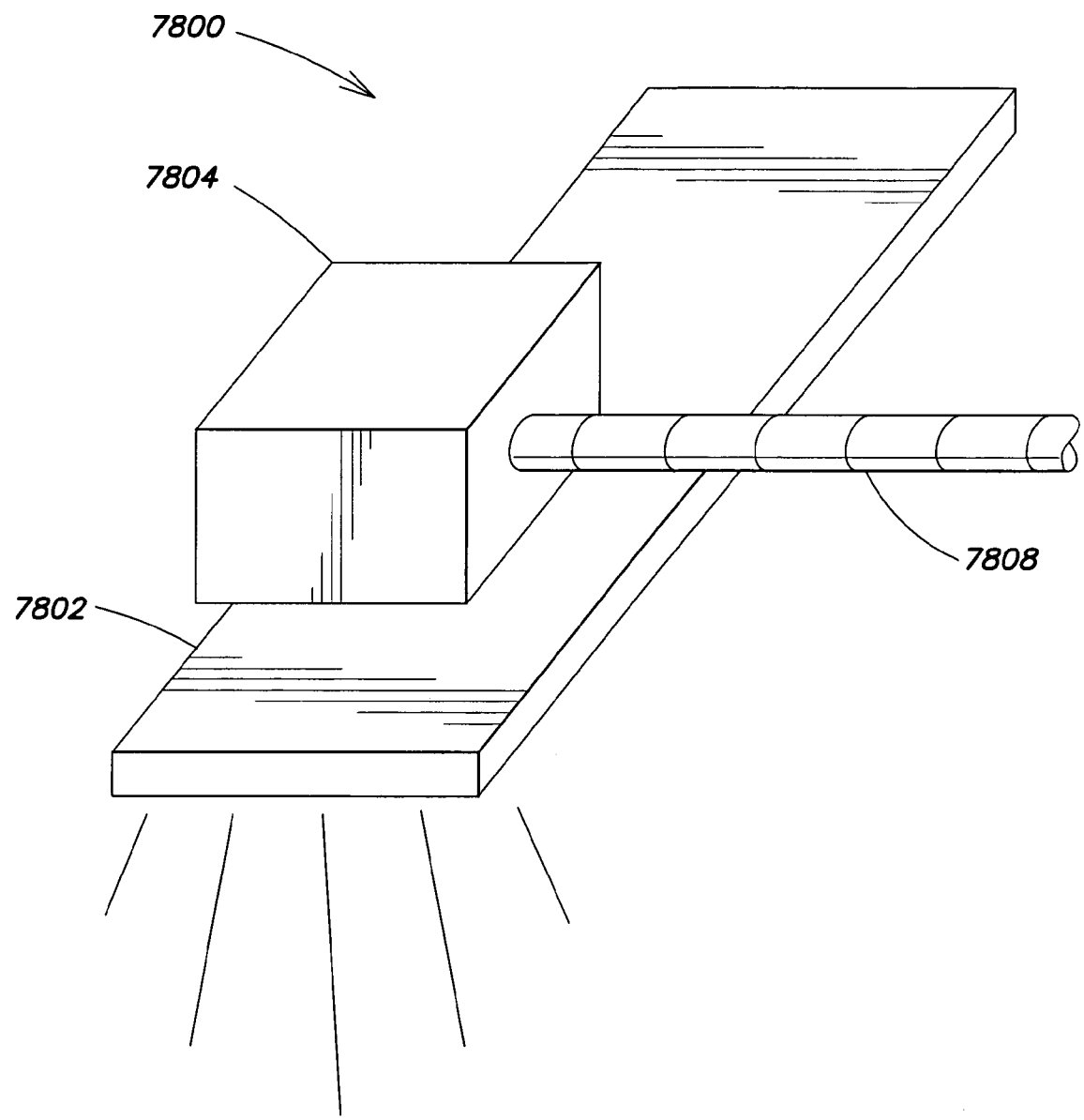
FIG. 78 illustrates a lighting system according to the present invention, which is associated with thermally conductive building material.

FIG. 78 illustrates a lighting system 7802 according to the present invention, which is associated with thermally conductive building material 7804. In embodiments, the building material 7804 is a junction box, housing, electrical box, or other system associated with an electrical housing system. The building material 7804 may also be associated with other building materials, such as, for example, piping, conduit 7808 or the like.

Figure 79:
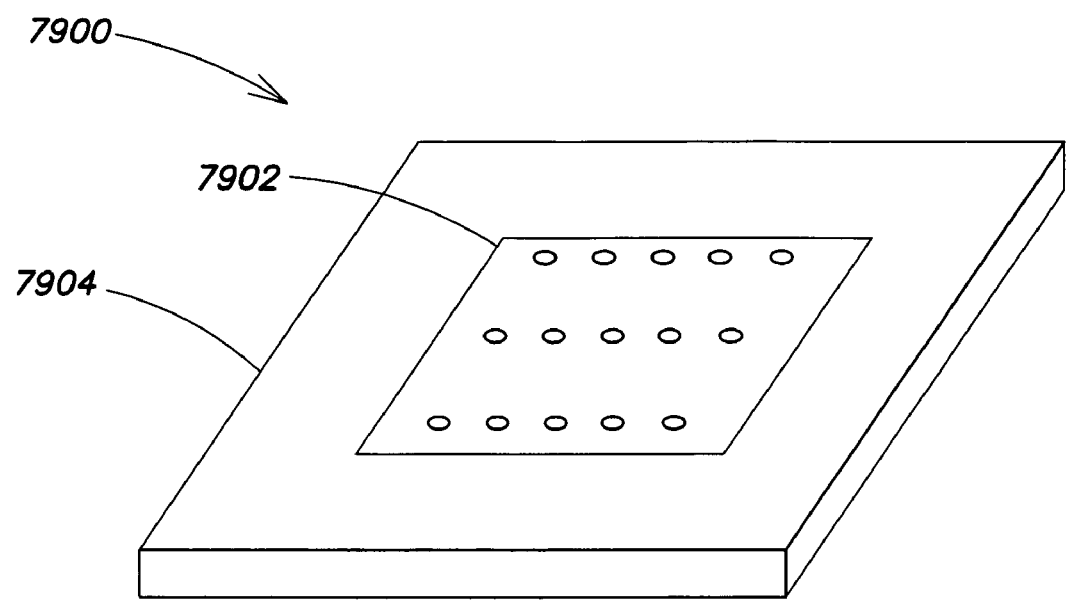
FIG. 79 illustrates a lighting system according to the present invention, which is associated with thermally conductive building material.

FIG. 79 illustrates a system 7900 according to the present invention, including a lighting system 7902 associated with thermally conductive building material 7904. In embodiments, the building material 7904 may be a ceiling tile, floor tile, wall tile or other construction decorative material.

Figure 80:
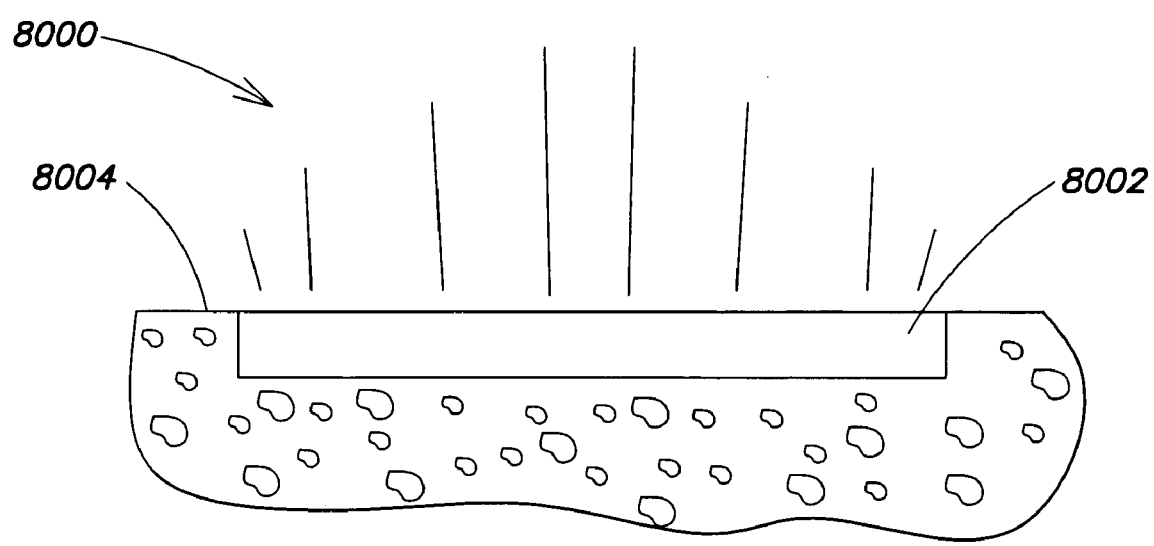
FIG. 80 illustrates a lighting system according to the present invention, which is associated with thermally conductive building material.

FIG. 80 illustrates a system 8000 according to the present invention, which is associated with thermally conductive building material 8004. In embodiments, the building material 8004 may be concrete, stone, or other material used in the construction or decoration of a building. For example, the building material 8004 may be a concrete floor adapted to fit a lighting system 8002 and the heat generated by the LED lighting system 8002 may be transferred to the floor.

Figure 81:
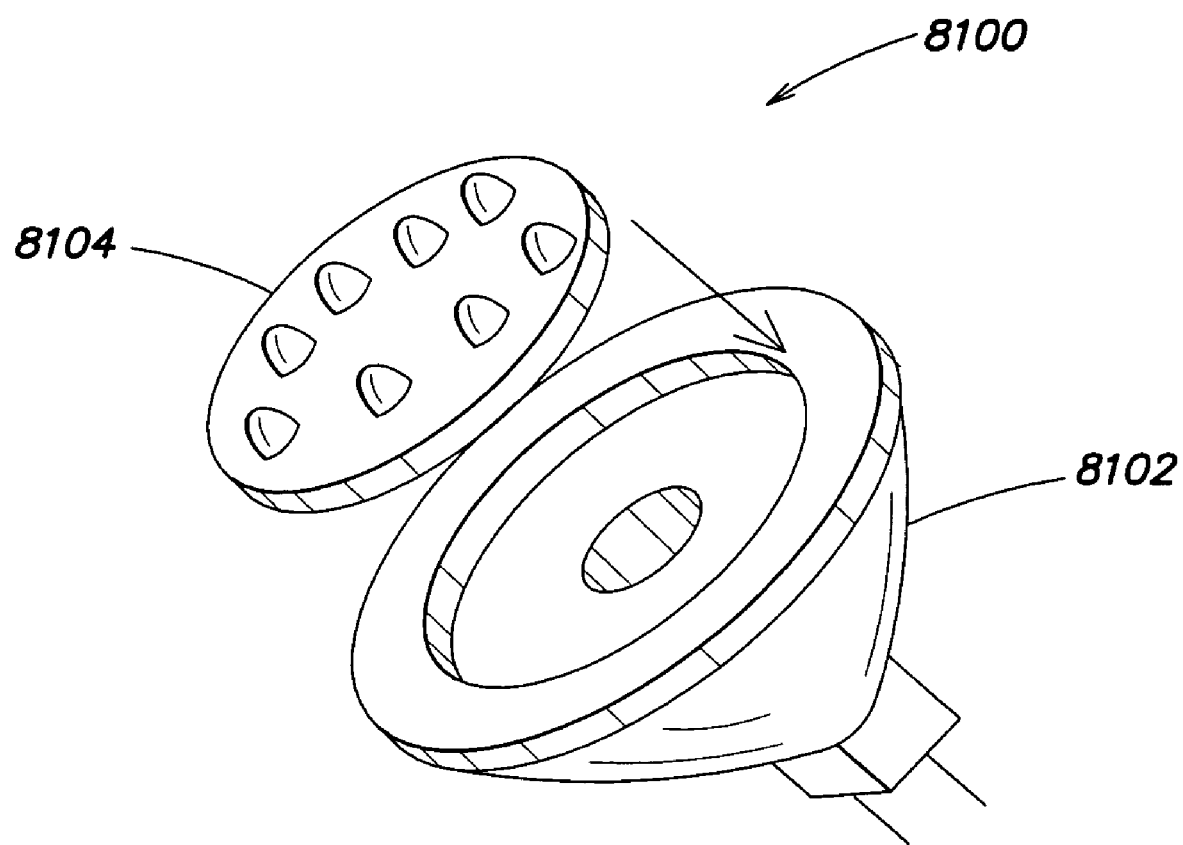
FIG. 81 illustrates a lighting system which includes a thermally conductive housing 8102 according to the principles of the present invention.

FIG. 81 illustrates a system 8100 according to the principles of the present invention, which includes a thermally conductive housing 8102. In embodiments, the thermally conductive housing 8102 is thermally associated with an LED lighting system 8104. The LED lighting system 8104 may be of the kind described herein with respect to other embodiments (e.g. LEDs mounted on a thermally conductive or backed board). In embodiments, the thermally conductive housing 8102 may be made of thermally conductive material (e.g. metal or ceramic). In embodiments, the housing 8102 may be machined, molded, cast or otherwise formed.

While many of the embodiments herein describe passive thermal management systems and methods, a lighting system according to the principles of the present invention may include active cooling. For example, the lighting system may include a fan or other device to actively move air across and or through the lighting system to remove heat. In an embodiment, the active cooling system may be included as part of a retrofit lighting system. In an embodiment, the active cooling system may be associated with a lighting fixture meant to house the lighting system.

A lamp socket may be specifically designed (e.g. with certain compatible mechanical or electrical interfaces) to mate with an LED lighting system. In an embodiment, such a socket may also be designed to permit, or alternatively to prevent (such as to avoid installation of a lighting system that is not electrically compatible with the conventional system), the compatibility with other conventional lighting systems (e.g. incandescent, halogen, fluorescent). In an embodiment, such a socket may be designed to permit, or alternatively to prevent, compatibility with certain sized lights (e.g. higher power consumption lights).

Figure 82:
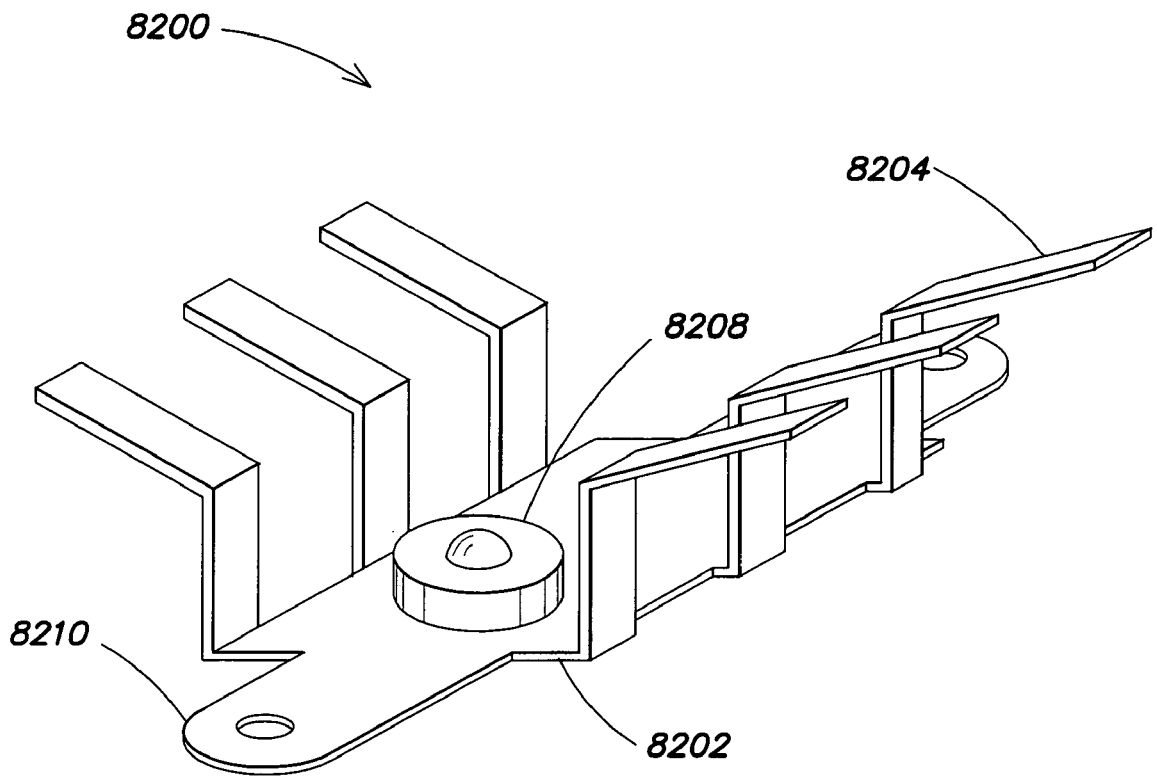
FIG. 82 illustrates a lighting system with a thermal management system according to the principles of the present invention.

FIG. 82 illustrates a lighting system 8200 with a thermal management system according to the principles of the present invention. In an embodiment, the lighting system 8200 includes an LED(s) 8208, a platform 8202, heat sink fins 8204 and modular connector 8210. In this embodiment, the LED(s) 8208 is mounted on the platform 8202 in such a way as to transfer heat generated by the LED(s) 8208 to the platform 8202. The platform 8202 is made of a thermally conductive material (e.g. metal). The heat sink fins 8204 are thermally associated with the platform (e.g. stamped from the same piece of metal). This arrangement promotes the transfer of heat from the LED(s) 8208 to the platform 8202 and the fins 8204 to dissipate the heat from the LED. In embodiments, the platform 8202 may be further associated with another thermally conductive surface (e.g. a mounting surface). The platform may be associated with the modular connector 8210 (e.g. stamped from the same piece of metal). The modular connector 8210 may be adapted to connect, or be connected with, another modular connector of another lighting system 8200. This methodology may be used to create a string of lighting systems 8200. The connection of the lighting systems 8200 may be flexible and allow for alteration in the string configuration. For example, the connection between lighting systems 8200 may be a pin connection to allow for lateral movement. In an embodiment, the connector 8210 may be a joint that allows rotational movement. In an embodiment, the lighting system 8200 may be made without the heat sink fins 8204.

Figure 83:
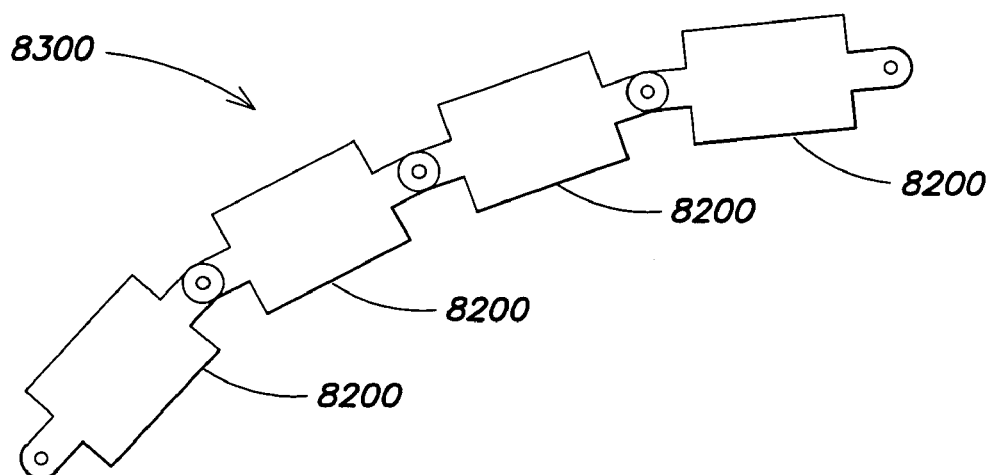
FIG. 83 illustrates a plurality of lighting systems in a connected configuration.

FIG. 83 illustrates a plurality of lighting systems 8200 in a connected configuration 8300. The connected configuration 8300 may be used to light a cove, channel letter, channel, or other area. The connected configuration may be used as a flexible lighting system to light areas where flexibility is desired or required.

Figure 84:
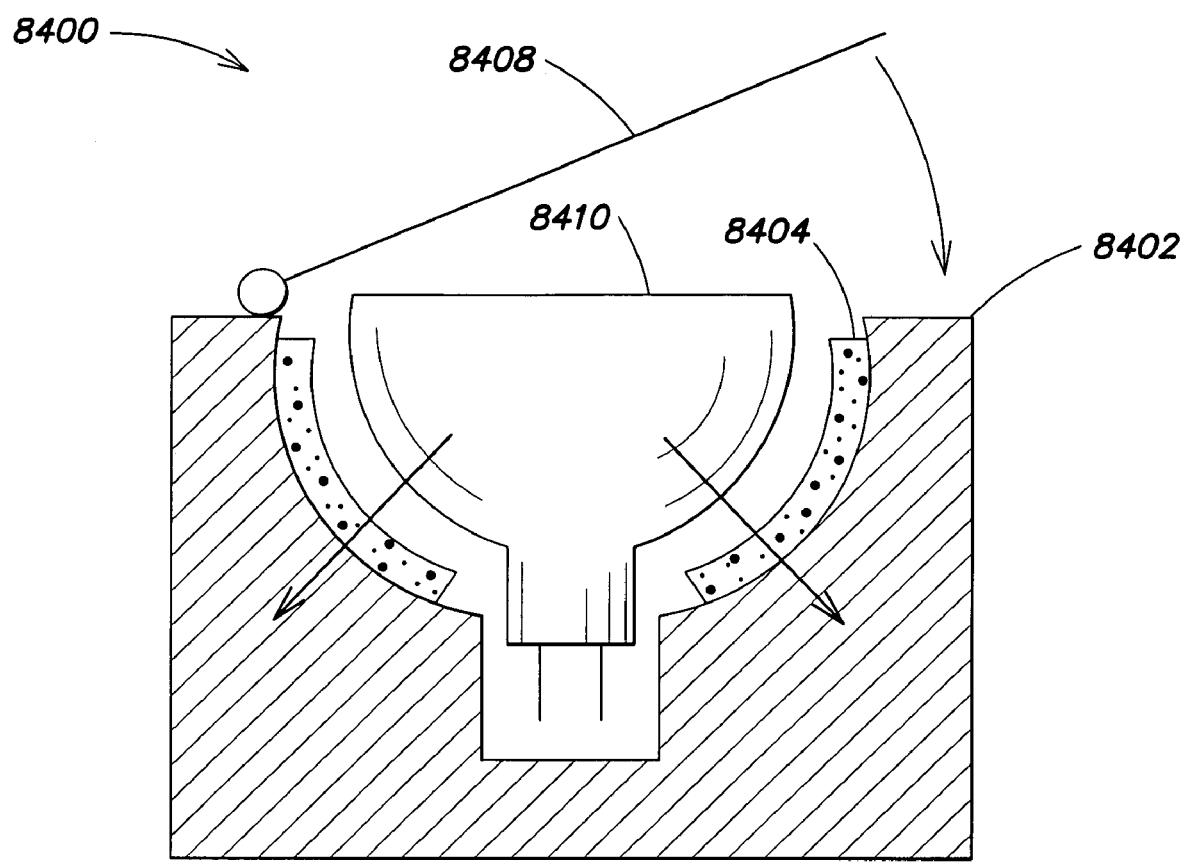
FIG. 84 illustrates a lighting system according to the principles of the present invention.

FIG. 84 illustrates a lighting system 8400 according to the principles of the present invention. In an embodiment, an LED light 8410 may be closely associated with a socket 8402 through the use of a mechanical facility 8408. The mechanical facility 8408 may be a lever, screw, snap connector or other mechanical facility designed to cause a positive mechanical mating of the LED light 8410 and the socket 8402. The socket 8402 may be thermally conductive and the housing of the LED light 8410 may also be thermally conductive and the positive mechanical connection between the two surfaces may be designed to promote the thermal transfer of heat from the LED light 8410 to the socket 8402. In an embodiment, a thermally conductive, malleable material 8404 may be used between the surface of the LED light 8410 and the socket mating surface to increase the surface connection area and to facilitate thermal transfer from the LED light 8410 and the socket 8402.

In embodiments the system 100 may include a thermal facility 8500, such as a heat-conductive plate, metal plate, gap pad, liquid heat-conducting material, potting facility, fan, vent, or other facility for removing heat from the light sources 104.

Figure 85:
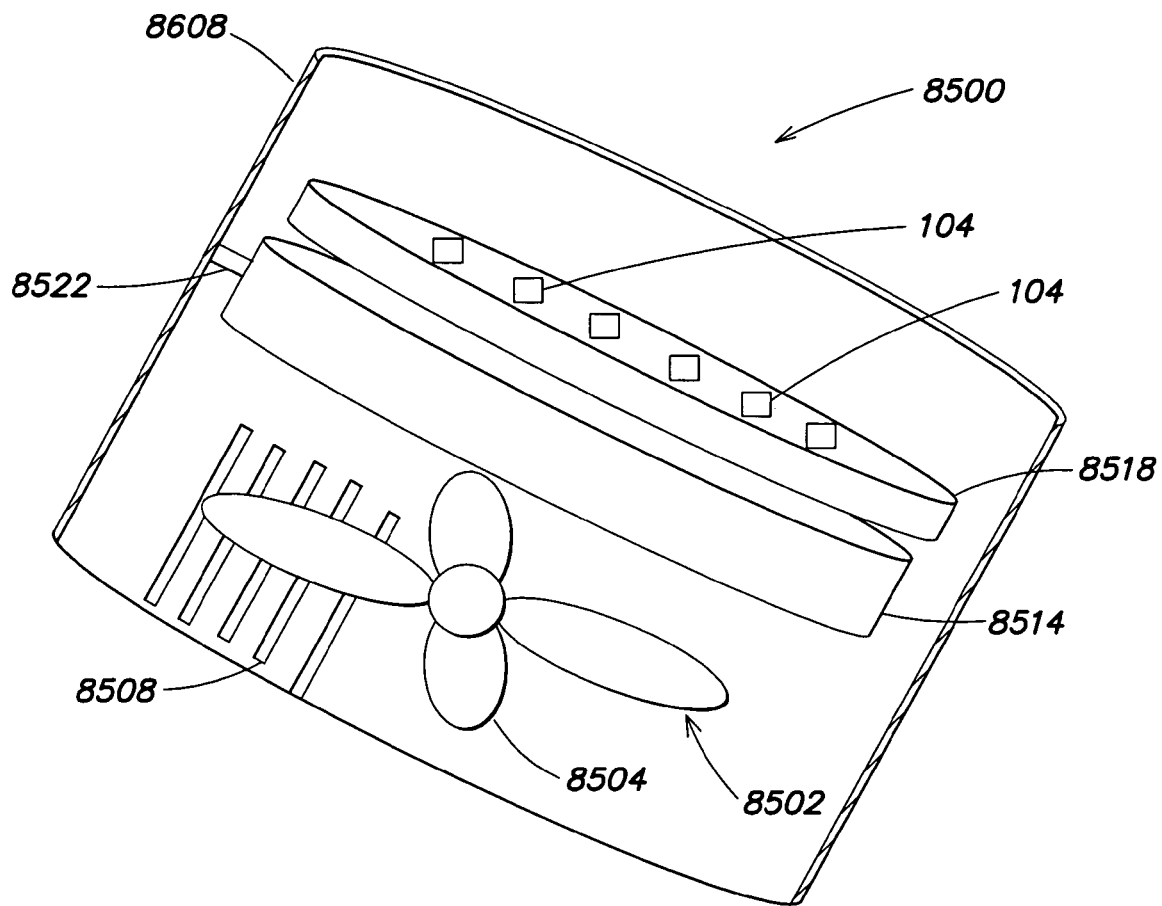
FIG. 85 depicts a thermal facility for a lighting system.

Semiconductor devices like LED light sources 104 can be damaged by heat; accordingly, a system 100 may include a thermal facility 8500 for removing heat from a lighting unit 100. Referring to FIG. 85, the thermal facility 8500 may be any facility for managing the flow of heat, such as a convection facility 8502, such as a fan 8504 or similar mechanism for providing air flow to the lighting unit 100, a pump or similar facility for providing flow of a heat-conducting fluid, a vent 8508 for allowing flow of air, or any other kind of convection facility 8510. A fan 8504 or other convection facility 8510 can be under control of a processor 102 and a temperature sensor such as a thermostat to provide cooling when necessary and to remain off when not necessary.

The thermal facility 8500 can also be a conduction facility 8512, such as a conducting plate or pad of metal, alloy, or other heat-conducting material, a gap pad 8514 between a board 8518 bearing light sources 104 and another facility, a thermal conduction path between heat-producing elements such as light sources 104 and circuit elements, or a thermal potting facility, such as a polymer for coating heat-producing elements to receive and trap heat away from the light sources 104. The thermal facility 8500 may be a radiation facility 8520 for allowing heat to radiate away from a lighting unit 100. A fluid thermal facility 8521 can permit flow of a liquid or gas to carry heat away from a lighting unit 100. The fluid may be water, a chlorofluorocarbon, a coolant, or the like. In a preferred embodiment a conductive plate is aluminum or copper. In embodiments a thermal conduction path 8522 conducts heat from a circuit board 8518 bearing light sources 104 to a housing 8528, so that the housing 8530 radiates heat away from the lighting unit 100.

Figure 86:
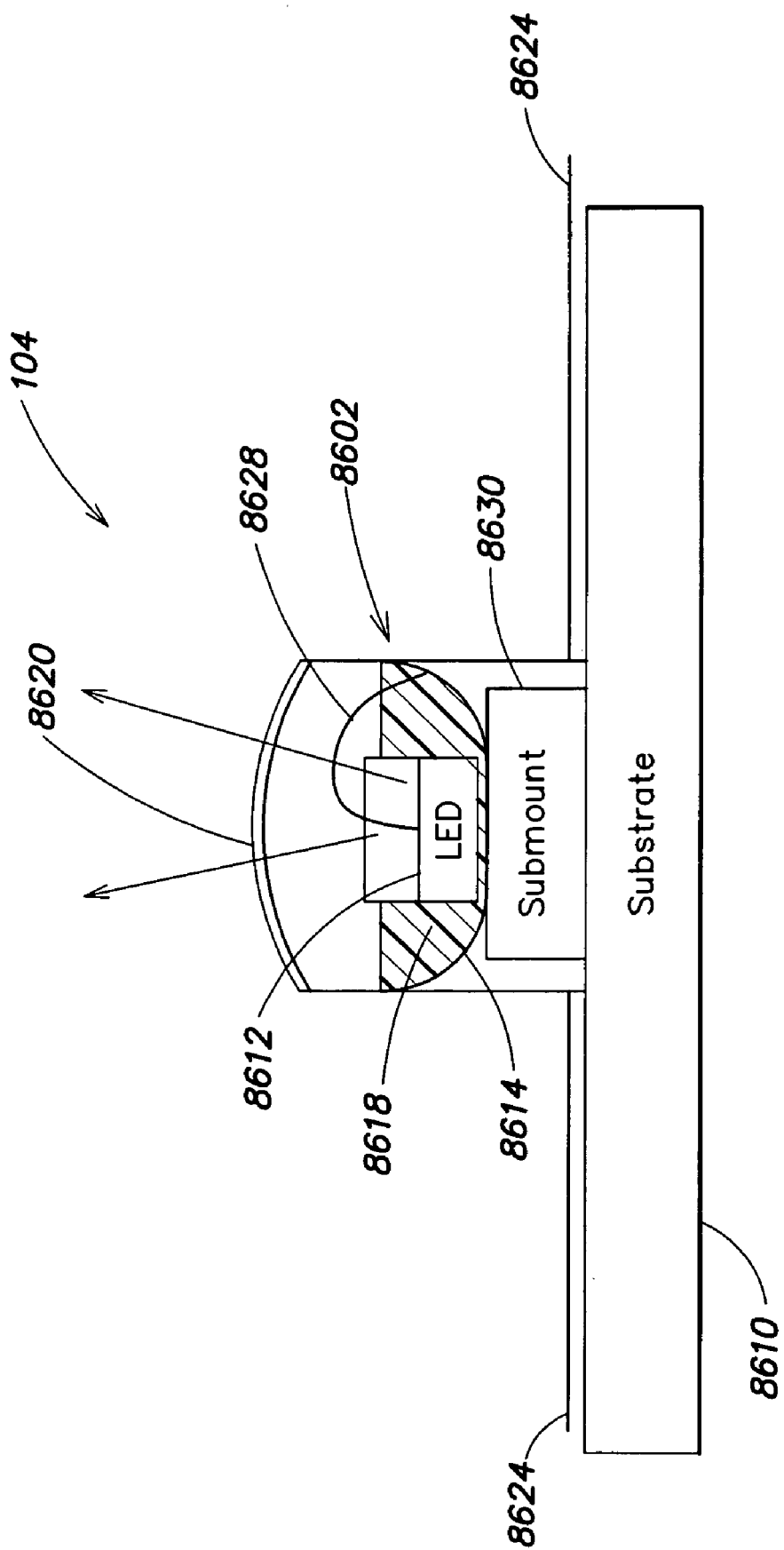
FIG. 86 depicts an LED module that includes a submount.

Referring to FIG. 86, one form of light source 104 is an LED module 8602. An LED module 8602 may be used as a light source 104 in a wide variety of components, subassemblies, boards 8518, products, fixtures, housings 8608, applications, methods of use and environments as described in this disclosure. In an embodiment, the LED module 8602 may comprise an LED package with a substrate 8610, one or more LED die 8612 (which, as context permits, may comprise any other light emitting source, such as the light sources 104 described above), a reflector 8614 for reflecting light from the LED die 8612 out from the module 8602, a filler 8618, such as a silicone or injection-molded plastic filler (which may have a hole or space in it to allow more light to pass through), a lens 8620 or other optical facility 8622 (which may be any type of optical facility described throughout this disclosure), and one or more leads 8624 for providing an external electrical connection from the module 8602 to other electronic components. In embodiments the reflector 8614 and the components held in the reflector 8614 are positioned on top of the leads 8624. A wire bond 8628 may connect the LED die 8612 to the edge of the reflector 8614. A submount 8630 may include one or more other electronic components for controlling the intensity of light emitted from the LED die 8612 as described below. Thus, the present invention encompasses a light source, such as an LED module 8602, with at least one LED die 8612, and a package for the LED die 8612, the package including a submount 8630, wherein the submount 8630 incorporates an electronic component for controlling the LED, wherein the electronic component facilitates control of at least one of the intensity and the apparent intensity of the LED die 8612 between at least three distinct levels of intensity.

Figure 87:
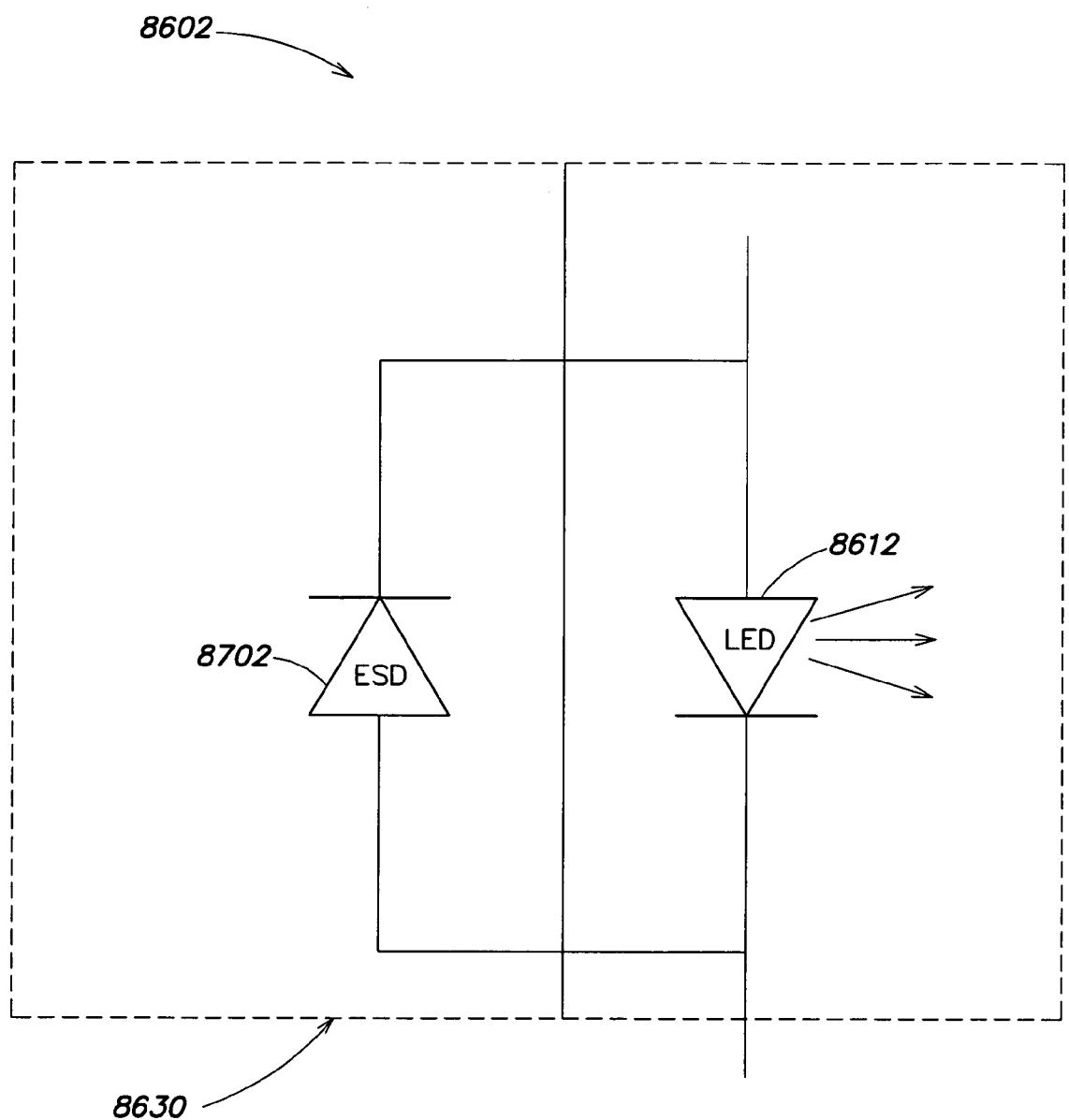
FIG. 87 depicts a simple configuration of a conventional LED module.

FIG. 87 shows a simple configuration of a conventional LED module 8602, with an ESD protection diode 8702 serving as the submount 8630 in a circuit with the LED die 8612. In embodiments, the submount may be augmented with other electronic components as described below.

Figure 88:
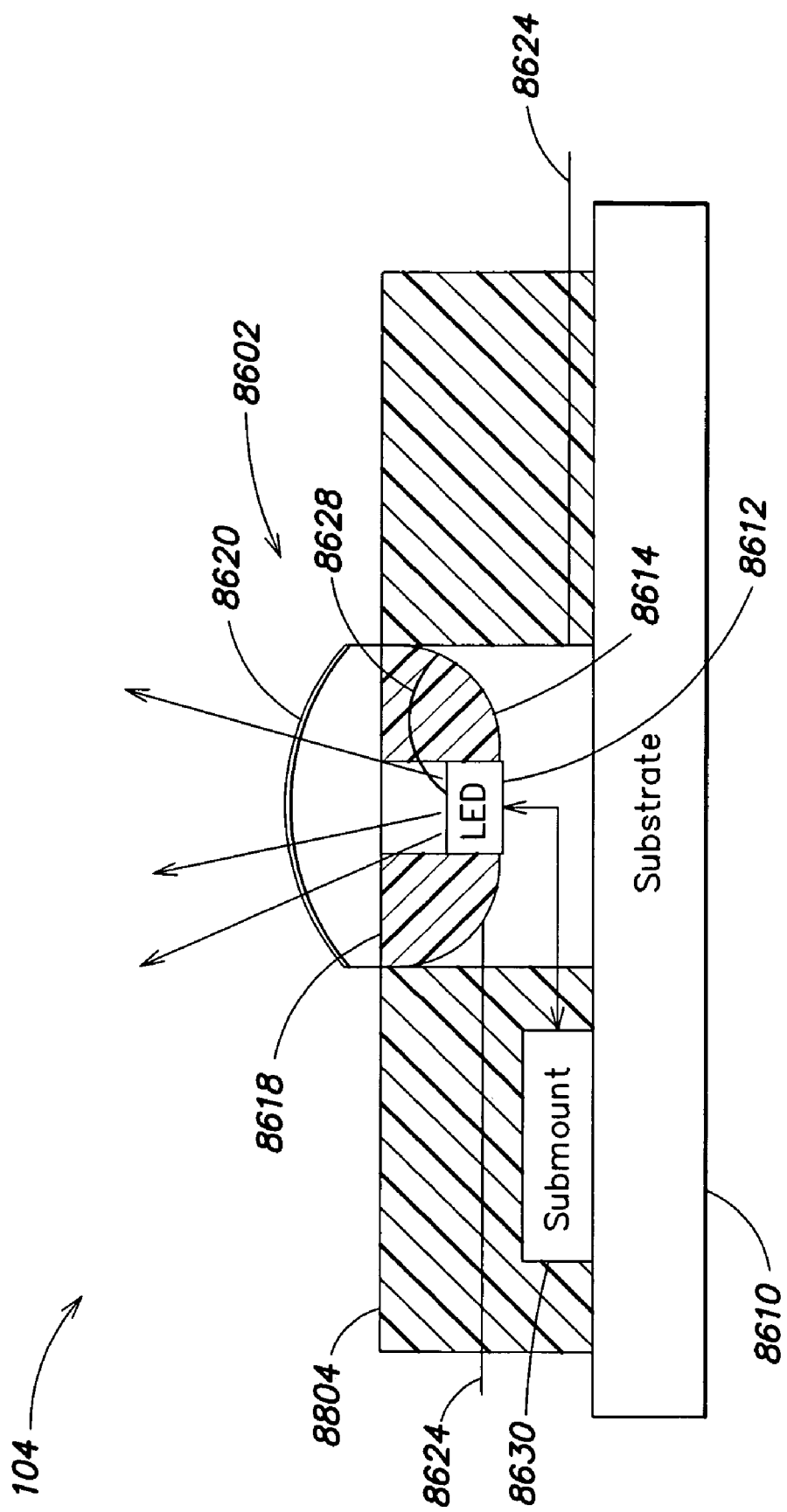
FIG. 88 depicts a simple configuration of a conventional LED module.

FIG. 88 shows another embodiment of an LED module 8602, which like the LED module of FIG. 86 can be used as a light source 104 in a wide variety of components, subassemblies, boards 8518, products, fixtures, housings 8608, applications, methods of use and environments as described in this disclosure. In this embodiment, the LED module 8602 may again comprise an LED package with a substrate 8610, one or more LED die 8612 (which, as context permits, may comprise any other light emitting source, such as the light sources 104 described above), a reflector 8614 for reflecting light from the LED die 8612 out from the module 8602, a filler 8618, such as a silicone or injection-molded plastic filler (which may have a hole or space in it to allow more light to pass through), a lens 8620 or other optical facility 8622 (which may be any type of optical facility described throughout this disclosure), and one or more leads 8624 for providing an external electrical connection from the module 8602 to other electronic components. In this case one of the leads 8624 may connect to the side of the reflector 8614. The entire package may include an injection molding 8804, such as injection-molded plastic, for holding the components in place. A wire bond 8628 may connect the LED die 8612 to the edge of the reflector 8614. A submount 8630 may include one or more other electronic components for controlling the intensity of light emitted from the LED die 8612 as described below. In this case the submount 8630, rather than being located directly under the LED die 8612 and the reflector 8614, is located in close proximity to the reflector cup on the substrate 8610 and is in electrical connection to the LED die 8612.

Figure 89:
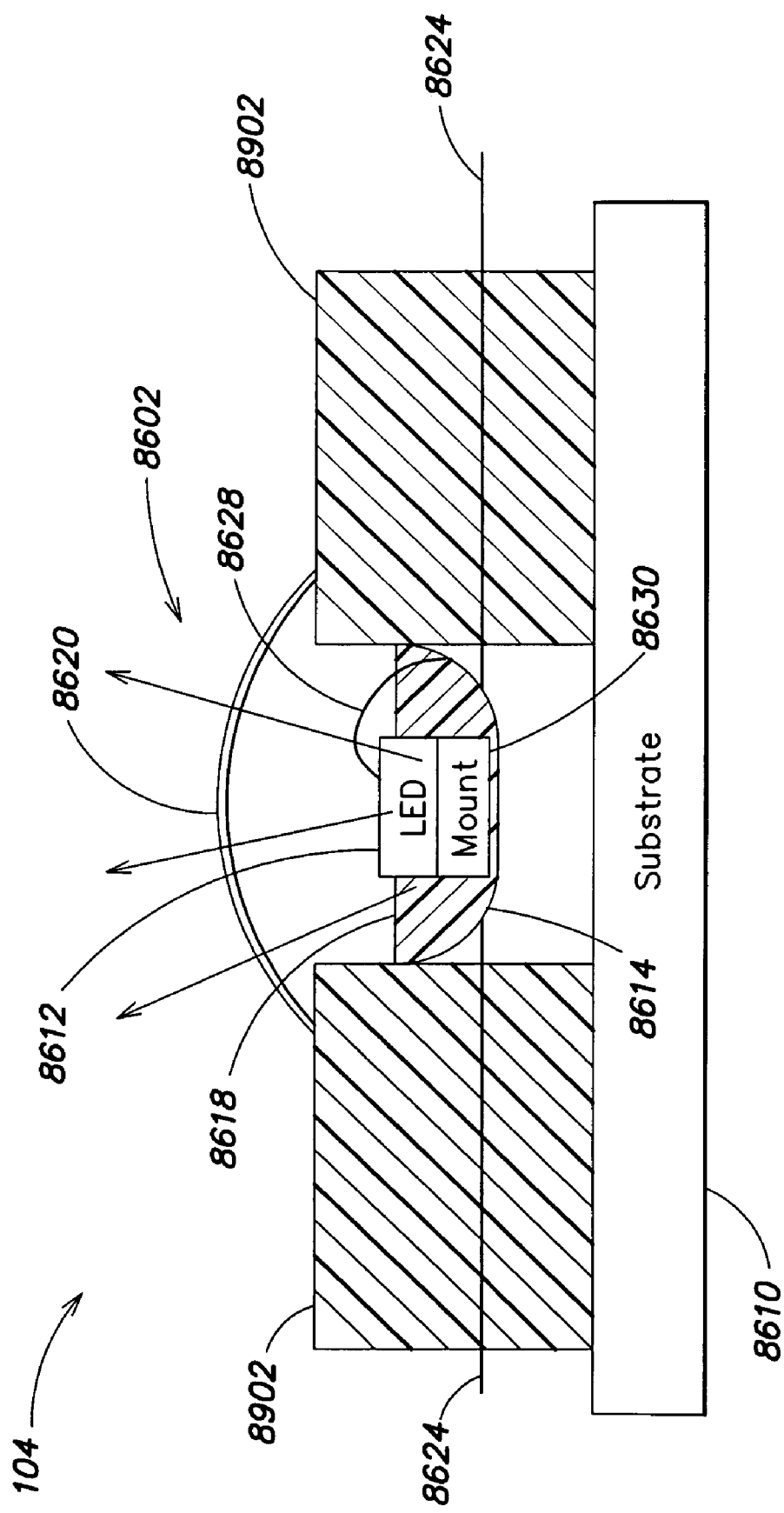
FIG. 89 depicts another embodiment of an LED module with a submount.

FIG. 89 shows another embodiment of an LED module 8602, which like the LED modules of FIGS. 86 and 88 can be used as a light source 104 in a wide variety of components, subassemblies, boards 8518, products, fixtures, housings 8608, applications, methods of use and environments as described in this disclosure. In this embodiment, the LED module 8602 may again comprise an LED package with a substrate 8610, one or more LED die 8612 (which, as context permits, may comprise any other light emitting source, such as the light sources 104 described above), a reflector 8614 for reflecting light from the LED die 8612 out from the module 8602, a filler 8618, such as a silicone or injection-molded plastic filler (which may have a hole or space in it to allow more light to pass through), a plastic encasing element 8902, a lens 8620 or other optical facility 8622 (which may be any type of optical facility described throughout this disclosure), and one or more leads 8624 for providing an external electrical connection from the module 8602 to other electronic components. In this case the leads 8624 may connect to the side of the reflector 8614. As in other embodiments, a wire bond 8628 may connect the LED die 8612 to the edge of the reflector 8614. A submount 8630 may include one or more other electronic components for controlling the intensity of light emitted from the LED die 8612 as described below. In this case the submount 8630, rather than being located directly under the LED die 8612 and the reflector 8614, is located in the cup of the reflector 8614 with the LED die 8612. In embodiments the LED module 8602 may be made by a mask process.

Other embodiments of LED packages that include an LED die 8612 and a submount 8630 may be understood by those of ordinary skill in the art and are encompassed herein. In embodiments the LED die 8612 may be a high-power LED die. In embodiments the LED die 8612 may be a five watt or greater LED die.

The substrate 8610 of the embodiments of FIGS. 86, 88 and 89 may be any conventional substrate for an LED package, such as a metal core substrate, a ceramic substrate, a ceramic on metal substrate, an FR4 substrate, a sapphire substrate, a silicon on sapphire substrate, or a silicon carbide substrate.

In the various embodiments described herein, an LED module 8602 may be controlled by the electronic components of the submount 8630. In addition to offering basic "on" and "off" or protection circuitry, in embodiments of the inventions electronic components located in the submount 8630 that is integrated with the LED die 8612 in the package 8904 can control the intensity or apparent intensity of light coming from the LED 8602, such as by controlling the level of current to the LED, by controlling the amplitude of pulses or current to the LED (pulse amplitude modulation), by controlling the width of pulses of current to the LED (pulse width modulation) or by a combination of any of the foregoing. Thus, the various embodiments described herein for providing such control can be embodied in the submount 8630, such as in packages of the types disclosed in connection with FIGS. 86, 88 and 89 and other embodiments described herein.

Figure 90:
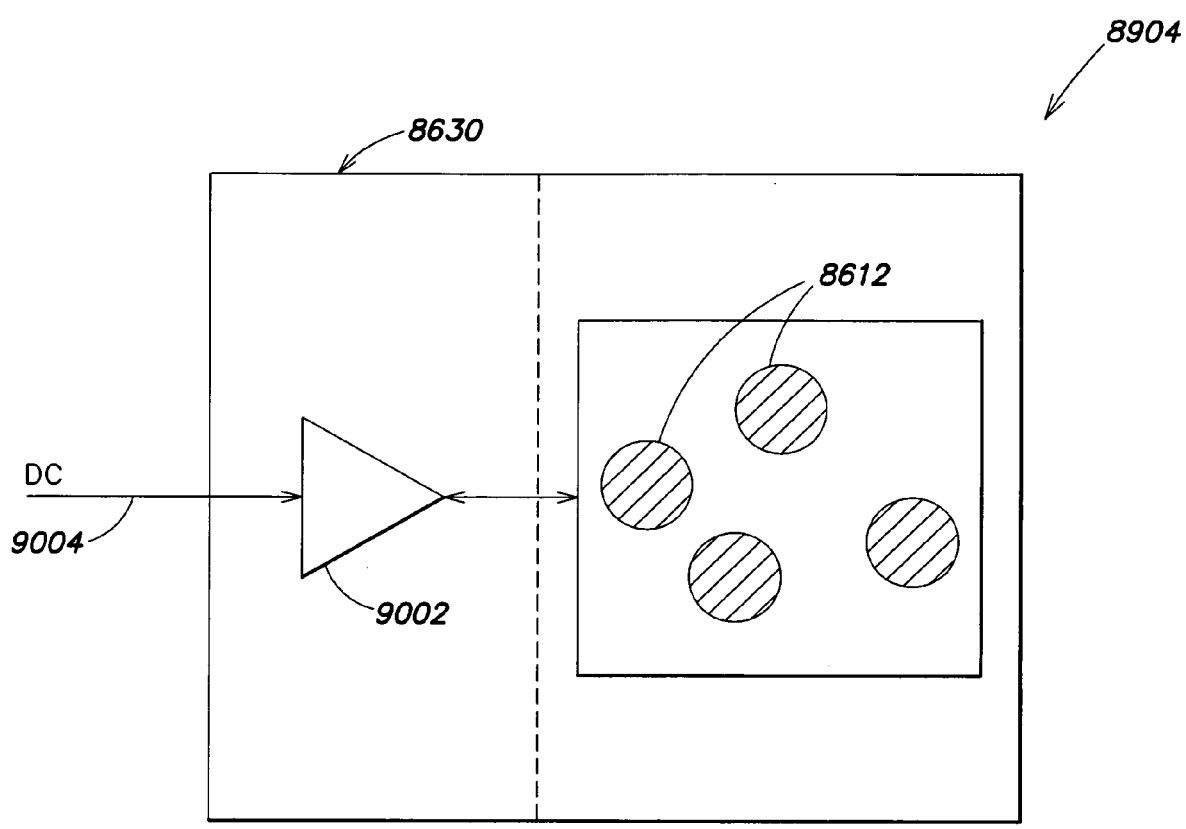
FIG. 90 depicts a schematic diagram showing a submount and a group of LED dies in a package.

Referring to FIG. 90, a schematic diagram is provided that shows a submount 8630, a group of LED dies 8612 in a package 8904 and a regulator 9002. The regulator 9002 may be a current regulator. The regulator 9002 may regulate an input signal 9004. It should be understood that the submount 8630 could be combined with a single LED die 8612, and that the submount 8630 and LED die(s) 8612 could be integrated into a variety of physical packages, such as those described in connection with FIGS. 86, 88 and 89, or other LED packages 8904 of various configurations that include a submount 8630 and LED die(s) 8612. Thus, the schematic diagrams of FIG. 90 and subsequent figures are intended to encompass any of the various physical packages 8904 that can include the components disclosed in connection with such figures.

Figure 91:
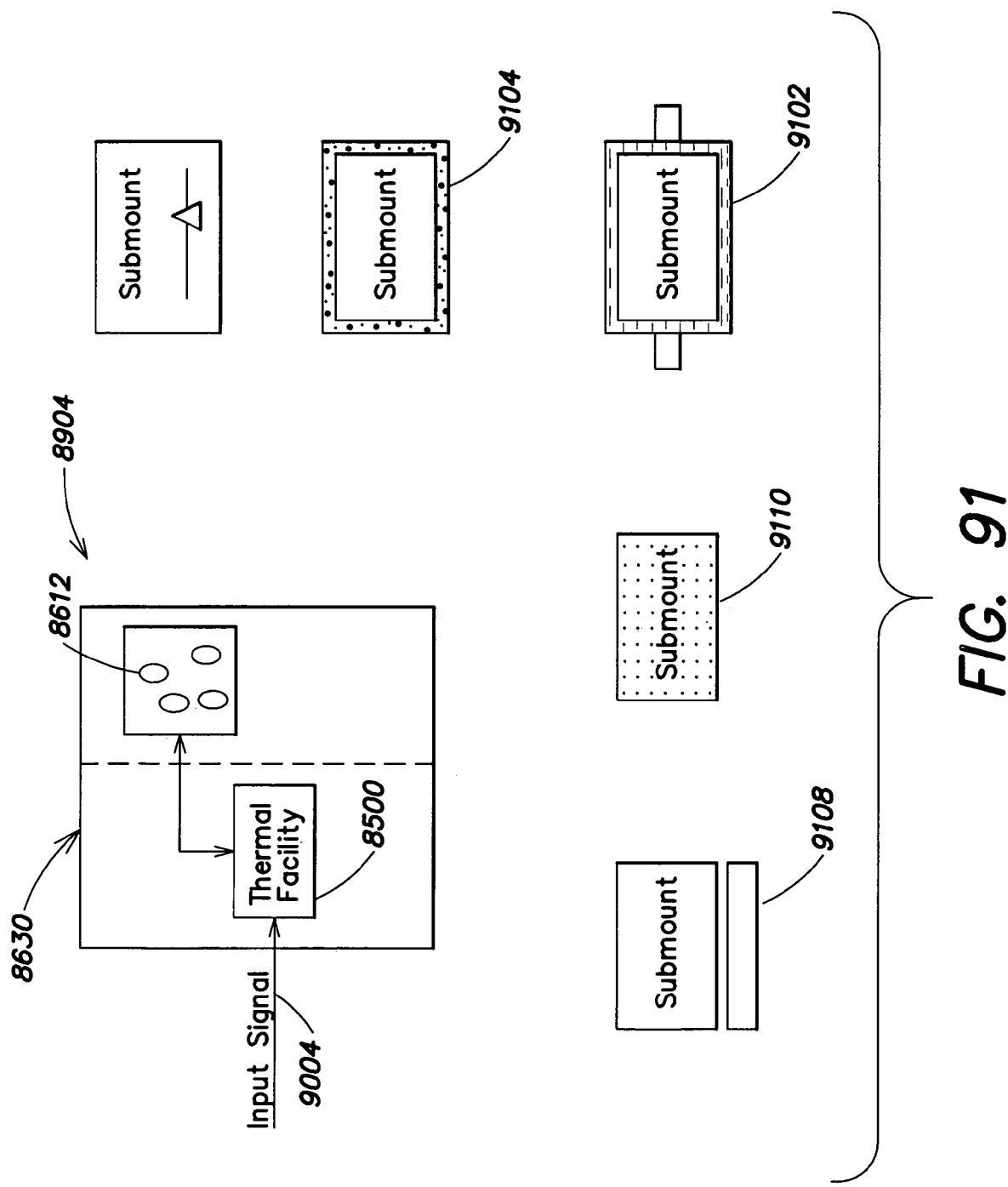
FIG. 91 depicts an LED module with various embodiments of a thermal facility.

Referring to FIG. 91, in embodiments the submount 8630 of the LED package 8904 may include a thermal facility 8500 for cooling at least one of the LED die(s) and the submount 8630. The thermal facility may be any thermal facility 8500 as described above. The thermal facility may be associated with an input signal 9004. In embodiments the thermal facility 8500 may be a Peltier effect device, a fluid cooling facility 9102, such as for cooling the submount 8630 with water or another cooling fluid, a potting facility 9104, such as for surrounding the submount 8630 and accepting heat from the submount 8630 or the LED die 8612, a thermally conductive plate 9108 or gap pad 8514, such as for conducting heat away from the submount 8630, a micromachine, such as a MEMs device 9110 fabricated from nano-materials and, for example, sprayed onto the submount 8630 for active cooling, a micro-fan or other thermal facility.

Figure 92:
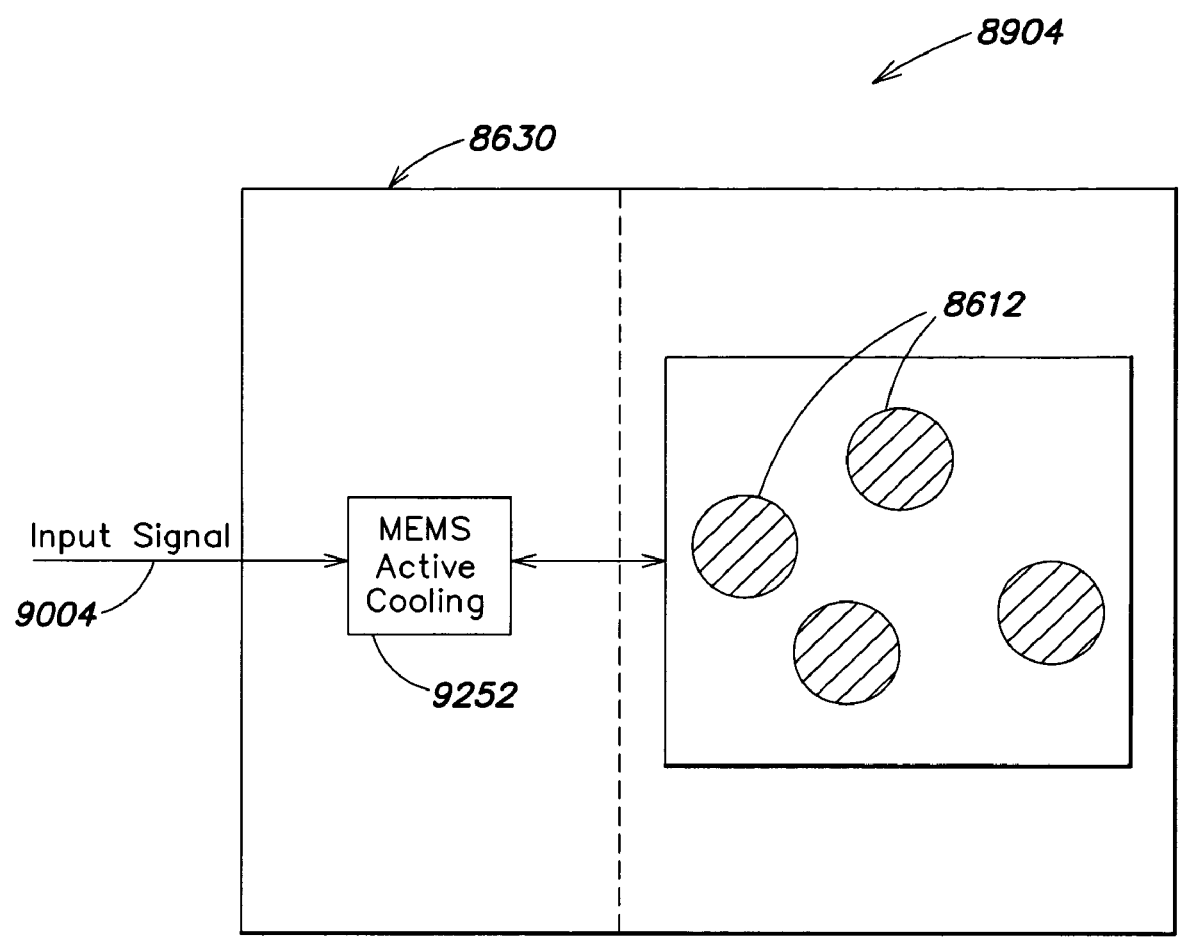
FIG. 92 depicts the incorporation of the MEMS active cooling element into a submount.

Referring to FIG. 92, a MEMS active cooling element 7252 may be incorporated into the submount 8630, such as to serve as a thermal facility 8500 for cooling the LED package 8904. The MEMS active cooling element 9252 may be associated with an input signal 9004.

Figure 93:
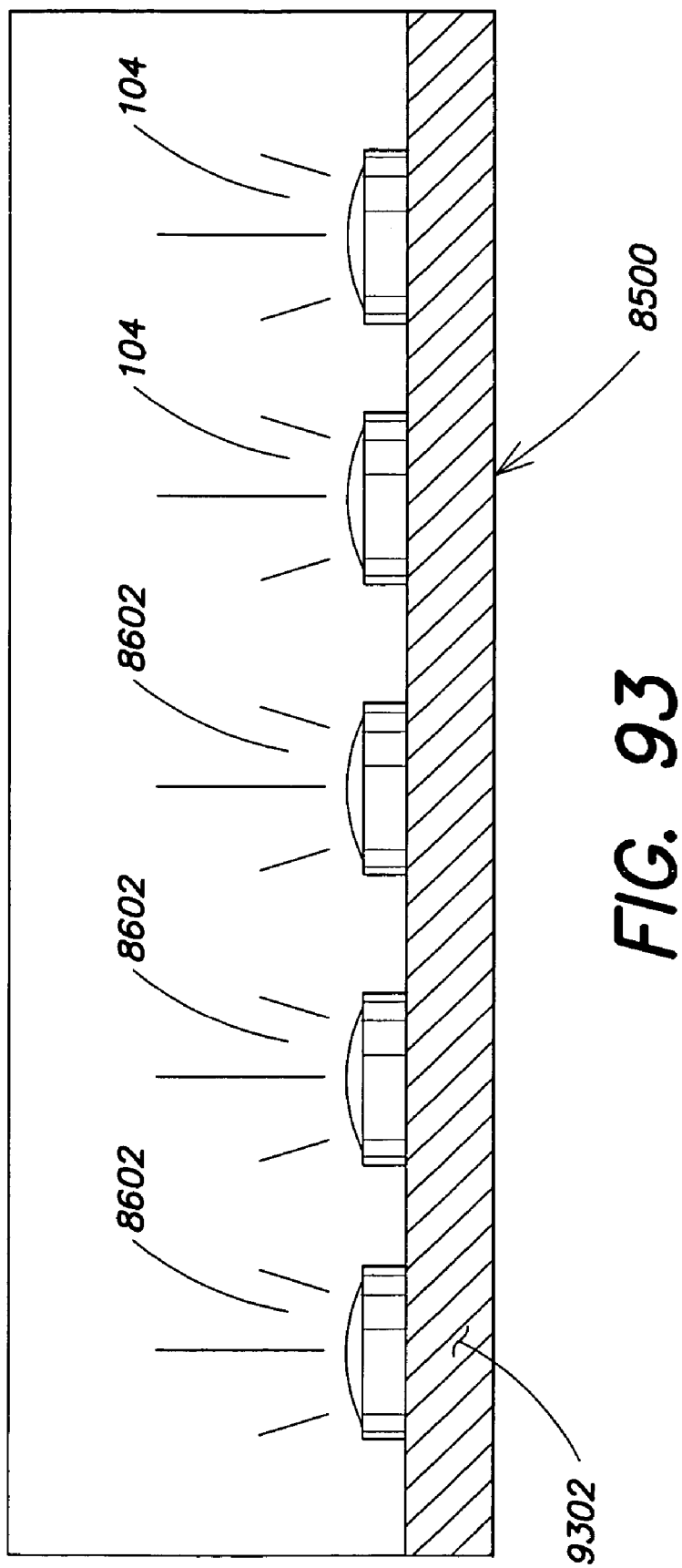
FIG. 93 depicts LEDs, a platform and a graphite thermal facility.

Referring to FIG. 93, light may be provided by a plurality of LEDs 8602 or other light sources 104 disposed in an environment that includes a platform for supporting the LEDs 8602 and a thermal facility 8500, which may include or be composed of a graphite material 9302, which may remove heat from the environment of the LEDs 8602. The graphite material 9302 may be supplied in a separate thermal platform, or it may comprise the platform upon which the LEDs 8602 are disposed.

Figure 94:
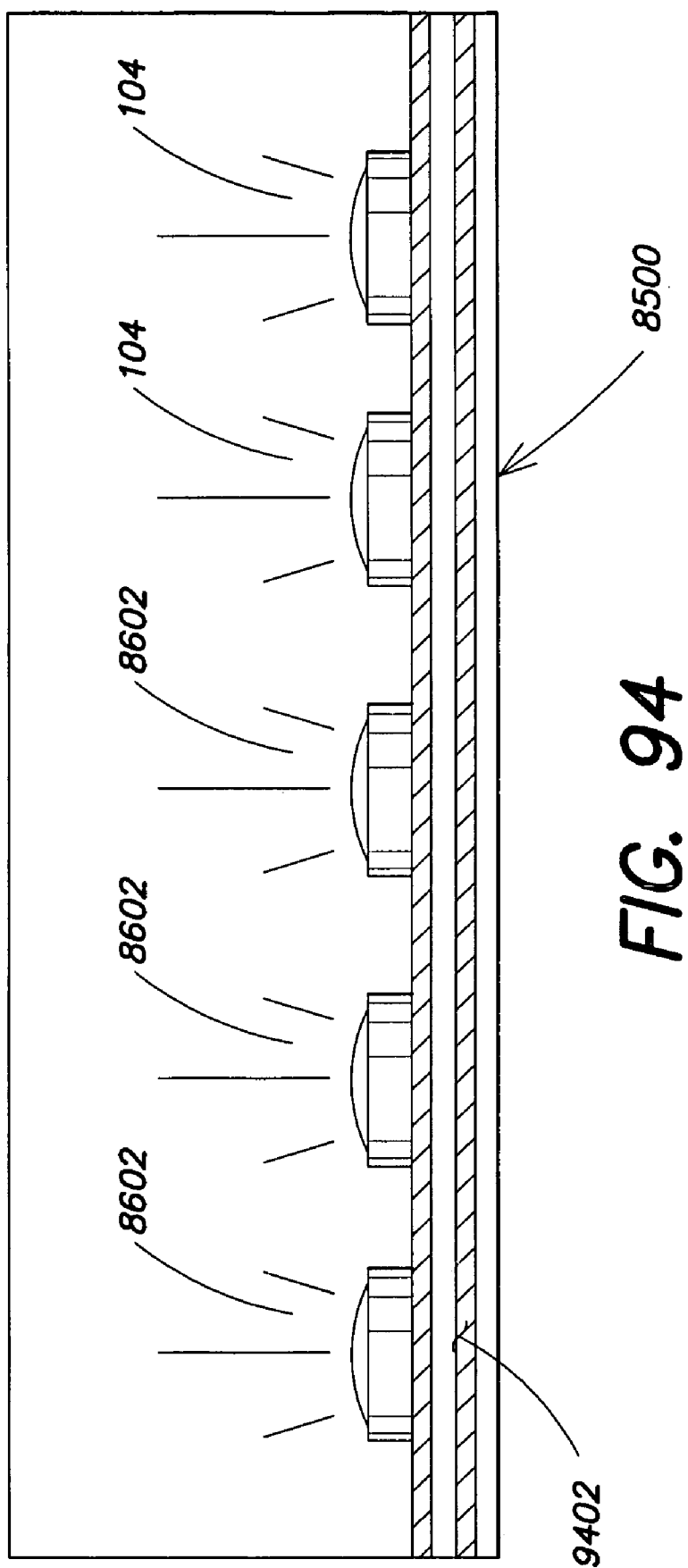
FIG. 94 depicts LEDs, a platform and a lamina thermal facility.

Referring to FIG. 94, light may be provided by a plurality of LEDs 8602 or other light sources 104 disposed in an environment that includes a platform for supporting the LEDs 8602 and a thermal facility 8500, which may include or be composed of a lamina board or lamina boards 9402, which may remove heat from the environment of the LEDs 8602.

Figure 95:
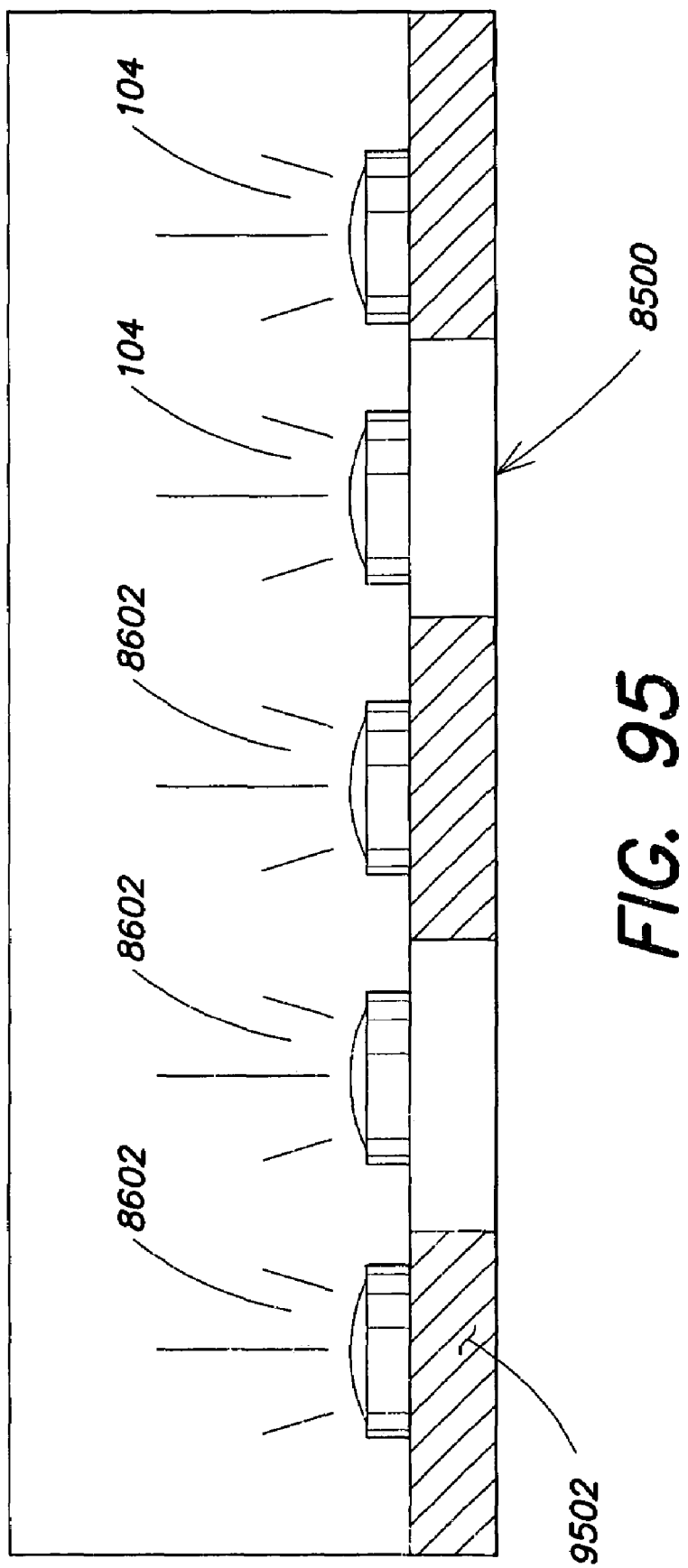
FIG. 95 depicts LEDs, a platform and a thermal facility made of a phase change material.

Referring to FIG. 95, light may be provided by a plurality of LEDs 8602 or other light sources 104 disposed in an environment that includes a platform for supporting the LEDs 8602 and a thermal facility 8500, which may include or be composed of a phase change material 9502, which may remove heat from the environment of the LEDs 8602. The phase change material 9502 may be a material such as that provided by OptoLum of Phoenix, Ariz. or Nanotherm PCM+, a phase change material provided by Nanotherm.

Figure 96:
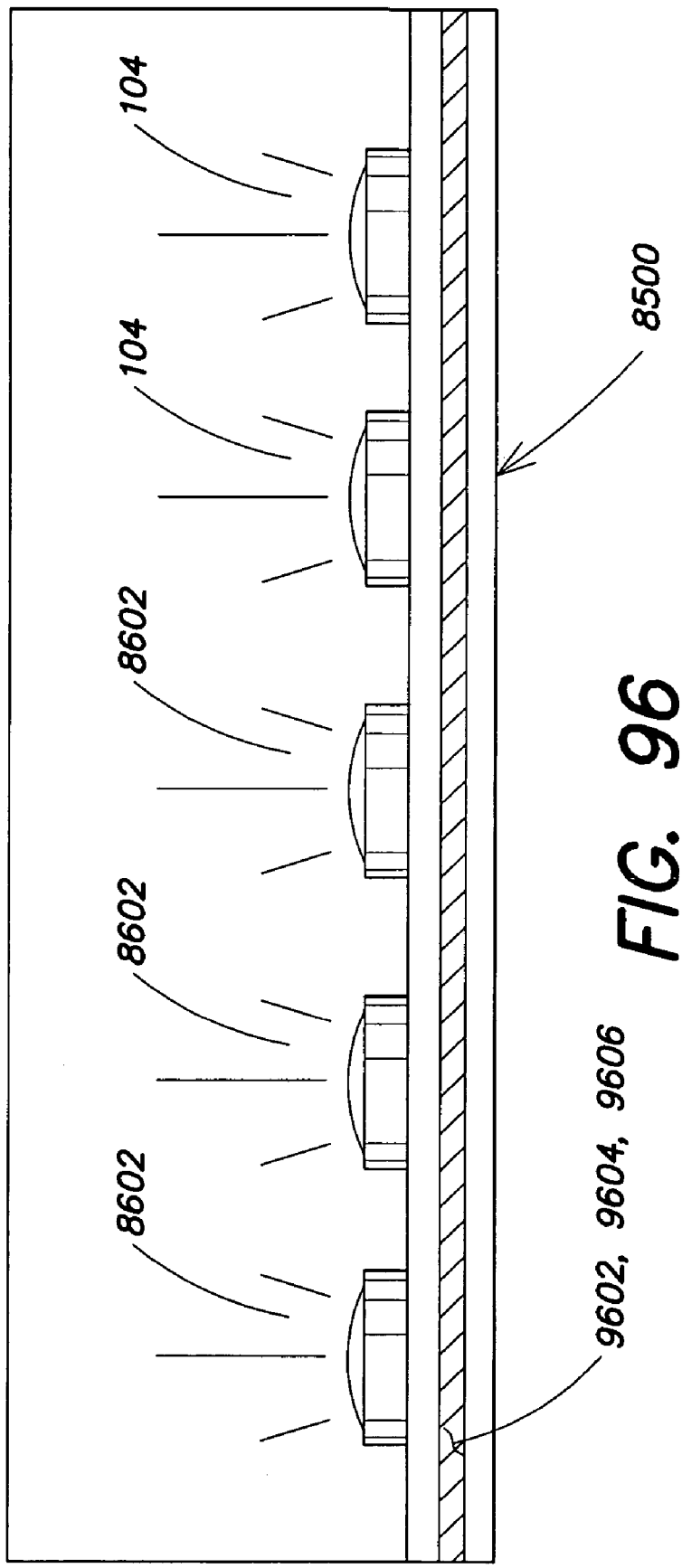
FIG. 96 depicts LEDs, a platform and a gap pad thermal facility.

Referring to FIG. 96, light may be provided by a plurality of LEDs 8602 or other light sources 104 disposed in an environment that includes a platform for supporting the LEDs 8602 and a thermal facility 8500, which may include or be composed of at least one of a silicon carbide material 9602, a diamond material 9604 and a gallium arsenide material 9606, which may remove heat from the environment of the LEDs 8602. Such materials may be used to form a gap pad or similar facility for accepting heat from the environment of the LEDs and conducting it away from the LEDs.

Figure 97:
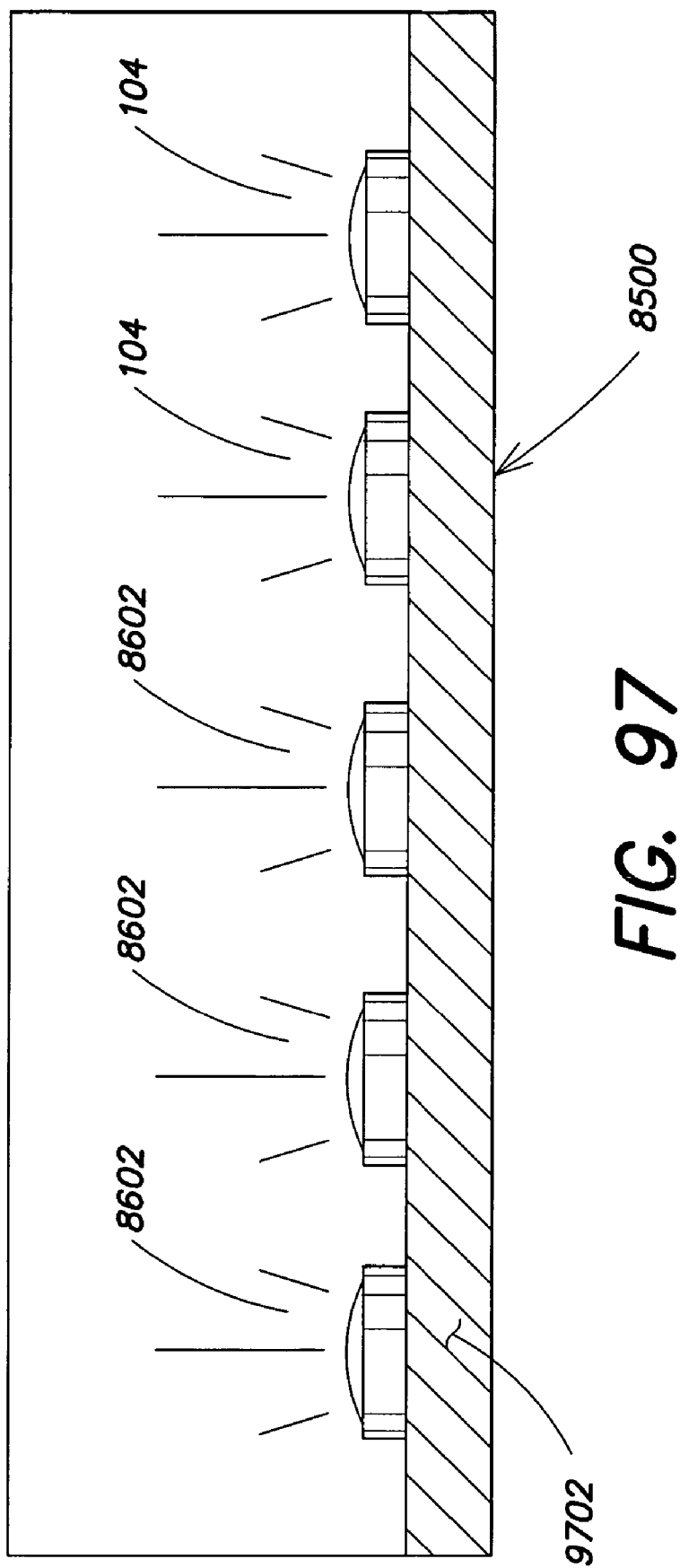
FIG. 97 depicts LEDs, a platform and a conductive polymer thermal facility.

Referring to FIG. 97, light may be provided by a pluralfty of LEDs 8602 or other light sources 104 disposed in an environment that includes a platform for supporting the LEDs 8602 and a thermal facility 8500, which may include or be composed of a polymer 9702 and providing a thermally conductive material, which may remove heat from the environment of the LEDs 8602. In embodiments, the thermally conductive polymers 9702, or thermoplastic heat-conducting compounds, may employ carbon, metal, and or ceramic fillers. In embodiments, the thermally conductive polymers 9702 may be injection-molded into the area of the platform that supports the LEDs, to accept heat from the LEDs. In embodiments the thermally conductive polymers may include LCS, polyphenylene sulfide, polyether ether ketone (PEEK), polyethylene terephthalate (PET), fiber-filled composites and polysulfones. In other embodiments the thermally conductive polymers may include medium-temperature resistant compounds such as acryolnitrile butadiene styrene (ABS), polybutylene terephthalate (PBT), polycarbonate and nylon. In embodiments the thermally conductive polymers consist of polymers filled with thermally conductive filler materials, such as carbon, graphite, carbon black, aluminum or various metals. In embodiments the thermally conductive polymers can be molded into heat sinks to fit the environment of the LEDs 8602 and the platform, such as to fill the space between a circuit board that bears the LEDs 8602 and the housing of a lighting unit 100, such as a lighting fixture. In other embodiments the polymers may be used as a heat-exchanger.

Figure 98:
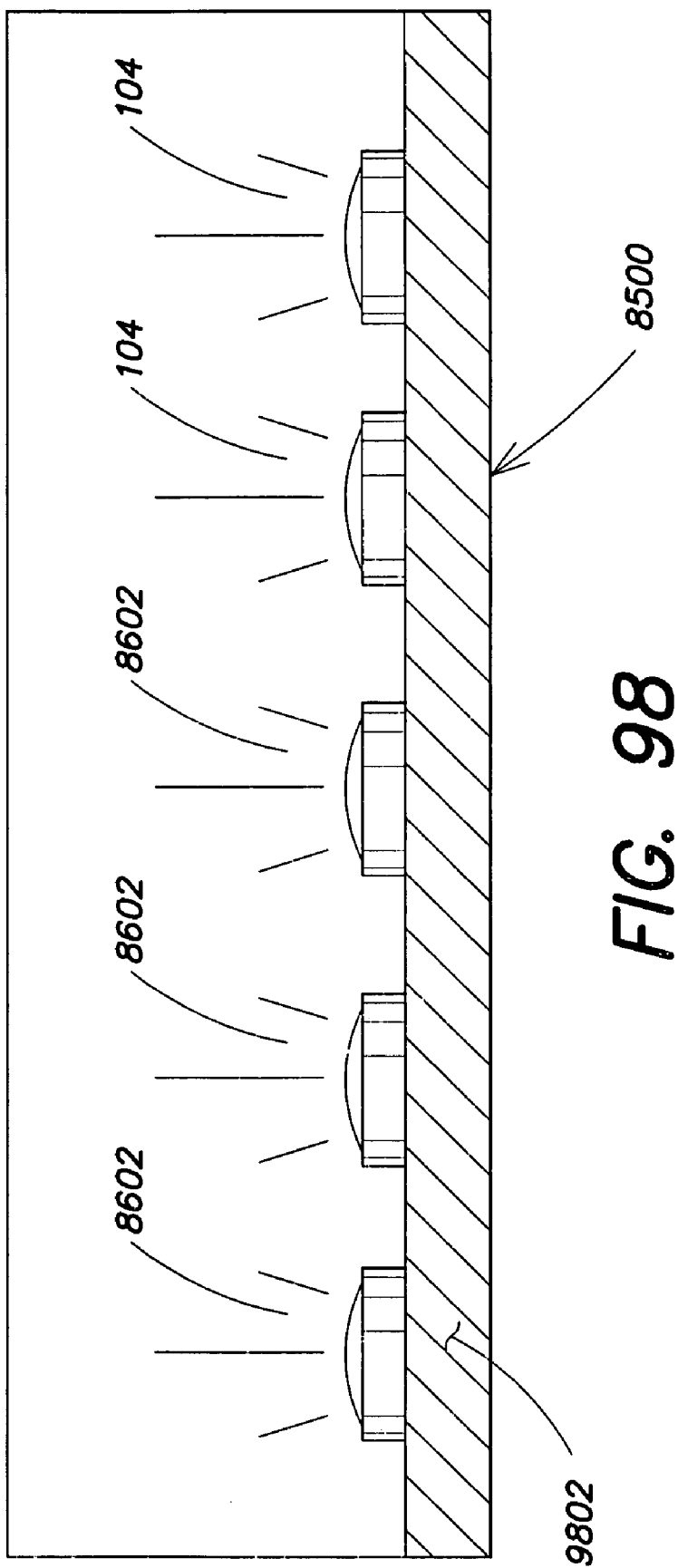
FIG. 98 depicts LEDs, a platform and a ceramic thermal facility.

Referring to FIG. 98, light may be provided by a plurality of LEDs 8602 or other light sources 104 disposed in an environment that includes a platform for supporting the LEDs 8602 and a thermal facility 8500, which may include or be composed of a ceramic material 9802, which may remove heat from the environment of the LEDs 8602. The ceramic material 9802 may be used to form the platform for the LEDs and other circuit component, may be used as a separate thermal plate, or may be used to form part of the housing of the lighting unit 100.

Figure 99:
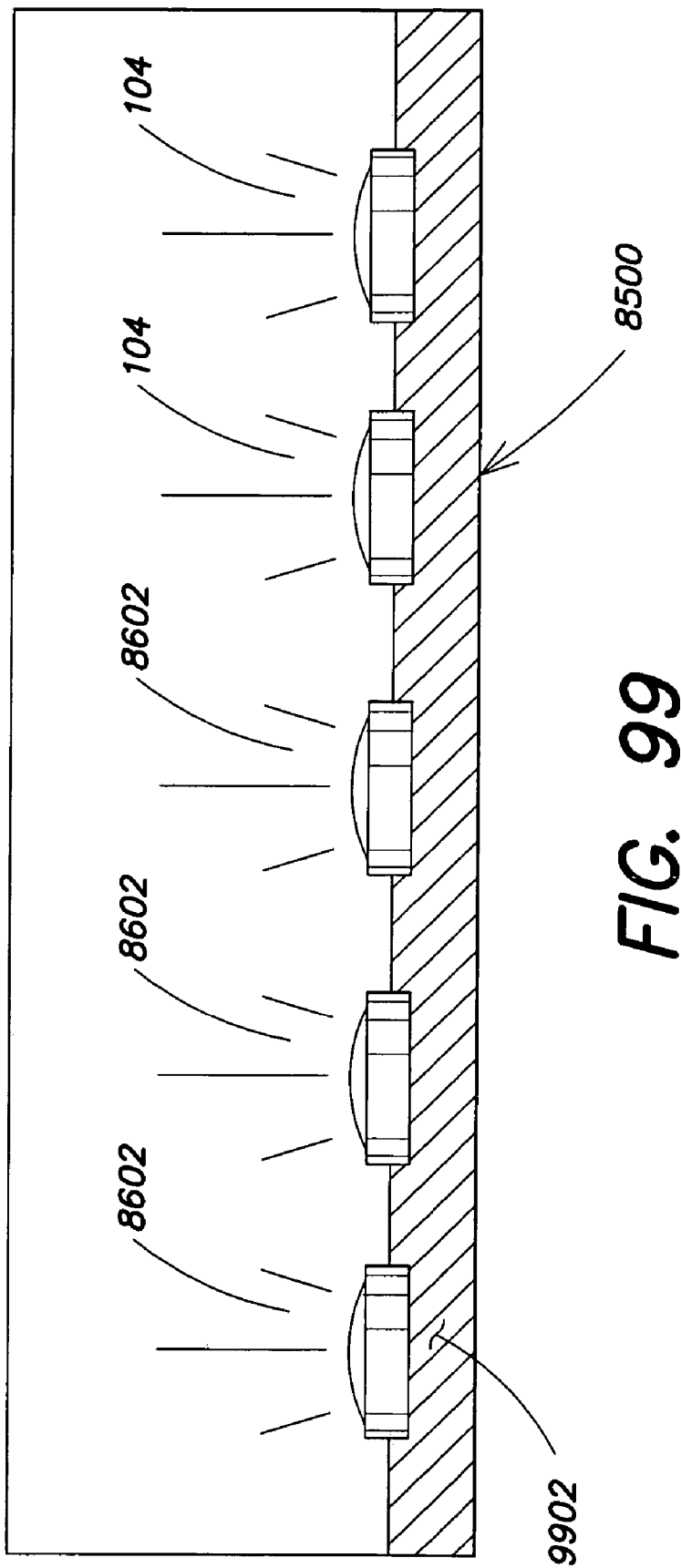
FIG. 99 depicts LEDs, a platform and a thermal paste thermal facility.

Referring to FIG. 99, light may be provided by a plurality of LEDs 8602 or other light sources 104 disposed in an environment that includes a platform for supporting the LEDs 8602 and a thermal facility 8500, which may include or be composed of a thermal paste 9902, which may remove heat from the environment of the LEDs 8602. The thermal paste 9902 may be any known thermal paste, such as micronized silver, such as Arctic Silver 3 provided by Arctic Silver company, Shin Etsu G751, silicone paste, a multiceramic thermal interface compound, such as Nanotherm Blue II, such as containing a blend of boron nitride, aluminum nitride and other nanopowders compounded into a multisynthetic carrier fluid, a blend of silver into a suspension fluid, such as Nanotherm Silver XTC from Nanotherm, a phase change material, such as Nanotherm PCM+ from Nanotherm, or silver grease, such as formed of silver oxide. The thermal paste may be used to fill space in or around the LEDs 8602 and other circuit components, to absorb heat from those components away from the LEDs 8602.

Figure 100:
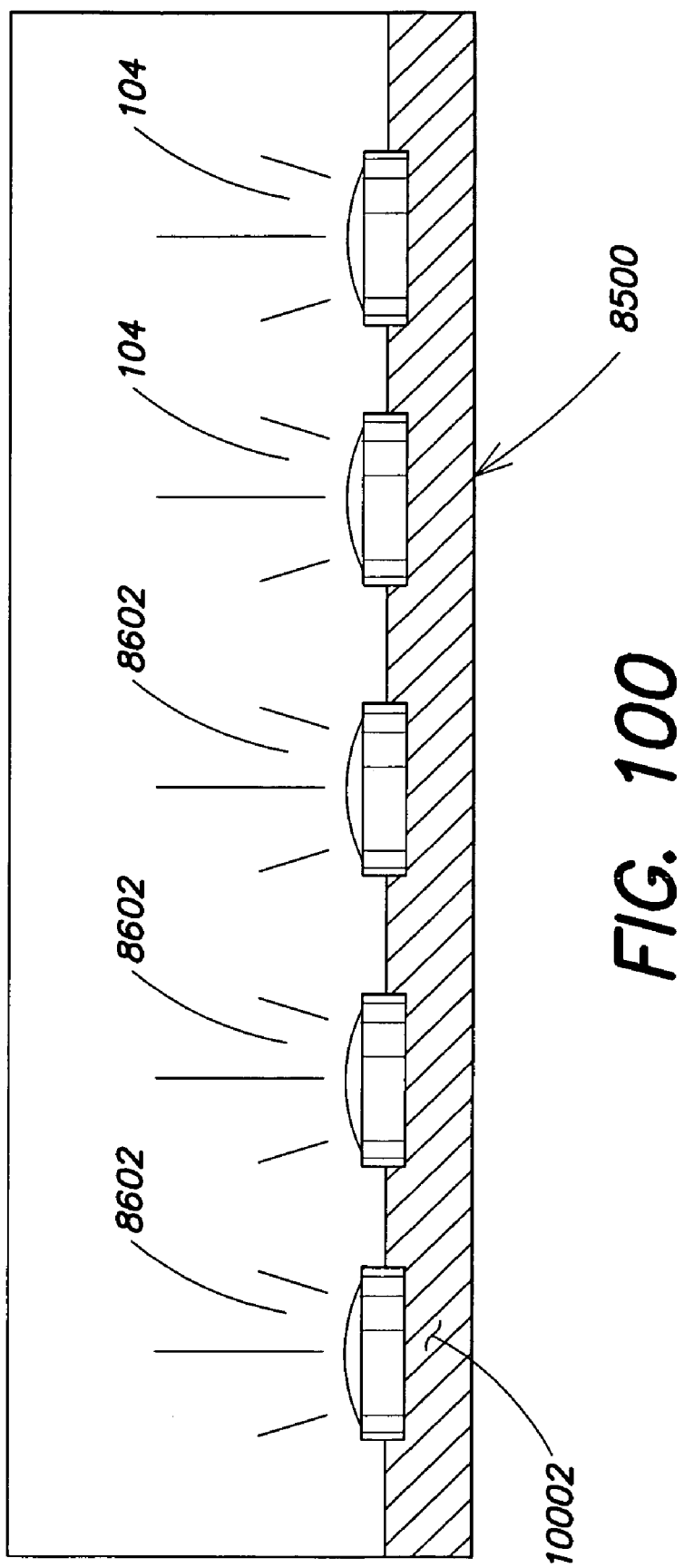
FIG. 100 depicts LEDs, a platform and a thermal epoxy facility.

Referring to FIG. 100, light may be provided by a plurality of LEDs 8602 or other light sources 104 disposed in an environment that includes a platform for supporting the LEDs 8602 and a thermal facility 8500, which may include or be composed of an epoxy 10002, which may remove heat from the environment of the LEDs 8602. The epoxy 10002 may be a thermal epoxy, such as an aluminum oxide filled epoxy, such as TCE-003 from Melcor, a silver-based epoxy, such as Arctic Silver Thermal Epoxy from Arctic Silver, an alumina adhesive, such as Artic Alumina thermal adhesive, or any other type of thermal epoxy. The epoxy may be used to cover or surround various thermal components, and to fill gaps between components, to help secure the components and to accept heat away from the LEDs 8602 and other components.

Figure 101:
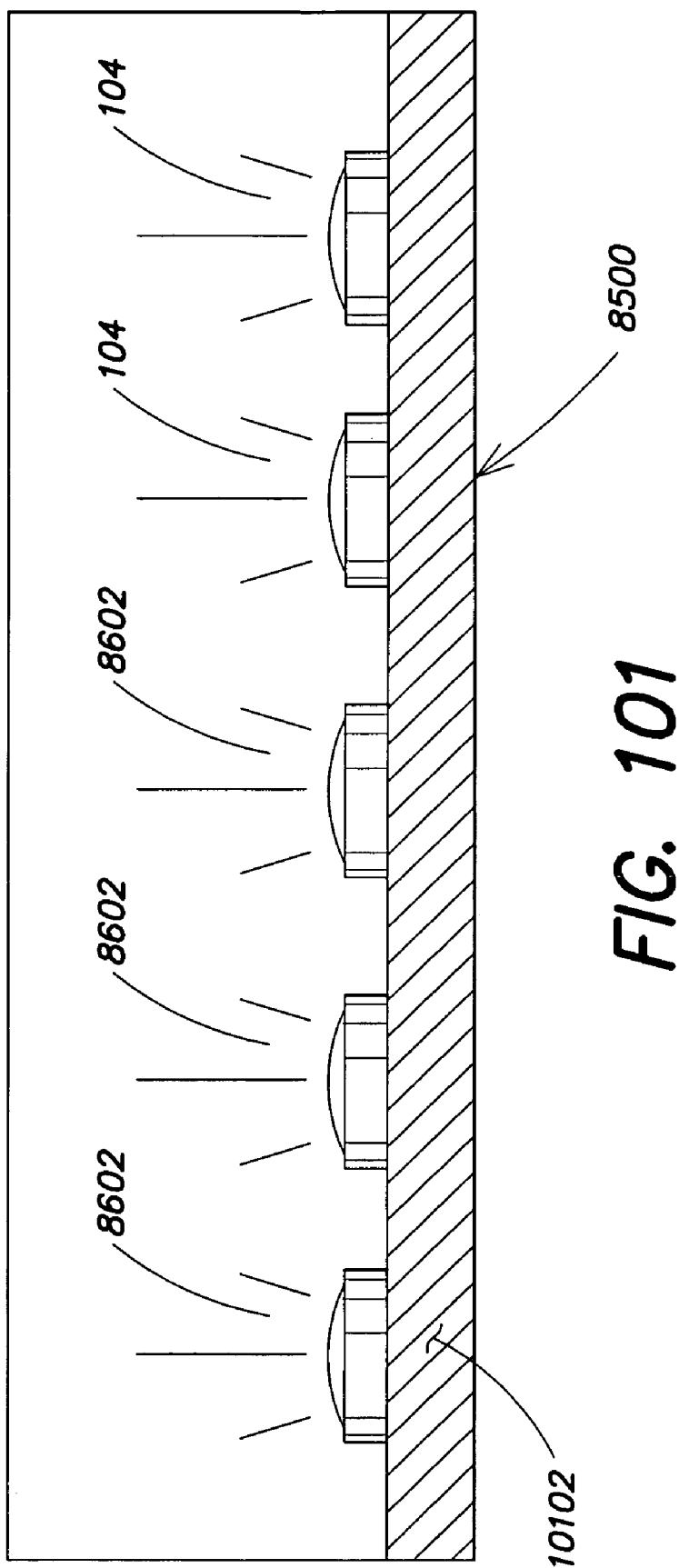
FIG. 101 depicts LEDs, a platform and a urethane thermal facility.

Referring to FIG. 101, light may be provided by a plurality of LEDs 8602 or other light sources 104 disposed in an environment that includes a platform for supporting the LEDs 8602 and a thermal facility 8500, which may include or be composed of a urethane 10102, which may remove heat from the environment of the LEDs 8602. In embodiments the urethane 10102 may be a thermally conductive adhesive, such as Dis-a-Paste 2000-A/B, Dis-a-Paste 2001-PMF, or other urethane adhesives supplied by Aptek Laboratories, Inc., or a hybrid urethane adhesive, such as Dis-a-Paste 2310-PBM or Dis-a-Paste 2311-PMF, also provided by Aptek Laboratories, mc, or Hysol U-09FL urethane adhesive from Henckel Loctite Corporation of Rocky Hill, Conn.

Figure 102:
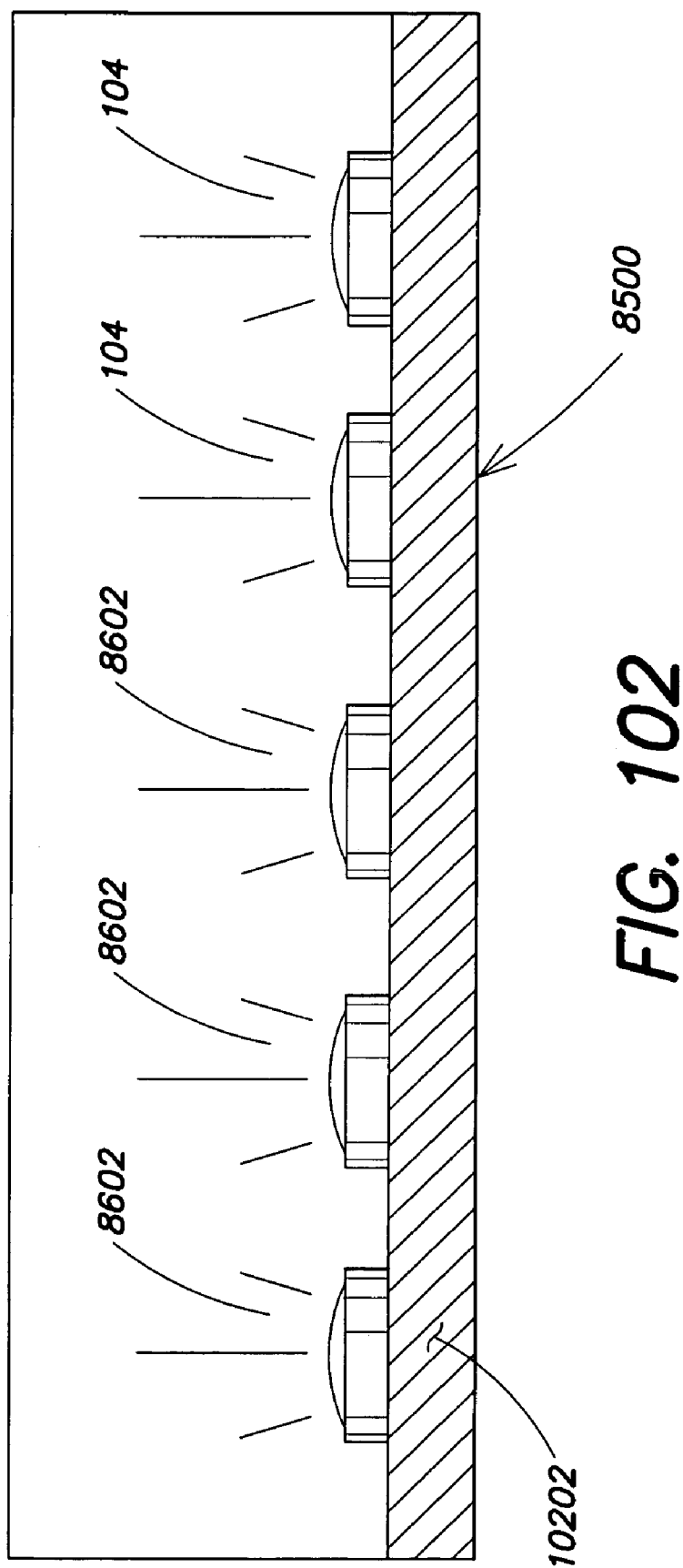
FIG. 102 depicts LEDs, a platform and a beryllium oxide thermal facility.

Referring to FIG. 102, light may be provided by a plurality of LEDs 8602 or other light sources 104 disposed in an environment that includes a platform for supporting the LEDs 8602 and a thermal facility 8500, which may include or be composed of berylium oxide 10202, which may remove heat from the environment of the LEDs 8602.

Figure 103:
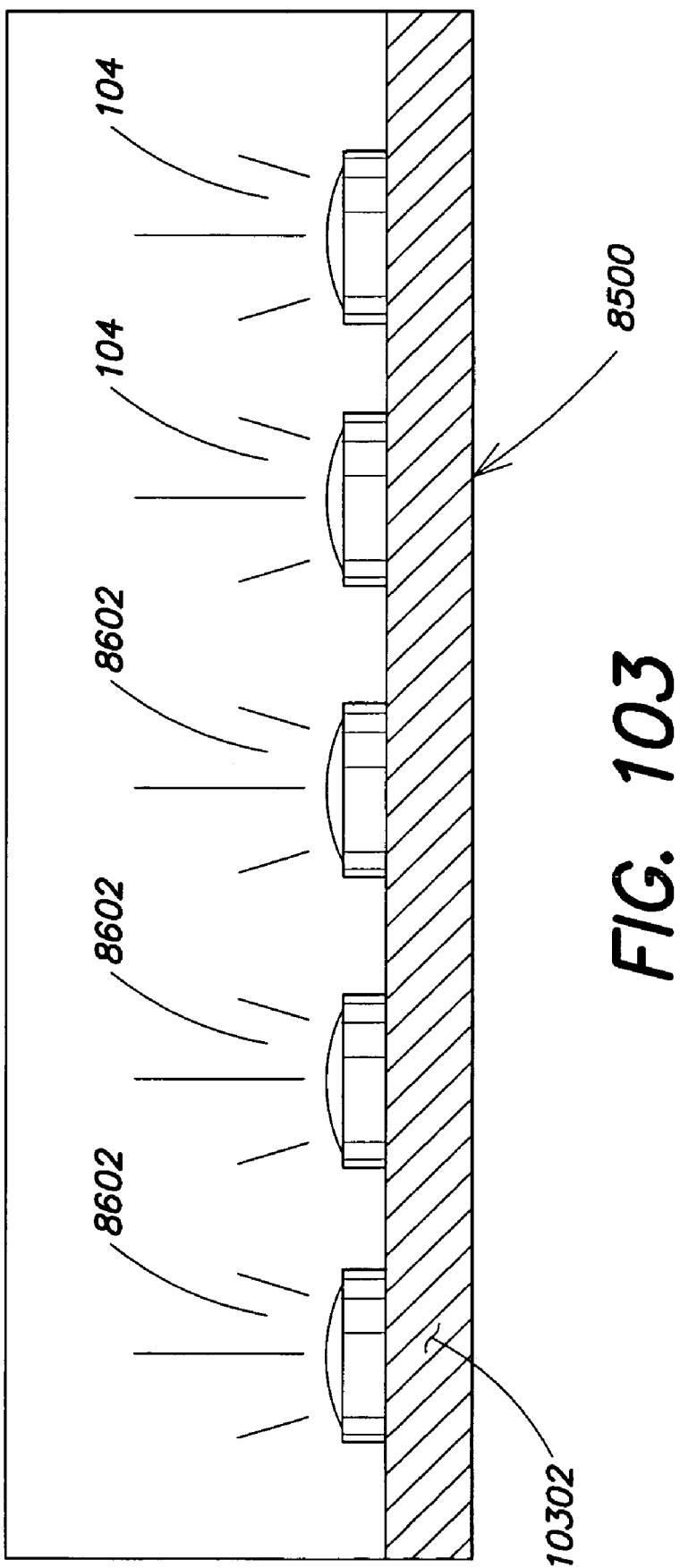
FIG. 103 depicts LEDs, a platform and an alumina thermal facility.

Referring to FIG. 103, light may be provided by a plurality of LEDs 8602 or other light sources 104 disposed in an environment that includes a platform for supporting the LEDs 8602 and a thermal facility 8500, which may include or be composed of an alumina material 10302, which may remove heat from the environment of the LEDs 8602.

Figure 104:
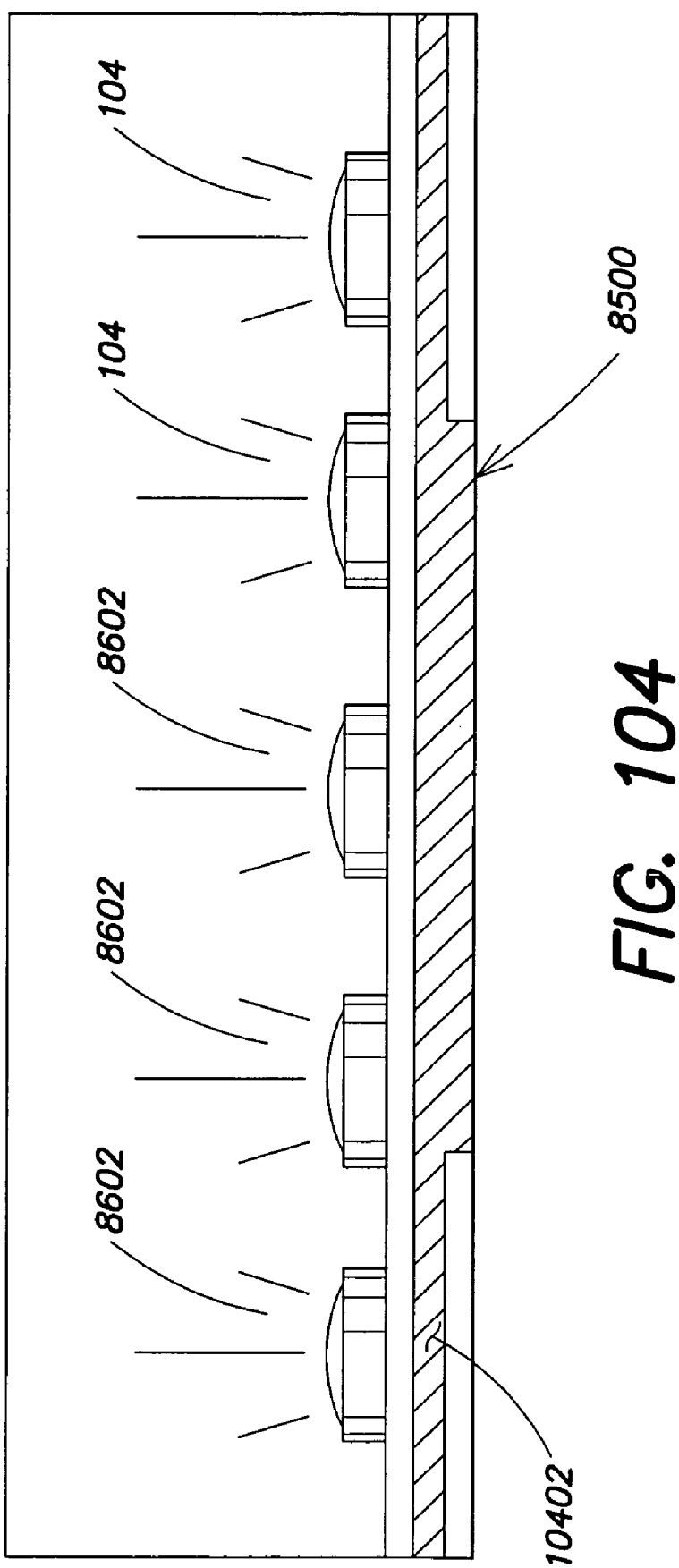
FIG. 104 depicts LEDs, a platform with a control circuit positioned on the back of the LED platform.

Referring to FIG. 104, light may be provided by a plurality of LEDs 8602 or other light sources 104 disposed in an environment that includes a platform for supporting the LEDs 8602 and a thermal facility 8500, which may include or be composed of a control circuit for the LEDs 8602 which may be on the back of the platform that supports the LEDs 8602, which may remove heat from the environment of the LEDs 8602. The platform may include or be composed of a thermally conductive material, such as any of the thermally conductive materials described herein.

Figure 105:
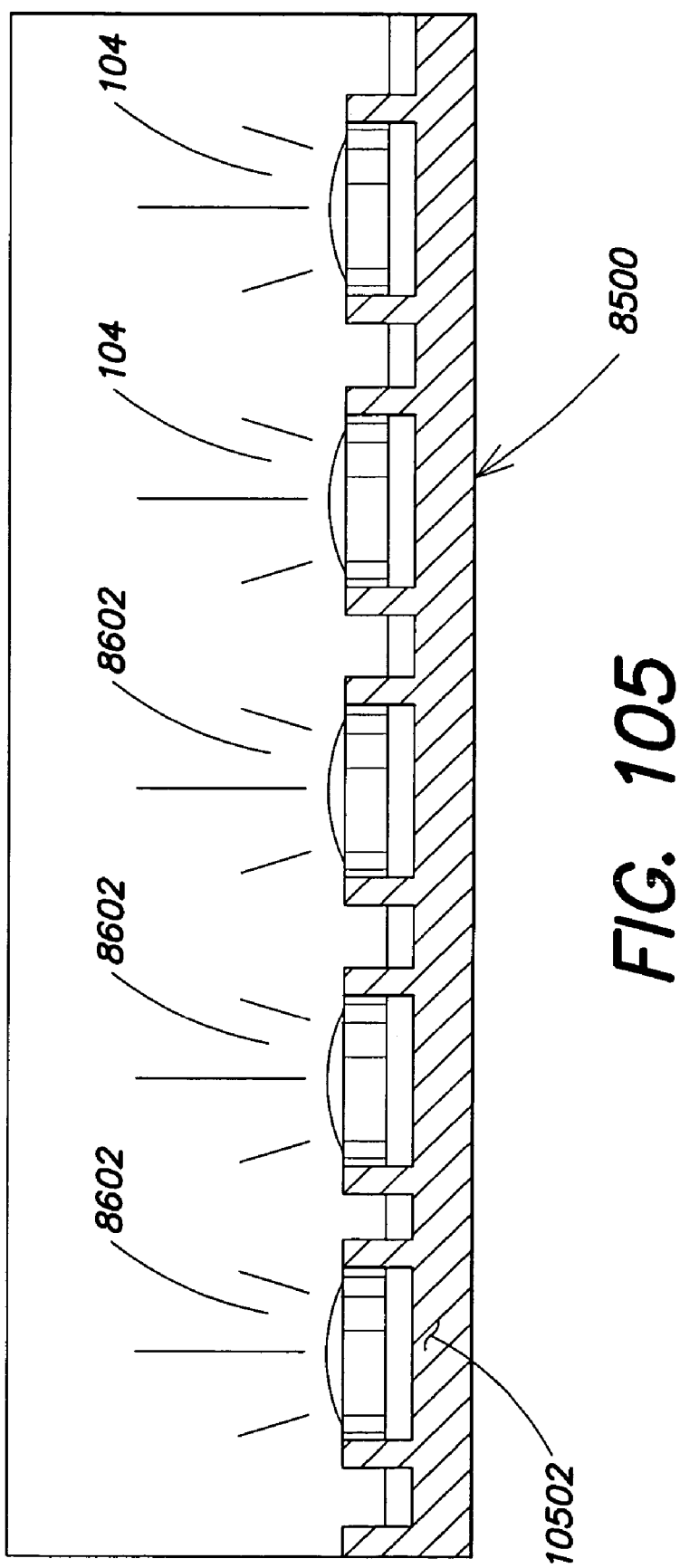
FIG. 105 depicts LEDs, a platform and a thermal potting facility.

Referring to FIG. 105, light may be provided by a plurality of LEDs 8602 or other light sources 104 disposed in an environment that includes a platform for supporting the LEDs 8602 and a thermal facility 8500, which may include or be composed of a thermal potting compound 10502, which may remove heat from the environment of the LEDs 8602. The thermal potting compound 10502 may be a urethane potting compound, a compound that has thermal bonding beads, an encapsulant, a dielectric resin, a Bis F resin, such as 832-TC thermal potting compound from MG Chemicals, a silicone potting compound, thermally conductive resin, or other potting compound. In embodiments the potting compound fills in all of the gaps between electrical components and accepts heat away from the LEDs 8602.

Figure 106:
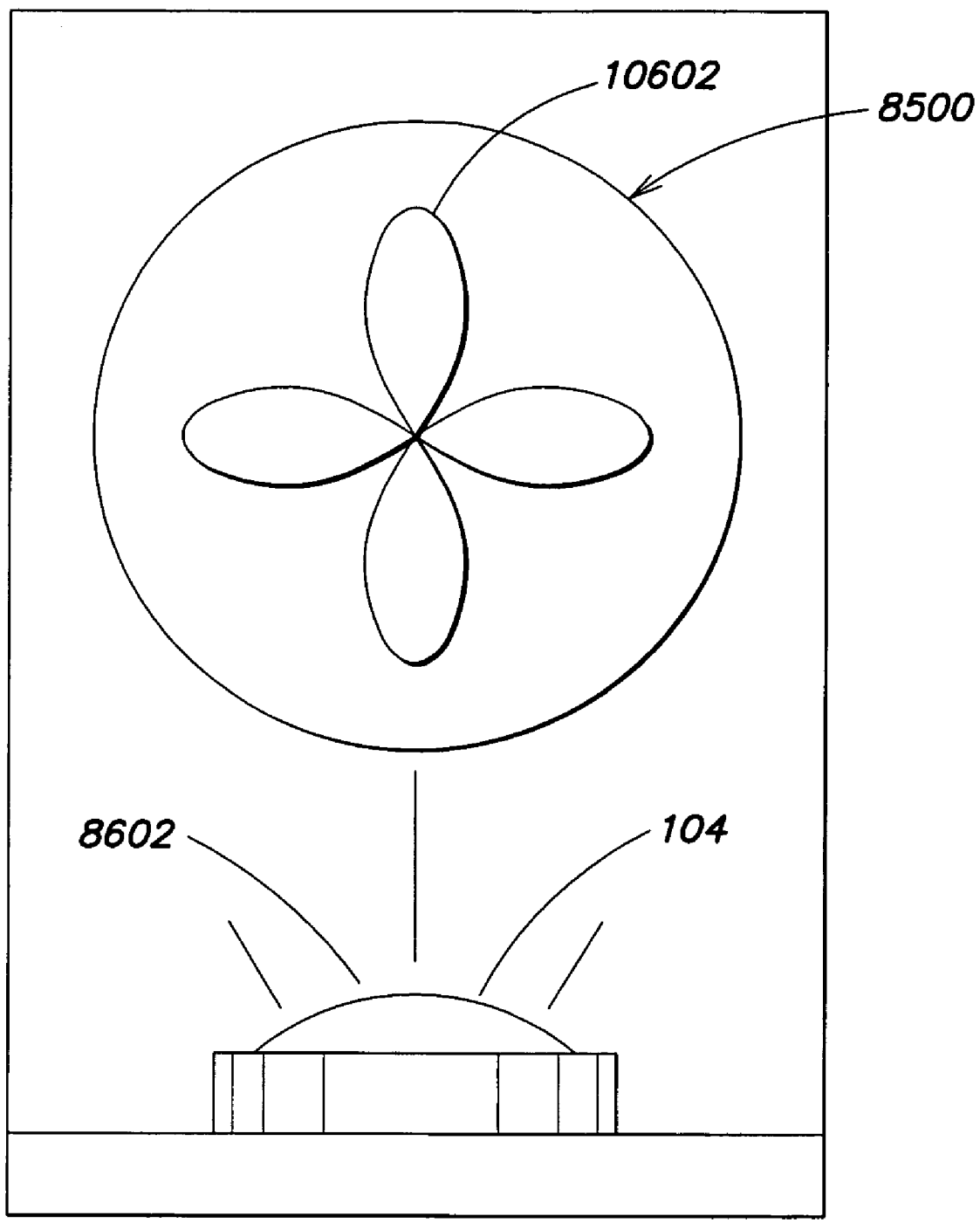
FIG. 106 depicts LEDs, a platform and a fan-type thermal facility.
Figure 107A:
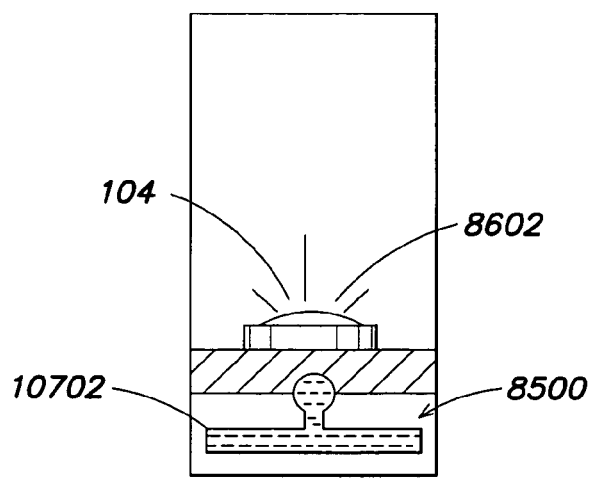
FIG. 107 depicts LEDs, a platform and a liquid cooling thermal facility.
Figure 107B:
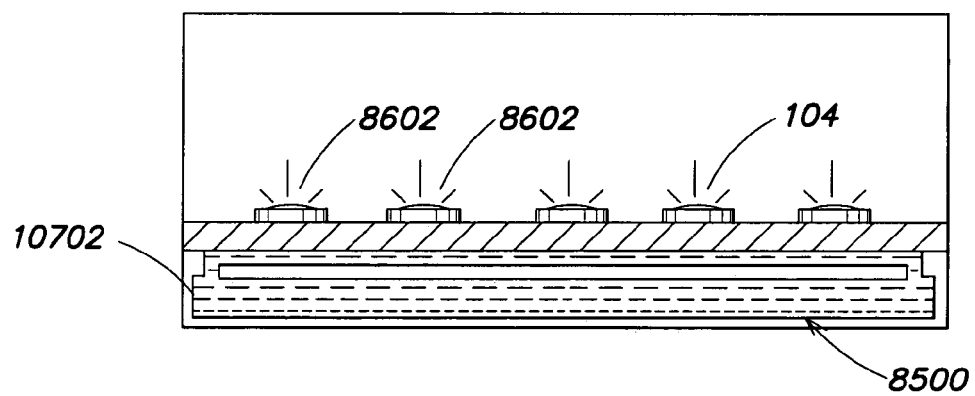
Figure 107C:
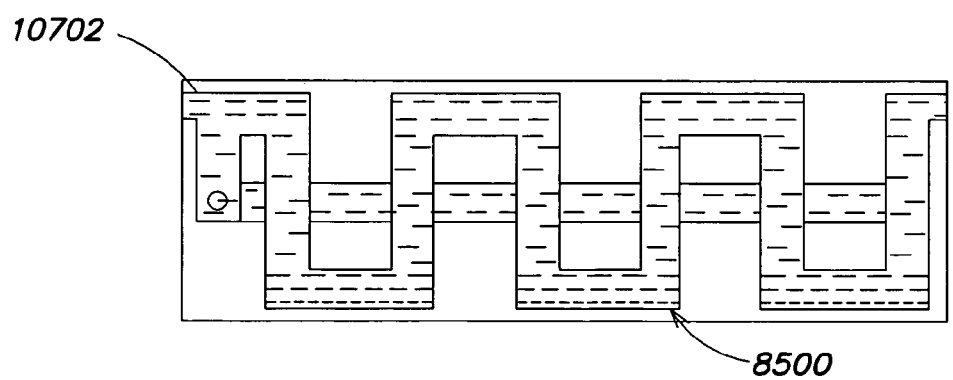
Figure 107D:
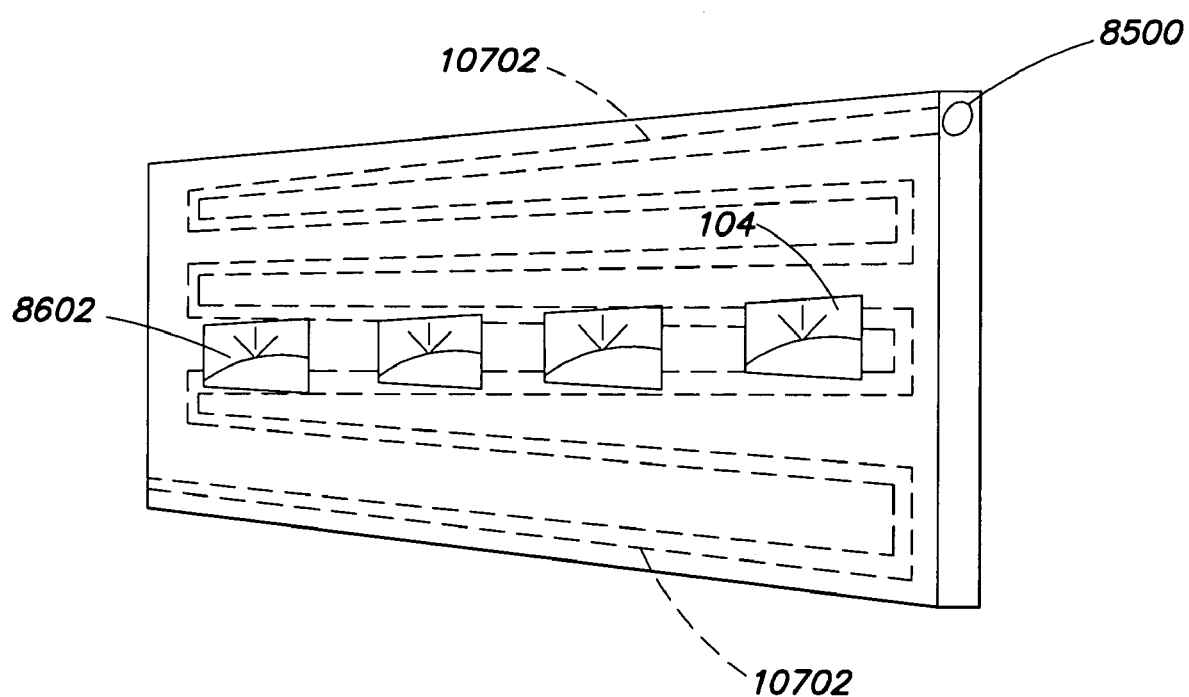

Referring to FIG. 106, light may be provided by a plurality of LEDs 8602 or other light sources 104 disposed in an environment that includes a platform for supporting the LEDs 8602 and a thermal facility 8500, which may include or be composed of a fan 10602, which may remove heat from the environment of the LEDs 8602.

Referring to FIG. 107, light may be provided by a plurality of LEDs 8602 or other light sources 104 disposed in an environment that includes a platform for supporting the LEDs 8602 and a thermal facility 8500, which may include or be composed of a liquid cooling facility 10702, which may remove heat from the environment of the LEDs 8602. The liquid cooling facility may use a liquid. The liquid may be water, a chlorofluorocarbon, liquid nitrogen, and/or a hydrocarbon. The liquid cooling facility may include an external liquid supply and a liquid exchange facility for moving liquid into and out of the environment of the LEDs 8602. The liquid cooling facility may circulate a liquid through a heat sink that is attached to the platform that supports the LEDs 8602, so that heat radiates from the LEDs into the sink and is carried away by the liquid from the environment of the LEDs 8602. Away from the LEDs 8602, the liquid cooling facility may include radiating elements 10702 to radiate the heat into the air. In certain embodiments, liquid cooling may be quieter than other thermal facilities, such as convection facilities, such as fans. The liquid cooling facility may include an impeller to move liquid through the system and one or more fans to cool the radiating elements 10702 of the liquid cooling system.

Figure 108:
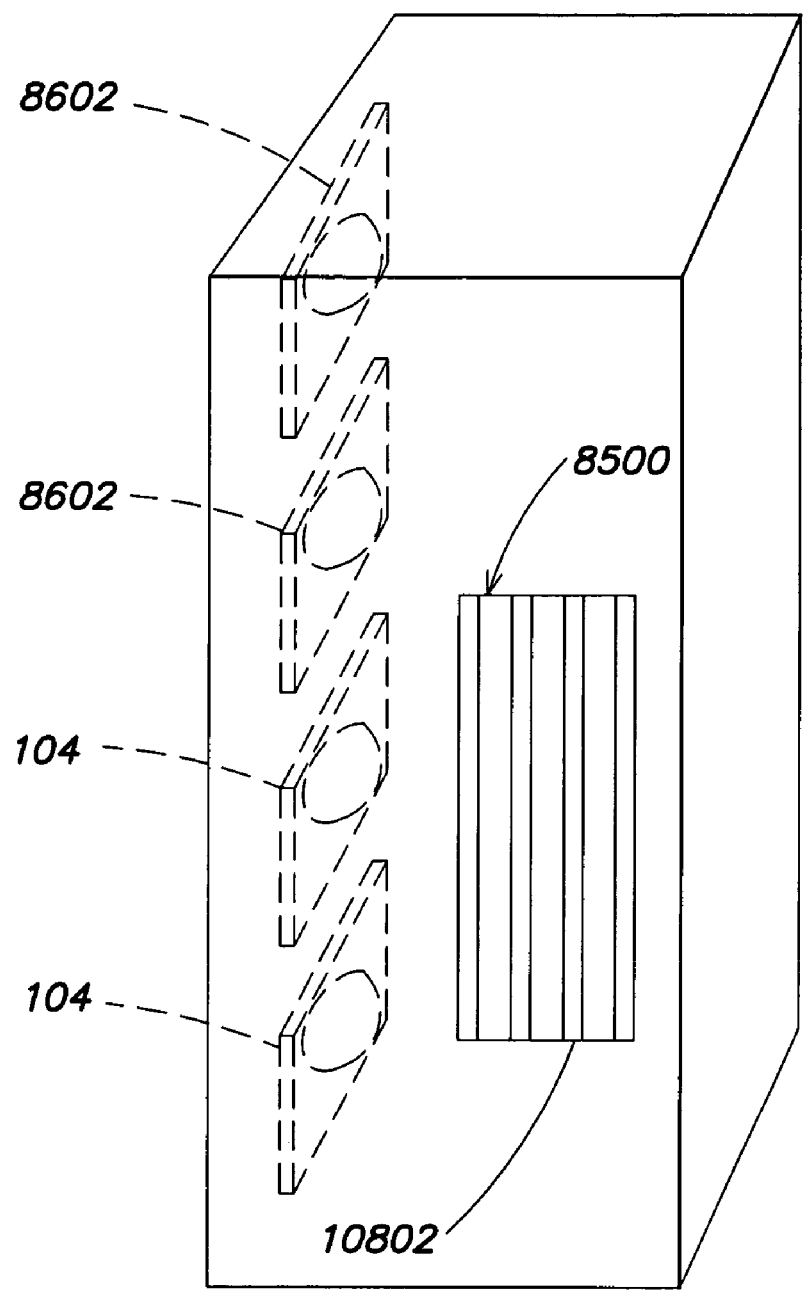
FIG. 108 depicts LEDs, a platform and a vent-based thermal facility.

Referring to FIG. 108, light may be provided by a plurality of LEDs 8602 or other light sources 104 disposed in an environment that includes a platform for supporting the LEDs 8602 and a thermal facility 8500, which may include or be composed of at least one vent 10802 for allowing air to exit the environment of the LEDs 8602, which may remove heat from the environment of the LEDs 8602. The vent may be in the housing or in an optical facility that covers the LEDs 8602, to allow hot air to escape the environment of the LEDs 8602.

Figure 109:
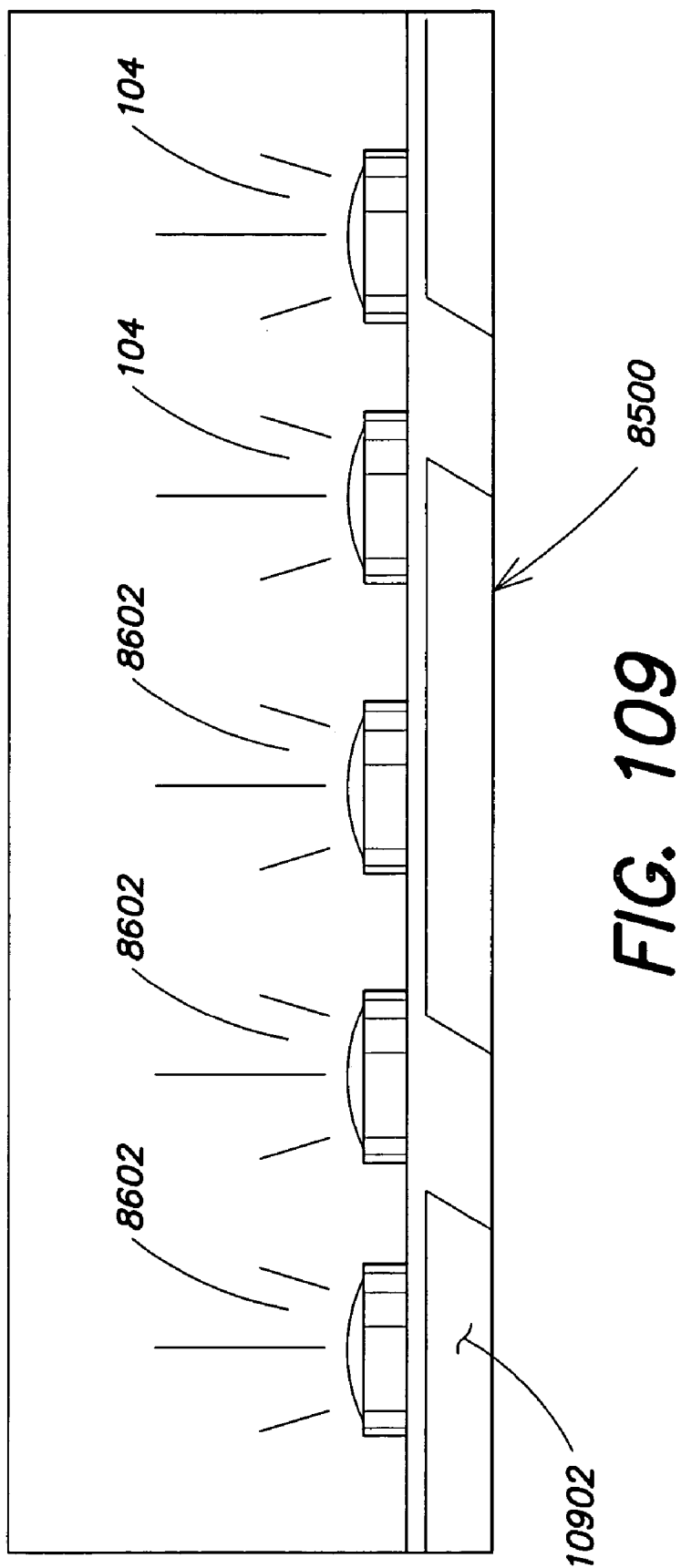
FIG. 109 depicts LEDs, a platform and a fin-based thermal facility.

Referring to FIG. 109, light may be provided by a plurality of LEDs 8602 or other light sources 104 disposed in an environment that includes a platform for supporting the LEDs 8602 and a thermal facility 8500, which may include or be composed of a fin connected to the platform for allowing heat to radiate away from the environment of the LEDs 8602, which may remove heat from the environment of the LEDs 8602. The fin may be connected to the platform that supports the LEDs, or to the housing of the architectural lighting fixture.

Referring to FIG. 110, light may be provided by a plurality of LEDs 8602 or other light sources 104 disposed in an environment that includes a platform for supporting the LEDs 8602 and a thermal facility 8500, which may include or be composed of a duct 11002 for allowing air to exit the environment of the LEDs 8602, which may remove heat from the environment of the LEDs 8602. The LEDs 8602 are disposed in a lamp and the duct is positioned in the lamp. The duct may travel through the housing of a fixture that houses the LEDs 8602 to the exterior of the housing, or it may travel through an optical facility that covers the LEDs 8602.

Figure 111A:
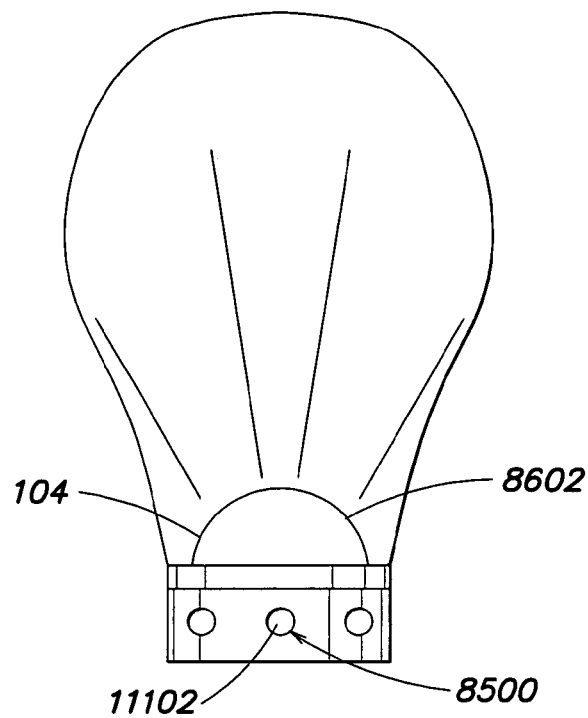
FIG. 111 depicts LEDs, a platform and a thermal facility.
Figure 111B:
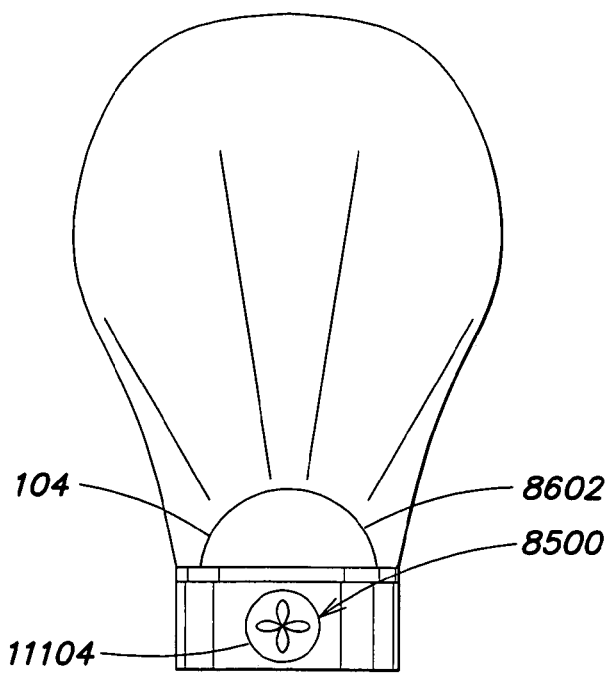

Referring to FIG. 111, light may be provided by a plurality of LEDs 8602 or other light sources 104 disposed in an environment that includes a platform for supporting the LEDs 8602 and a thermal facility 8500, which may include or be composed of a hole 11102 in the light bulb, which may remove heat from the environment of the LEDs 8602. The light bulb may include a miniature fan 11104 for moving air out of the environment of the light sources 104.

Figure 112A:
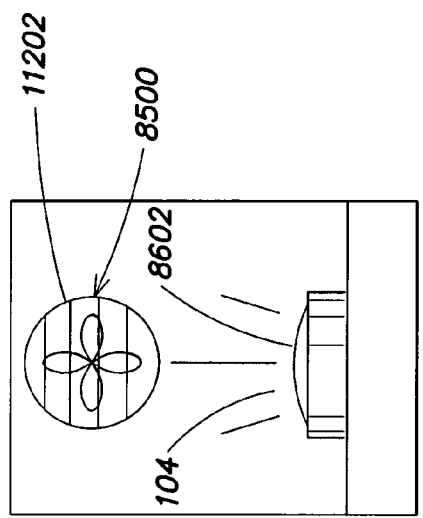
FIG. 112 depicts LEDs, a platform and a thermal facility.
Figure 112B:
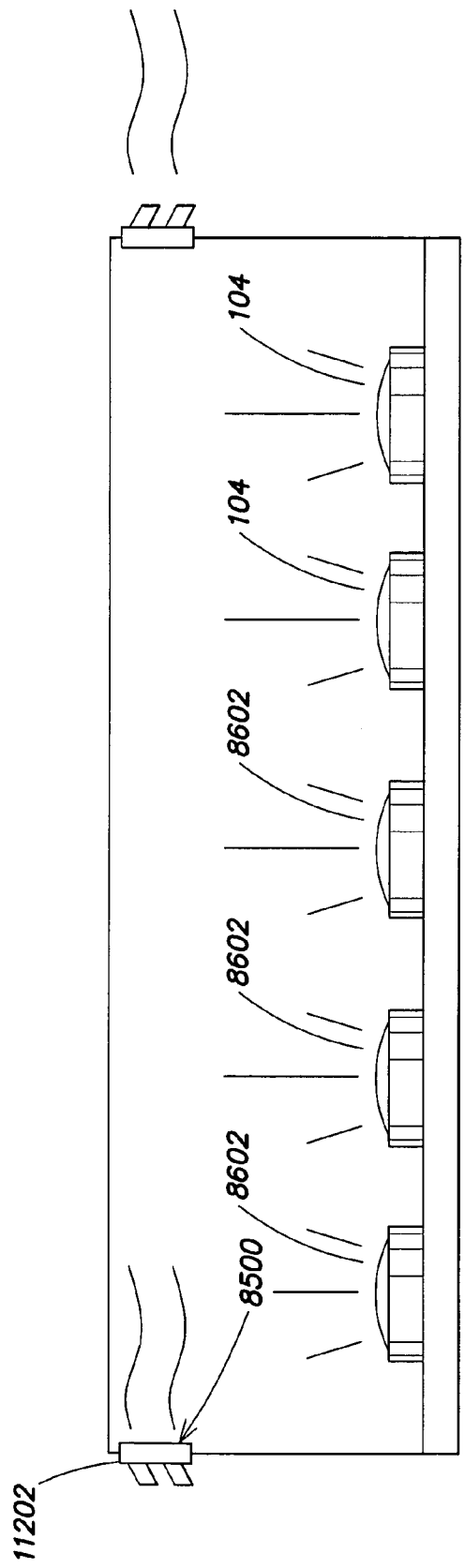

Referring to FIG. 112, light may be provided by a plurality of LEDs 8602 or other light sources 104 disposed in an environment that includes a platform for supporting the LEDs 8602 and a thermal facility 8500, which may include or be composed of disposing a fan in the lighting fixture for moving air out of the lighting fixture, which may remove heat from the environment of the LEDs 8602. The light fixture may be any type of lighting fixture described throughout the present disclosure.

Figure 113:
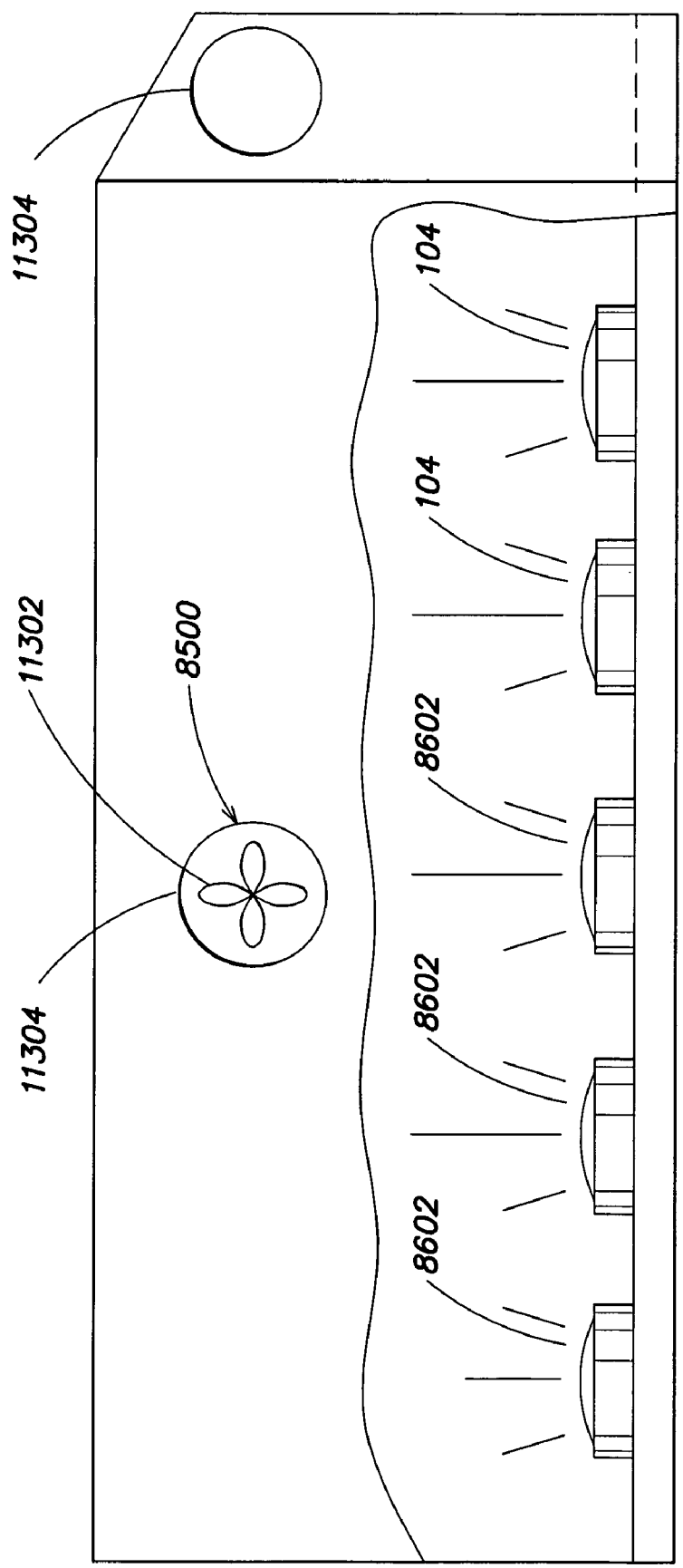
FIG. 113 depicts LEDs, a platform and a miniature fan thermal facility.

Referring to FIG. 113, light may be provided by a plurality of LEDs 8602 or other light sources 104 disposed in an environment that includes a platform for supporting the LEDs 8602 and a thermal facility 8500, which may include or be composed of positioning a miniature fan 11302 in the LED-based lamp, which may remove heat from the environment of the LEDs 8602. The platform may include an LED-based lamp designed to fit into a lighting fixture. The LED-based lamp may include a hole 11304 for allowing air to exit the lamp. The hole 11304 may be configured to come in through the center of the lighting fixture and exit the side of the lighting fixture.

Referring to FIG. 114, light may be provided by a plurality of LEDs 8602 or other light sources 104 disposed in an environment that includes a platform for supporting the LEDs 8602 and a thermal facility 8500, which may include or be composed of a duct 11402 for removing air from the environment of the LEDs 8602, which may remove heat from the environment of the LEDs 8602.

Figure 115:
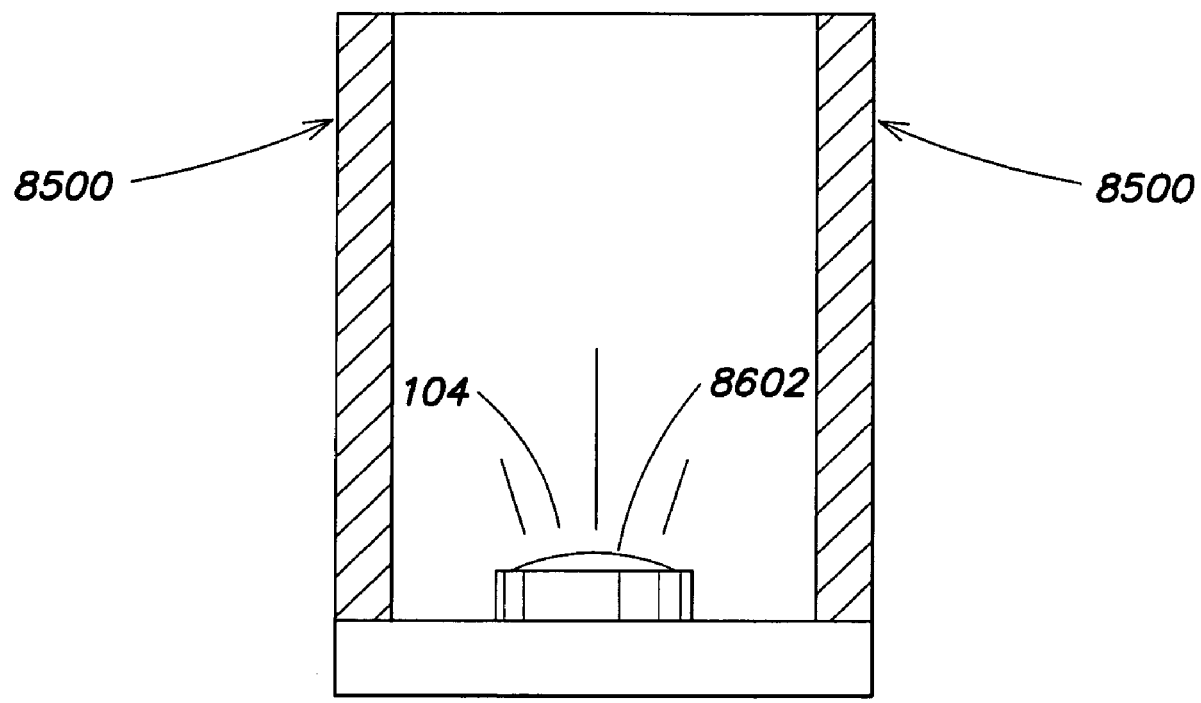
FIG. 115 depicts LEDs, a platform and a double-walled thermal facility.

Referring to FIG. 115, light may be provided by a plurality of LEDs 8602 or other light sources 104 disposed in an environment that includes a platform for supporting the LEDs 8602 and a thermal facility 8500, which may include or be composed of a facility for moving air between the walls of the double-walled lighting fixture, which may remove heat from the environment of the LEDs 8602. The platform may include a double-walled lighting fixture.

Figure 116:
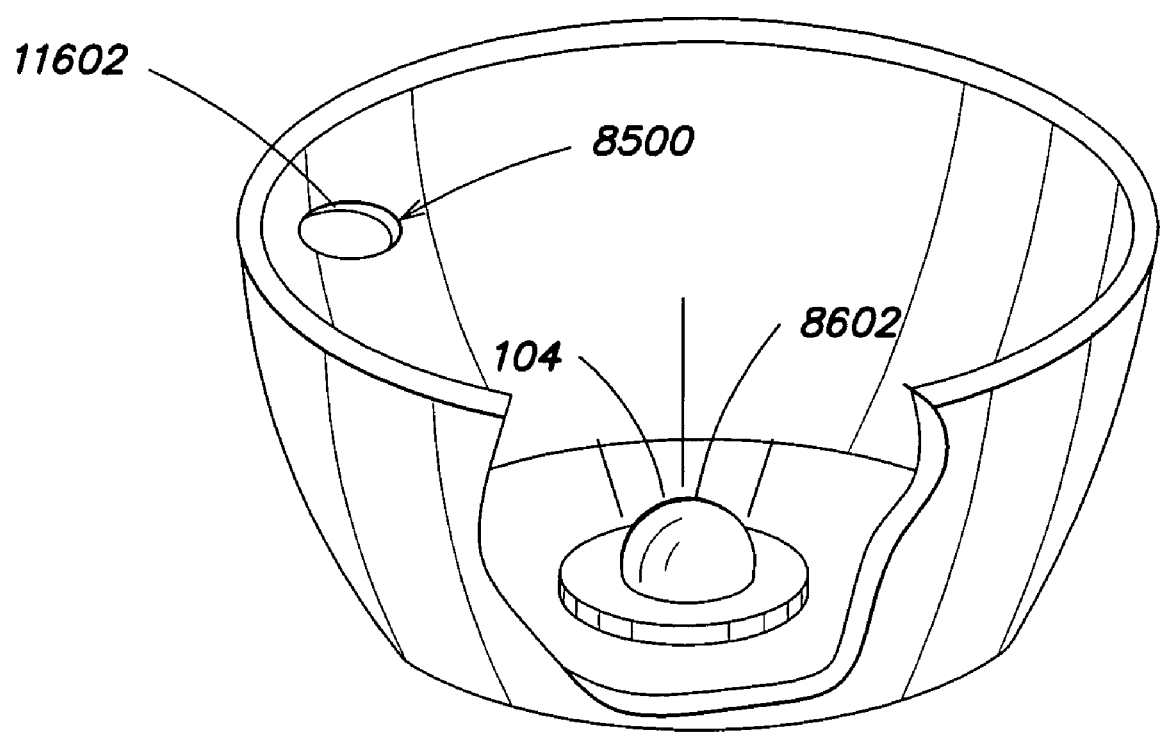
FIG. 116 depicts LEDs, a platform and a thermal facility.

Referring to FIG. 116, light may be provided by a plurality of LEDs 8602 or other light sources 104 disposed in an environment that includes a platform for supporting the LEDs 8602 and a thermal facility 8500, which may include or be composed of a hole 11602 in the LED-lamp, which may remove heat from the environment of the LEDs 8602. The platform may include a reflector-type lighting fixture. The LEDs 8602 may be disposed in a LED-lamp that is disposed in a reflector-type lighting fixture. The hole 11602 may be positioned to move air toward the edges of the lamp, so that cooler air may circulate to the middle of the lamp.

Figure 117:
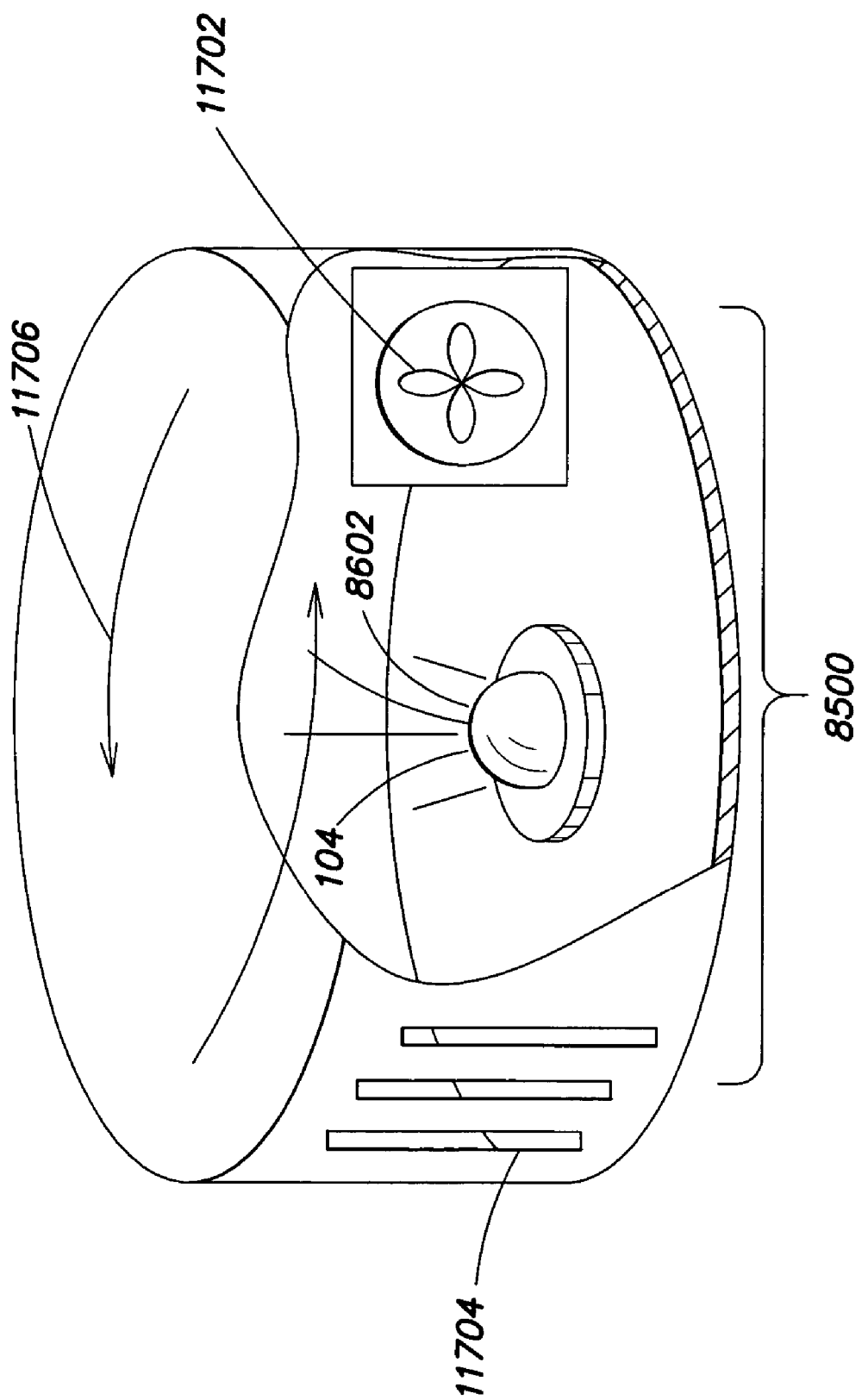
FIG. 117 depicts LEDs, a platform and a thermal facility.

Referring to FIG. 117, light may be provided by a plurality of LEDs 8602 or other light sources 104 disposed in an environment that includes a platform for supporting the LEDs 8602 and a thermal facility 8500, which may include or be composed of a convection facility for encouraging the circulation 11706 of air in the environment of the LEDs 8602, which may remove heat from the environment of the LEDs 8602. The convection facility may be a directional convection facility. The convection facility may cause air to flow in a curved flow pattern. The convection facility may be a squirrel cage fan 11702 that circulates air to the center of the LED-based lamp and ejects air out the ejection slots 11704 of the LED-based lamp. The LED-based lamp may be configured into a puck that can be surface-mounted to a ceiling. In embodiments, the fan may be any other kind of fan or blower, such as various industrial fans, centrifugal fans, impellers, rack blowers, dual squirrel cage blowers, or the like.

Figure 118:
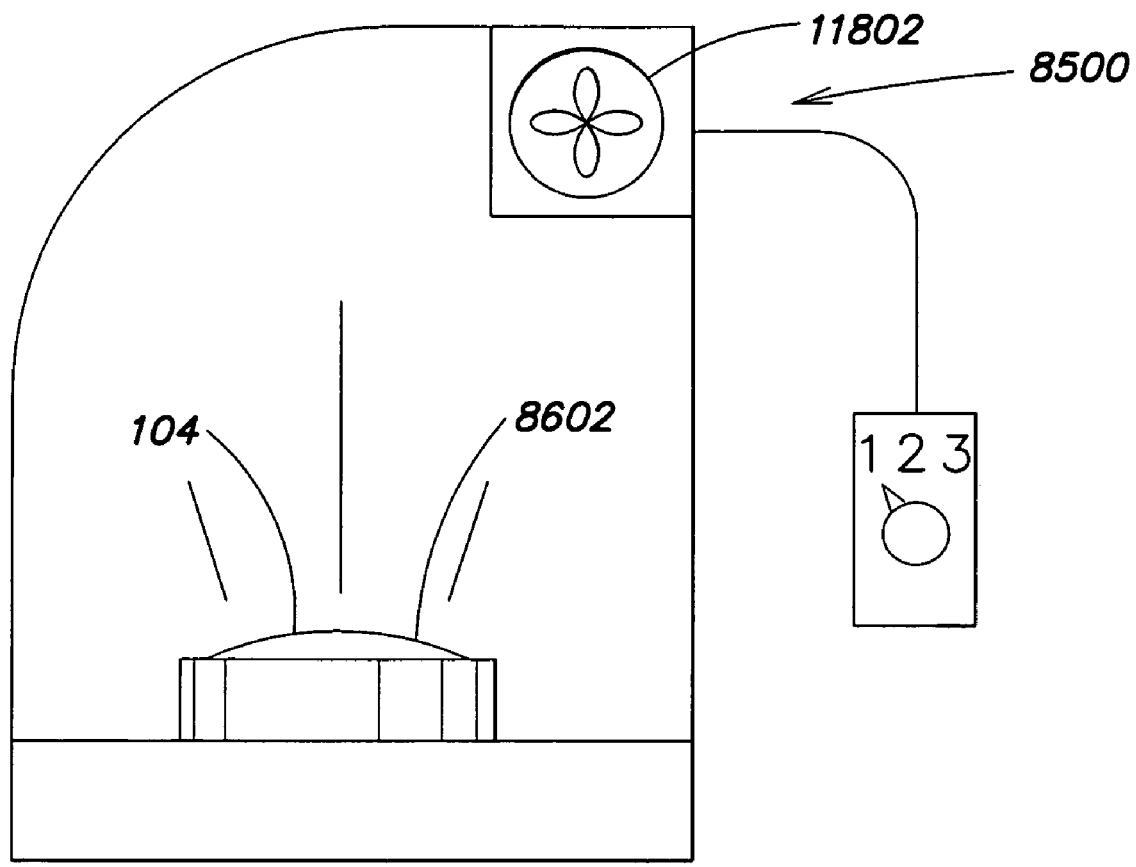
FIG. 118 depicts LEDs, a platform and a variable-speed fan thermal facility.

Referring to FIG. 118, light may be provided by a plurality of LEDs 8602 or other light sources 104 disposed in an environment that includes a platform for supporting the LEDs 8602 and a thermal facility 8500, which may include or be composed of a variable speed fan 11802, which may remove heat from the environment of the LEDs 8602. The variable speed fan may be disposed in an LED-based lamp.

Figure 119:
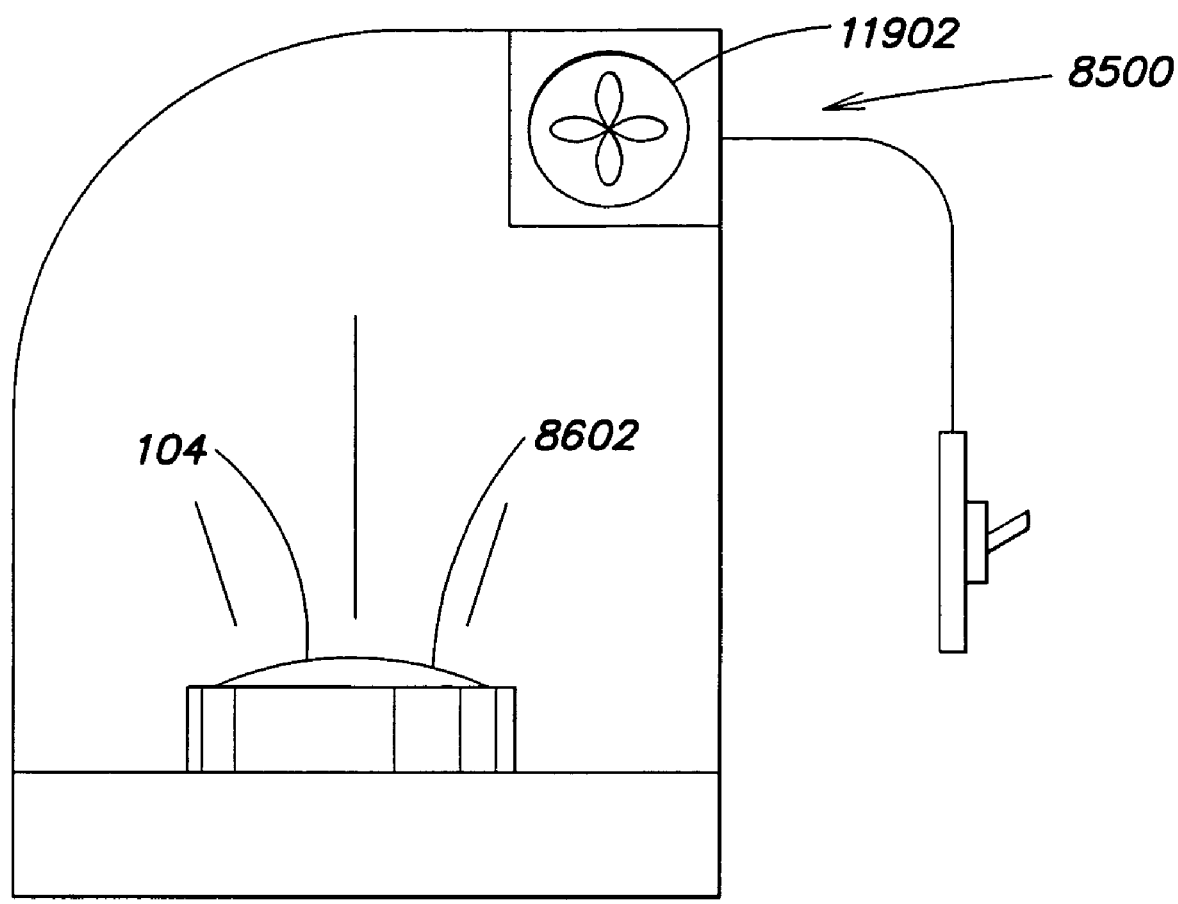
FIG. 119 depicts LEDs, a platform and a thermal facility.

Referring to FIG. 119, light may be provided by a plurality of LEDs 8602 or other light sources 104 disposed in an environment that includes a platform for supporting the LEDs 8602 and a thermal facility 8500, which may include or be composed of a switchable fan 11902 disposed in the LED-based lamp, which may remove heat from the environment of the LEDs 8602. The platform may comprise an LED-based lamp.

Referring to FIG. 120, light may be provided by a plurality of LEDs 8602 or other light sources 104 disposed in an environment that includes a platform for supporting the LEDs 8602 and a thermal facility 8500, which may include or be composed of a fan 12002, which may remove heat from the environment of the LEDs 8602. An LED 8602 for indicating an alarm 12004 condition when a fan is not working may also be provided.

Figure 121:
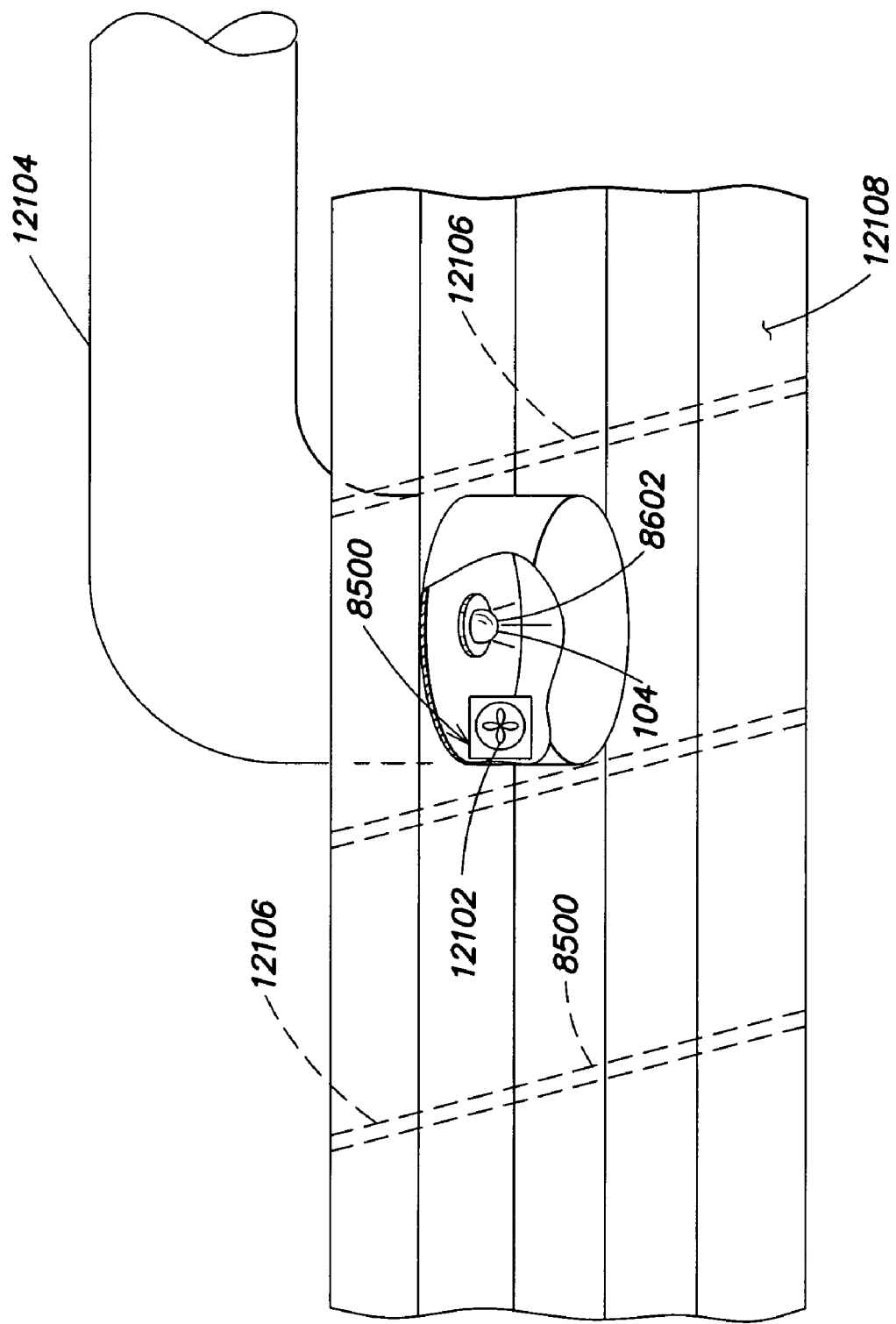

Referring to FIG. 121, light may be provided by a plurality of LEDs 8602 or other light sources 104 disposed in an environment that includes a platform and a surface mounting facility for the platform, so that the platform can be disposed on a flat surface. The platform may comprise a puck-shaped housing. The puck-shaped housing may include a thermal facility 8500. The thermal facility may be a fan. The fan may be a squirrel cage fan 12102. A ceiling tile configured to receive the puck-shaped housing may also be provided. The ceiling tile 12108 may be integrated with the puck-shaped housing. The ceiling tile may include at least one of a power facility and a data facility for the lighting system. The ceiling tile may be associated with a duct 12104 for providing airflow to the fixture. The ceiling tile may include an active cooling facility. The cooling facility may be a liquid cooling facility 12106. The cooling facility may be an air cooling facility. In embodiments the cooling facility may be a Peltier cooling facility, based on a thermoelectric refrigeration effect, such as Peltier module. The Peltier module consists of layers of n- and p-type semiconductor materials, such for n-p and p-n junctions. Each junction has thermal contact with radiators. When current is switched on, one radiator cools and the other heats. Peltier modules can be set up in a cascade formation, with multiple layers, to provide power active heat sinks, sometimes known as Peltier coolers or Peltier refrigerators. In embodiments a fan may be used to provide active cooling of the radiating elements of the Peltier cooler. Peltier coolers in certain embodiments can be conventional peltier modules, such as provided by Melcor or Kryotech.

Figure 122:
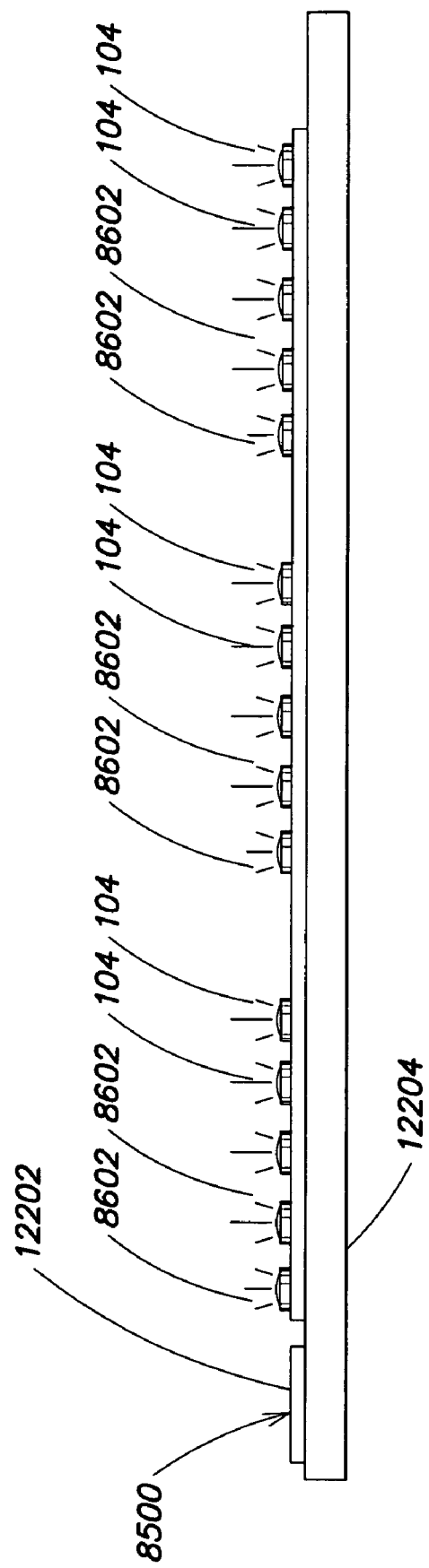

Referring to FIG. 122, light may be provided by a plurality of LEDs 8602 or other light sources 104 disposed in an environment that includes a platform for supporting the LEDs 8602, where the platfonn may include a lighting fixture 12204, and a thermal facility 8500, which may include or be composed of an insert to the lighting fixture that allows heat to dissipate from the environment of the LEDs 8602, which may remove heat from the environment of the LEDs 8602. The lighting fixture may be a fluorescent lighting fixture and the thermal facility 8500 may include or be composed of an insert to the fluorescent lighting fixture that allows heat to dissipate from the environment of the LEDs 8602.

Figure 123:
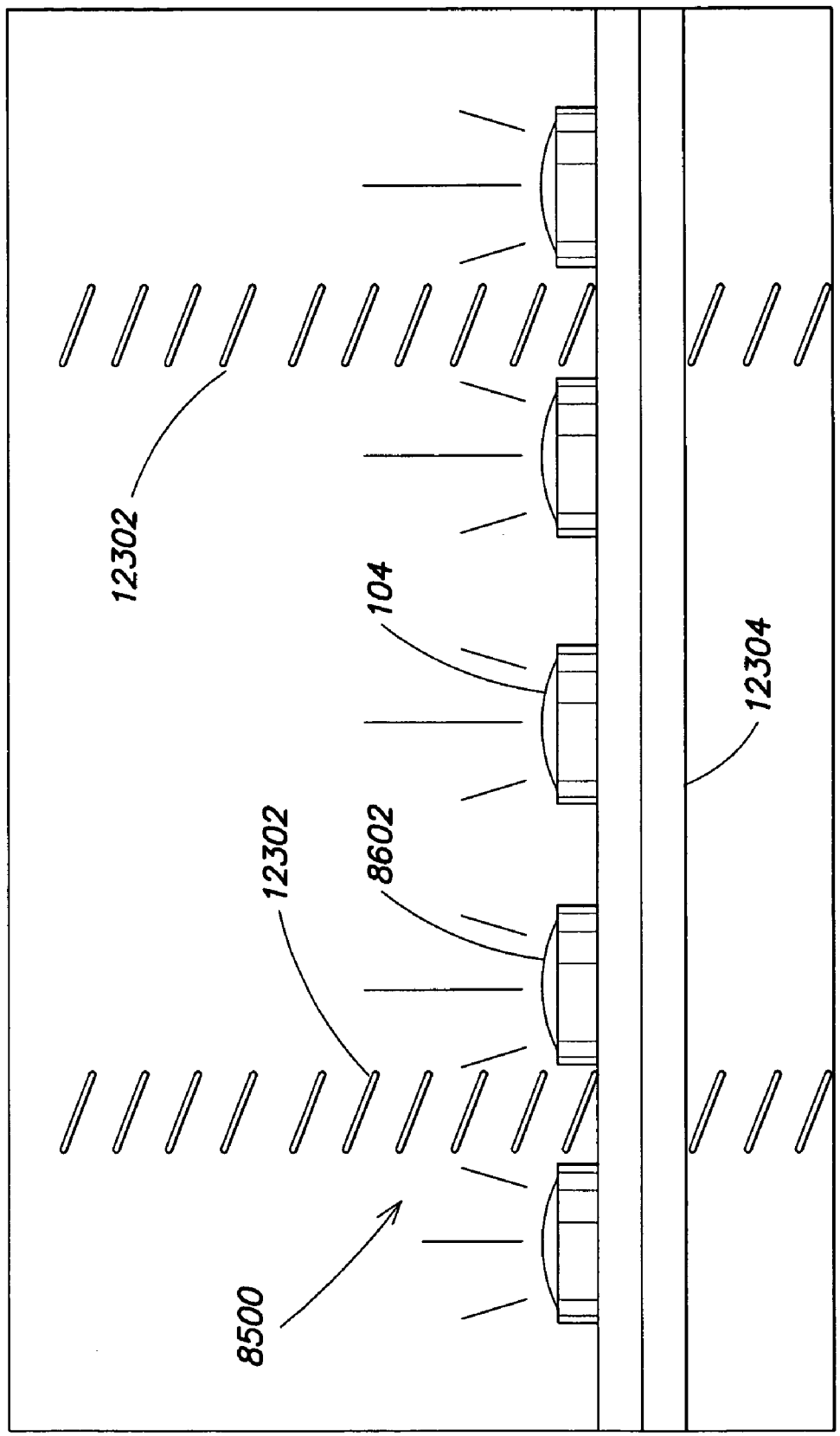

Referring to FIG. 123, light may be provided by a plurality of LEDs 8602 or other light sources 104 disposed in an environment that includes a platform for supporting the LEDs 8602 and a thermal facility 8500, which may include or be composed of a pressure-generating facility to maintain contact between the platform and a thermally conductive material 12304 for accepting heat away from the environment of the LEDs 8602, which may remove heat from the environment of the LEDs 8602. The pressure generating facility may comprise a plurality of springs 12302. The springs 12302 may provide an electrical connection. The thermally conductive material may be a thermal pad. The thermally conductive material 12304 may be an epoxy. The thermally conductive material may be a thermal potting material.

Figure 124:
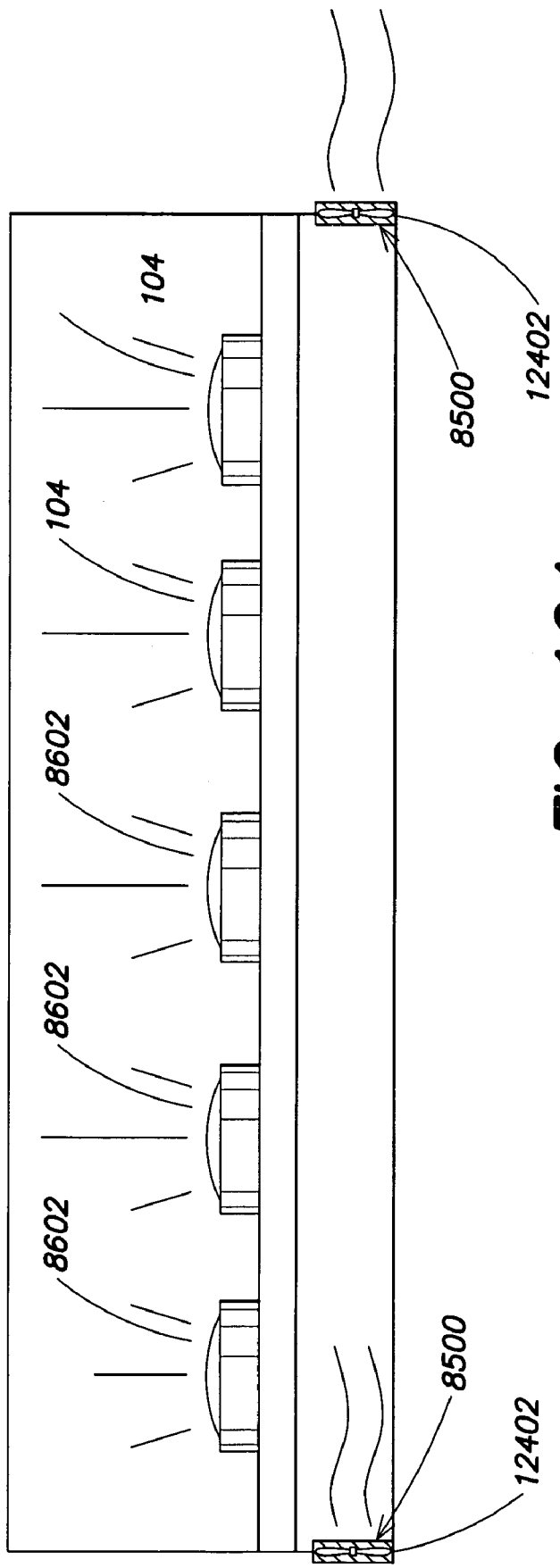

Referring to FIG. 124, light may be provided by a plurality of LEDs 8602 or other light sources 104 disposed in an environment that includes a platform for supporting the LEDs 8602 and a thermal facility 8500, which may include or be composed of a metal core having a plurality of fins 12402, which may remove heat from the environment of the LEDs 8602. The fins may form part of a fan.

The fan or convection facilities discussed herein may include a noise dampening facility, which may reducing noise caused by the flow of air. The noise dampening facility may be a passive noise dampening facility. The passive noise dampening facility may be a noise absorbing material. The noise dampening facility may be an active noise dampening facility. The active noise dampening facility may include a plurality of blades for reflecting sound in different directions. The active noise dampening facility may include a noise canceling facility. The noise dampening facility may include adjusting the airflow rates of the thermal facility to make noise inaudible to the human ear. The making the noise inaudible may comprise shifting the frequency of the noise caused by the airflow.

The fan or convection facilities discussed herein may respond to a sensor-feedback facility. The sensor feedback facility may include a sound sensor. The sensor may be a vibration sensor or a motion sensor. The sensor may accelerate the thermal facility when motion is not detected. The sensor may diminish the activity of the thermal facility when motion is detected. The sensor may accelerate the noise canceling facility when motion is detected. The sensor may diminish the noise canceling facility when motion is not detected. The passive noise dampening facility may comprise a non-metallic fixture. The passive noise dampening facility may include providing a rubber feature of the fixture. The rubber feature may be a washer or a socket. The passive noise canceling feature may be a shape of the fixture. The fixture may be provided with an irregular shape to reduce reflected noise. The fixture may be provided with an insulating material. The insulating material may be positioned on the exterior of the fixture to absorb noise.

Having thus described several illustrative embodiments, it is to be appreciated that various alterations, modifications, and improvements will readily occur to those skilled in the art. Such alterations, modifications, and improvements are intended to be part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

The invention claimed is:

1. An apparatus, comprising:
    an LED-based lighting device;
    a lighting fixture platform having at least one thermally conductive portion;
    a lighting socket mounted to the at least one thermally conductive portion and configured to mechanically and electrically engage with the LED-based lighting device; and
    at least one mechanical cover configured to exert a force on the LED-based lighting device so as to facilitate a positive mechanical mating of the lighting device and the lighting socket by pushing the lighting device into the lighting socket,
    wherein the lighting socket is configured to facilitate a transfer of heat generated by the lighting device from the lighting device to the at least one thermally conductive portion of the lighting fixture platform, via the lighting socket, when the lighting device is engaged in the lighting socket and operated to generate light.

2. The apparatus of claim 1, wherein the lighting socket includes at least one of a mechanical interface and an electrical interface configured to selectively facilitate engagement only with lighting devices having a particular power consumption.

3. The apparatus of claim 1, wherein the lighting device includes a base member adapted to be associated with a conventional light bulb socket.

4. The apparatus of claim 1, wherein the lighting device includes at least one of a thermally conductive back plate, a thermally conductive transfer plate, and a heat sink to facilitate the transfer of heat generated by the lighting device.

5. The apparatus of claim 4, wherein the lighting device includes the thermally conductive back plate, and wherein at least one of the lighting socket and the lighting device is configured such that the thermally conductive back plate of the lighting device is thermally associated with the at least one thermally conductive portion of the lighting fixture platform when the lighting device is engaged in the lighting socket.

6. The apparatus of claim 1, wherein the lighting device includes a housing having at least one vent to facilitate the transfer of the heat generated by the lighting device.

7. The apparatus of claim 1, wherein the lighting device includes a housing having one or more surface treatments to facilitate the transfer of the heat generated by the lighting device.

8. The apparatus of claim 1, wherein the lighting device includes a thermally conductive housing to facilitate the transfer of the heat generated by the lighting device.

9. The apparatus of claim 1, wherein the lighting device includes a puck-shaped housing.

10. The apparatus of claim 1, further comprising at least one sensor associated with the lighting socket.

11. The apparatus of claim 10, wherein the at least one sensor is configured to provide at least one signal indicating a proper engagement of the lighting device in the lighting socket.

12. The apparatus of claim 11, further comprising at least one processor coupled to the lighting socket and configured to monitor the at least one signal provided by the at least one sensor, the at least one processor further configured to control an operating power of the lighting device, when the lighting device is engaged in the lighting socket, based at least in part on the at least one signal provided by the at least one sensor.

13. The apparatus of claim 10, wherein the at least one sensor includes a temperature sensor configured to provide at least one signal representing a heat flow in the apparatus.

14. The apparatus of claim 13, further comprising at least one processor coupled to the lighting socket and configured to monitor the at least one signal provided by the at least one sensor, the at least one processor further configured to control an operating power of the lighting device, when the lighting device is engaged in the lighting socket, based at least in part on the at least one signal provided by the at least one sensor.

15. The apparatus of claim 1, wherein the lighting socket comprises a socket heat transfer member thermally associated with the at least one thermally conductive portion of the lighting fixture platform.

16. The apparatus of claim 15, wherein the lighting device includes a housing and an exposed thermally conductive back plate, and wherein the lighting device is configured such that the thermally conductive back plate makes contact with the socket heat transfer member as the lighting device is engaged with the lighting socket.

17. The apparatus of claim 1, further comprising a flexible thermal transfer member configured to facilitate the transfer of the heat generated by the lighting device, the flexible thermal transfer member including a flexible positive load device that is compressed when the lighting device is engaged with the lighting socket.

18. The apparatus of claim 1, further comprising a thermal transfer facility associated with the lighting socket.

19. The apparatus of claim 18, wherein an inner surface of the thermal transfer facility is configured to become thermally associated with the lighting device when the lighting device is engaged with the lighting socket.

20. The apparatus of claim 19, wherein the lighting device includes a thermally conductive housing, and wherein the inner surface of the thermal transfer facility becomes thermally associated with the thermally conductive housing of the lighting device when the lighting device is engaged with the lighting socket.

21. The apparatus of claim 18, wherein the thermal transfer facility includes at least one sensor to provide at least one signal indicating a presence or absence of the lighting device in the lighting socket.

22. The apparatus of claim 21, wherein the at least one signal provided by the at least one sensor further indicates a proper engagement of the lighting device with the thermal transfer facility.

23. The apparatus of claim 22, further comprising at least one processor coupled to the lighting socket and configured to monitor the at least one signal provided by the at least one sensor, the at least one processor further configured to control an operating power of the lighting device, when the lighting device is engaged in the lighting socket, based at least in part on the at least one signal provided by the at least one sensor.

24. The apparatus of claim 1, further comprising a thermally conductive material configured to thermally associate the lighting device and the lighting socket as the lighting device is engaged in the lighting socket.

25. The apparatus of claim 24, wherein the thermally conductive material is disposed between the lighting device and the lighting socket.

26. The apparatus of claim 24, wherein the thermally conductive material includes a thermally conductive malleable material.

27. The apparatus of claim 24, wherein the thermally conductive material is attached to the lighting device.

28. The apparatus of claim 24, wherein the thermally conductive material is attached to the lighting socket.

29. The apparatus of claim 1, wherein the mechanical mating facilitates the transfer of the heat generated by the lighting device from the lighting device to the at least one thermally conductive portion of the lighting fixture platform.

30. The apparatus of claim 29, wherein the mechanical cover comprises at least one of a lever, a screw, and a snap connector.

31. The apparatus of claim 1, wherein the lighting fixture platform is thermally associated with a thermally conductive building material, such that the heat generated by the lighting device is transferred to the building material.

32. The apparatus of claim 1, wherein the lighting fixture platform is thermally associated with at least one of an electrical junction box and a conduit, such that the heat generated by the lighting device is transferred to the at least one of the electrical junction box and the conduit.

33. A lighting fixture, comprising:
an LED-based lighting device;
a lighting fixture platform having at least one thermally conductive portion;
a lighting socket mounted proximate to the at least one thermally conductive portion and configured to mechanically and electrically engage with the LED-based lighting device; and
at least one mechanical cover configured to exert a force on the LED-based lighting device so as to facilitate a positive mechanical mating of the lighting device and the lighting socket by pushing the LED-based lighting device into the lighting socket, wherein the lighting socket is configured to facilitate a transfer of heat generated by the LED-based lighting device from the LED-based lighting device to the at least one thermally conductive portion of the lighting fixture platform when the LED-based lighting device is engaged in the lighting socket and operated to generate light.

34. The lighting fixture of claim 33, wherein the LED-based lighting device includes a puck-shaped housing.

35. The lighting fixture of claim 33, wherein the LED-based lighting device includes a thermally conductive housing to facilitate the transfer of the heat generated by the LED-based lighting device.

36. The lighting fixture of claim 33, wherein the LED-based lighting device includes a thermally conductive back plate to facilitate the transfer of the heat generated by the LED-based lighting device.

37. The lighting fixture of claim 36, wherein at least one of the lighting socket and the LED-based lighting device is configured such that the thermally conductive back plate of the LED-based lighting device is thermally associated with the at least one thermally conductive portion of the lighting fixture platform when the LED-based lighting device is engaged in the lighting socket.

38. The lighting fixture of claim 33, further comprising at least one sensor associated with at least one of the lighting socket and the LED-based lighting device and configured to provide at least one sensor signal.

39. The lighting fixture of claim 38, wherein the at least one sensor signal indicates a proper engagement of the LED-based lighting device in the lighting socket.

40. The lighting fixture of claim 39, further comprising at least one processor coupled to the lighting socket and configured to monitor the at least one sensor signal, the at least one processor further configured to control an operating power of the LED-based lighting device, when the LED-based lighting device is engaged in the lighting socket, based at least in part on the at least one sensor signal.

41. The lighting fixture of claim 38, wherein the at least one sensor includes a temperature sensor, and wherein the at least one sensor signal represents a heat flow in the lighting fixture.

42. The lighting fixture of claim 41, further comprising at least one processor coupled to the lighting socket and configured to monitor the at least one sensor signal, the at least one processor further configured to control an operating power of the LED-based lighting device, when the LED-based lighting device is engaged in the lighting socket, based at least in part on the at least one sensor signal.

43. An apparatus, comprising:
an LED-based lighting device;
a lighting fixture platform having at least one thermally conductive portion;
a lighting socket mounted proximate to the at least one thermally conductive portion and configured to mechanically and electrically engage with the LED-based lighting device; and
at least one mechanical cover configured to exert a force on the LED-based lighting device so as to facilitate a positive mechanical mating of the lighting device and the lighting socket by pushing the lighting device into the lighting socket,
wherein the apparatus is configured to facilitate a transfer of heat generated by the lighting device from the lighting device to the at least one thermally conductive portion of the lighting fixture platform via a solid thermal conduction path when the lighting device is engaged in the lighting socket and operated to generate light.

44. An apparatus, comprising:
an LED-based lighting device including a thermally conductive housing to facilitate the transfer of heat generated by the lighting device;
a lighting fixture platform having at least one thermally conductive portion;
a lighting socket mounted proximate to the at least one thermally conductive portion and configured to mechanically and electrically engage with the LED-based lighting device; and
at least one mechanical cover configured to exert a force on the LED-based lighting device so as to facilitate a positive mechanical mating of the lighting device and the lighting socket by pushing the LED-based lighting device into the lighting socket,
wherein the apparatus is configured to facilitate a transfer of the heat generated by the lighting device from the lighting device to the at least one thermally conductive portion of the lighting fixture platform when the lighting device is engaged in the lighting socket and operated to generate light.

45. The apparatus of claim 44, wherein the lighting device includes at least one of a thermally conductive back plate, a thermally conductive transfer plate, and a heat sink to facilitate the transfer of heat generated by the lighting device.

46. The apparatus of claim 45, wherein the lighting device includes the thermally conductive back plate, and wherein at least one of the lighting socket and the lighting device is configured such that the thermally conductive back plate of the lighting device is thermally associated with the at least one thermally conductive portion of the lighting fixture platform when the lighting device is engaged in the lighting socket.

47. The apparatus of claim 44, wherein the lighting device includes a puck-shaped housing.

48. The apparatus of claim 44, wherein the lighting fixture platform is thermally associated with a thermally conductive building material, such that the heat generated by the lighting device is transferred to the building material.

49. The apparatus of claim 44, wherein the lighting fixture platform is thermally associated with at least one of an electrical junction box and a conduit, such that the heat generated by the lighting device is transferred to the at least one of the electrical junction box and the conduit.

50. An apparatus, comprising:
an LED-based lighting device;
a lighting fixture platform having at least one thermally conductive portion;
a lighting socket mounted proximate to the at least one thermally conductive portion and configured to mechanically and electrically engage with the LED-based lighting device; and
at least one mechanical cover configured to exert a force on the lighting device so as to facilitate a positive mechanical mating of the lighting device and the lighting socket by pushing the lighting device into the lighting socket,
wherein the apparatus is configured to facilitate a transfer of heat generated by the lighting device from the lighting device to the at least one thermally conductive portion of the lighting fixture platform when the lighting device is engaged in the lighting socket and operated to generate light;

the apparatus further comprising a thermally conductive material configured to thermally associate the lighting device and the at least one thermally conductive portion of the lighting fixture platform via a contact thermal conduction path when the lighting device is engaged in the lighting socket.

51. The apparatus of claim 50, wherein the thermally conductive material is configured to thermally associate the lighting device and the lighting socket via the contact thermal conduction path when the lighting device is engaged in the lighting socket.

52. The apparatus of claim 51, wherein the thermally conductive material is disposed between the lighting device and the lighting socket.

53. The apparatus of claim 50, wherein the thermally conductive material includes a thermally conductive malleable material.

54. The apparatus of claim 50, wherein the thermally conductive material is attached to the lighting device.

55. The apparatus of claim 50, wherein the thermally conductive material is attached to the lighting socket.

56. A method, comprising acts of:
exerting a force on an LED-based lighting device with at least one mechanical cover so as to facilitate a positive mechanical mating of the lighting device and a lighting socket by pushing the LED-based lighting device into the lighting socket; and facilitating a transfer of heat generated by the LED-based lighting device that is mechanically and electrically engaged in the lighting socket, the lighting socket being mounted proximate to at least one thermally conductive portion of a lighting fixture platform, the transfer of the heat being from the LED-based lighting device to the lighting fixture platform via a solid thermal conduction path.

57. The method of claim 56, further comprising an act of controlling an operating power of the LED-based lighting device based at least in part on a proper engagement of the LED-based lighting device in the lighting socket.

58. The method of claim 56, further comprising an act of controlling an operating power of the LED-based lighting device based at least in part on a heat flow associated with the LED-based lighting device.

59. The method of claim 56, further comprising an act of transferring the heat generated by the LED-based lighting device from the lighting fixture platform to a thermally conductive building material.

60. The method of claim 56, further comprising an act of transferring the heat generated by the LED-based lighting device from the lighting fixture platform to at least one of an electrical junction box and a conduit.

\* \* \* \* \*